(12) United States Patent
Hoya et al.

(10) Patent No.: US 8,592,674 B2
(45) Date of Patent: Nov. 26, 2013

(54) PROPYLENE BASED RESIN COMPOSITION AND USE THEREOF

(75) Inventors: Hiroshi Hoya, Ichihara (JP); Kiminori Noda, Ichihara (JP); Norihide Inoue, Ichihara (JP); Hiroshi Uehara, Ichihara (JP); Eiji Shiba, Ichihara (JP); Masayoshi Yamaguchi, Ichihara (JP); Manabu Kawamoto, Tokyo (JP); Akira Yamashita, Tokyo (JP)

(73) Assignee: Mitsui Chemicals, Inc., Tokyo (JP)

( * ) Notice: Subject to any disclaimer, the term of this patent is extended or adjusted under 35 U.S.C. 154(b) by 0 days.

(21) Appl. No.: 13/618,857

(22) Filed: Sep. 14, 2012

(65) Prior Publication Data
US 2013/0017351 A1 Jan. 17, 2013

Related U.S. Application Data

(60) Division of application No. 11/642,983, filed on Dec. 21, 2006, which is a continuation of application No. PCT/JP2005/021730, filed on Nov. 25, 2005.

(30) Foreign Application Priority Data

| Nov. 25, 2004 | (JP) | 2004-341316 |
|---|---|---|
| Nov. 26, 2004 | (JP) | 2004-343171 |
| Mar. 4, 2005 | (JP) | 2005-061577 |
| Mar. 25, 2005 | (JP) | 2005-088109 |
| Mar. 28, 2005 | (JP) | 2005-091468 |
| Mar. 31, 2005 | (JP) | 2005-105470 |
| Mar. 31, 2005 | (JP) | 2005-105471 |
| May 26, 2005 | (JP) | 2005-153415 |
| May 27, 2005 | (JP) | 2005-155238 |
| Aug. 10, 2005 | (JP) | 2005-232605 |
| Sep. 22, 2005 | (JP) | 2005-276776 |
| Sep. 22, 2005 | (JP) | 2005-276777 |
| Sep. 22, 2005 | (JP) | 2005-276778 |
| Oct. 19, 2005 | (JP) | 2005-304837 |
| Oct. 19, 2005 | (JP) | 2005-304838 |
| Oct. 19, 2005 | (JP) | 2005-304839 |
| Nov. 1, 2005 | (JP) | 2005-318593 |

(51) Int. Cl.
*H01L 31/00* (2006.01)
*C08L 53/00* (2006.01)
*C08G 63/48* (2006.01)

(52) U.S. Cl.
USPC ........ 136/251; 428/36.92; 442/327; 524/528; 525/240

(58) Field of Classification Search
USPC ........ 136/251; 428/36.92; 442/327; 524/528; 525/240
See application file for complete search history.

(56) References Cited

U.S. PATENT DOCUMENTS

| 3,618,807 A | 11/1971 | Rownd |
|---|---|---|
| 4,820,876 A | 4/1989 | Nuttens et al. |
| 4,842,930 A | 6/1989 | Schinkel et al. |
| 4,871,805 A | 10/1989 | Shimomura et al. |
| 5,001,197 A | 3/1991 | Hendewerk |
| 5,045,589 A | 9/1991 | Ueno |
| 5,412,020 A | 5/1995 | Yamamoto et al. |
| 5,473,016 A | 12/1995 | Fujii et al. |
| 5,561,185 A | 10/1996 | Hashimoto et al. |
| 5,916,988 A | 6/1999 | Tsutsui et al. |
| 5,986,009 A | 11/1999 | Thoen et al. |
| 5,998,039 A | 12/1999 | Tanizaki et al. |
| 6,339,123 B1 | 1/2002 | Raetzsch et al. |
| 6,348,535 B1 | 2/2002 | Sugimoto et al. |
| 6,562,907 B2 | 5/2003 | Johoji et al. |
| 6,677,403 B1 | 1/2004 | Abe |
| 6,855,406 B2 | 2/2005 | Takayasu et al. |
| 7,320,950 B2 | 1/2008 | Okamoto et al. |
| 7,488,789 B2 | 2/2009 | Ikenaga et al. |
| 7,524,190 B2 | 4/2009 | Jiang et al. |
| 7,541,402 B2 | 6/2009 | Abhari et al. |
| 7,678,934 B2 | 3/2010 | Hirota et al. |
| 7,728,078 B2 | 6/2010 | Ikenaga et al. |
| 7,737,239 B2 | 6/2010 | Ikenaga et al. |
| 7,767,313 B2 | 8/2010 | Ikenaga et al. |
| 2002/0055592 A1 | 5/2002 | Johoji et al. |
| 2002/0193527 A1 | 12/2002 | Nakata et al. |

(Continued)

FOREIGN PATENT DOCUMENTS

| EP | 0 273 228 A2 | 7/1988 |
|---|---|---|
| EP | 0 412 518 A2 | 2/1991 |

(Continued)

OTHER PUBLICATIONS

Robert Portnoy (Polypropylene for Medical Applications, Business briefing: Medical device manufacturing & technology 2002, 1-4).*
Communication (EP Search Report) in EP Appln No. 11 18 2777.0 dated Nov. 3, 2011.
Communication (EP Search Report) in EP Appln No. 11 18 2782.0 dated Nov. 7, 2011.

(Continued)

*Primary Examiner* — Ling Choi
*Assistant Examiner* — Chun-Cheng Wang
(74) *Attorney, Agent, or Firm* — Foley & Lardner LLP

(57) ABSTRACT

Means for Solving the Problems
The thermoplastic resin composition (X1) of the present invention comprises (A1), (B1), (C1), and optionally (D1) below:

1 to 90 wt % of an isotactic polypropylene (A1);

9 to 98 wt % of a propylene/ethylene/α-olefin copolymer (B1) containing 45 to 89 mol % of propylene-derived structural units, 10 to 25 mol % of ethylene-derived structural units, and optionally, 0 to 30 mol % of $C_4$-$C_{20}$ α-olefin-derived structural units (a1);

1 to 80 wt % of a styrene-based elastomer (C1); and 0 to 70 wt % of an ethylene/α-olefin copolymer (D1) whose density is in the range of 0.850 to 0.910 g/cm³, wherein (A1)+(B1)+(C1)+(D1)=100 wt %.

14 Claims, 9 Drawing Sheets

(56) References Cited

U.S. PATENT DOCUMENTS

| | | |
|---|---|---|
| 2003/0224194 A1 | 12/2003 | Howell et al. |
| 2004/0127614 A1 | 7/2004 | Jiang et al. |
| 2004/0147771 A1* | 7/2004 | Chow et al. ............... 556/140 |
| 2004/0158000 A1 | 8/2004 | Yada et al. |
| 2004/0220336 A1 | 11/2004 | Abhari et al. |
| 2005/0107530 A1 | 5/2005 | Datta et al. |
| 2005/0171263 A1 | 8/2005 | Kanamori et al. |
| 2006/0247381 A1 | 11/2006 | Mori et al. |
| 2007/0225431 A1 | 9/2007 | Mori et al. |
| 2008/0306219 A1 | 12/2008 | Ikenaga et al. |

FOREIGN PATENT DOCUMENTS

| | | | |
|---|---|---|---|
| EP | 0 480 698 A2 | 4/1992 | |
| EP | 480698 A2 * | 4/1992 | ............. C08L 23/12 |
| EP | 0 627 464 A2 | 12/1994 | |
| EP | 0 636 650 A1 | 2/1995 | |
| EP | 0 936 247 A1 | 8/1999 | |
| EP | 1 022 292 A2 | 7/2000 | |
| EP | 1 614 699 A1 | 1/2006 | |
| EP | 1 630 197 A1 | 3/2006 | |
| EP | 1 741 747 A1 | 1/2007 | |
| JP | 59-157127 | 9/1984 | |
| JP | 02-140258 | 5/1990 | |
| JP | 03-033186 | 5/1991 | |
| JP | 4-505339 T | 9/1992 | |
| JP | 06-016832 | 1/1994 | |
| JP | 6-122792 A | 5/1994 | |
| JP | 06-198830 | 7/1994 | |
| JP | 6-263937 A | 9/1994 | |
| JP | 07-076360 | 3/1995 | |
| JP | 08-113681 | 5/1996 | |
| JP | 08-269271 | 10/1996 | |
| JP | 08-283696 | 10/1996 | |
| JP | 08-302093 | 11/1996 | |
| JP | 09-501447 | 2/1997 | |
| JP | 09-268241 | 10/1997 | |
| JP | 09-278909 | 10/1997 | |
| JP | 10-077375 | 3/1998 | |
| JP | 10-120865 | 5/1998 | |
| JP | 10-212382 | 8/1998 | |
| JP | 10-258488 | 9/1998 | |
| JP | 11-206406 | 8/1999 | |
| JP | 11-286578 A | 10/1999 | |
| JP | 11-286584 | 10/1999 | |
| JP | 11-293058 | 10/1999 | |
| JP | 11-293061 | 10/1999 | |
| JP | 11-293062 A | 10/1999 | |
| JP | 11-349753 | 12/1999 | |
| JP | 2000-052510 | 2/2000 | |
| JP | 2000-068543 | 3/2000 | |
| JP | 2000-091611 A | 3/2000 | |
| JP | 2000-129053 | 5/2000 | |
| JP | 2000-198892 A | 7/2000 | |
| JP | 2000-198893 A | 7/2000 | |
| JP | 2000-230088 A | 8/2000 | |
| JP | 2000-281807 | 10/2000 | |
| JP | 2001-068703 | 3/2001 | |
| JP | 2001-081255 | 3/2001 | |
| JP | 2001-111077 | 4/2001 | |
| JP | 2001-171439 | 6/2001 | |
| JP | 2001-172451 | 6/2001 | |
| JP | 2001-192490 | 7/2001 | |
| JP | 2002-088164 | 3/2002 | |
| JP | 2002-140941 A | 5/2002 | |
| JP | 2002-234115 | 8/2002 | |
| JP | 2002-265709 A | 9/2002 | |
| JP | 2002-348417 | 12/2002 | |
| JP | 2003-033999 | 2/2003 | |
| JP | 2003-136650 A | 5/2003 | |
| JP | 2003-145695 A | 5/2003 | |
| JP | 2003-201375 | 7/2003 | |
| JP | 2003-205966 | 7/2003 | |
| JP | 2003-268169 | 9/2003 | |
| JP | 2003-306587 | 10/2003 | |
| JP | 2003-313377 | 11/2003 | |
| JP | 2004-167905 | 6/2004 | |
| JP | 2004-197027 A | 7/2004 | |
| JP | 2004-217839 A | 8/2004 | |
| JP | 2004-292668 | 10/2004 | |
| JP | 2005-047944 | 2/2005 | |
| JP | 2005-053970 | 3/2005 | |
| JP | 2005-187588 | 7/2005 | |
| JP | 2005-325153 | 11/2005 | |
| KR | 0071627 | 9/1993 | |
| KR | 200123057 | 3/2001 | |
| KR | 2001-0032711 | 4/2001 | |
| WO | WO-99/29774 | 6/1999 | |
| WO | WO-03/092018 A1 | 11/2003 | |
| WO | WO-03/095538 A1 | 11/2003 | |
| WO | WO-2004/087775 A1 | 10/2004 | |
| WO | WO-2004/106430 A1 | 12/2004 | |
| WO | WO-2005/103141 A1 | 3/2005 | |

OTHER PUBLICATIONS

EP Communication—European Search Report in EP Appln No. 10008405.2 dated Oct. 5, 2010.
EP Communication in EP Search Report Appln No. 10008404.5 dated Oct. 6, 2010.
EP Communication of EP Search Report Appln No. 10008403.7 dated Oct. 6, 2010.
European Office Action dated Sep. 16, 2009, received in Application No. 05809773.4.
Final Office Action U.S. Appl. No. 11/642,983 dated Jan. 19, 2011.
International Search Report dated Feb. 28, 2006, received in corresponding International Application No. PCT/JP2005/021730.
Non-Final Office Action U.S. Appl. No. 11/642,983 dated Aug. 2, 2010.
Non-Final Office Action U.S. Appl. No. 11/642,983 dated Mar. 30, 2010.
Notice of Allowance U.S. Appl. No. 11/642,983 dated Aug. 6, 2012.
Office Action issued by Korean Intellectual Property Office dated Jun. 5, 2008, Korean Application No. 2008-7007328.
Taiwanese Office Action dated Jul. 27, 2009, received in corresponding Application No. 95107148.
Non-Final Office Action U.S. Appl. No. 13/619,001 dated Feb. 12, 2013.
Non-Final Office Action U.S. Appl. No. 13/619,239 dated Mar. 5, 2013.
Non-Final Office Action U.S. Appl. No. 13/619,001 dated Aug. 28, 2013.
Final Office Action U.S. Appl. No. 13/619,239 dated Sep. 6, 2013.

* cited by examiner

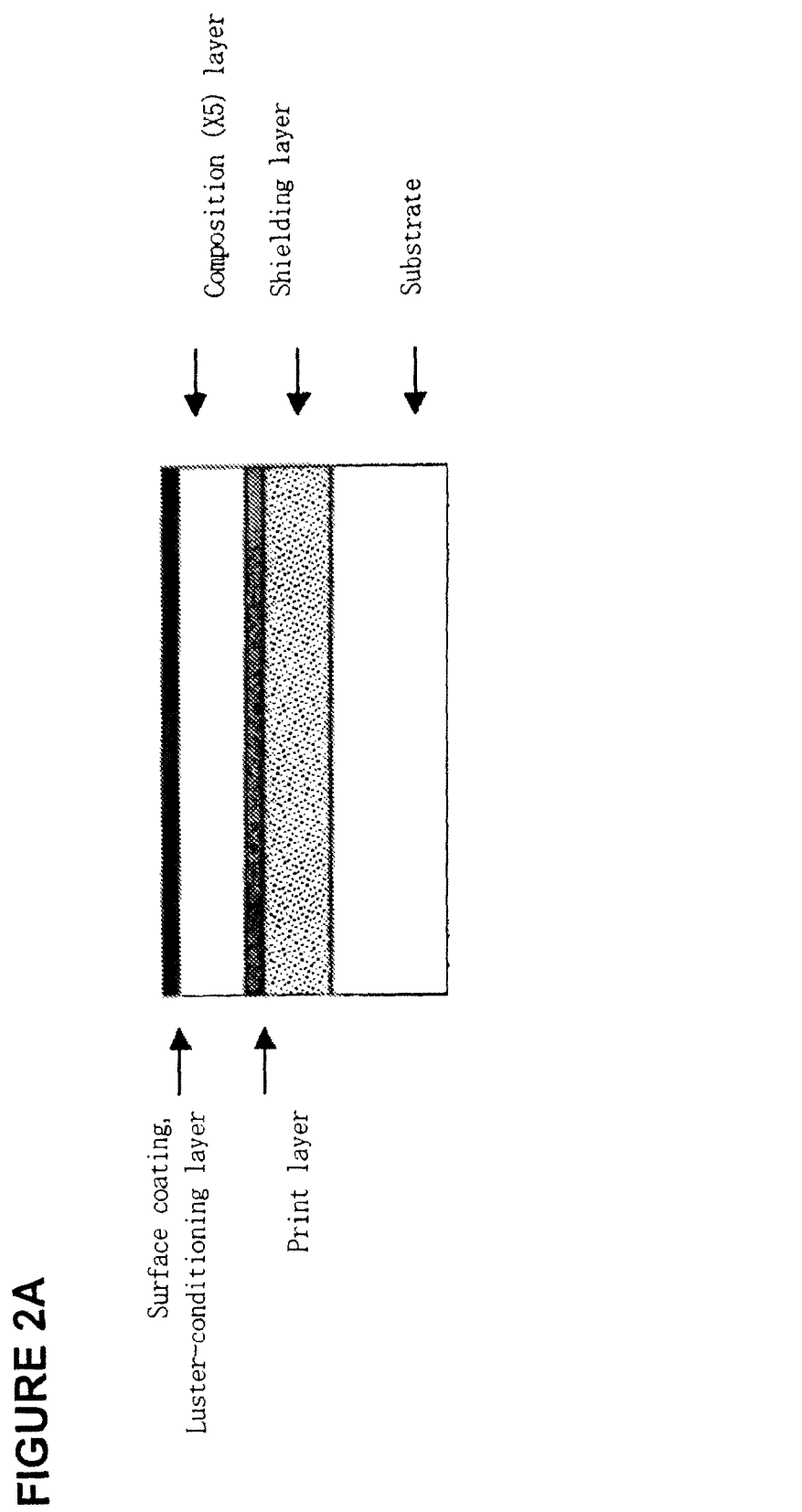

PROPYLENE BASED RESIN COMPOSITION AND USE THEREOF

CROSS REFERENCE TO RELATED APPLICATIONS

This application is a Divisional Application of U.S. Ser. No. 11/642,983 filed Dec. 21, 2006; which is a Continuation Application of PCT/JP2005/021730 filed Nov. 25, 2005; which claims priority from Japanese Application No. 2004-341316 filed Nov. 25, 2004; Japanese Application No. 2004-34171 filed Nov. 26, 2004; Japanese Application No. 2005-061577 filed Mar. 4, 2005; Japanese Application No. 2005-088109 filed Mar. 25, 2005; Japanese Application No. 2005-091468 filed Mar. 28, 2005; Japanese Application No. 2005-105470 filed Mar. 31, 2005; Japanese Application No. 2005-105471 filed Mar. 31, 2005; Japanese Application No. 2005-153415 filed May 26, 2005; Japanese Application No. 2005-155238 filed May 27, 2005; Japanese Application No. 2005-232605 filed Aug. 10, 2005; Japanese Application No. 2005-276777 filed Sep. 22, 2005; Japanese Application No. 2005-276776 filed Sep. 22, 2005; Japanese Application No. 2005-276778 filed Sep. 22, 2005; Japanese Application No. 2005-304837 filed Oct. 19, 2005; Japanese Application No. 2005-304838 filed Oct. 19, 2005; Japanese Application No. 2005-304839 filed Oct. 19, 2005; and Japanese Application No. 2005-318593 filed Nov. 1, 2005. The subject matter of each of the above listed applications is incorporated herein by reference in entirety.

TECHNICAL FIELD

The present invention relates to a propylene-based resin composition and the use thereof.

More particularly, the present invention (first aspect) relates to a thermoplastic resin composition, a molded article at least part of which is made of the thermoplastic resin composition, and various articles at least part of which is made of the thermoplastic resin composition. Still more particularly, the present invention relates to a thermoplastic resin composition that has excellent mechanical properties and is excellent in rubber elasticity and permanent compression set not only at normal temperature but also at high temperatures, a molded article at least part of which is made of the thermoplastic resin composition, and various articles at least part of which is made of the thermoplastic resin composition.

The present invention (second aspect) more particularly relates to a thermoplastic resin composition comprising a specific propylene/α-olefin copolymer, a crosslinked product of said thermoplastic resin composition, and a molded article thereof. Still more particularly, it relates to a thermoplastic resin composition that can be molded at low temperatures and provide a molded article exhibiting well-balanced flexibility, scratch resistance, and whitening resistance, a crosslinked product of the thermoplastic resin composition, and a molded article thereof.

More particularly, the present invention (third aspect) relates to a propylene-based polymer composition and a molded article made of said composition such as films, sheets, blow-molded articles, injection-molded articles, tubes, and cap liners.

More particularly, the present invention (fourth aspect) relates to an oriented film made of a polypropylene-based resin composition, and still more particularly to a heat-shrinkable film excellent in transparency, flexibility, impact resistance, and mechanical properties has a high heat-shrink ratio but a small extent of spontaneous shrinkage at room temperature.

The present invention (a fifth aspect) more particularly relates to a polyolefin-made decorative sheet and still more particularly to a polyolefin-made decorative sheet excellent in flexibility, scratch resistance, abrasion resistance, whitening resistance on orientation, whitening resistance on folding, wrinkle resistance, heat resistance, water resistance, compression set resistance, and mechanical strength.

The present invention (sixth aspect) more particularly relates to a propylene-based resin composition and a molded article obtained from said composition. Still more particularly, the present invention relates to a propylene-based resin composition that contains a large amount of inorganic filler and is excellent in flexibility, mechanical strength, elongation at break, heat resistance, scratch resistance, whitening resistance, and flame retardance, and a molded article of the composition.

More particularly, the present invention (seventh aspect) more particularly relates to a foaming material, a foam, and the use of the foam. Still more particularly, the present invention relates to a composition that can provide foams having a low specific gravity, a low permanent compression set, excellent tear strength, low resilience, and excellent scratch resistance; a foam; and the use of the foam.

More particularly, the present invention (eighth aspect) more particularly relates to a soft polypropylene-based resin composition that has high adhesion to inorganic materials, such as metal and glass, and various plastics and can provide laminates excellent in flexibility, transparency, rubber elasticity, and scratch resistance.

More particularly, the present invention (ninth aspect) relates to a sheet for sealing a solar cell between a front face member and a back surface member that are plate or sheet made of glass or plastics.

More particularly, the present invention (tenth aspect) more particularly relates to an electric/electronic element-sealing sheet suitable for sealing various electrical and electronic elements, particularly solar cells, and also relates to various applications of the sheet (solar cell-sealing sheets, solar cell modules, power generators, etc.)

BACKGROUND ART

A number of resin compositions have been developed for use in a variety of applications. As described later, propylene-based resin compositions are employed for some applications, but further improvements are requested on the properties required in each application.

For instance, various materials have been used in components or parts and sheets for automobile components, industrial machine components, electrical and electronic components, building materials, and cap liners where rubber elasticity is required. An example of such material is vulcanized rubber. Vulcanized rubber is generally produced by kneading rubber with crosslinkers, crosslinking auxiliaries, additives, auxiliaries, and others to prepare an unvulcanized rubber blend, followed by vulcanization with heating. Therefore, vulcanized rubber encounters problems of complicated production processes and a high cost. In addition, due to thermosetting nature, vulcanized rubber cannot be recycled.

On the other hand, vinyl chloride resin is known as a material that does not require vulcanization but has rubber-like properties. However, vinyl chloride resin is inferior in rubber elasticity to vulcanized rubber, resulting in limited application. Recently, development of a material substituting vinyl chloride resin has been awaited for reasons such as the difficulty in incineration.

A thermoplastic elastomer is known as a polymer material that is plasticized and moldable like plastics at high temperatures while exhibiting rubber elasticity at normal temperature. As a recyclable olefinic thermoplastic elastomer, a dynamically crosslinked product of polypropylene and ethylene/α-olefin copolymer is known. However, in this case, there is also a problem of an increased cost due to the need of using crosslinkers and crosslinking auxiliaries.

In order to overcome these shortcomings, Patent Document 1 proposes a polyethylene-based resin composition mainly composed of an olefinic elastomer mainly derived from ethylene and its use. However, the heat resistance is insufficient because the major component is polyethylene.

As another measure, compositions comprising propylene-based polymers have recently been studied (see Patent Document 2).

However, the composition in Patent Document 2 still has room for improvement in mechanical properties, oil acceptance, or others. In addition, neither rubber elasticity nor permanent compression set at high temperature is described in Patent Document 2.

On the other hand, as described above, a thermoplastic elastomer is known as a polymer material that is plasticized and moldable like plastics at high temperatures while exhibiting rubber elasticity at normal temperature. Examples thereof include, besides the dynamically crosslinked product of polypropylene and ethylene/α-olefin copolymer, a composition of polypropylene and a styrene-based elastomer (see Patent Document 3). This material is excellent in strength, flexibility, and heat resistance, and hence, can suitably be used for cap liners and others.

A thermoplastic olefinic elastomer comprising polypropylene and ethylene/α-olefin copolymer is also used because flexibility can be further improved (see Patent Document 4).

However, the above olefinic thermoplastic elastomers are insufficient in balance of flexibility and scratch resistance, causing a problem that scratch resistance and whitening resistance are deteriorated if sufficient flexibility is attained. These are the background art for the first and second aspects of the present invention.

Polypropylene-based resin compositions are used in various applications such as electrical and electronic components, industrial materials, furniture, stationery, convenience goods, containers and packages, toys, leisure goods, and medical articles because of their excellent heat resistance, transparency, and moldability. As a technology of improving the flexibility and impact resistance of polypropylene-based resin compositions, addition of various soft materials is also known.

For instance, Patent Document 5 describes that a composition composed of a polypropylene-based resin and a specific propylene/ethylene/α-olefin copolymer elastomer is excellent in transparency and usable, for example, for stretch films.

Patent Document 6 describes a composition composed of polypropylene and a specific α-olefin copolymer elastomer in which the propylene content is more than 20 wt % and not more than 80 wt %, the ethylene content is more than 10 wt % and not more than 45 wt %, and the α-olefin content is more than 10 wt % and not more than 45 wt %.

Patent Document 7 describes a composition composed of polypropylene and a specific propylene/butene/ethylene copolymer is usable for industrial shrink films and wrap films for service.

Patent Document 8 describes, for example, that a composition composed of amorphous propylene/butene random copolymer and crystalline propylene-based polymer is excellent in whitening resistance on folding and usable for molded articles, transparent boxes, and others.

Patent Document 9 describes a sheet excellent in whitening resistance and transparency made of a composition mainly composed of a styrene-based elastomer and polypropylene.

When polypropylene is used in applications where transparency is required, such as stretch films, the film is sometimes required to maintain transparency when stretched or after treated at high temperatures.

However, the compositions in Patent Documents 5 and 6 are insufficient in whitening resistance on stretching or heating. Further, the compositions in Patent Documents 7 and 8 are poor in strength and have difficulties in practical use.

The composition comprising the styrene-based elastomer described in Patent Document 9 is excellent in whitening resistance, flexibility, and transparency, but styrene-based elastomers are generally immiscible with polypropylene, whereby molded articles of such composition are whitened under some service conditions. Moreover, the composition containing the styrene-based elastomer has excellent rubber elasticity at room temperature, but its rubber elasticity is poor at high temperatures. These are the background art for the third aspect of the present invention.

As a material widely used for heat-shrinkable films, polyvinylchloride resin and polystyrene resin are known. There is, however, concern about adverse effects on human bodies and environment of byproducts generated on disposal of these resins. Therefore, development of heat-shrinkable films using polyolefin is now underway. Conventional heat-shrinkable films made of polyolefin-based resin are inferior to heat-shrinkable films made of vinyl chloride resin in mechanical strength and heat shrink ratio at low temperatures. In particular, when this film is used as heat-shrinkable labels for beverage PET bottles, the film is often subjected to shrinking process together with a PET bottle in a heat-shrink tunnel using steam or others, and therefore, there is demand for a heat-shrinkable film having a high shrink ratio at lower temperatures.

Further, for separating PET bottles and label resins on recycling PET bottles, PET bottles and label resins are pulverized together and gravitationally separated in liquid phase based on the difference between these materials in buoyancy in water. For example, the specific gravity of polystyrene-based resin is about 1.03 to about 1.06, so that polystyrene-based resin sinks in water together with PET resin, which has a specific gravity of 1.3 to 1.5. Therefore, the label made of such resin having a specific gravity of 1 or higher is difficult to separate from PET resin by the above method. For this reason, a low-temperature heat-shrinkable film made of polyolefin having a specific gravity smaller than 1 is awaited to be developed.

As an attempt to meet this demand, for example, Patent Document 10 discloses a heat-shrinkable film obtained from crystalline polypropylene and propylene/1-butene random copolymer. This film has a high heat shrink ratio and is excellent in transparency. However, since the propylene/1-butene random copolymer (optionally containing 10 mol % or less of another α-olefin unit) is poor in impact resistance, the film obtained from this copolymer is also insufficient in flexibility or impact resistance.

Patent Document 11 discloses a heat-shrinkable film made of propylene/α-olefin random copolymer and petroleum resin wherein the copolymer is obtained from propylene and a $C_2$-$C_{20}$ α-olefin and has a melting point of 40 to 115° C. as measured with a DSC. This film possesses a higher heat shrink ratio than the film in Patent Document 10, but it is still insufficient in flexibility and impact resistance.

Patent Document 12 discloses a heat-shrinkable film having a film mainly composed of a propylene/α-olefin random copolymer (propylene/ethylene random copolymer) as an intermediate layer.

In the propylene/α-olefin random copolymer, 2 to 7 mol % of a co-monomer (ethylene or α-olefin) is copolymerized with propylene. The propylene/α-olefin random copolymer (propylene/ethylene random copolymer) alone cannot attain a sufficient heat shrink ratio, and impact resistance of films obtained therefrom is also poor.

Patent Document 12 also discloses a technology of adding linear low-density polyethylene and ethylene-based rubber to a propylene/α-olefin random copolymer (propylene/ethylene random copolymer). This technology improves heat shrink ratio and impact resistance of the film, but has a problem that film transparency is lowered.

Patent Document 13 discloses that a composition consisting of 20 to 50 parts by weight of polypropylene and 80 to 50 parts by weight of propylene/butene/ethylene copolymer is usable for stretch films and others. However, the document does not describe film drawing or use for heat-shrinkable films. These are the background art for the fourth aspect of the invention.

As a sheet for surface decoration or protection in building materials, home electric appliances, automobile interior and exterior materials, and others, there have conventionally been used films mainly composed of vinyl chloride resin, which have well-balanced scratch resistance, whitening resistance on folding, wrinkle resistance, transparency, and others.

However, since such films have disadvantages such as difficulty in incineration as described above, a focus has been made in the art on polyolefin-based materials with less burden on environment.

For instance, Patent Document 14 discloses a decorative sheet having a polypropylene film as an essential component layer. Patent Document 15 discloses a decorative sheet having a thermoplastic olefinic elastomer as an essential component layer.

However, in the decorative sheet proposed in Patent Document 14, which has a polypropylene film as a component layer, the high crystallinity and the melting point of polypropylene cause problems such as lowering in flexibility and occurrence of cracks or whitening at bended faces during folding processing. The decorative sheet proposed in Patent Document 15, which has a thermoplastic-olefinic elastomer as a component layer, is excellent in flexibility and hardly encounters cracking or whitening at bended faces, but has problems of insufficient transparency and mechanical strength, and others.

In order to solve these problems, Patent Document 16 proposes a decorative sheet having a layer made of a resin composition containing a specific non-crystalline polyolefin and a crystalline polypropylene at a specific ratio.

This decorative sheet was less liable to cracks and whitening at bended faces but insufficient in mechanical strength, scratch resistance, and heat resistance.

Patent Document 17 proposes a decorative sheet having a polyester film as a surface protective layer.

Using a polyester film as a surface protective layer significantly improved mechanical strength and scratch resistance, but such material containing a polar group in its molecular chain had a problem of poor water resistance (resistance against water vapor permeation). These are the background art for the fifth aspect of the invention.

Polypropylene-based resin is a more excellent material than polyethylene-based resin (polyethylene-based elastomer) in heat resistance, mechanical resistance, and scratch resistance, and molded articles obtained from polypropylene-based resin are used in various applications. Molded articles prepared from a conventional polypropylene and inorganic filler are excellent in heat resistance and mechanical strength, but poor in flexibility and impact resistance. For this reason, in uses where such properties as flexibility and impact resistance are required, polyethylene-based resin is mainly employed. However, the problem is that molded articles of polyethylene-based resin are insufficient in scratch resistance.

As a molded article obtained from polypropylene-based resin and inorganic filler (flame retardant), an electric cable or wire harness is known, which requires scratch resistance. Patent Document 18 discloses an insulated electrical wire for automobiles using a specific propylene polymer. The molded article used in Patent Document 18 was excellent in flexibility and impact resistance but insufficient in scratch resistance. These are background art for the sixth aspect of the invention.

As a resin material having a low specific gravity, which means light in weight, and is excellent in flexibility and mechanical strength, a crosslinked foam is widely used in building interior and exterior materials, automobile components such as interior materials and door glassruns, packaging materials, convenience goods, and others. This is because, while mechanical strength of a resin is lowered when merely foamed for reducing its weight, foaming with crosslinking can attain weight reduction without lowering mechanical strength by bonding the molecular chains to each other through crosslinking reaction of the resin.

Crosslinked foams of resins are also used for footwear and footwear components, for example, shoe soles (mainly midsoles) for sports shoes and others. This results from demand for a material that is lightweight, less deformed in long-term use, mechanically strong enough to be durable in use under severe conditions, low resilient so as to absorb impact on landing, and scratch resistance.

Conventionally, a crosslinked foam formed from ethylene/vinyl acetate copolymer has been widely used for shoe soles. However, the crosslinked foam formed from ethylene/vinyl acetate copolymer composition has a high specific gravity and a large permanent compression set. Therefore, when the foam is used for shoe soles, there are problems of heavy weight and significant abrasion caused by loss of mechanical strength due to compression during long-term use.

To overcome these disadvantages, Patent Documents 19 and 20 disclose a crosslinked foam obtained from ethylene/α-olefin copolymer and a crosslinked foam obtained from a mixture of ethylene/vinyl acetate copolymer and ethylene/α-olefin copolymer, respectively. In these foams, the specific gravity and permanent compression set are reduced, but satisfactory performances have not been attained.

As a material obtained by dynamic crosslinking of olefinic rubber, a thermoplastic elastomer is known (see Patent Document 21). However, Patent Document 21 does not suggest foaming. In addition, it is difficult to foam the thermoplastic olefinic elastomer at a high foaming ratio for providing foams with a low specific gravity. Therefore, the thermoplastic olefinic elastomer is not suitable for the above applications.

As described above, it has been hard to obtain foams having low specific gravity, low permanent compression set (CS), excellent tear strength, low resilience, and good scratch resistance. These are the background art for the seventh aspect of the invention.

Since films or sheets of soft polypropylene-based resin are superior to those of soft polyethylene-based resin in heat resistance, flexibility, and mechanical strength, it is expected that their use will be developed in automobile components, building materials, food industry, and others. In these fields, the film or sheet is used as laminates with inorganic material, such as metal (including aluminum, copper, iron, stainless steel, etc.) and glass, or various plastics in many cases, so that the film or sheet is required to have excellent adhesion to various materials. In particular, soft polypropylene-based resin that exhibits adhesion to inorganic materials such as metal has been awaited.

It is difficult to graft polypropylene-based resin with a polar monomer using an organic peroxide or the like, and such grafting greatly decreases the molecular weight, significantly lowering heat resistance and mechanical properties.

Patent Document 22 describes a technology of adding an organosilicon compound to polypropylene for improving adhesion to metal and others. However, the laminate obtained using this technology is poor in transparency, flexibility, and rubber elasticity, and hence, its use is limited. The polyethylene resin obtained by this technology has improved adhesion as compared with conventional unmodified polypropylene. However, the polypropylene-based resin obtained by this technology had high crystallinity, and therefore, it was sometimes easily peeled off since peeling stress was concentrated when peeling. These are the background art of the eighth aspect of the invention.

In conventional sheets for sealing a solar cell between front and back plates or sheets made of glass, plastics, or others (solar cell-sealing sheet), ethylene/vinyl acetate copolymer (in this specification, often abbreviated as "EVA") has been commonly used. This is because EVA is flexible and highly transparent and provides long-term durability when blended with appropriate additives such as a weathering stabilizer and an adhesion promoter.

However, EVA has a low melting point, causing problems in heat resistance such as thermal deformation at environmental temperatures where solar cell modules are used. To resolve this problem, a crosslinked structure is formed by adding an organic peroxide to impart heat resistance.

Solar cell-sealing sheets are prepared by a known sheet molding process applicable to molding polyolefin. There has been a problem that addition of an organic peroxide disables high-speed production because low-temperature molding is inevitable to avoid decomposition of the organic peroxide.

The production process of a solar cell module configured as (glass or plastics)/(solar cell-sealing sheet)/(solar cell)/(solar cell-sealing sheet)/(back sheet) generally includes two steps: a temporary bonding step by vacuum heat lamination and a crosslinking step using a high-temperature oven. Since the crosslinking step using the organic peroxide takes several tens of minutes, omitting or speed-up of the crosslinking step is strongly required.

In long-term use of solar cells, gas generated by decomposition of EVA (acetic acid gas) or the vinyl acetate group in EVA itself may have adverse effects on the solar cell and lower its power generation efficiency.

To resolve such problems, a solar cell-sealing sheet using ethylene/α-olefin copolymer has been proposed (see Patent Document 23). With the proposed materials, the adverse effects on solar cell elements are considered to decrease, but balance of heat resistance and flexibility is insufficient. Furthermore, the crosslinking is hard to omit since desirable heat resistance is not attained without crosslinking. These are the background art for the ninth aspect of the invention.

Recent advancement in electrical/electronics elements is remarkable, and they have been widely used in every aspect of social, industrial, and domestic circumstances. Generally, electrical/electronics elements are easily affected by moisture, oxidants, and others, and hence, they are sealed in many applications to attain stable operation and long service life.

Nowadays, various materials for sealing electrical/electronics elements are produced and supplied in the market. Among them, a sealing sheet made of an organic polymer is very useful because of its applicability to relatively wide area and ease in use. In addition, transparency can be attained relatively easily, and hence, the sealing sheet is particularly suitable for sealing electrical/electronics elements using light, especially solar cells.

Solar cells are generally used in sealed solar cell modules, because they are used outdoors such as on the roof of buildings in many cases. The solar cell module has a structure in which a solar cell element made of polycrystalline silicon or others is sandwiched between solar cell-sealing materials made of a soft transparent resin to form a stack, of which the front and back surfaces are covered with solar cell module protective sheets. That is, a typical solar cell module has a layered structure, solar cell module protective sheet (front protective sheet)/solar cell-sealing sheet/solar cell element/solar cell-sealing sheet/solar cell module protective sheet (back protective sheet). Owing to this structure, the solar cell module has weatherability and is suitable for use outdoors such as on the roof of buildings.

As a material forming the solar cell-sealing sheet (solar cell-sealing material), ethylene-vinyl acetate copolymer (EVA) has been widely used from the viewpoint of transparency, flexibility, or others as described above (for example, see Patent Document 24). When used as the solar cell-sealing material, EVA is generally crosslinked to attain heat resistance. However, the crosslinking takes a relatively long time of about one to two hours, lowering the production speed and productivity of solar cell elements. Further, there has been a concern about possible adverse effects of acetic acid gas or other chemicals generated by decomposition of EVA on solar cell modules.

As one of the methods for solving the above-mentioned technical problems, use of a solar cell-sealing sheet made of non-crosslinked resin has been proposed (for example, see Patent Document 25). However, with an increase in requested levels of the productivity, durability under severe conditions, and service life of solar cells, all of the transparency, heat resistance, and flexibility have become required to have levels higher than those attainable with EAA, EMAA, or other resins proposed specifically in Patent Document 25. If such a request is satisfied, the sealing sheet would be quite useful for electrical/electronics elements besides solar cells.

When the sealing sheet is used for solar cell modules and others, since the sheet is laminated with glass or others in many cases, adhesion to glass and others is practically important. Some conventional sealing sheets have insufficient adhesion to glass and others, and hence, the improvement has been strongly desired. These are the background art for the tenth aspect of the present invention.

Patent Document 1: Japanese Patent Laid-Open Publication No. 2002-088164
Patent Document 2: Japanese Patent Laid-Open Publication No. H08-302093
Patent Document 3: Japanese Patent Laid-Open Publication No. H07-076360
Patent Document 4: Japanese Patent Laid-Open Publication No. H11-349753

Patent Document 5: Japanese Patent Laid-Open Publication No. H08-302093
Patent Document 6: Japanese Patent Laid-Open Publication No. H08-113681
Patent Document 7: Japanese Patent Laid-Open Publication No. 2002-348417
Patent Document 8: Japanese Patent Laid-Open Publication No. 2005-47944
Patent Document 9: Japanese Patent Laid-Open Publication No. H08-269271
Patent Document 10: Japanese Patent Laid-Open Publication No. H09-278909
Patent Document 11: Japanese Patent Laid-Open Publication No. 2003-306587
Patent Document 12: Japanese Patent Laid-Open Publication 2002-234115
Patent Document 13: Japanese Patent Laid-Open Publication No. H08-302093
Patent Document 14: Japanese Patent Laid-Open Publication No. H06-198830
Patent Document 15: Japanese Patent Laid-Open Publication No. H06-16832
Patent Document 16: Japanese Patent Laid-Open Publication No. 2000-281807
Patent Document 17: Japanese Patent Laid-Open Publication No. H10-258488
Patent Document 18: Japanese Patent Laid-Open Publication No. 2003-313377
Patent Document 19: Unexamined Patent Application Publication No. H09-501447
Patent Document 20: Japanese Patent Laid-Open Publication No. H11-206406
Patent Document 21: Japanese Patent Laid-Open Publication No. 2001-171439
Patent Document 22: Japanese Patent Laid-Open Publication No. 2003-201375
Patent Document 23: Japanese Patent Laid-Open Publication No. 2000-91611
Patent Document 24: Japanese Patent Laid-Open Publication No. H08-283696
Patent Document 25: Japanese Patent Laid-Open Publication No. 2001-068703

DISCLOSURE OF THE INVENTION

Problems to be Solved by the Invention

An object of the present invention is to provide propylene-based resin compositions suitable for use in various applications and the use thereof.

An object of the first aspect of the invention to solve the above-mentioned problems is to provide a resin composition that is excellent in mechanical properties and excellent in rubber elasticity and permanent compression set not only at normal temperature but also at high temperatures, a molded article obtained using the composition, and the use thereof.

An object of the second aspect of the invention to solve the above-mentioned problems is to provide a thermoplastic resin composition having excellent balance of flexibility and scratch resistance and good whitening resistance, a crosslinked product obtained by crosslinking the thermoplastic resin composition, and a molded article with well-balanced flexibility and scratch resistance as well as excellent whitening resistance.

An object of the third aspect of the invention to solve the above-mentioned problems is to provide a propylene-based polymer composition that is particularly excellent in mechanical strength, transparency, and whitening resistance (on orientation and heat treatment) and also excellent in impact resistance, scratch resistance, flexibility, transparency, stretching property, room-temperature rubber elasticity, and high-temperature rubber elasticity; and a molded article of the composition.

An object of the fourth aspect of the invention is to provide a film excellent in shrinking properties (high shrink ratio on heating and reduced spontaneous shrink at room temperature), transparency, flexibility, stretching property, and impact resistance, and a heat-shrinkable film using the film; and another object is to provide a resin composition suitable for use in the film and the heat-shrinkable film.

An object of the fifth aspect of the invention is to provide a polyolefin-based decorative sheet excellent in flexibility, scratch resistance, abrasion resistance, whitening on orientation, whitening on folding, wrinkle resistance, heat resistance, water resistance, compression set resistance, and mechanical strength.

An object of the sixth aspect of the invention is to provide a propylene-based resin composition that contains a large amount of an inorganic filler and is excellent in flexibility, mechanical strength, elongation at break, heat resistance, scratch resistance, whitening resistance, and flame retardance. Another object of the sixth aspect of the invention is to provide a method for producing a propylene-based resin composition excellent in flexibility, mechanical strength, elongation at break, heat resistance, whitening resistance, and flame retardance, and especially in scratch resistance; and a propylene-based polymer composition suitable for use in producing the resin composition. Still another object of the sixth aspect of the invention is to provide a molded article made of the above composition and an electrical wire having an insulator and/or a sheath made of the composition.

An object of the seventh aspect of the invention is to provide a material for foam capable of providing a foam excellent in tear strength, low resilience, and scratch resistance and a foam made of the material.

An object of the eighth aspect of the invention is to provide a soft polypropylene-based resin composition that has high adhesion to inorganic materials, such as metal and glass, and various plastics and can form a laminate excellent in flexibility, transparency, rubber elasticity, and scratch resistance.

An object of the ninth aspect of the invention to solve the above-mentioned problems is to provide a solar cell-sealing sheet using a soft propylene-based material that is newly introduced into these fields, specifically to provide a solar cell-sealing sheet that causes no gas resulting from decomposition of the raw material, and hence, has no adverse effect on solar cell elements and exhibits excellent mechanical strength, solar cell sealing ability, transparency, weatherability, and heat resistance even without crosslinking.

An object of the tenth aspect of the invention to solve the above-mentioned problems is to provide an electrical/electronics element-sealing sheet that is suitable for protecting solar cells and various electrical/electronics elements and excellent in transparency, heat resistance, and flexibility. Another object of the tenth aspect of the invention is to further impart excellent adhesion, which is essential in practical use, to the excellent electrical/electronics element-sealing sheet.

Means for Solving the Problems

The present inventors have studied intensively to solve the above problems and accomplished the present invention.

Namely, thermoplastic resin composition (X1) according to the first aspect of the invention comprises (A1), (B1), (C1), and if necessary, (D1) below:

1 to 90 wt % of isotactic polypropylene (A1);

9 to 98 wt % of propylene/ethylene/α-olefin copolymer (B1) containing 45 to 89 mol % of propylene-derived structural units, 10 to 25 mol % of ethylene-derived structural units, and if necessary, 0 to 30 mol % of $C_4$-$C_{20}$ α-olefin-derived structural units (a1);

1 to 80 wt % of styrene-based elastomer (C1); and 0 to 70 wt % of ethylene/α-olefin copolymer (D1) having a density of 0.850 to 0.910 g/cm$^3$;

wherein (A1)+(B1)+(C1)+(D1)=100 wt %.

Thermoplastic resin composition (X1) according to the first aspect of the invention preferably further contains softener (E1) in an amount of 1 to 400 parts by weight relative to 100 parts by weight of the total of (A1)+(B1)+(C1)+(D1).

The molded article of the first aspect of the invention has at least one portion made of thermoplastic resin composition (X1).

The molded article of the first aspect of the invention is preferably a film or sheet.

The molded article of the first aspect of the invention is preferably a mono-filament, a fiber, or a nonwoven fabric.

The automobile interior or exterior component of the first aspect of the invention has at least one portion made of thermoplastic resin composition (X1).

The home electric appliance component of the first aspect of the invention has at least one portion made of thermoplastic resin composition (X1).

The construction or building component of the first aspect of the invention has at least one portion made of thermoplastic resin composition (X1).

The packaging sheet or cap liner of the first aspect of the invention has at least one portion made of thermoplastic resin composition (X1).

The cap of the first aspect has the above cap liner.

The packaging container of the first aspect of the invention has the above cap.

The gasket of the first aspect of the invention has at least one portion made of the thermoplastic resin composition (X1).

The daily-use product of the first aspect of the invention have at least one portion made of thermoplastic resin composition (X1).

The decorative sheet of the first aspect has at least one portion made of thermoplastic resin composition (X1).

Thermoplastic resin composition (X2) according to the second aspect of invention comprises (A2), (B2), (C2), (D2), and (E2) below:

5 to 95 wt % of propylene/α-olefin copolymer (B2) whose melting point is not higher than 100° C. or not observed when measured with a differential scanning calorimeter (DSC);

5 to 95 wt % of styrene-based elastomer (C2);

0 to 90 wt % of isotactic polypropylene (A2);

0 to 70 wt % of ethylene/α-olefin copolymer (D2) having a density of 0.850 to 0.910 g/cm$^3$;

wherein (A2)+(B2)+(C2)+(D2)=100 wt %, and softener (E2) in an amount of 0 to 400 parts by weight relative to 100 parts by weight of the total of (A2)+(B2)+(C2)+(D2).

In thermoplastic resin composition (X2) according to the second aspect of the invention, propylene/α-olefin copolymer (B2) is preferably a copolymer of propylene and at least one $C_4$-$C_{20}$ α-olefin.

In thermoplastic resin composition (X2) according to the second aspect of the invention, propylene/α-olefin copolymer (B2) is preferably a propylene/1-butene copolymer with a molecular weight distribution (Mw/Mn) of 3 or less as measured by gel permeation, chromatography (GPC).

In thermoplastic resin composition (X2) according to the second aspect of the invention, propylene/α-olefin copolymer (B2) is preferably produced by polymerization using a metallocene catalyst.

The crosslinked product of thermoplastic resin composition (X2) of the second aspect of the invention is obtained by crosslinking thermoplastic resin composition (X2).

The molded article of the second aspect of the invention is made of thermoplastic resin composition (X2).

The molded article of the second aspect of the invention is made of the above crosslinked product.

The molded article of the second aspect of the invention is obtained by further crosslinking the above molded article.

Propylene-based polymer composition (X3) according to the third aspect of the invention comprises 10 to 98 wt % of propylene-based polymer (A3) that contains 90 mol % or more of propylene-derived structural units, is insoluble in n-decane at 23° C., and has an intrinsic viscosity [η] of 0.01 to 10 dl/g as measured in decalin at 135° C.; and 2 to 90 wt % of soft propylene/α-olefin random copolymer (B3) satisfying all of requirements (b1) to (b5) below:

(b1) the intrinsic viscosity [η] measured in decalin at 135° C. is 0.01 to 10 dl/g;

(b2) the melting point is not higher than 100° C. or not observed when measured with a DSC;

(b3) the content of propylene-derived structural units is 60 to 75 mol %, the content of ethylene-derived structural units is 10 to 14.5 mol %, and the content of $C_4$-$C_{20}$ α-olefin-derived structural units is 10.5 to 30 mol % (wherein the total of propylene-derived structural units, ethylene-derived structural units, and $C_4$-$C_{20}$ α-olefin-derived structural units is 100 mol %);

(b4) the triad tacticity (mm-fraction) measured with $^{13}$C-NMR is 85% to 97.5%; and (b5) the molecular weight distribution (Mw/Mn) measured by gel permeation chromatography (GPC) is 1.0 to 3.0.

In propylene-based polymer composition (X3) according to the third aspect of the invention, the melting point of propylene-based polymer (A3) is preferably 110 to 170° C. as measured with a differential scanning calorimeter (DSC).

Preferably, propylene-based polymer composition (X3) according to the third aspect of the invention further contains at least one polymer (C3) that is selected from an ethylene-based polymer and a styrene-based polymer and has a Shore A hardness of 95 or less and/or a Shore D hardness of 60 or less, wherein the total of component(s) (C3) is in the range of 1 to 40 parts by weight relative to 100 parts by weight of the total of propylene-based polymer (A3) and soft propylene/α-olefin random copolymer (B3).

In a preferred embodiment of the propylene-based polymer composition (X3) according to the third aspect of the invention, the intensites of magnetization in decay process due to transverse relaxation for propylene-based polymer (A3), soft propylene/α-olefin random copolymer (B3), and propylene-based polymer composition (X3-1) described below, each of which is measured with pulse NMR (solid-echo experiment, observed for $^1$H) up to 1000 μs, satisfy relation (3-1) below in the entire range of t (observing time) from 500 to 1000 μs.

$$M(t)_A \times (1-f_B) + M(t)_B \times f_B - M(t)_{X-1} \geq 0.02 \quad \text{3-1}$$

$M(t)_A$: intensity of magnetization in decay process at time t measured for propylene-based polymer (A3) used in propylene-based polymer composition (X3), $M(t)_B$: intensity of magnetization in decay process at time t measured for soft propylene/α-olefin random copolymer (B3) used in propylene-based polymer composition (X3), $M(t)_{X-1}$: intensity of magnetization in decay process at time t measured for propylene-based polymer composition (X3-1) prepared by melt-kneading a polypropylene containing propylene-based polymer (A3) used in propylene-based polymer (X3) with soft propylene/α-olefin random copolymer (B3) used in propylene-based polymer (X3) in such a ratio that the weight ratio of polymer (A3) to copolymer (B3) in composition (X3-1) is identical to the ratio in propylene-based polymer composition (X3), and $f_B$: weight ratio of soft propylene/α-olefin random copolymer (B3) to the total of propylene-based polymer (A3) and soft propylene/α-olefin random copolymer (B3) in propylene-based polymer composition (X3); $0.02 \leq f_B \leq 0.90$, wherein t (observation time) is 500 to 1000 μs; $M(t)_A$, $M(t)_B$ and $M(t)_{X-1}$ are each normalized as 0 to 1 (the maximum intensity is set to be 1).

The molded article of the third aspect of the invention is made of propylene-based polymer composition (X3).

The molded article of the third aspect is preferably any of a film, a sheet, a blow-molded article, an injection-molded article, and a tube.

The cap liner of the third aspect of the invention has at least one layer of propylene-based polymer composition (X3).

The wrap film for foods of the third aspect of the invention has at least one layer made of propylene-based polymer composition (X3).

The wrap film for foods of the third aspect of the invention comprises preferably a laminate having at least one layer made of propylene-based polymer composition (X3) and at least one layer made of an ethylene homopolymer or an ethylene copolymer containing 70 mol % or more of ethylene units.

The single-layer or multilayer film according to the fourth aspect of invention has at least one layer that is made of resin composition (X4) comprising (A4) and (B4) below and monoaxially or biaxially oriented:

10 to 97 wt % of isotactic polypropylene (A4); and 3 to 90 wt % of propylene/ethylene/α-olefin copolymer (B4) that contains 40 to 85 mol % of propylene-derived structural units, 5 to 30 mol % of ethylene-derived structural units, and 5 to 30 mol % of $C_4$-$C_{20}$ α-olefin-derived structural units (a4), the melting point of (B4) being not higher than 100° C. or not observed when measured with a differential scanning calorimeter, wherein the total of (A4) and (B4) is 100 wt %.

In the single-layer or multilayer film according to the fourth aspect of the invention, resin composition (X4) preferably contains hydrocarbon resin (C4) having a softening point of 50° C. to 160° C. as measured with the ring-and-ball method and a number-average molecular weight of 300 to 1400 as measured by gel permeation chromatography (GPC) in an amount of 3 to 70 parts by weight relative to 100 parts by weight of the total of (A4)+(B4).

The heat-shrinkable film of the fourth aspect of the invention comprises the above film.

The resin composition (X4) according to the fourth aspect of the invention comprises 10 to 97 wt % of an isotactic polypropylene (A4);

3 to 90 wt % of a propylene/ethylene/α-olefin copolymer (B4) that contains 40 to 85 mol % of a propylene-derived structural units, 5 to 30 mol % of an ethylene-derived structural units, and 5 to 30 mol % of a $C_4$-$C_{20}$ α-olefin-derived structural units (a4), the melting point of (B4) being not higher than 100° C. or not observed when measured with a differential scanning calorimeter, wherein the total of (A4) and (34) is 100 wt %; and A hydrocarbon resin (C4) having a softening point of 50° C. to 160° C. as measured with the ring-and-ball method and a number-average molecular weight of 300 to 1400 as measured by gel permeation chromatography (GPC) in an amount of 3 to 70 parts by weight relative to 100 parts by weight of the total of (A4)+(B4).

The polyolefin decorative sheet according to the fifth aspect of invention has at least one component layer made of propylene-based polymer composition (X5) that contains isotactic polypropylene (A5) and propylene-based polymer (B5) whose melting point is not higher than 120° C. or not observed when measured with a differential scanning calorimeter (DSC), wherein the amount of (A5) is 10 to 99 parts by weight and the amount of (B5) is 1 to 90 parts by weight based on 100 parts by weight of the total of (A5) and (B5).

In the polyolefin decorative sheet according to the fifth aspect, propylene-based polymer composition (X5) preferably contains at least one soft polymer (CS) other than propylene-based polymer (B5) having a Shore A hardness of 95 or less and/or a Shore D hardness of 60 or less in an amount of 1 to 80 parts by weight relative to 100 parts by weight of the total of (A5) and (B5).

In the polyolefin decorative sheet according to the fifth aspect of the invention, the layer made of propylene-based polymer composition (X5) is preferably used as a protective layer.

Preferably, the polyolefin decorative sheet according to the fifth aspect of the invention further has at least one component layer made of a polyolefin-based resin composition other than propylene-based polymer composition (X5).

In the polyolefin decorative sheet according to the fifth aspect of the invention, the layer made of propylene-based polymer composition (X5) and the layer made of a polyolefin-based resin composition other than propylene-based polymer composition (X5) are preferably laminated without intervening of any adhesive therebetween.

Propylene-based resin composition (X6) according to the sixth aspect of the present invention contains 0 to 80 wt % of propylene-based polymer (A6) whose melting point is 120 to 170° C. as measured with a differential scanning calorimeter (DSC);

5 to 85 wt % of propylene-based polymer (B6) whose melting point is not higher than 120° C. or not observed when measured with a differential scanning calorimeter (DSC);

0 to 40 wt %, as total, of one or more elastomer (C6) selected from ethylene-based elastomer (C6-1) and styrene-based elastomer (C6-2); and 15 to 80 wt % of inorganic filler (D6), wherein the total of components (A6), (B6), (C6), and (D6) is 100 wt %.

In propylene-based resin composition (X6) according to the sixth aspect of the invention, propylene-based polymer (B6) is preferably propylene/$C_4$-$C_{20}$ α-olefin random copolymer (B6-1) satisfying requirements (a) and (b) below:

(a) the molecular weight distribution (Mw/Mn) measured by gel permeation chromatography (GPC) is 1 to 3; and (b) the melting point, Tm (° C.), and the content of co-monomer-derived structural units, M (mol %), determined from $^{13}$C-NMR spectrum measurement satisfy the relation, $$146\exp(-0.022M) \geq Tm \geq 125\exp(-0.032M),$$

wherein Tm is lower than 120° C.

In propylene-based resin composition (X6) according to the sixth aspect of the invention, propylene-based polymer (B6) is preferably propylene/ethylene/$C_4$-$C_{20}$ α-olefin random copolymer (B6-2) satisfying requirements (m) and (n) below:

(m) the molecular weight distribution (Mw/Mn) measured by gel permeation chromatography (GPC) is 1 to 3; and (n) the copolymer contains 40 to 85 mol % of propylene-derived structural units, 5 to 30 mol % of ethylene-derived structural units, and 5 to 30 mol % of $C_4$-$C_{20}$ α-olefin-derived structural units, wherein the total of propylene-derived structural units, ethylene-derived structural units, and $C_4$-$C_{20}$ α-olefin-derived structural units is 100 mol %.

In propylene-based resin composition (X6) according to the sixth aspect, inorganic filler (D6) is preferably at least one compound selected from metal hydroxides, metal carbonates, and metal oxides.

Propylene-based resin composition (X6) according to the sixth aspect of the invention preferably contains oil (E6) in an amount of 0.1 to 20 parts by weight relative to 100 parts by weight of the total of propylene-based polymer (A6), propylene-based polymer (B6), at least one elastomer (C6) selected from ethylene-based elastomer (C6-1) and styrene-based elastomer (C6-2), and inorganic filler (D6).

Propylene-based resin composition (X6) according to the sixth aspect preferably contains graft-modified polymer (F6), in which a polar group-containing vinyl compound is grafted in an amount of 0.01 to 10 wt % based on 100 wt % of the graft-modified polymer, in an amount of 0.1 to 30 parts by weight relative to 100 parts by weight of the total of propylene-based polymer (A6), propylene-based polymer (B6), at least one elastomer (C6) selected from ethylene-based elastomer (C6-1) and styrene-based elastomer (C6-2), and inorganic filler (D).

In the method for producing propylene-based resin composition (X6) according to the sixth aspect of the invention, propylene-based polymer (B6) and graft-modified polymer (F6) are melt-kneaded to produce propylene-based polymer composition (G6), and said propylene-based polymer composition (G6) is melt-kneaded with components including inorganic filler (D6), optionally propylene-based polymer (A6), and optionally at least one elastomer (C6) selected from ethylene-based elastomer (C6-1) and styrene-based elastomer (C6-2).

Propylene-based resin composition (X6) of the sixth aspect of the invention is produced by the above method.

Propylene-based polymer composition (G'6) according to the sixth aspect of the invention comprises 99 to 14 parts by weight of propylene-based polymer (B6) whose melting point is lower than 120° C. or not observed when measured with a differential scanning calorimeter (DSC); and 1 to 86 parts by weight of graft-modified polymer (F6) in which a polar group-containing vinyl compound is grafted in an amount of 0.01 to 10 wt % based on 100 wt % of the graft-modified polymer.

Propylene-based polymer composition (G'6) according to the sixth aspect of the invention preferably contains 99 to 50 parts by weight of propylene-based polymer (B6) and 1 to 50 parts by weight of graft-modified polymer (F6).

The molded article of the sixth aspect of the invention is made of propylene-based resin composition (X6).

The molded article of the sixth aspect of the invention is preferably an insulator or a sheath in an electrical wire.

The electrical wire of the sixth aspect of the invention has an insulator made of the propylene-based resin composition (X6) and/or a sheath made of the propylene-based resin composition (X6).

The electrical wire of the sixth aspect of the invention is preferably an electrical wire for automobiles or apparatuses.

Material for foam (X7) according to the seventh aspect of the invention contains propylene-based polymer (B7) whose melting point is lower than 100° C. or not observed when measured with a differential scanning calorimeter.

Material for foam (X7) according to the seventh aspect of the invention preferably contains the propylene-based polymer (B7) that is a copolymer of propylene and at least one $C_2$-$C_{20}$ α-olefin except propylene and the melting point of the copolymer is lower than 100° C. or not observed when measured with a differential scanning calorimeter.

The material for foam (X7) according to the seventh aspect of the invention is preferably a composition containing 30 to 100 parts by weight of propylene-based polymer (B7) and 0 to 70 parts by weight of propylene-based polymer (A7) having a melting point of 100° C. or higher as measured with a differential scanning calorimeter, wherein the total of (B7) and (A7) is 100 parts by weight.

Material for foam (X7) according to the seventh aspect of the invention is preferably a composition containing 1 to 1900 parts by weight of ethylene/α-olefin copolymer (C7) and/or 1 to 1900 parts by weight of ethylene/polar monomer copolymer (D7) relative to 100 parts by weight of the total of propylene-based polymer (B7) and, optional propylene-based polymer (A7).

In material for foam (X7) according to the seventh aspect of the invention, propylene-based polymer (B7) is preferably propylene/ethylene/α-olefin copolymer (37-1) containing 45 to 92 mol % of propylene-derived structural units, 5 to 25 mol % of ethylene-derived structural units, and 3 to 30 mol % of $C_4$-$C_{20}$ α-olefin-derived structural units, wherein the total of propylene-derived structural units, ethylene-derived structural units, and $C_4$-$C_{20}$ α-olefin-derived structural units is 100 mol %.

Material for foam (X7) according to the seventh aspect of the invention preferably further contains a foaming agent (E7).

In material for foam (X7) according to the seventh aspect of the invention, ethylene/α-olefin copolymer (C7) is preferably ethylene/1-butene copolymer.

The foam of the seventh aspect is obtained from material for foam (X7).

The foam of the seventh aspect of the invention is preferably obtained by heat treatment or radiation treatment of material for foam (X7).

The foam of the seventh aspect of the invention is preferably obtained by heat treatment of material for foam (X7) placed in a mold.

The foam of the seventh aspect of the invention is preferably obtained by secondary compression of the above foam.

The foam of the seventh aspect of the invention preferably has a gel content of 70% or more and a specific gravity of 0.6 or less.

The laminate of the seventh aspect of the invention has a layer comprising the above foam and a layer made of at least one material selected from polyolefin, polyurethane, rubber, leather, and artificial leather.

The footwear of the seventh aspect of the invention comprises the above foam or the above laminate.

The footwear component of the seventh aspect of the invention comprises the above foam or laminate.

The footwear component is preferably a mid sole, an inner sole, or a sole.

Resin composition (X8) according to the eighth aspect of the invention contains a thermoplastic resin composition containing 0 to 90 wt % of propylene-based polymer (A8) whose melting point is 100° C. or higher as measured with a differential scanning calorimeter and 10 to 100 wt % of soft propylene-based copolymer (B8) that is a copolymer of propylene and at least one $C_2$-$C_{20}$ α-olefin except propylene, the Shore A hardness of (B8) being 30 to 80, the melting point of (B8) being lower than 100° C. or not observed when measured with a differential scanning calorimeter; and relative to 100 parts by weight of the thermoplastic resin composition (total of (A8) and (B8)), 0.1 to 10 parts by weight of coupling agent (Y8) and 0 to 5 parts by weigh of organic peroxide (Z8).

The laminate of the eighth aspect of the invention contains at least one layer [a] containing resin composition (X8) and a layer [b] containing a material selected from metal, an inorganic compound, and a polar plastic material on one or both surfaces of layer [a].

The solar cell-sealing sheet according to the ninth aspect of the invention contains thermoplastic resin composition (X9) composed of 0 to 70 wt % of propylene-based polymer (A9) whose melting point is 100° C. or higher as measured with a differential scanning calorimeter and 30 to 100 wt % of soft propylene-based copolymer (B9) that is a copolymer of propylene and at least one $C_2$-$C_{20}$ α-olefin except propylene, the Shore A hardness of (B9) being 30 to 80, the melting point of (B9) being lower than 100° C. or not observed when measured with a differential scanning calorimeter.

In the solar cell-sealing sheet according to the ninth aspect of the invention, soft propylene copolymer (B9) is preferably propylene/ethylene/α-olefin copolymer (B9-1) containing 45 to 92 mol % of propylene-derived structural units, to 25 mol % of ethylene-derived structural units, and 3 to 30 mol % of $C_4$-$C_{20}$ α-olefin-derived structural units, the melting point of (B9-1) being lower than 100° C. or not observed when measured with DSC.

The solar cell-sealing sheet according to the ninth aspect preferably contains 100 parts by weight of thermoplastic resin composition (X9) and 0.1 to 5 parts by weight of coupling agent (Y9).

The solar cell-sealing sheet according to the ninth aspect of the invention is preferably non-crosslinked.

The solar cell-sealing sheet according to the ninth aspect of the invention preferably has an internal haze of 1.0% to 10% when the sheet has a thickness of 1 mm.

The electrical/electronics element-sealing sheet according to the tenth aspect of the invention has layer (I-10) made of an ethylene-based copolymer having a Shore A hardness of 50 to 90 and an ethylene content of 60 to 95 mol %; and layer (II-10) made of thermoplastic resin composition (X10) containing 0 to 90 parts by weight of propylene-based polymer (A10) whose melting point is 100° C. or higher as measured with a differential scanning calorimeter and 10 to 100 parts by weight of propylene-based copolymer (B10), wherein the total of (A10) and (B10) is 100 parts by weight. Here, copolymer (B10) is a copolymer of propylene and at least one olefin selected from ethylene and $C_4$-$C_{20}$ α-olefins and has a Shore A hardness of 30 to 80 and the melting point of (B10) is lower than 100° C. or not observed when measured with a differential scanning calorimeter.

In the electrical/electronics element-sealing sheet according to the tenth aspect of the invention, layer (I-10) preferably further contains 0.1 to 5 parts by weight of a silane coupling agent, 0 to 5 parts by weight of an organic peroxide, and 0 to 5 parts by weight of a weathering stabilizer relative to 100 parts by weight of the ethylene-based copolymer.

In the electrical/electronics element-sealing sheet according to the tenth aspect of the invention, the ethylene-based copolymer is preferably a copolymer obtained using ethylene and at least one monomer selected from the group consisting of vinyl acetate, acrylic esters, methacrylic esters, propylene, 1-butene, 1-hexene, 4-methyl-1-pentene, and 1-octene.

In the electrical/electronics element-sealing sheet according to the tenth aspect of the invention, thermoplastic resin composition (X10) preferably has a permanent compression set measured at 23° C. of 5% to 35% and a permanent compression set measured at 70° C. of 50% to 70%.

In the electrical/electronics element-sealing sheet according to the tenth aspect of the invention, layer (I-10) made of the ethylene-based copolymer and layer (II-10) made of thermoplastic resin composition (X10) are preferably directly laminated with each other.

The solar cell-sealing sheet of the tenth aspect of the invention comprises the above electrical/electronics element-sealing sheet.

The solar cell module of the tenth aspect of the invention is fabricated with the above solar cell-sealing sheet.

Preferably, the solar cell module of the tenth aspect of the invention further has a layer made of glass or polyester resin, wherein the solar cell-sealing sheet is bonded to the layer made of glass or polyester resin via layer (I-10).

Furthermore, the solar cell module of the tenth aspect of the invention preferably has a silicon solar cell element, wherein the solar cell-sealing sheet is bonded to the silicon solar cell element via layer (II-10).

The electric power generator of the tenth aspect of the invention has the above solar cell module.

Effects of the Invention

The present invention provides propylene-based resin compositions suitable for various applications and the use thereof.

The thermoplastic resin composition of the first aspect of the invention is excellent in mechanical properties and also in rubber elasticity and permanent compression set at high temperatures as well as normal temperature. When it contains a softener, the composition has excellent balance, especially at high temperatures, between appearance-retaining ability and rubber elasticity and permanent compression set. The molded article of the first aspect of the invention exhibits excellent mechanical properties and also excellent rubber elasticity and permanent compression set at high temperatures as well as normal temperature because the article contains at least one portion made of the above thermoplastic resin composition. In addition, when a softener is contained, the molded article has excellent balance, especially at high temperature, between the appearance-retaining ability and the rubber elasticity and permanent compression set. The thermoplastic resin composition of the first aspect is suitably used for various applications owing to the above properties.

The molded article made of the thermoplastic resin composition of the second aspect of the invention or the crosslinked material thereof exhibits well-balanced flexibility and scratch resistance and also has excellent whitening resistance. The article, therefore, exerts excellent performances as various molded articles such as automobile interior and exterior components, home electric appliance components, construction and building components, wrapping sheets, cap liners, gaskets, and convenience goods.

The propylene-based polymer composition according to the third aspect of the invention provides molded articles that are particularly excellent in mechanical properties, transparency, whitening (on orientation and heat treatment), and also are excellent in impact resistance, scratch resistance, flexibility, transparency, stretching property, rubber elasticity at room and high temperatures. Molded articles made of the above composition are excellent in impact resistance, scratch resistance, flexibility, transparency, stretching property, room-temperature rubber elasticity, and high-temperature rubber elasticity.

The film of the fourth aspect of the invention is excellent in transparency, flexibility, stretching property, impact resistance, and orientation property (low-temperature orientation property), especially excellent in shrinking properties (high heat shrink ratio and reduced spontaneous shrink at room temperature). The film of the fourth aspect provides a high-performance heat-shrinkable film. The resin composition of the fourth aspect of the invention provides films and heat-shrinkable films excellent in transparency, flexibility, stretching property, impact resistance, drawing property (low-temperature drawing property), and especially shrinking properties.

The polyolefin decorative sheet of the fifth aspect of the invention is excellent in flexibility, scratch resistance, abrasion resistance, whitening resistance on stretching, whitening resistance on folding, wrinkle resistance, heat resistance, water resistance, compression set resistance, and mechanical strength (strength at break). In addition, the sheet can avoid problems such as dioxin generation on incineration and adverse effects of plasticizers on human bodies.

The propylene-based resin composition of the sixth aspect of the invention contains a large amount of an inorganic filler and is excellent in flexibility, mechanical strength, elongation at break, and scratch resistance. When it contains oil, the propylene-based resin composition of the sixth aspect of the invention is especially excellent in scratch resistance and low-temperature embrittlement resistance. Further, when it contains a graft-modified polymer, the propylene-based resin composition of the sixth aspect of the invention is especially excellent in scratch resistance. The method for producing propylene-based resin compositions according to the sixth aspect of the invention provides propylene-based resin compositions excellent in flexibility, mechanical strength, elongation at break, flame retardance, and especially in scratch resistance. The propylene-based polymer composition of the sixth aspect of the invention is suitable for use in producing the above propylene-based resin composition, and in particular, provides the composition with excellent scratch resistance. The propylene-based resin composition of the sixth aspect of the invention is also suitable for use in molded articles excellent in flame retardance, especially for electrical wires, etc. because of the high content of inorganic filler.

The material for foam of the seventh aspect of the invention provides foams with a low specific gravity and a small permanent compression set excellent in tear strength, low resilience, and scratch resistance. The foam of the seventh aspect of the invention has a low specific gravity, a small permanent compression set, and is excellent in tear strength, low resilience, and scratch resistance. The foam of the seventh aspect of the invention may be used in a laminate. The foam and laminate of the seventh aspect of the invention have a low specific gravity, a small permanent compression set, and is excellent in tear strength, low resilience, and scratch resistance; therefore they are suitable for use in footwear and footwear components.

The resin composition of the eighth aspect of the invention is well heat-bonded to inorganic materials such as metal and glass and to various plastic materials and also excellent in peel strength over a wide range of temperature. Further, a laminate obtained from the resin composition of the eighth aspect of the invention is excellent in flexibility, heat resistance, transparency, scratch resistance, rubber elasticity, and mechanical strength; therefore it can be used suitably for various applications.

The solar cell-sealing sheet of the ninth aspect of the invention causes no adverse effect on the solar cell elements because it does not generate gas derived from decomposition of the component materials. The sheet is excellent in heat resistance, mechanical strength, flexibility (solar cell-sealing property), and transparency. In addition, because crosslinking of the component materials is not necessary, the time for sheet molding and time for solar cell module production can be significantly shortened, and also used solar cells can be easily recycled.

The tenth aspect provides an electrical/electronic element-sealing sheet with excellent adhesion to glass and others. The electrical/electronic element-sealing sheet is suitably used outdoors and practically valuable in sealing of solar cell elements and other uses.

BRIEF DESCRIPTION OF DRAWINGS

FIG. 2A shows an example of a decorative board using the polyolefin decorative sheet of the fifth aspect, in which the decorative board has a layer made of propylene-based polymer composition (X5).

EXPLANATIONS OF SYMBOLS

Figure 1A:
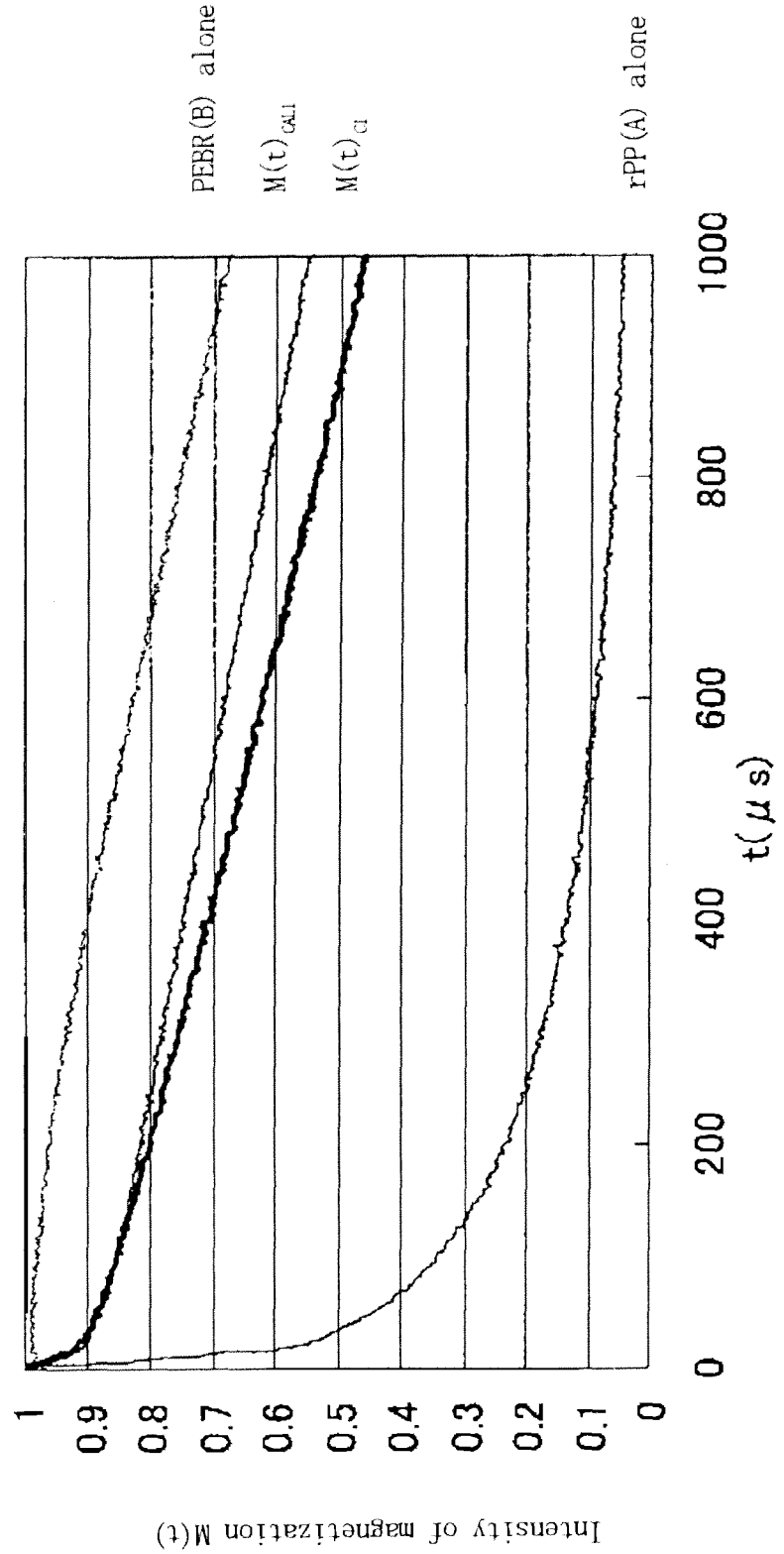
FIG. 1A shows the intensity of magnetization in decay process for the sample prepared in Example 3-1.
Figure 1B:
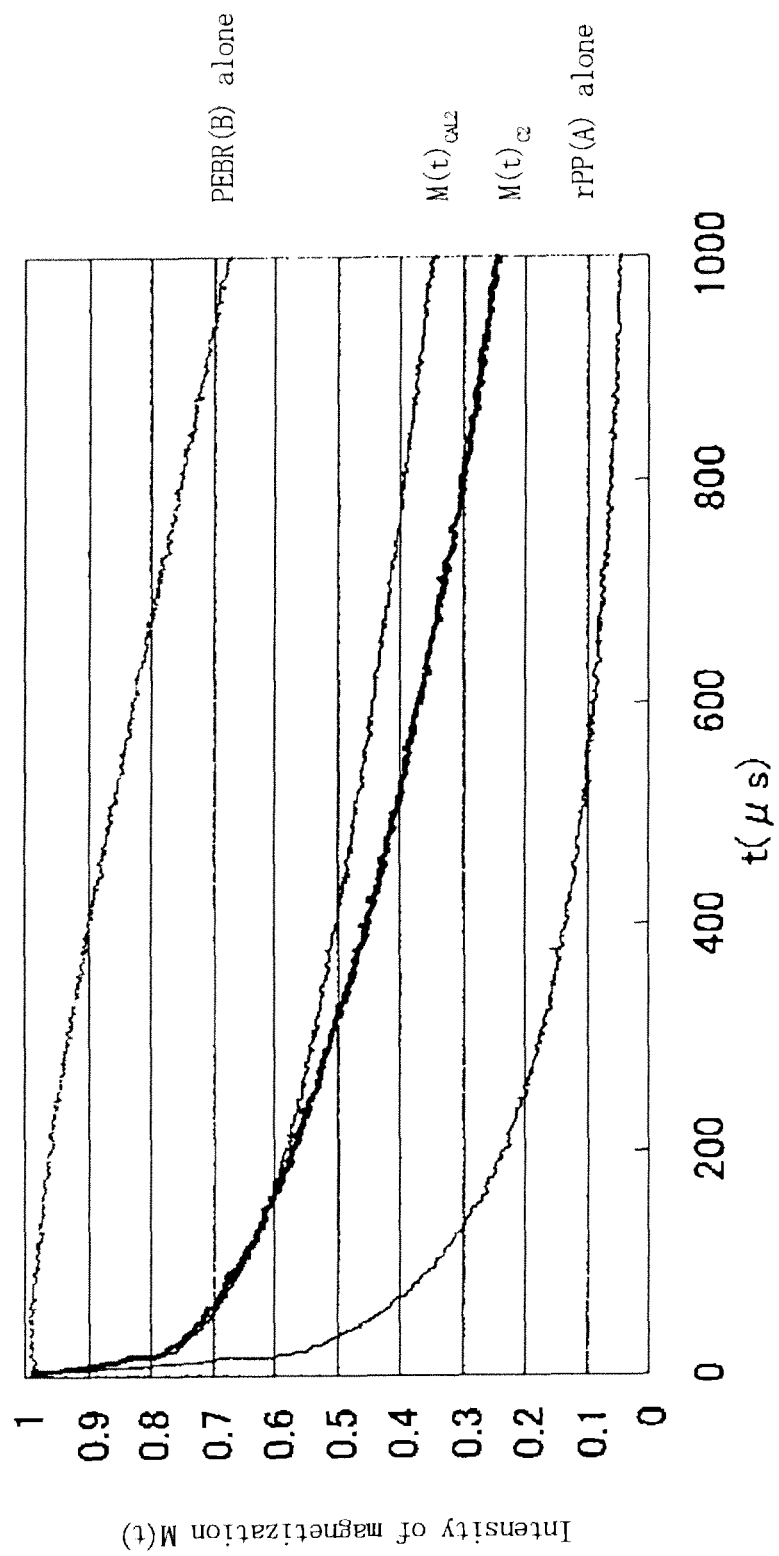
FIG. 1B shows the intensity of magnetization in decay process for the sample prepared in Example 3-2.
Figure 1C:
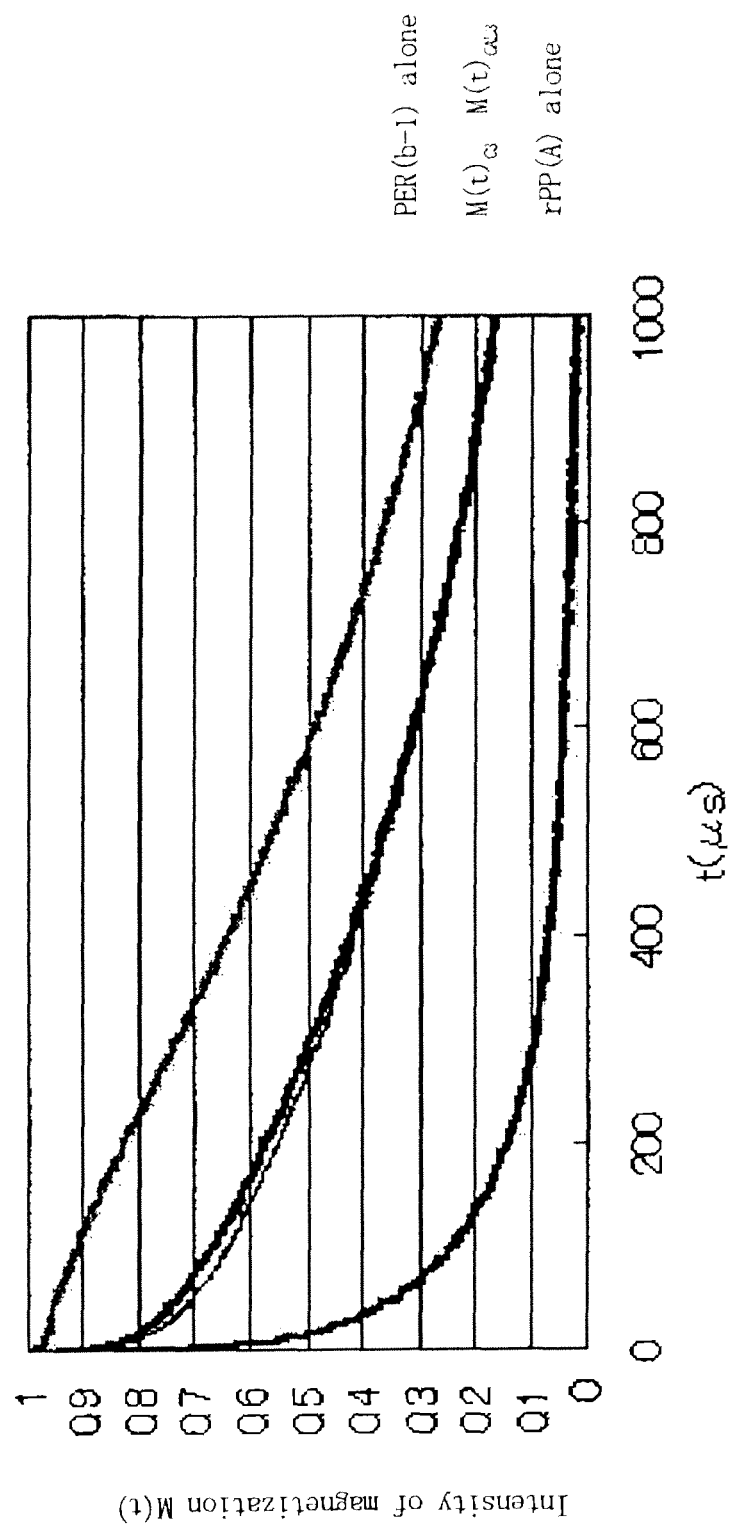
FIG. 1C shows the intensity of magnetization in decay process for the sample prepared in Comparative Example 3-1.
Figure 1D:
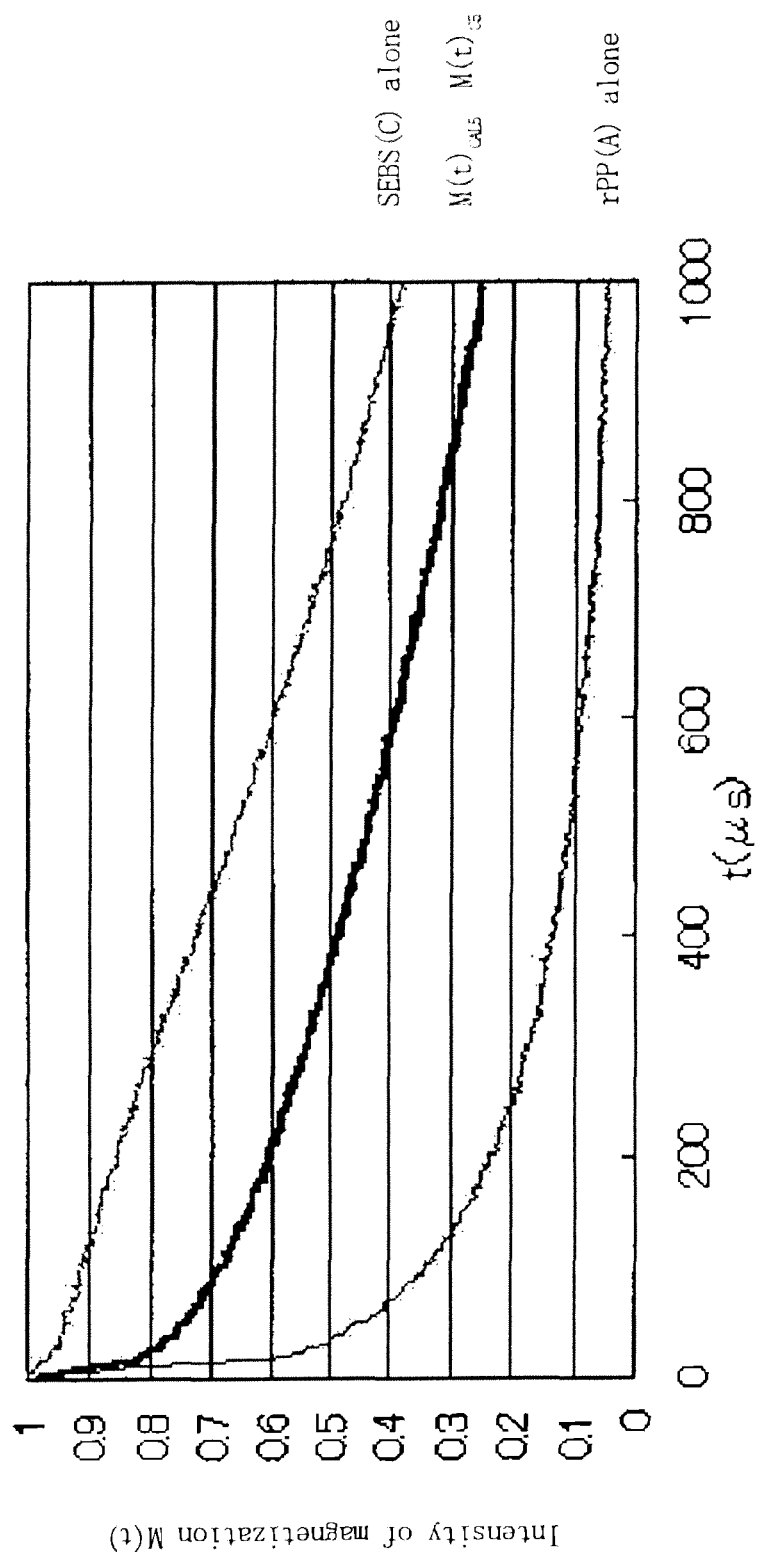
FIG. 1D shows the intensity of magnetization in decay process for the sample prepared in Comparative Example 3-2.
Figure 1E:
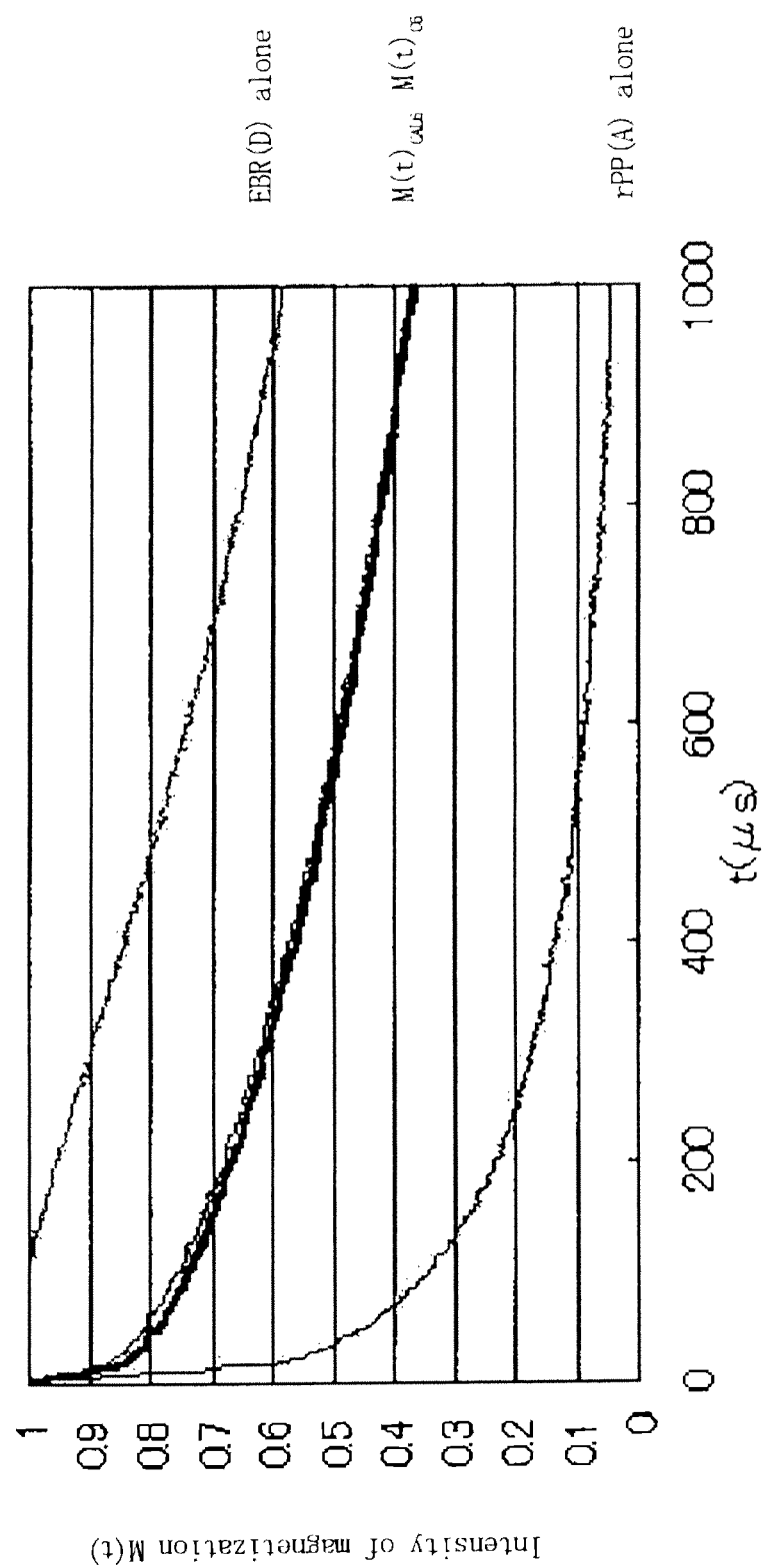
FIG. 1E shows the intensity of magnetization in decay process for the sample prepared in Comparative Example 3-3.

1: Solar cell module-protecting sheet (front protective sheet)
2: Solar cell module-protecting sheet (back protective sheet)
3: Solar cell-sealing sheet
4: Solar cell-sealing sheet
31: Layer (I-10)
41: Layer (I-10)

32: Layer (II-10)
42: Layer (II-10)
5: Solar cell element

BEST MODE FOR CARRYING OUT THE
INVENTION

1. First Aspect

Hereinafter, the first aspect of the present invention is explained in detail.

<Isotactic Polypropylene (A1)>

Isotactic polypropylene (A1) used in the first aspect of the invention is a polypropylene whose isotactic pentad fraction determined by NMR is 0.9 or more, and preferably 0.95 or more.

The isotactic pentad fraction (mmmm) is measured and determined by the method described in a prior publication (Japanese Patent Laid-Open Publication No. 2003-147135).

Isotactic polypropylenes (A1) include homopolypropylene and copolymers of propylene and at least one $C_2$-$C_{20}$ α-olefin except propylene. The $C_2$-$C_{20}$ α-olefins except propylene include ethylene, 1-butene, 1-pentene, 1-hexene, 4-methyl-1-pentene, 1-octene, 1-decene, 1-dodecene, 1-tetradecene, 1-hexadecene, 1-octadecene, and 1-eicosene. Of these, ethylene or $C_4$-$C_{10}$ α-olefins are preferable.

These α-olefins may form a random or block copolymer with propylene.

The α-olefin-derived structural units may be present in the polypropylene in a ratio of 35 mol % or less, and preferably 30 mol % or less.

Isotactic polypropylene (A1) preferably has a melt flow rate (MFR) at 230° C. under a load of 2.16 kg determined in accordance with ASTM D1238 in the range of 0.01 to 1000 g/10 min, and preferably 0.05 to 100 g/10 min.

There may be used, if necessary, a plurality of isotactic polypropylenes (A1) in combination, for example, two or more components different in melting point or rigidity.

As isotactic polypropylene (A1), there may be used, according to desired properties, any one or combination selected from homopolypropylene excellent in heat resistance (known homopolypropylene, generally having 3 mol % or less of copolymerized components except propylene), block polypropylene having well-balanced heat resistance and flexibility (known block polypropylene, generally containing 3 to 30 wt % of n-decane-soluble rubber components), and random polypropylene having well-balanced flexibility and transparency (known random polypropylene, typical melting point is 110° C. to 150° C. as measured with a DSC).

Such isotactic polypropylene (A1) can be produced, for example, by polymerizing propylene or copolymerizing propylene and the α-olefin(s), with a Ziegler catalyst system composed of a solid catalyst component containing magnesium, titanium, halogen, and an electron donor as essential components, an organoaluminum compound, and an electron donor, or a metallocene catalyst system containing a metallocene as one catalytic component.

<Propylene/Ethylene/α-Olefin Copolymer (B1)>

Propylene/ethylene/α-olefin random copolymer (B1) used in the first aspect contains propylene-derived structural units in an amount of 45 to 89 mol %, preferably 52 to 85 mol %, and more preferably 60 to 80 mol %, ethylene-derived structural units in an amount of 10 to 25 mol %, preferably 10 to 23 mol %, and more preferably 12 to 23 mol %, and optionally $C_4$-$C_{20}$ α-olefin-derived structural units (a1) in an amount of 0 to 30 mol %, preferably 0 to 25 mol %, and more preferably 0 to 20 mol %. When $C_4$-$C_{20}$ α-olefin-derived structural units (a1) are contained as an essential component, the content of propylene-derived structural units is preferably 45 to 89 mol %, more preferably 52 to 85 mol %, and still more preferably 60 to 80 mol %; the content of ethylene-derived structural units is preferably 10 to 25 mol %, more preferably 10 to 23 mol %, and still more preferably 12 to 23 mol %; and the content of the $C_4$-$C_{20}$ α-olefin-derived structural units (a1) is preferably 1 to 30 mol %, more preferably 3 to 25 mol %, and still more preferably 5 to 20 mol %.

Propylene/ethylene/α-olefin copolymer (B1) containing propylene-derived structural units, ethylene-derived structural units, and optional $C_4$-$C_{20}$ α-olefin-derived structural units in the above ratio has good compatibility with isotactic polypropylene (A1), and the resultant propylene-based polymer composition is likely to be sufficient in transparency, flexibility, heat resistance, and scratch resistance.

The desirable intrinsic viscosity [η] of propylene/ethylene/α-olefin copolymer (B1) is generally 0.01 to 10 dl/g and preferably 0.05 to 10 dl/g when measured in decalin at 135° C. With the above range of intrinsic viscosity [η], propylene/ethylene/α-olefin random copolymer (B1) is excellent in weatherability, ozone resistance, resistance to thermal aging, low-temperature characteristics, resistance to dynamic fatigue, and others.

The stress at 100% elongation (M100) of propylene/ethylene/α-olefin copolymer (B1) is generally 4 MPa or less, preferably 3 MPa or less, and more preferably 2 MPa or less, when measured in accordance with JIS K6301 with a JIS #3 dumbbell at span of 30 mm at a tensile speed of 30 ram/min at 23° C. With the above range of stress at 100% elongation, propylene/ethylene/α-olefin copolymer (B1) exhibits excellent flexibility, transparency, and rubber elasticity.

The crystallinity of propylene/ethylene/α-olefin copolymer (B1) determined by X-ray diffractometry is generally 20% or less, and preferably 0 to 15%.

It is desired that propylene/ethylene/α-olefin copolymer (B1) has a single glass transition temperature (Tg) and the Tg measured with a DSC is generally −10° C. or lower, and preferably −15° C. or lower. With the above range of Tg, propylene/ethylene/α-olefin copolymer (B1) exhibits excellent cold-temperature resistance and low-temperature characteristics.

When propylene/ethylene/α-olefin copolymer (B1) exhibits a melting point (Tm in ° C.) in the endothermic curve obtained with a DSC, generally its melting endothermic entalpy, ΔH, is 30 J/g or less and the following relation is satisfied between $C_3$ (propylene) content (mol %) and ΔH (J/g) wherein "$C_3$ content" means the proportion of propylene-derived structural units determined by analyzing the $C^{13}$-NMR spectrum.

$$\Delta H < 345 \ \text{Ln} \ (C_3 \text{ content in mol \%}) - 1492,$$

wherein, 76≤$C_3$ content (mol %)≤90.

In order to obtain propylene/ethylene/α-olefin copolymer (B1) satisfying the above relation between propylene content (mol %) and melting endothermic enthalpy DH (J/g), the crystallinity of the copolymer is lowered by appropriately selecting polymerization conditions. For example, the copolymer with a low crystallinity can be obtained by selecting an appropriate catalyst. In propylene/ethylene/α-olefin copolymer (B1) obtained with such a catalyst, even when the propylene content is unchanged, the melting endothermic enthalpy ΔH decreases, thereby satisfying the above relation between propylene content (mol %) and ΔH (J/g). An example of suitable catalysts for lowering the crystallinity is disclosed in Examples of the present specification.

The crystallinity of propylene/ethylene/α-olefin copolymer (B1) can be regulated also by selecting the polymerization temperature and pressure as appropriate. For example, elevating the polymerization temperature can yield the copolymer with a lower crystallinity. Reducing the polymerization pressure also yields the copolymer with a lower crystallinity. Such polymerization conditions result in propylene/ethylene/α-olefin copolymer (B1) with a lower melting endothermic entalpy, ΔH, thereby satisfying the above relation between propylene content (mol %) and ΔH (J/g), even with the propylene content unchanged.

The molecular weight distribution (Mw/Mn, relative to polystyrene standards, Mw: weight-average molecular weight, Mn: number-average molecular weight) measured by gel permeation chromatography (GPC) is preferably 4.0 or less, more preferably 3.0 or less, and still more preferably 2.5 or less.

The melting point of propylene/ethylene/α-olefin copolymer (B1) is generally lower than 100° C., or preferably not observed when measured with a DSC. Here, "melting point is not observed" means that any crystal melting peak having a heat of crystal melting of 1 J/g or more is not observed in the temperature range of −150° C. to 200° C. The measurement conditions are as described in Examples of the first aspect of invention.

The triad tacticity (mm-fraction) of propylene/ethylene/α-olefin copolymer (B1) determined by $^{13}$C-NMR is preferably 85% or more, more preferably 85% to 97.5%, still more preferably 87% to 97%, and particularly preferably 90% to 97%. With the above range of mm-fraction, the copolymer is particularly excellent in balance of flexibility and mechanical strength, and therefore suitable for the first aspect of the invention. The mm-fraction can be determined by the method described in WO 04/087775 from Page 21 line 7 to Page 26 line 6.

Propylene/ethylene/α-olefin copolymer (B1) may be partly graft-modified with a polar monomer. The polar monomers include hydroxyl group-containing ethylenically unsaturated compounds, amino group-containing ethylenically unsaturated compounds, epoxy group-containing ethylenically unsaturated compounds, aromatic vinyl compounds, unsaturated carboxylic acids and derivatives thereof, vinyl esters, vinyl chloride, and others.

Such modified propylene/ethylene/α-olefin copolymer is obtained by graft-polymerizing the polar monomer to propylene/ethylene/α-olefin copolymer (B1). In graft polymerization of propylene/ethylene/α-olefin copolymer (B1) with the polar monomer, the polar monomer is used in an amount of generally 1 to 100 parts by weight, and preferably 5 to 80 parts by weight, relative to 100 parts by weight of propylene/ethylene/α-olefin copolymer (B1). A radical initiator is generally used in the graft polymerization.

As the radical initiator, an organic peroxide, an azo compound, or others may be used. The radical initiator may be mixed directly with propylene/ethylene/α-olefin copolymer (B1) and the polar monomer, or may be dissolved in a small amount of an organic solvent prior to mixing. Any organic solvent capable of dissolving the radical initiator may be used without particular limitations.

A reducing substance may be used in graft polymerization of the polar monomer to propylene/ethylene/α-olefin copolymer (B1). The reducing substance increases the grafting amount of the polar monomer.

Conventional methods may be used for graft-modification of propylene/ethylene/α-olefin copolymer (B1) with the polar monomer. For example, there may be mentioned a method in which propylene/ethylene/α-olefin copolymer (B1) is dissolved in an organic solvent; the polar monomer, radical initiator, and others are added to the resulting solution; and the reaction is conducted at 70 to 200° C., preferably 80 to 190° C., for 0.5 to 15 hr, preferably 1 to 10 hr.

Alternatively, the modified propylene/ethylene/α-olefin copolymer can be produced by reacting propylene/ethylene/α-olefin copolymer (B1) with the polar monomer using an extruder or others without any solvent. It is desirable that the reaction is performed generally at a temperature equal to or higher than the melting point of propylene/ethylene/α-olefin copolymer (B1), specifically at 120 to 250° C., generally for 0.5 to 10 min.

The desirable modification ratio (ratio of the polar monomer grafted) of the modified propylene/ethylene/α-olefin copolymer is generally 0.1 to 50 wt %, preferably 0.2 to 30 wt %, and more preferably 0.2 to 10 wt %.

When the propylene-based polymer composition of the first aspect of the invention contains the modified propylene/ethylene/α-olefin copolymer, it attains excellent adhesion and compatibility with other resins, and molded articles formed from the propylene-based polymer composition have improved surface wettability in some cases.

Propylene/ethylene/α-olefin copolymer (B1) can be produced with the metallocene catalyst used for producing isotactic polypropylene (A1) by similar procedures to those in producing (A1), but the production is not limited thereto. For example, the catalyst described in WO 04/087775 may be used.

<Styrene-Based Elastomer (C1)>

As styrene-based elastomer (C1) used in the first aspect of the invention, styrene/diene thermoplastic elastomers can be given, but the styrene-based elastomer is not limited thereto. In particular, block copolymer elastomers and random copolymer elastomers are preferred. In such elastomers, the styrene-type monomer is exemplified by styrene, α-methylstyrene, p-methylstyrene, vinylxylene, vinylnaphthalene, mixtures thereof, and others; and the diene-type monomer is exemplified by butadiene, isoprene, pentadiene, mixtures thereof, and others.

The typical examples of styrene-based elastomer (C1) include hydrogenated diene polymers comprising polybutadiene block segments and styrene type compound (including styrene itself, the same applies hereinafter)/butadiene copolymer block segments; hydrogenated diene polymers comprising polyisoprene block segments and styrene type compound/isoprene copolymer block segments; block copolymers comprising polymer blocks mainly derived from a styrene type compound and polymer blocks mainly derived from a conjugated diene; hydrogenated product of random copolymers of styrene type compound and conjugated diene; and hydrogenated derivatives of block copolymers comprising polymer blocks mainly derived from a styrene type compound and polymer blocks mainly derived from a conjugated diene.

The content of styrene-type monomer component in the styrene thermoplastic elastomer is not particularly limited, but is preferably in the range of 5 to 40 wt %, considering flexibility and rubber elasticity in particular.

Styrene-based elastomers (C1) may be used alone or in combination. Commercial products may also be used as styrene-based elastomer (C1).

<Ethylene/α-Olefin Random Copolymer (D1)>

Ethylene/α-olefin random copolymer (D1) optionally used in the first aspect of the invention refers to a copolymer of ethylene and a $C_3$-$C_{20}$ α-olefin, preferably a $C_3$-$C_{10}$ α-olefin.

Copolymers having the following properties are preferably used:

(a) the density in accordance with ASTM 1505 at 23° C. is 0.850 to 0.910 g/cm$^3$, preferably 0.860 to 0.905 g/cm$^3$, and more preferably 0.865 to 0.895 g/cm$^3$; and (b) the MFR measured at 190° C. under a load of 2.16 kg is 0.1 to 150 g/10 min, and preferably 0.3 to 100 g/10 min.

Ethylene/α-olefin random copolymer (D1) having these properties is preferably used, because a softener is well retained in the composition.

There is no limitation on the method for producing the ethylene/α-olefin random copolymer (D1). The copolymer can be produced by copolymerizing ethylene and the α-olefin with a radical-polymerization catalyst, Philips catalyst, Ziegler-Natta catalyst, or a metallocene catalyst. In particular, the copolymer produced with a metallocene catalyst has a molecular weight distribution (Mw/Mn) of generally 3 or less, which is suitable for use in the fist aspect of the invention.

The crystallinity of ethylene/α-olefin random copolymer (D1) measured by X-ray diffractometry is generally 40% or less, preferably 0 to 39%, and more preferably 0 to 35%.

Specific examples of the $C_3$-$C_{20}$ α-olefin used as a co-monomer include propylene, 1-butene, 1-pentene, 1-hexene, 4-methyl-1-pentene, 1-octene, 1-decene, and 1-dodecene. These are used alone or in combination. Among them, propylene, 1-butene, 1-hexene, and 1-octene are preferable. Furthermore, if necessary, a small amount of (an)other co-monomer(s), for example, a diene such as 1,6-hexadiene or 1,8-octadiene, or a cycloolefin such as cyclopentene, may be used. The α-olefin content in the copolymer is generally 3 to 50 mol %, preferably 5 to 30 mol %, and more preferably 5 to 25 mol %.

The molecular structure of the copolymer may be linear or branched with long or short side-chains. Further, a plurality of different ethylene/α-olefin random copolymers (D1) may be used as a mixture.

Ethylene/α-olefin random copolymer (D1) can be produced by known methods using a vanadium catalyst, a titanium catalyst, a metallocene catalyst, or the like. For example, there may be mentioned the method described in Japanese Patent Laid-Open Publication No. H10-212382.

<Softener (E1)>

Softener (E1) optionally used in the first aspect of the invention may be selected from various oils such as paraffin oil and silicon oil. In particular, paraffin oil is suitably used. For the oils suitably used, the kinematic viscosity at 40° C. is 20 to 800 cSt (centistokes) and preferably 40 to 600 cSt, the pour point is 0 to –40° C. and preferably 0 to –30° C., and the flash point (COC test) is 200 to 400° C. and preferably 250 to 350° C.

One of the oils suitably used for the first aspect of the invention is naphthene process oil, which is a petroleum-derived softener blended in rubber processing for softening, dispersing components, lubricating, or other purposes. This oil contains 30 to 45 wt % of naphthene-type hydrocarbons. Blending such process oil further improves the melt-pour point of resin compositions on molding and the flexibility of molded articles, and also reduces occurrence of surface stickiness caused by bleeding in molded articles. In the first aspect, a naphthene process oil having an aromatic hydrocarbon content of 10 wt % or less is used. Using the naphthene oil reduces incidence of surface bleeding in molded articles.

<Thermoplastic Resin Composition (X1)>

Thermoplastic resin composition (X1) of the first aspect of the invention contains (A1), (B1), (C1), and if necessary, (D1):

1 to 90 wt % of isotactic polypropylene (A1);

9 to 98 wt % of propylene/ethylene/α-olefin copolymer (B1) containing 45 to 89 mol % of propylene-derived structural units, 10 to 25 mol % of ethylene-derived structural units, and if necessary, 0 to 30 mol % of $C_4$-$C_{20}$ α-olefin-derived structural units (a1);

1 to 80 wt % of styrene-based elastomer (C1); and 0 to 70 wt % of ethylene/α-olefin copolymer (D1) having a density of 0.850 to 0.910 g/cm$^3$, wherein the total of (A1)+(B1)+(C1)+(D1) is 100 wt %.

The content of component (A1) is preferably 5 to 80 wt %, and more preferably 10 to 75 wt %; the content of component (B1) is preferably 5 to 92 wt %, and more preferably 10 to 75 wt %; the content of component (C1) is preferably 3 to 75 wt %, and more preferably 5 to 65 wt %; and the content of component (D1) is preferably 0 to 65 wt %, and more preferably 0 to 60 wt %.

When component (D1) is contained as an essential component, the content of each component is as follows: the content of component (A1) is preferably 1 to 89 wt %, more preferably 5 to 80 wt %, and still more preferably 10 to 75 wt %; the content of component (B1) is preferably 9 to 97 wt %, more preferably 5 to 90 wt %, and still more preferably 10 to 75 wt %; the content of component (C1) is preferably 1 to 80 wt %, more preferably 3 to 75 wt %, and still more preferably 5 to 65 wt %; and the content of component (D1) is preferably 1 to 70 wt %, more preferably 2 to 65 wt %, and still more preferably 5 to 60 wt %.

Thermoplastic resin composition (X1) preferably contains softener (E1) in an amount of 1 to 400 parts by weight, preferably 1 to 200 parts by weight, and still more preferably 1 to 150 parts by weight, relative to 100 parts by weight of the total of components (A1), (B1), (C1), and if any, (D1).

As long as the objective of the first aspect of the invention is not impaired, thermoplastic resin composition (X1) may also contain other resins, other rubbers, inorganic filler, or others; and also may contain additives such as weathering stabilizers, heat stabilizers, antistatic agents, anti-slip agents, anti-blocking agents, anti-fogging agents, lubricants, pigments, dyes, plasticizers, anti-aging agents, hydrochloric acid absorbers, antioxidants, and nucleating agents. The amount of these additional resins, rubbers, inorganic filler, and additives to be mixed in thermoplastic resin composition (X1) is not particularly limited unless the objective of the first aspect is impaired. In an embodiment, the total of isotactic polypropylene (A1), propylene/ethylene/α-olefin random copolymer (B1), styrene-based elastomer (C1), if necessary ethylene/α-olefin random copolymer (D1), and if necessary softener (E1) is 60 to 100 wt % and preferably 80 to 100 wt % of the whole composition, and the remainder is accounted for by the above-described other resins, rubbers, additives, inorganic filler, and others.

Thermoplastic resin composition (X1) can be obtained with a known kneader (for example, single-screw or twin-screw extruder, Banbury mixer, roll mixer, calendar mixer, etc.), preferably with a molding machine capable of continuous kneading and extruding such as a single-screw or twin-screw extruder.

Although the composition is preferably non-crosslinked for facilitating recycling in accordance with the objective of the first aspect of the invention, it may be crosslinked as necessary. For crosslinking, there may be employed a method of dynamic crosslinking using a known crosslinker or crosslinking auxiliary or a method in which thermoplastic resin composition (X1) is kneaded with a crosslinker, crosslinking auxiliary, or others and molded, followed by post-crosslinking with heating or electron beam irradiation.

<Molded Article at Least Part of which is Made of Thermoplastic Resin Composition (X1)>

Thermoplastic resin composition (X1) according to the first aspect of the invention may be shaped into various articles, for example, sheets, unoriented or oriented films, filaments, and others with various shapes. The molded article at least part of which is made of thermoplastic resin composition (X1) may be a molded article the whole of which is made of thermoplastic resin composition (X1) or may be a composite article of the thermoplastic resin composition with other materials in which a portion of the article is made of thermoplastic resin composition (X1). For example, the molded article according to the first aspect of the invention may be a multilayer laminate. In this case, at least one layer of the laminate contains thermoplastic resin composition (X1). For example, there may be mentioned multilayer films, multilayer sheets, multilayer containers, multi layer tubes, multilayer coating films in which the composition is contained as one of the constituents of water-based paint, and others.

The molded articles include, specifically, molded articles obtained by known heat molding such as extrusion molding, injection molding, inflation molding, blow molding, extrusion blow molding, injection blow molding, press molding, vacuum molding, calendar molding, and foam molding. Hereinafter, the molded article will be explained with reference to several examples.

For example, when the molded article according to the first aspect of the invention is an extrusion-molded article, the shapes and product types are not particularly limited, and include sheets, films (unoriented), pipes, hoses, electrical wire covers, tubes, and others. In particular, preferred are sheets (for example, skin material, etc.), films, tubes, catheters, monofilaments, nonwoven fabrics, and others.

For extrusion molding of thermoplastic resin composition (X1), known extruders and molding conditions can be employed. For example, a molded article with a desired shape can be obtained by extruding melted thermoplastic resin composition (X1) with an extruder, such as single-screw extruder, kneading extruder, ram extruder, or gear extruder, through a predetermined die or the like.

An oriented film can be obtained by drawing the above extruded sheets or films (unoriented) by known methods such as tentering (longitudinal-transverse or transverse-longitudinal orientation), simultaneous biaxial orientation, and uniaxial orientation.

In drawing the sheet or unoriented film, the draw ratio is generally about 20 to 70 in biaxial drawing, and about 2 to 10 in uniaxial drawing. It is preferred that the oriented film obtained by drawing has a thickness of about 5 to 200 μm.

As film-shape molded articles, inflation films may be produced. On inflation molding, drawdown is not likely to develop.

Such sheet-shaped or film-shaped molded articles at least part of which is made of thermoplastic resin composition (X1) as described above are less electrostatically charged and are excellent in rigidity such as tensile modulus, heat resistance, stretching property, impact resistance, aging resistance, transparency, translucency, gloss, stiffness, moisture resistance, and gas barrier property. They can be widely used as packaging films and others. The sheet-shaped or film-shaped molded article made of thermoplastic resin composition (X1) may be a multilayer molded article having at least one layer of thermoplastic resin composition (X1).

Filament-shaped molded articles can be produced, for example, by extruding melted thermoplastic resin composition (X1) through a spinneret. The filament thus obtained may be further drawn. The drawing should be performed to orient the molecules along at least one axis of the filament, and the draw ratio is preferably about 5 to 10. The filament made of thermoplastic resin composition (X1) is less electrostatically charged and is excellent in transparency, rigidity, heat resistance, impact resistance, and stretching property. As the method for producing nonwoven fabrics, there may be mentioned the spunbond method and the melt-blowing method. The resulting nonwoven fabrics are less electrostatically charged and are excellent in rigidity, heat resistance, impact resistance, and stretching property.

Injection-molded articles can be produced by injection molding thermoplastic resin composition (X1) into various shapes using known injection molding machines and conditions. The injection-molded articles made of thermoplastic resin composition (X1) are less electrostatically charged and are excellent in transparency, rigidity, heat resistance, impact resistance, surface gloss, chemical resistance, abrasion resistance, and the like; hence they are widely used in automobile interior trims, automobile exterior components, housings for home electric appliances, containers, and others.

Blow-molded articles can be produced by blow molding thermoplastic resin composition (X1) using known blow molding machines and conditions. Here, the blow-molded article at least part of which is made of thermoplastic resin composition (X1) may be a multilayer molded article containing at least one layer of thermoplastic resin composition (X1).

For example, in extrusion blow molding, a hollow molded article can be produced by extruding thermoplastic resin composition (X1) through a die in a molten state at a resin temperature of 100° C. to 300° C. to form a tubular parison, which is held in a mold with a desired shape and subsequently shaped to the mold at a resin temperature of 130° C. to 300° C. by blowing air thereinto. The blow ratio is desirably about 1.5 to 5 in the transverse direction.

In injection blow molding, a hollow molded article can be produced by injecting thermoplastic resin composition (X1) into a parison mold at a resin temperature of 100° C. to 300° C. to form a parison, which is held in a mold with a desired shape and subsequently shaped to the mold at a resin temperature of 120° C. to 300° C. by blowing air thereinto. The blow ratio is desirably 1.1 to 1.8 in the longitudinal direction and 1.3 to 2.5 in the transverse direction.

The blow-molded article at least part of which is made of thermoplastic resin composition (X1) is excellent in transparency, flexibility, heat resistance, impact resistance, and moisture resistance.

The press-molded articles include stamping-molded articles. For example, when a base material and a skin material are press-molded at a time into a composite (stamping molding), the base material can be formed from the propylene composition according to the first aspect of the invention.

Such stamping-molded articles include, specifically, automobile interior components such as door trims, rear package trims, sheet back garnishes, and instrumental panels.

The press-molded articles at least part of which is made of thermoplastic resin composition (X1) are less electrostatically charged and are excellent inflexibility, heat resistance, transparency, impact resistance, aging resistance, surface gloss, chemical resistance, and abrasion resistance.

In one embodiment of the first aspect of the invention, the molded article having at least portion made of the thermoplastic resin composition (X1) is a film or sheet, a monofilament, a fiber, or nonwoven fabric. These are useful as stretching materials.

The molded articles at least part of which is made of the thermoplastic resin composition (X1) are excellent in mechanical properties such as hardness, excellent in rubber elasticity and permanent compression set not only at normal temperature but also at high temperatures, and excellent in transparency and scratch resistance. In addition, even when the softener is contained, the articles are well-balanced in appearance-retaining ability and rubber elasticity and permanent compression set, particularly at high temperature. The molded articles are easily recycled and produced in a cost-effective manner. Therefore, thermoplastic resin composition (X1) is suitable for use for automobile interior components, automobile exterior components, home electric appliance components, construction and building components, wrapping sheets, cap liners, gaskets, and convenience goods. In particular, the composition is suitably used for automobile interior and exterior components, which are required to exhibit rubber elasticity even at high temperatures.

The automobile interior components at least part of which is made of thermoplastic resin composition (X1) include, for example, door trims, gaskets, and others.

The automobile exterior components at least part of which is made of thermoplastic resin composition (X1) include bumpers and others.

The home electric appliance components at least part of which is made of thermoplastic resin composition (X1) include packings and others.

The construction or building components at least part of which is made of thermoplastic resin composition (X1) include waterproof sheets, floorings, and others.

The packaging sheets at least part of which is made of thermoplastic resin composition (X1) include mono-layer sheets and multilayer sheets using the resin composition of the first aspect of the invention in at least one layer.

The cap liners at least part of which is made of thermoplastic resin composition (X1) include liners for potable water bottle caps and others. As the method for producing the cap liner, there may be mentioned a method of punching out a sheet prepared from thermoplastic resin composition (X1) with a sheet-forming machine.

As the method for producing caps having the cap liner of the first aspect, there may be mentioned, for example, (1) method in which the cap liner is bonded to the inside top face of a cap with an adhesive, (2) sheet punching method in which the cap liner in molten or semi-molten state is bonded to the inside top face of a cap, and (3) in-shell molding method in which the source materials for the cap liner of the first aspect are melt-kneaded with an extruder or the like, and the melt of the resulting composition is placed on the inside top face of a cap and stamped therein into a cap liner shape. The cap liner of the first aspect of the invention can be attached to any of plastic caps and metal caps regardless of a cap material.

The cap having the cap liner of the first aspect of the invention can be attached to packaging containers for beverages such as mineral water, tea, carbonated drinks, sports drinks, fruits drinks, and milk beverage, and food products such as grilled meat sauce, soybean sauce, sauce, mayonnaise, and ketchup.

The convenience goods at least part of which is made of thermoplastic resin composition (X1) include grips and others.

For each of the automobile interior components, automobile exterior components, home electric appliance components, construction or building components, packaging sheets, cap liners, gaskets, and convenience goods at least part of which is made of thermoplastic resin composition (X1), the whole body may be made of thermoplastic resin composition (X1) or it may be a composite of the thermoplastic resin composition with other materials in which a portion of the composite is made of thermoplastic resin composition (X1).

The decorative sheet at least part of which is made of thermoplastic resin composition (X1) has at least one layer made of thermoplastic resin composition (X1). Hereinafter, the decorative sheet is explained.

The decorative sheet of the first aspect of the invention is used, for example, for conventional decorative boards in which the sheet is bonded on the surface of base materials such as plywood, steel plate, aluminum plate, particle board, MDF (medium-density fiberboard), inorganic board (such as gypsum board), concrete wall, plastic board, foam, and heat insulator, with an adhesive or by another method. The decorative sheets of the first aspect include building material protective sheets, for example, a sheet used for the surface layer of floor, wall, ceiling, or other parts. Both decorative sheets and building material protective sheets are used for protecting surfaces and for producing design such as print or pictures.

A typical example of the decorative sheet of the first aspect of the invention contains at least one layer of thermoplastic resin composition (X1). The decorative sheet may contain two or more layers of thermoplastic resin composition (X1), in which case the two or more layers may be composed of the same components or different components from each other.

The decorative sheet of the first aspect of the invention may contain, besides the layer(s) made of thermoplastic resin composition (X1), known component layers for decorative sheets, such as a layer displaying print and picture designs, a surface-coating layer, a luster-adjusting layer, a shielding layer (which prevents the substrate surface from being seen through a foreground layer, and in some cases, serves as a base material), and an adhesive layer bonding these layers together.

The structure of the decorative sheet according to the first aspect of the invention is not particularly limited. One example is a structure in which the decorative sheet contains a layer [a] made of thermoplastic resin composition (X1), at least one layer [b] selected from a print layer, a picture layer, and a shielding layer, and optionally at least one layer [c] selected from a surface-coating layer and a luster-adjusting layer.

Another example is a structure in which the decorative sheet contains a shielding layer [d], a layer [a] made of thermoplastic resin composition (X1), at least one layer [b] selected from a print layer and a picture layer, and optionally at least one layer [c] selected from a surface-coating layer and a luster-adjusting layer.

The layer made of thermoplastic resin composition (X1) is excellent in scratch resistance, abrasion resistance, whitening resistance on folding, wrinkle resistance, heat resistance, and transparency, and is therefore suitable for use as a protective layer for protecting a print or picture layer (that is, used as a surface layer protecting a print or picture layer; a known treatment may be applied to the layer made of thermoplastic resin composition (X1) to provide a surface-coating layer, a luster-adjusting layer, or others thereon unless the objectives of the first aspect of the invention are impaired). Decorative sheets with such structure are particularly preferable.

Since the layer made of thermoplastic resin composition (X1) is also excellent in flexibility and water resistance, it can be suitably used as one layer in combination with a layer of other components. In this case, the layer made of thermoplastic resin composition (X1) can be bonded without a known adhesive or an adhesive having the same effect as the known adhesives. Specifically, sufficient bond strength can be attained by known hot-melt bonding techniques such as heat lamination, extrusion lamination, sandwich lamination, and co-extrusion.

Therefore, the layer of thermoplastic resin composition (X1) can be suitably used for a decorative sheet in combination with layers made of a polyolefin-based resin other than the thermoplastic resin composition (X1), that is, layers made of a polyolefin-based resin out of the scope of thermoplastic resin composition (X1) (including known adhesive polyolefin resin layers).

The thickness of the layer made of thermoplastic resin composition (X1) is not particularly limited, but is generally 5 to 2000 μm.

To the decorative sheet or construction material protective sheet of the first aspect of the invention, there may be applied known treatments such as embossing, engraving, and wiping.

The decorative sheet or construction material protective sheet of the first aspect of the invention can be suitably used in a laminate in which the back surface of the layer made of thermoplastic resin composition (X1) is bonded to a layer made of a polyolefin-based resin other than thermoplastic resin composition (X1) without an adhesive. The polyolefin based resin other than thermoplastic resin composition (X1) used herein may be any resin other than thermoplastic resin composition (X1). That is, any resin that is not included in thermoplastic resin composition (X1) may be used without limitations. Specifically, such resins include polyethylene, polypropylene, poly-α-olefin, ethylene/α-olefin copolymer, ethylene/polar vinyl monomer copolymer, a mixed resin composition thereof, and others.

Beside these, the above olefin-based resin may further contain additives such as inorganic fillers, weathering stabilizers, heat stabilizers, antistatic agents, anti-slip agents, anti-blocking agents, anti-fogging agents, lubricants, pigments, dyes, plasticizers, anti-aging agents, hydrochloric acid absorbers, antioxidants, and nucleating agents, unless the objectives of the first aspect of the invention are impaired. Here, "lamination without an adhesive" means direct lamination by hot-melt bonding.

There is no particular limitation on the method for producing the decorative sheet or building material protective sheet of the first aspect of the invention. Known methods may be employed.

There is no particular limitation on the application of the decorative sheet or building material protective sheet of the first aspect. The sheet can be suitably used for home electric appliances and furniture such as TV cabinets, stereo-speaker boxes, video recorder cabinets, various storage furniture, and united furniture; housing members such as doors, door-frames, window sashes, crown, plinth, and opening frames; furniture members such as doors of kitchen furniture and storage furniture; building materials such as floor material, ceiling material, and wall paper; automobile interior materials; stationery; office goods; and others.

2. Second Aspect

Hereinafter, the second aspect of the present invention will be described in detail.

<Isotactic Polypropylene (A2)>

Examples of isotactic polypropylenes (A2) optionally used in the second aspect of the invention include homopolypropylene and copolymers of propylene and at least one $C_2$-$C_{20}$ α-olefin except propylene. Specific examples of the $C_2$-$C_{20}$ α-olefin except propylene include the same as those for isotactic polypropylene (A1) used in the first aspect of the invention. Also, the preferable range is the same.

These α-olefins may form a random or block copolymer with propylene.

The polypropylene may contain structural units derived from such α-olefin in an amount of 20 mol % or less, and preferably 15 mol % or less.

The melting point of isotactic polypropylene (A2) measured with a differential scanning calorimeter (DSC) is generally 100 to 170° C. (except 100° C.), preferably 105 to 170° C., and more preferably 110 to 165° C.

There may be used, if necessary, a plurality of isotactic polypropylenes (A2) together, for example, two or more components different in melting point or rigidity.

Isotactic polypropylene (A2) preferably has the same properties as those of isotactic polypropylene (A1) used in the first aspect of the invention concerning an isotactic pentad fraction (mmmm) and an MFR.

In order to attain desired properties, isotactic polypropylene (A2) may be one or more polypropylenes selected from homopolypropylene excellent in heat resistance, block polypropylene with well-balanced heat resistance and flexibility, and random polypropylene with well-balanced flexibility and transparency, like isotactic polypropylene (A1) of the first aspect of the invention.

Isotactic polypropylene (A2) can be produced by the method similar to that for producing isotactic polypropylene (A1) used in the first aspect of the invention.

<Propylene/α-Olefin Copolymer (B2)>

Propylene/α-olefin copolymers (B2) used in the second aspect include propylene/ethylene copolymer and copolymers of propylene and at least one $C_4$-$C_{20}$ α-olefin. The $C_4$-$C_{20}$ α-olefins include 1-butene, 1-pentene, 1-octene, 1-decene, and others. Copolymers of propylene and at least one $C_4$-$C_{20}$ α-olefin are preferable and propylene/1-butene copolymer is more preferable.

The melting point of propylene/α-olefin copolymer (B2) is generally not higher than 100° C. or not observed when measured with a differential scanning calorimeter (DSC). The melting point is preferably 30 to 90° C., and more preferably 40 to 85° C. Here, "melting point is not observed" means that any melting endothermic peak of crystal with a melting endothermic entalpy of crystal of 1 J/g or more is not observed in the temperature range of −150 to 200° C. The measurement conditions are as described in Examples of the second aspect of the invention.

In propylene/α-olefin copolymer (B2), the molecular weight distribution (Mw/Mn, relative to polystyrene standards, Mw: weight-average molecular weight, Mn: number-average molecular weight) measured by gel permeation chromatography (GPC) is preferably 1 to 3, and more preferably 1.5 to 2.5.

With propylene/α-olefin copolymer (B2), it is preferred that the melting point of Tm (° C.) and the co-monomer content (M in mol %) determined by $^{13}$C-NMR satisfy the relation, $$146\exp(-0.022M) \geq Tm \geq 125\exp(-0.032M).$$

Any copolymer satisfying the above relation may be used in the second aspect without particular limitation on "M", but "M" is generally in the range of 5 to 45.

In propylene/α-olefin copolymer (B2), the melt flow rate (MFR) determined at 230° C. under a load of 2.16 kg in accordance with ASTM D1238 (in the present specification, often called "MFR" (230° C.)) is generally 0.1 to 40 g/10 min, and preferably 0.5 to 20 g/10 min.

Propylene/α-olefin copolymer (B2) preferably has the same triad tacticity (mm-fraction) as that of propylene/ethylene/α-olefin copolymer (B1) of the first aspect of the invention, whereby the same effect can be obtained.

Namely, the triad tacticity (mm-fraction) of propylene/α-olefin copolymer (B2) is preferably 85% or more, more preferably 85% to 97.5%, still more preferably 87% to 97%, and particularly preferably 90% to 97% as determined by $^{13}$C-NMR. With the above range of triad tacticity (mm-fraction), particularly well-balanced flexibility and mechanical strength is attained, which is desirable for the present invention. The mm-fraction can be determined with the method described in WO 04/087775 from page 21, line 7 to page 26, line 6.

Propylene/α-olefin copolymer (B2) is publicly known and can be produced by the method described in WO 04/087775. Propylene/α-olefin copolymer (B2) is preferably produced using a metallocene catalyst.

It is preferred that propylene/α-olefin copolymer (B2) be not propylene/ethylene/$C_4$-$C_{20}$ α-olefin copolymer containing 45 to 89 mol % of propylene-derived structural units, 10 to 25 mol % of ethylene-derived structural units, and 0 to 30 mol % of $C_4$-$C_{20}$ α-olefin-derived structural units.

<Styrene-Based Elastomer (C2)>

Styrene-based elastomer (C2) is the same as styrene-based elastomer (C1) used in the first aspect of the invention. The type and styrene content thereof are also the same as (C1).

<Ethylene/α-Olefin Random Copolymer (D2)>

The method for producing ethylene/α-olefin random copolymer (D2) is not particularly limited, but there is employed a known method using a vanadium catalyst, a titanium catalyst, a metallocene catalyst, or the like. In particular, the copolymer produced using the metallocene catalyst generally has a molecular weight distribution (Mw/Mn) of 3 or less, and is suitably used for the second aspect of the invention.

Ethylene/α-olefin random copolymer (D2) is the same as ethylene/α-olefin random copolymer (D1) used in the first aspect of the invention except for the production method.

<Softener (E2)>

Softener (E2) is the same as softener (E1) used in the first aspect of the invention.

<Thermoplastic Resin Composition (X2)>

Thermoplastic resin composition (X2) of the second aspect of the invention comprises (A2), (B2), (C2), (D2), and (E2):

5 to 95 wt % of propylene/α-olefin copolymer (B2) whose melting point is not higher than 100° C. or not observed when measured with a differential scanning calorimeter (DSC);

5 to 95 wt % of styrene-based elastomer (C2);

0 to 90 wt % of isotactic polypropylene (A2);

0 to 70 wt % of ethylene/α-olefin copolymer (D2) whose density is 0.850 to 0.910 g/cm$^3$;

(wherein the total of (A2)+(32)+(C2)+(D2) is 100 wt %) and softener (E2) in an amount of 0 to 400 parts by weight relative to 100 parts by weight of the total of (A2)+(B2)+(C2)+(D2).

Here, the content of component (B2) is preferably 5 to 85 wt %, and more preferably 10 to 75 wt %; the content of component (C2) is preferably 15 to 95 wt %, and more preferably 25 to 90 wt %; the content of component (A2) is preferably 0 to 80 wt %, and more preferably 0 to 65 wt %; and the content of component (D2) is preferably 0 to 65 wt %, and more preferably 0 to 60 wt %.

When component (A2) is contained as an essential component, the content of component (B2) is 5 to 94 wt %, preferably 5 to 83 wt %, and more preferably 10 to 72 wt %; the content of component (C2) is 5 to 95 wt %, preferably 15 to 95 wt %, and more preferably 25 to 90 wt %; the content of component (A2) is 1 to 90 wt %, preferably 2 to 80 wt %, and more preferably 3 to 65 wt %; and the content of component (D2) is 0 to 70 wt %, preferably 0 to 65 wt %, and more preferably 0 to 60 wt %.

Thermoplastic resin composition (X2) may also contain softener (E2) in an amount of 0 to 400 parts by weight, preferably 0 to 200 parts by weight, and more preferably 0 to 150 parts by weight, relative to 100 parts by weight of the total of (A2), (B2), (C2), and (D2). When component (E2) is contained in the composition, the lower limit of the content of (E2) is not limited to, but, for example, 1 part by weight or more relative to 100 parts by weight of the total of (A2), (B2), (C2), and (D2).

For instance, when the composition (X2) contains isotactic polypropylene (A2) as an essential component and is used for convenience goods, skin materials (artificial leather), cap liners, automobile interior materials, packing, gaskets, waterproof sheets, or the like as described later, the content of component (B2) is 5 to 50 wt %, preferably 15 to 50 wt %, and more preferably 20 to 45 wt %; the content of component (C2) is 5 to 90 wt %, preferably 10 to 80 wt %, and more preferably 20 to 75 wt %; the content of component (A2) is 5 to 45 wt %, preferably 5 to 40 wt %, and more preferably 5 to 35 wt %; and the content of component (D2) is 0 to 50 wt %, preferably 0 to 40 wt %, and more preferably 0 to 30 wt %. Here, (X2) may also contain, as an optional component, softener (E2) in an amount of 1 to 400 parts by weight, preferably 1 to 350 parts by weight, and more preferably 1 to 300 parts by weight, relative to 100 parts by weight of the total of (A2), (B2), (C2), and (D2). The composition provides well-balanced flexibility with scratch and whitening resistances, and it can be well kneaded even at low temperatures.

For instance, when (X2) contains isotactic polypropylene (A2) as an essential component and it is used for home electric appliance components, automobile exterior materials, packaging sheets, monofilaments, or the like as described later, the content of component (B2) is 5 to 45 wt %, preferably 5 to 35 wt %, and more preferably 5 to 30 wt %; the content of component (C2) is 5 to 45 wt %, preferably 5 to 35 wt %, and more preferably 5 to 30 wt %; the content of component (A2) is 50 to 90 wt %, preferably 60 to 90 wt %, and more preferably 65 to 90 wt %; and the content of component (D2) is 0 to 30 wt %, preferably 0 to 25 wt %, and more preferably 0 to 20 wt %. Here, (X2) may also contain, as an optional component, softener (E2) in an amount of 1 to 100 parts by weight, preferably 1 to 70 parts by weight, and more preferably 1 to 50 parts by weight, relative to 100 parts by weight of the total of (A2), (B2), (C2), and (D2). With such composition, particularly, well-balanced mechanical properties such as tensile modulus, transparency, impact resistance, scratch resistance, and whitening resistance can be attained.

Unless the objects of the second aspect of the invention are impaired, thermoplastic resin composition (X2) may contain other resins, other rubbers, inorganic fillers or others; and may further contain additives like those for the first aspect of the invention. The content of these additional resins, rubbers, inorganic fillers, and additives is not particularly limited unless the objects of the second aspect of the invention are impaired. An exemplary embodiment concerning the content of these additional resins, rubbers, inorganic fillers, and additives is the same as that in the first aspect of the invention.

That is, unless the objects of the second aspect of the invention are impaired, thermoplastic resin composition (X2) may additionally contain other resins, other rubbers, inorganic fillers, or others, and also additives such as weathering stabilizers, heat stabilizers, antistatic agents, anti-slip agents, anti-blocking agents, anti-fogging agents, lubricants, pigments, dyes, plasticizers, anti-aging agents, hydrochloric acid absorbers, antioxidants, and nucleating agents. There are no particular limitations on the amount of these additional resins, rubbers, inorganic filler, additives, and others added to thermoplastic resin composition (X2), unless the objects of the second aspect are impaired. In an exemplary embodiment, the total of propylene/α-olefin copolymer (B2), styrene-based elastomer (C2), if necessary isotactic polypropylene (A2), if necessary ethylene/α-olefin copolymer (D2), and if necessary softener (E2), is 60 to 100 wt %, preferably 80 to 100 wt % of the whole composition, and the remainder is accounted for by the above-described other resins, rubbers, additives, inorganic filler, and others.

Thermoplastic resin composition (X2) is produced with a publicly known kneader as in the case of first aspect of the invention. Preferable methods are also the same.

Thermoplastic resin composition (X2) may be crosslinked, if necessary. The crosslinked product of the present invention can be produced by dynamic crosslinking with a known crosslinker or crosslinking auxiliary. Alternatively, post-crosslinking may be applied by heat or irradiation with electron beam or others to a molded article formed from thermoplastic resin composition (X2) alone or a mixture prepared by kneading thermoplastic resin composition (X2), a crosslinker, a crosslinking auxiliary, and others.

Particularly in dynamic crosslinking, since propylene/α-olefin copolymer (B2) has a low melting point and can be molded at low temperatures, there is an advantage that thermoplastic resin composition (X2) can be dynamically crosslinked under wide range of conditions.

<Molded Article Made of Thermoplastic Resin Composition (X2) or Crosslinked Material Thereof>

Thermoplastic resin composition (X2) and crosslinked product thereof can be used for molded articles, for example, sheets, unoriented or oriented films, filaments, and others with various shapes. The molded article made of thermoplastic resin composition (X2) or crosslinked product thereof may be an article in which whole body is made of thermoplastic resin composition (X2) or crosslinked product thereof, or in which at least one portion is composed of thermoplastic resin composition (X2) or a crosslinked product thereof. For example, the molded article may be, like a laminated film, a composite with another thermoplastic resin composition having different resin components or a composite with another material, in which the composite has a portion made of thermoplastic resin composition (X2) or crosslinked product thereof.

The above molded articles specifically include molded articles obtained with a known method as used in the first aspect of the invention. Hereinafter, the molded articles are described with reference to several examples.

For example, for extrusion-molded articles, there is no particular limitation on the shapes and application products of the molded article. They include, for example, those as described in the first aspect of the invention. Preferred examples are also the same. For example, there may be mentioned, sheets, (unoriented) films, pipes, hoses, electrical wire covers, tubes, and others. Especially, sheets (for example, skin material, etc.), films, tubes, catheters, monofilaments, and nonwoven fabrics are preferable.

The method for molding thermoplastic resin compositions (X2) or crosslinked products thereof by extrusion is the same as the first aspect of the invention.

Oriented films can be obtained similarly to the case of in the first aspect of the invention.

The draw ratio in drawing sheets or unoriented films and the thickness of resulting oriented films are the same as those in the first aspect of the invention.

As the film-shaped molded article, an inflation film can be produced. On inflation molding, drawdown is not likely to develop.

The film or film-shaped molded articles made of thermoplastic resin composition (X2) or the crosslinked material thereof are excellent inflexibility, strength, heat resistance, stretching property, impact resistance, aging resistance, transparency, see-through property, gloss, rigidity, moisture resistance, and gas barrier property, and can be widely used as packaging films and others.

The filament-shaped molded article is obtained in a way similar to that in the first aspect of the invention, and may be oriented in a way similar to that in the first aspect of the invention. The filament made of thermoplastic resin composition (X2) or crosslinked product thereof is excellent in transparency, flexibility, strength, heat resistance, impact resistance, and stretching property.

The nonwoven fabric is produced, specifically, by the spunbond method or the melt-blown method. The resulting nonwoven fabric is excellent in flexibility, mechanical strength, heat resistance, impact resistance, and stretching property.

The injection-molded article can be produced in a similar way to that in the first aspect of the invention. The injection-molded article made of thermoplastic resin composition (X2) or crosslinked product thereof is excellent in flexibility, transparency, strength, heat resistance, impact resistance, surface gloss, chemical resistance, abrasion resistance, and the like. It can be widely used for automobile interior trims, automobile exterior materials, housings for home electric appliances, containers, and others.

The blow-molded article can be produced in a similar way to that in the first aspect of the invention. The blow-molded article made of thermoplastic resin composition (X2) or crosslinked product thereof may be a multilayer molded article containing at least one layer made of thermoplastic resin composition (X2).

Extrusion blow molding and injection blow molding are conducted similarly to those in the first aspect of the invention. The blow-molded article made of thermoplastic resin composition (X2) or crosslinked product thereof is excellent in transparency, flexibility, heat resistance, impact resistance, and moisture resistance as well.

The press-molded articles include articles similar to the first aspect of the invention. Specific examples of stamping-molded articles also include articles similar to the first aspect of the invention.

The press-molded article made of thermoplastic resin composition (X2) or crosslinked product thereof is excellent in flexibility, heat resistance, transparency, impact resistance, aging resistance, surface gloss, chemical resistance, abrasion resistance, and others.

The molded article made of thermoplastic resin composition (X2) or crosslinked product thereof is excellent in mechanical strength such as hardness, excellent in rubber elasticity and permanent compression set at high temperatures as well as normal temperature, and also excellent in transparency and scratch resistance. In addition, when softener (E2) is contained, the article is excellent in balance of the shape retention and the rubber elasticity and permanent compression set, especially at high temperatures. Furthermore, the article is easily recycled and obtained in a cost-effective manner. Therefore, thermoplastic resin composition (X2) or crosslinked product thereof is suitable for use in automobile interior components, automobile exterior components, home electric appliance components, construction or building components, wrapping sheets, cap liners, gaskets, and convenience goods; particularly, it is suitable for use in automobile interior and exterior components, for which rubber elasticity is required even at high temperatures.

Specific examples of automobile interior components automobile exterior components, home electric appliance components, construction and building components, wrapping sheets, cap liners, and convenience goods made of thermoplastic resin composition (X2) or crosslinked material thereof include the same examples as described in the first aspect of the invention. As the method for producing the cap liners, there may be mentioned a method of punching out a sheet prepared from thermoplastic resin composition of the second aspect of the invention.

The method for producing caps with the cap liners and applications of the cap liners and the caps with the cap liners are the same as the first aspect of the invention.

The molded article made of crosslinked material of thermoplastic resin composition (X2) may be produced by molding crosslinked material of thermoplastic resin composition (X2). Alternatively the article can also be produced by applying post-crosslinking with heating or irradiating electron beam or others to a molded article formed from thermoplastic resin composition (X2) alone or a mixture prepared by kneading thermoplastic resin composition (X2), a crosslinker or crosslinking auxiliary, and others.

3. Third Aspect

Hereinafter, the third aspect of the present invention is explained in detail.

<Propylene-Based Polymer (A3)>

Propylene-based polymer (A3) used in the third aspect of the invention contains 90 mol % or more of propylene units, is insoluble in n-decane at 23° C., and has an intrinsic viscosity [η] of 0.01 to 10 dl/g as measured in decalin at 135° C. or a melt flow rate (MFR) of 0.01 to 50 g/10 min as measured at 230° C. under a load of 2.16 kg in accordance with ASTM D1238.

Propylene-based polymers (A3) include homopolypropylene and copolymers of propylene and at least one $C_2$-$C_{20}$ α-olefin except propylene. Specific examples of the $C_2$-$C_{20}$ α-olefins except propylene include the $C_2$-$C_{20}$ α-olefins used for isotactic polypropylene (A1) of the first aspect of the invention. Also, the preferable range is the same.

These α-olefins may form a random copolymer with propylene.

Propylene-based polymer (A3) may contain structural units derived from such α-olefin in an amount of 10 mol % or less, preferably 7 mol % or less.

If necessary, a plurality of propylene-based polymers (A3) may be used together. For example, two or more polymers different in melting point or rigidity may be used.

Propylene-based polymer (A3) is insoluble in n-decane at 23° C. Such property can be examined as follows.

Five grams of a sample are completely dissolved in 300 mL of n-decane at 145° C. and kept for 1 hr; the resultant solution is left at room temperature (23° C.) for 1 hr and stirred with a rotator for additional 1 hr; the solution is filtered through a 325-mesh screen; to the filtrate is added acetone about three times by volume of the filtrate to precipitate a polymer component dissolved in the solution; the mixture is through a 325-mesh screen to collect the polymer component, which is regarded as then-decane-soluble component.

In the third aspect of the invention, the component that is not soluble in n-decane is regarded as the n-decane-insoluble component. This n-decane-insoluble component corresponds to polypropylene-based polymer (A3). The n-decane-soluble component corresponds to, for example, part or all of other components or soft component (C3) described below, which may be optionally added.

For preparing composition (X3) of the third aspect of the invention, there may be used a polypropylene such as random PP and block PP, which contains both n-decane-insoluble propylene-based polymer (A3) and the n-decane-soluble component. The above random PP and block PP may contain the n-decane-soluble component in an amount of generally 30 wt % or less. In this case, in analyzing decay of magnetization, the intensity of magnetization for PP multiplied by the content of the n-decane-insoluble component in PP is regarded as the intensity of magnetization for component (A3). Note that, $f_B$ is calculated based on the content of component (B3) and the content of component (A3) in PP, that is, the content of the n-decane-insoluble component contained in PP.

It is desirable that propylene-based polymer (A3) has an intrinsic viscosity [η] of 0.01 to 10 dl/g, and preferably 1.2 to 5.0 dl/g as measured in decalin at 135° C., or a melt flow rate (MFR) of 0.01 to 50 g/10 min, and preferably 0.3 to 30 g/10 min as measured at 230° C. under a load of 2.16 kg in accordance with ASTM D1238.

The melting point of propylene-based polymer (A3) measured with a differential scanning calorimeter is generally 100° C. or higher, preferably 110 to 170° C., and more preferably 110 to 150° C.

Propylene-based polymer (A3) may be isotactic or syndiotactic, but the isotactic structure is preferred considering heat resistance and others.

To obtain polypropylene-based polymer composition (X3) containing propylene-based polymer (A3) insoluble in decane at 23° C., homopolypropylene excellent in heat resistance or homopolypropylene containing the propylene-based polymer (A3) insoluble in decane at 23° C. may be also used. A block polypropylene (known block polypropylene, having generally 3 to 30 wt % of n-decane-soluble rubber components) with well-balanced heat resistance and flexibility as long as it contains propylene-based polymer (A3) insoluble in decane at 23° C. may be also used. Propylene/α-olefin random copolymer (except soft propylene/α-olefin random copolymer (B3)) with well-balanced flexibility and transparency as long as it contains propylene-based polymer (A3) insoluble in decane at 23° C. may be used.

There is no particular limitation on the polypropylene containing propylene-based polymer (A3), but it is desirable that the content of the components insoluble in decane at 23° C. is generally 70 wt % or more, preferably 80 wt % or more, and more preferably 87 wt % or more.

There is no particular limitation on the polypropylene containing propylene-based polymer (A3), but it is desirable and the melting peak observed with a differential scanning calorimeter (DSC) is generally 100° C. or higher, and preferably 110 to 150° C.

The polypropylene containing propylene-based polymer (A3) can be produced in a similar way to that in producing isotactic polypropylene (A1) used in the first aspect of the invention.

<Soft Propylene/α-Olefin Random Copolymer (B3)>

Soft propylene/α-olefin random copolymer (B3) used in the third aspect of the invention satisfies all of requirements (b3-1) to (b3-5) below.

(b3-1) The intrinsic viscosity [η] measured in decalin at 135° C. is 0.01 to 10 dl/g, and preferably 0.05 to 10 dl/g.

(b3-2) The melting point is lower than 100° C., and preferably not higher than 60° C. or not observed when measured with a differential scanning calorimeter (DSC), wherein "melting point is not observed" means that any melting endothermic peak of crystal with a melting endothermic entalpy of crystal of 1 J/g or more is not observed in the temperature range of −150 to 200° C. The measurement conditions are as described in Examples of the third aspect of the invention.

(b3-3) The content of propylene-derived structural units is 60 to 75 mol %, and preferably 56 to 73 mol %; the content of ethylene-derived structural units is 10 to 14.5 mol %, and preferably 12 to 14 mol %; and the content of $C_4$-$C_{20}$ α-olefin-derived structural units is 10.5 to 30 mol %, and preferably 15 to 25 mol %. As the α-olefin, 1-butene is particularly preferable.

(b3-4) Triad tacticity (mm-fraction) determined by $^{13}$C-NMR is 85% to 97.5%, preferably 87% to 97%, and more preferably 90% to 97%. With the above range of mm-fraction, the flexibility and mechanical strength are particularly well-balanced, which is desirable for the third aspect of the invention. The mm-fraction can be determined in accordance with the method as described in WO 04/087775 from Page 21 line 7 to Page 26 line 6.

(b3-5) Molecular weight distribution (Mw/Mn, relative to polystyrene standards, Mw: weight-average molecular weight, Mn: number-average molecular weight) measured by gel permeation chromatography (GPC) is 1.0 to 3.0, and preferably 2.5 or less. The molecular weight distribution within the above range indicates that soft propylene/α-olefin random copolymer (B3) is composed of polymer chains with a uniform structure. With soft propylene/α-olefin random copolymer (B3) composed of polymer chains with a uniform structure, on heat treatment of molded articles at high temperatures (100° C. or higher), whitening can be suppressed more effectively than the case using a soft propylene/α-olefin random copolymer with a wider molecular weight distribution.

Desirable embodiments of soft propylene/α-olefin random copolymer (B3) have independently the following additional properties.

Soft propylene/α-olefin random copolymer (B3) is preferably the same as propylene/ethylene/α-olefin copolymer (B1) of the first aspect of the invention in the stress at 100% elongation (M100), crystallinity, and glass transition temperature Tg. These properties exhibit the same effects.

When soft propylene/α-olefin random copolymer (B3) shows a melting point (Tm in ° C.) in the endothermic curve obtained with a differential scanning calorimeter (DSC), the melting endothermic entalpy ΔH is generally 30 J/g or less and also satisfies the same relation between $C_3$ (propylene) content (mol %) and ΔH (J/g) as that of propylene/ethylene/α-olefin copolymer (B1) used in the first aspect of the invention.

The Shore A hardness of soft propylene/α-olefin random copolymer (B3) is generally 30 to 80, and preferably 35 to 70.

Soft propylene/α-olefin random copolymer (B3) desirably has a melt flow rate (MFR) in the range of 0.01 to 50 g/10 min, and preferably 0.05 to 40 g/10 min, as measured at 230° C. under a load of 2.16 kg in accordance with ASTM D1238.

When soft propylene/α-olefin random copolymer (B3) is used, regardless of the type of propylene-based polymer (A3), resultant propylene-based polymer composition (X3) exhibits excellent whitening resistance, transparency, flexibility, heat resistance, and stretching property, which is suitable for the third aspect of the invention.

Soft propylene/α-olefin random copolymer (B3) can be produced, for example, by the method described in WO 04/87775.

<Propylene-Based Polymer Composition (X3)>

Propylene-based polymer composition (X3) of the third aspect comprises propylene-based polymer (A3) in an amount of 10 to 98 wt %, preferably 20 to 95 wt %, and more preferably 50 to 93 wt %; and soft propylene/α-olefin random copolymer (B3) in an amount of 2 to 90 wt %, preferably 5 to 80 wt %, and more preferably 7 to 50 wt % wherein the total of (A3) and (B3) is 100 wt %.

In a preferred embodiment of propylene-based polymer composition (X3), intensites of magnetization decaying due to transverse relaxation of propylene-based polymer (A3), soft propylene/α-olefin random copolymer (B3), and propylene-based polymer composition (X3-1) described below each measured to 1000 μs in pulse NMR measurements (Solid-echo experiment, observed for $^1$H) satisfy relation (3-1) below in the entire range of t (observing time) from 500 to 1000 μs:

$$M(t)_A \times (1-f_B) + M(t)_B \times f_B - M(t)_{X-1} \geq 0.02 \qquad 3\text{-}1$$

$M(t)_A$: the intensity of magnetization in decay process at time t measured for propylene-based polymer (A3) used in propylene-based polymer composition (X3), $M(t)_B$: the intensity of magnetization in decay process at time t measured for soft propylene/α-olefin random copolymer (B3) used in propylene-based polymer composition (X3), $M(t)_{X-1}$: the intensity of magnetization in decay process at time t measured for propylene-based polymer composition (X3-1), which is prepared by melt-kneading soft propylene/α-olefin random copolymer (B3) used in propylene-based polymer composition (X3) and polypropylene containing propylene-based polymer (A3) used in propylene-based polymer composition (X3) in the same ratio at that in propylene-based polymer composition (X3), and $f_B$: the weight ratio of soft propylene/α-olefin random copolymer (B3) to the total of propylene-based polymer (A3) and soft propylene/α-olefin random copolymer (B3) in propylene-based polymer composition (X3); $0.02 \leq f_B \leq 0.90$, wherein t (observation time) is 500 to 1000 μs; each of $M(t)_A$, $M(t)_B$, and $M(t)_{X-1}$ is normalized into 0 to 1 (the maximum magnitude is set to be 1).

Composition (X3-1) is prepared as follows: polypropylene containing propylene-based polymer composition (X3) used in propylene-based polymer (X3) and soft propylene/α-olefin random copolymer (B3) used in propylene-based polymer composition (X3) are melt-kneaded so that the ratio of polymer (A3) and copolymer (B3) is the same as that in propylene-based polymer composition (X3). The polypropylene containing propylene-based polymer (A3) may be composed only of propylene-based polymer (A3) or may contain, as described above, components other than propylene-based polymer (A3), for example, the component soluble in decane at 23° C., in an amount of 30 wt % or more of the polypropylene.

The above composition is obtained by using a known melt-kneader at 160 to 300° C. Specifically, there may be mentioned a method in which source materials are loaded in an amount of 70 vol % or more into a Labo plast-mill (for example, manufactured by Toyo Seiki Seisaku-Sho, Ltd.) and kneaded at 160 to 250° C. with 30 rpm to 100 rpm for 3 min or more; and the kneaded material is air-cooled to obtain the desired composition.

Hereinafter, the conditions for the pulse NMR measurement and the definition of decay curves are explained.

In the third aspect of the invention, the decay curve M(t) represents the behavior of magnetization generally called spin-spin relaxation. The decay curve, which represents the relation of the intensity of magnetization "M" versus the observation time "t" (0 to 1000 μs), can be obtained under the following conditions in the pulse NMR measurement.

Sample preparation: about 0.5 g of a sample is loaded in a 10-mmΦ glass tube

Frequency: proton resonance frequency at 25 MHz

Method: Solid-echo sequence

90°-pulse: 2.0 μs, pulse delay: 4 s, and number of scans: 8

Measuring temperature: 100° C.

Details for decay curve M(t) are described in "Kakujiki Kyomei No Kiso To Genri" (1987) p. 258 by Ryuzo Kitamaru, Kyoritsu Shuppan; and Kubo, R. and Tomita, K., J. Phys. Soc. Jpn., 9 (1954), 888.

The decay curve M(t) ranges from 0 to 1, because it is normalized on the basis of its maximum value.

Although the reason is unclear why preferred composition (X3) can be obtained when the above relation is satisfied, the present inventors consider as follows. M(t) is an index representing the motion of the polymer molecular chains, and if there were no molecular level interaction between propylene-based polymer (A3) and soft propylene/α-olefin random copolymer (B3) in a propylene-based polymer composition, inequality (3-1) would be approximately reduced to the following equation:

$$M(t)_A \times (1-f_B) + M(t)_B \times f_B = M(t)_{X-1} \qquad 3\text{-}1\text{-}2$$

If there are molecular level interactions between propylene-based polymer (A3) and soft propylene/α-olefin random copolymer (B3) in the propylene-based polymer composition, the molecular motion of components (A3) and (B3) will change. In particular, when the molecular motion of soft propylene/α-olefin random copolymer (B3) with a quite low crystallinity is constrained by the interaction, the decay of the magnetization for the propylene-based polymer composition becomes fast, and hence, formula (3-1) is satisfied.

With the propylene polymer composition satisfying the above relation, molded articles thereof not suffer from separation or break between propylene-based polymer (A3) and soft propylene/α-olefin random copolymer (B3) even when deformation or impact is applied to the article, and therefore it is likely to exhibit excellent whitening resistance, scratch resistance, heat resistance, and stretching property while retaining flexibility. In addition, because crystalline propylene-based polymer (A3) and non-crystalline soft propylene/α-olefin random copolymer (B3) are mixed well in the composition, when the molded article of the composition is kept at high temperatures (annealed), whitening of the molded article caused by the growth of crystalline component during annealing is likely to be suppressed.

In the third aspect of the invention, composition (X3-1) satisfies preferably formula (3-1-3), and more preferably formula (3-1-4) below:

$$\{M(t)_A \times (1-f_B) + M(t)_B \times f_B\} - M(t)_{X-1} > 0.04 \qquad 3\text{-}1\text{-}3,$$

$$\{M(t)_A \times (1-f_B) + M(t)_B \times f_B\} - M(t)_{X-1} > 0.05 \qquad 3\text{-}1\text{-}4,$$

wherein, t is 500 to 1000 μs.

When propylene-based polymer composition (X3) further has the property specified by formula (3-2) below besides the above properties, the molded article thereof is well-balanced flexibility and mechanical strength, and suitable for use in the third aspect of the invention. Furthermore, composition (X3) satisfies preferably formula (3-2-2), and more preferably formula (3-2-3) below.

$$TS_{X-1} \geq -35 f_B + TS_0 \qquad (3\text{-}2),$$

$$TS_{X-1} \geq -30 f_B + TS_0 \qquad (3\text{-}2\text{-}2),$$

$$TS_{X-1} \geq -25 f_B + TS_0 \qquad (3\text{-}2\text{-}3),$$

$TS_{X-1}$: strength at break of propylene-based polymer composition (X3-1) obtained by melt-kneading propylene-based polymer (A3) and propylene/α-olefin random copolymer (B3) at the same weight ratio as that in propylene-based polymer composition (X3), $TS_0$: strength at break of propylene-based polymer (A3) used in propylene-based polymer composition (X3), and $f_B$: composition ratio of soft propylene/α-olefin random copolymer (B3) (0.02 ≤ $f_B$ ≤ 0.90).

Whether these relations are satisfied or not is examined, for example, by using a 2-mm thick pressed sheet obtained under the following press-molding conditions at a tensile speed of 200 mm/min in accordance with JIS K7113-2.

Press-molding conditions:

heating time: 5 to 7 min, heating temperature: 190 to 250° C., pressure on heating: 0.1 MPa or higher, and cooling speed: 200° C./5 min or higher (cooling down to room temperature in 5 min).

When propylene-based polymer composition (X3) of the third aspect of the invention further has a property represented by formula (3-3) below besides the above properties, the molded article thereof has excellent whitening resistance and recovery property; thus such composition is preferred. The composition satisfies preferably formula (3-3-2), and more preferably formula (3-3-3).

$$EL(YS) \geq EL(YS)_0 + f_B \times 15 \qquad (3\text{-}2)$$

$$EL(YS) \geq EL(YS)_0 + f_B \times 17 \qquad (3\text{-}2\text{-}2)$$

$$EL(YS) \geq EL(YS)_0 + f_B \times 20 \qquad (3\text{-}2\text{-}3)$$

EL(YS): elongation where yield stress is attained in the tensile test (elongation at yield) of propylene-based polymer composition (X3-1) obtained by melt-kneading propylene-based polymer (A3) and soft propylene/α-olefin random copolymer (B3) at the same ratio as that in propylene-based polymer composition (X3)

$EL(YS)_0$: elongation where yield stress is attained in the tensile test (elongation at yield) of propylene-based polymer (A3) used in propylene-based polymer composition (X3).

$f_B$: composition ratio of soft propylene/α-olefin random copolymer (B3) (0.02 ≤ $f_B$ ≤ 0.90)

Whether these relations are satisfied or not is examined, for example, by testing a 2-mm thick press-molded sheet obtained under the following press-mold conditions at a tensile speed of 200 mm/min in accordance with JIS K7113-2.

Press-mold conditions:

heating time: 5 to 7 min, heating temperature: 190° C. to 250° C., heating pressure: 0.1 MPa or higher, and cooling speed: 200° C./5 min or higher (cooling to room temperature in 5 min)

Note that when the propylene-based polymer composition has no yield point, the composition is regarded as satisfying the property represented by formula 3-3.

Propylene-based polymer composition (X3) is produced with a known kneader as in the first aspect of the invention. Preferable methods are also the same.

<Ethylene-Based Polymer and Styrene-Based Polymer (C3)>

Propylene-based polymer composition (X3) of the third aspect of the invention may further contain at least one polymer (soft component) that is selected from ethylene-based polymer and styrene-based polymer and has a Shore A hardness of 95 or less and/or a Shore D hardness of 60 or less. Shore A hardness and Shore D hardness are measured with a 2-mm thick press-molded sheet that is prepared at a press temperature of 190° C., cooled to room temperature, and left at 23° C. for 3 days before measurement.

A polymer having a Shore A hardness of 20 or more is more preferable.

Specific examples of the ethylene-based polymer or styrene-based polymers include styrene-based elastomers, ethylene/α-olefin random copolymers, ethylene/vinyl acetate copolymers, ethylene/acrylic acid copolymers, ethylene/methyl methacrylate copolymers, and others. A styrene-based elastomer (C3-1) and ethylene/α-olefin random copolymer (C3-2) below are preferably used.

Specific examples of styrene-based elastomer (C3-1) include hydrogenated diene polymers comprising polybutadiene block segments and styrene type compound (including styrene itself, the same applies hereinafter)/butadiene copolymer block segments, hydrogenated diene polymers comprising polyisoprene block segments and styrene type compound/isoprene copolymer block segments, block copolymers comprising polymer blocks mainly derived from a styrene type compound and polymer blocks mainly derived from a conjugated diene; hydrogenated products of random copolymers of styrene type compound and conjugated diene, hydrogenated derivatives of block copolymers comprising polymer blocks mainly derived from a styrene type compound and polymer blocks mainly derived from a conjugated diene; and others. Known elastomers may be used without limitation. Styrene-based elastomer (C3-1) may be used alone or in combination.

Styrene-based elastomer (C3-1) may be oil-extended. For example, styrene-based elastomer (C3-1) can incorporate a publicly known paraffin oil having a kinematic viscosity at 40° C. of 20 to 800 cSt and preferably 40 to 600 cSt, a pour point of 0 to −40° C. and preferably 0 to −30° C., and a flash temperature (COC test) of 200 to 400° C. and preferably 250 to 350° C. Thus, incorporating the paraffin oil significantly improves flexibility of molded articles. The amount of the paraffin oil to be added is preferably 10 to 150 parts by weight relative to 100 parts by weight of styrene-based elastomer (C3-1) before oil-extended. In this case, combination of styrene-based elastomer (C3-1) before oil-extended and the oil is regarded as one styrene-based elastomer. The oil may be separately added to propylene-based polymer composition (X3). In this case, the oil is also regarded as one of the components of polymer (C3).

Ethylene/α-olefin random copolymer (C3-2) refers to a copolymer obtained by copolymerizing ethylene with an α-olefin having 3 to 20 carbon atoms, preferably 3 to 10 carbon atoms, and the copolymer with the following properties is preferably used:

(a) the density at 23° C. in accordance with ASTM 1505 is in the range of 0.850 to 0.910 g/cm$^3$, preferably 0.860 to 0.905 g/cm$^3$, and more preferably 0.865 to 0.895 g/cm$^3$; and (b) the MFR at 190° C. under a load of 2.16 kg is in the range of 0.1 to 150 g/10 min and preferably 0.3 to 100 g/10 min.

The crystallinity of ethylene/α-olefin random copolymer determined by X-ray diffractometry is 40% or less, preferably 0 to 39%, and more preferably 0 to 35%.

Specific examples of the $C_3$-$C_{20}$ α-olefin used as the co-monomer include propylene, 1-butene, 1-pentene, 1-hexene, 4-methylpent-1-ene, 1-octene, 1-decene, and 1-dodecene. These co-monomers may be used alone or in combination. Among them, propylene, 1-butene, 1-hexene, and 1-octene are preferable. If necessary, a small amount of another co-monomer, for example, a diene such as 1,6-hexadiene and 1,8-octadiene, a cycloolefin such as cyclopentene, or others may be used. The α-olefin content in the copolymer is generally 3 to 50 mol %, preferably 5 to 30 mol %, and more preferably 5 to 25 mol %.

The molecular structure of the copolymer may be linear or branched with long or short side-chains. Further, a plurality of different ethylene/α-olefin random copolymers may be used as a mixture.

The methods for producing ethylene/α-olefin random copolymer (C3-2) are not particularly limited, but include a known method using a vanadium catalyst, a titanium catalyst, a metallocene catalyst, or the like. In particular, the copolymer produced using a metallocene catalyst has a molecular weight distribution (Mw/Mn) of generally 3 or lower, and is suitable for use in the third aspect of the invention.

Ethylene/α-olefin random copolymer (C3-2) may be oil-extended. For example, known paraffin oil as described above can be incorporated into ethylene/α-olefin random copolymer (C3-2), and addition of paraffin oil significantly improves the flexibility of molded articles. The amount of paraffin oil to be added is preferably 10 to 150 parts by weight relative to 100 parts by weight of ethylene/α-olefin random copolymer (C3-2) before oil-extended. In this case, the combination of ethylene/α-olefin random copolymer (C3-2) before oil-extended and the oil is regarded as one ethylene/α-olefin random copolymer (C3-2). Oil may be separately added to propylene-based polymer composition (X3). In this case, the oil is also regarded as one of the components of polymer (C3).

When one or more polymers (C3) selected from ethylene-based polymers and styrene-based polymers are used, the amount thereof is not particularly limited; the total of one or more polymers (C3) selected from ethylene-based polymers and styrene-based polymers is generally 1 to 40 parts by weight, preferably 5 to 30 parts by weight, and more preferably 5 to 20 parts by weight, relative to 100 parts by weight of the total of propylene-based polymer (A3) and propylene/α-olefin copolymer (B3). Addition of such polymer (C3) is preferred, because the composition provides molded articles with improved impact resistance.

Propylene-based polymer composition (X3) may contain other resins besides (A3), (B3), and (C3), other rubbers besides (A3), (B3), and (C3), known adhesion improvers, or the additives as described in the first aspect of the invention, unless the objects of the third aspect of the invention are impaired. The amount of these components is not limited within such range that the objects of the third aspect of the invention are not impaired. In one embodiment, the amount is 40 parts by weight or less and preferably 20 parts by weight or less, relative to 100 parts by weight of the total of propylene-based polymer (A3), soft propylene/α-olefin random copolymer (B3), and, if any, one or more polymer (C3) selected from ethylene-based polymers and styrene-based polymers.

Particularly, in applications where a known pigment is added for coloring, propylene-based polymer composition (X3) of the third aspect of the invention is suitable, because it provides molded articles with excellent whitening resistance.

The molded article of the third aspect of the invention is produced from propylene-based polymer composition (X3) using a known molding method such as blow molding, injection molding, extrusion molding, and inflation molding. Specific examples of the molded articles related to the third aspect include blow-molded articles, injection-molded articles, extrusion-molded articles including films and sheets, inflation-molded articles, tubes, and others. More particularly, they include containers such as infusion solution bottles, food cups, food bottles, sanitary bottles such as shampoo bottles, cosmetics bottles, and tubes; sheets or films such as food packaging films, electronic component-packaging films, and other packaging sheet or films; caps, home electric appliance housings, automobile components, convenience goods, stationery, and others.

Among them preferred are blow-molded or injection-molded containers, injection-molded articles, extrusion-molded sheets, films or tubes, and inflation-molded sheets or films.

Another preferred example of the molded article related to the third aspect is a wrap film for foods (food packaging material in a form of wrap film).

The wrap film for foods is a single-layer or multilayer film having at least one layer of the molded article of the third aspect of the invention.

Multilayer configuration may be adopted to attain properties other than the effects of the third aspect of the invention, such as cutting property and stickiness. The resin components to form a layer other than the layer formed from propylene-based polymer composition (X3) include polypropylene, high-density polyethylene, low-density polyethylene, linear low-density polyethylene, ultra-low-density polyethylene, nylon, poly(4-methyl-1-pentene), ethylene/vinyl acetate copolymer, and others. Preferred are ethylene-based copolymers containing 70 mol %, or more of ethylene units.

The thickness of the wrap film for foods related to the third aspect is not particularly limited to, but generally 5 to 50 μm and preferably 8 to 30 μm in view of film strength, flexibility, and transparency.

The film related to the third aspect is produced using a single-layer or multilayer T-die molding machine or an inflation molding machine conventionally used for molding polyolefin films.

In order to adjust stickiness and anti-clouding property, the food wrap film of the third aspect may contain a known tackifier or surfactant. The tackifiers include liquid hydrocarbons such as polybutene and an olefin oligomer, liquid paraffin, aliphatic petroleum resins, alicyclic petroleum resins, and the like. The surfactants include glycerin fatty acid monoesters, glycerin fatty acid esters, sorbitan fatty acid esters, and the like. These may be used alone or as a mixture of two or more.

In the food wrap film of the third aspect, when at least the layer made of propylene-based polymer composition (X3) is uniaxially or biaxially oriented, the film has excellent nerve and has no yield point while retaining the above properties. The lack of yield point indicates that the film retains sufficient stress and tension, for example, when it is stretched to cover a container or the like, and hence the film is suitable for wrapping. The draw ratio is not particularly limited; for example, in uniaxial orientation, the desired draw ratio is 1.2 to 5.0 and preferably 1.5 to 3.5. In biaxial orientation, it is desired that the longitudinal draw ratio is 1.2 to 5.0 and preferably 1.5 to 3.5 and the transverse one is 1.2 to 5.0 and preferably 1.5 to 3.5.

The food wrap film using propylene-based polymer composition (X3) has excellent heat resistance, transparency, and whitening resistance.

Another preferred example of the molded article related to the third aspect is a cap liner, which has at least one layer made of propylene-based polymer composition (X3).

4. Fourth Aspect

Hereinafter, the fourth aspect of the present invention is explained in detail.

<Isotactic Polypropylene (A4)>

Isotactic polypropylenes (A4) used in the fourth aspect include homopolypropylene and copolymers of propylene and at least one $C_2$-$C_{20}$ α-olefin except propylene. Specific examples of the $C_2$-$C_{20}$ α-olefins except propylene include the same as those for isotactic polypropylene (A1) used in the first aspect. Also, the preferable range is the same.

These α-olefins may form a random or block copolymer with propylene.

Structural units derived from such α-olefin may be contained in a ratio of 10 mol % or less, preferably 7 mol or less, in all monomers including propylene.

Isotactic polypropylene (A4) preferably has the same properties as those of isotactic polypropylene (A1) used in the first aspect concerning isotactic pentad fraction (mmmm) and melt flow rate (MFR).

There may be used, if necessary, a plurality of isotactic polypropylenes (A4) together, for example, two or more components different in melting point or rigidity.

To attain desired properties, there may be used, as isotactic polypropylene (A4), one or more polypropylenes selected from homopolypropylene with excellent heat resistance (publicly known, generally containing 3 mol % or less of comonomer except propylene), block polypropylene with excellent balance of heat resistance and flexibility (publicly known, generally containing 3 to 30 wt % of n-decane-soluble rubber components), and random polypropylene with excellent balance of flexibility and transparency (publicly known, generally having a melting peak of 100° C. or higher and preferably in the range of 115° C. to 160° C. as measured with a differential scanning calorimeter (DSC)).

Such isotactic polypropylene (A4) can be produced similarly to isotactic polypropylene (A1) used in the first aspect.

<Propylene/Ethylene/α-Olefin Copolymer (B4)>

Propylene/ethylene/α-olefin copolymer (B4) used in the fourth aspect of the invention is a copolymer with at least one $C_2$-$C_{20}$ α-olefin except propylene and its melting point is lower than 100° C. and preferably not observed when measured with a differential scanning calorimeter DSC. Here, the expression "melting point is not observed" means that any melting endothermic peak of crystal having a melting endothermic entalpy of crystal of 1 J/g or more is not observed in the temperature range of −150 to 200° C. The measurement conditions are as described in Examples of the fourth aspect of the invention.

In propylene/ethylene/α-olefin copolymer (B4), the content of propylene-derived structural units is 40 to 85 mol %, preferably 58 to 80 mol %, and more preferably 58 to 74 mol %; the content of ethylene-derived structural units is 5 to 30 mol %, preferably 10 to 14.5 mol %, and more preferably 11 to 14.5 mol %; and the content of $C_4$-$C_{20}$ α-olefin-derived structural units is 5 to 30 mol %, preferably 10 to 27.5 mol %, and more preferably 15 to 27.5 mol %.

Propylene/ethylene/α-olefin copolymer (B4) containing the propylene-derived structural units, ethylene-derived structural units, and $C_4$-$C_{20}$ α-olefin-derived structural units at the above ratio has excellent compatibility with isotactic polypropylene (A4), and therefore, the resulting propylene-based polymer composition is likely to exhibit excellent transparency, flexibility, heat resistance, and scratch resistance.

When the contents of structural units derived from propylene, ethylene, and a $C_4$-$C_{20}$ α-olefin are in the preferable ranges, propylene/ethylene/α-olefin copolymer (B4) attains more excellent balance of heat resistance and scratch resistance. More specifically, the copolymer with a more satisfactory ethylene content provides oriented films with excellent transparency and impact resistance; and the copolymer with a more satisfactory α-olefin content provides oriented films with excellent flexibility as well as transparency and impact resistance. Therefore, such copolymer can be suitably used in the fourth aspect.

Among the $C_4$-$C_{20}$ α-olefins, 1-butene is especially preferable in the fourth aspect of the invention.

Propylene/ethylene/α-olefin copolymer (B4) preferably has the same properties as propylene/ethylene/α-olefin copolymer (B1) used in the first aspect of the invention concerning intrinsic viscosity [η], crystallinity, glass transition temperature Tg, molecular weight distribution (Mw/Mn), and triad tacticity (mm-fraction). Effects of these properties are also similar.

For instance, propylene/ethylene/α-olefin copolymer (B4) has the molecular weight distribution (Mw/Mn, relative to polystyrene standards, Mw: weight-average molecular weight, Mn: number-average molecular weight) of 4.0 or less, preferably 3.0 or less, and more preferably 2.5 or less as measured with GPC.

The triad tacticity (mm-fraction) of the propylene/ethylene/α-olefin copolymer (B4) measured by $^{13}$C-NMR is preferably 85% or more, more preferably 85% to 97.5%, still more preferably 87% to 97%, and particularly preferably 90% to 97%. With the above range of triad tacticity, the balance of flexibility and mechanical strength is particularly excellent, which is suitable for the fourth aspect of the invention. The mm-fraction can be determined by the method described in WO 04/087775 from Page 21 line 7 to Page 26 line 6.

When propylene/ethylene/α-olefin copolymer (B4) has a melting point (Tm in ° C.) in the endothermic curve measured with a differential scanning calorimeter (DSC), the melting endothermic entalpy ΔH is generally 30 J/g or less, and the same relation between the C3 content (mol %) and melting endothermic entalpy ΔH (J/g) is satisfied as with propylene/ethylene/α-olefin copolymer (B1) used in the first aspect of the invention.

In the fourth aspect of the invention, the propylene/ethylene/α-olefin copolymer (B4) exhibiting no melting point is more preferred.

Propylene/ethylene/α-olefin copolymer (B4) may be partly graft-modified with a polar monomer. The polar monomers include hydroxyl group-containing ethylenically unsaturated compounds, amino group-containing ethylenically unsaturated compounds, epoxy group-containing ethylenically unsaturated compounds, aromatic vinyl compounds, unsaturated carboxylic acids or derivatives thereof, vinyl esters, vinyl chloride, and others.

<Resin Composition (X4)>

The film of the fourth aspect of the invention is a single-layer or multilayer film having at least one layer made of resin composition (X4) containing (A4) and (B4), wherein the layer of the resin composition is at least uniaxially or biaxially oriented. Resin composition (X4) used in the fourth aspect contains (A4) and (B4) below:

isotactic polypropylene (A4) in an amount of 10 to 97 wt %, preferably 50 to 95 wt %, and more preferably 55 to 95 wt %; and propylene/ethylene/α-olefin copolymer (B4) in an amount of 3 to 90 wt %, preferably 5 to 50 wt %, and more preferably 5 to 45 wt %.

If the contents of (A4) and (B4) were out of the above ranges, it would be difficult to form into an oriented film, and the film would have stretching property and significantly lowered nerve.

In order to improve the heat shrink ratio of the film related to the fourth aspect, there may be added hydrocarbon resin (C4) having a softening point of 50° C. to 160° C. as measured with the ring-and-ball method in accordance with ASTM-D36 and a number-average molecular weight of 300 to 1400 as measured with GPC. Specific examples of hydrocarbon resins (C4) include publicly known petroleum resin (aliphatic hydrocarbon resin, aromatic hydrocarbon resin, alicyclic hydrocarbon resin, hydrogenated derivatives thereof, etc.), rosin, rosin ester, terpene resin, and hydrogenated derivatives thereof.

The amount of hydrocarbon resin (C4) added is preferably 3 to 70 parts by weight, and more preferably 5 to 50 parts by weight, relative to 100 parts by weight of resin composition (X4) composed of (A4) and (B4). With the amount in this range, the impact resistance of film is rarely lowered.

In order to further improve the impact resistance of the film related to the fourth aspect, there may be added publicly known ethylene/α-olefin random copolymer. This ethylene/α-olefin random copolymer preferably has the same properties as those of ethylene/α-olefin random copolymer (D1) used in the first aspect concerning density and MFR.

There is no particular limitation on the method for producing such ethylene/α-olefin random copolymer. The copolymer can be produced by copolymerizing ethylene and the α-olefin with a radical polymerization catalyst, a Philips catalyst, a Ziegler-Natta catalyst, or a metallocene catalyst. In particular, the copolymer produced with a metallocene catalyst has a molecular weight distribution (Mw/Mn) of generally 3 or less and is suitably used for the fourth aspect.

The amount of ethylene/α-olefin random copolymer added is preferably 1 to 30 parts by weight and more preferably 3 to 20 parts by weight, relative to 100 parts by weight of resin composition (X4) composed of (A4) and (B4). In the case of putting a high priority in film transparency, 20 parts by weight or less is preferable.

To resin composition (X4) there may also be added other resins, other rubbers, inorganic filler, and the like, and also additives as with the first aspect, as long as the objectives of the fourth aspect are not impaired. For resin composition (X4), the amounts of such other resins, other rubbers, inorganic filler, additives, and others are not particularly limited as long as the objectives of the fourth aspect are not impaired. In one embodiment, the total of isotactic polypropylene (A4), propylene/ethylene/α-olefin copolymer (B4), if any hydrocarbon resin (C4), and if any, the ethylene/α-olefin random copolymer is 60 to 100 wt %, and preferably 80 to 100 wt % of the whole composition.

<Films>

The film of the fourth aspect has at least one layer made of resin composition (X4) containing isotactic polypropylene (A4), propylene/ethylene/α-olefin copolymer (B4), and optionally hydrocarbon resin (C4), wherein the layer made of resin composition (X4) is at least uniaxially or biaxially oriented. The above layer can be produced by common molding and orientation methods for polyolefin resin films. For example, there may be employed a method in which a film molded by publicly known methods such as inflation molding and T-die molding is uniaxially or biaxially oriented with a heating roll/tenter at 40° C. to 180° C. and preferably 60° C. to 160° C. Simultaneous biaxial orientation with tubular molding technique may also be employed.

The draw ratio is not particularly limited to, but generally 1.5 or more, preferably 2 to 10, and more preferably 3 to 8. Exemplary embodiments include a uniaxially oriented film in which the draw ratio is generally 1.5 or more, preferably 2 to 10, more preferably 3 to 8; and a biaxially oriented film in which the longitudinal draw ratio is generally 1.5 or more, preferably 2 to 10, and more preferably 3 to 8 and the transverse draw ratio is generally 1.5 or more, preferably 2 to 10, and more preferably 3 to 8. The thickness of the oriented film thus obtained is generally 10 to 400 μm. In the fourth aspect, this oriented film can be used as a layer made of resin composition (X4).

The films of the fourth aspect with the multilayer structure include an embodiment in which (an)other film(s) is/are laminated on one side or both sides of the above film. The films to be laminated are not particularly limited to, but include films made of polyolefin such as polyethylene, polypropylene, polybutene, polycycloolefin resin, ethylene/vinyl acetate copolymer, ethylene/acrylic acid copolymer, and ethylene/methyl methacrylate copolymer; styrene-based resin film; films made of polyester such as polyethylene terephthalate and polybutylene terephthalate; films made of polyamide such as nylon-6 and nylon-6,6; ethylene/vinyl alcohol copolymer film; and others. As a laminate of adhesive polyolefin and gas-barrier resin, there may be mentioned, for example, a laminate of maleic anhydride-modified polyethylene and ethylene/vinyl alcohol copolymer. Such another film is preferably a uniaxially or biaxially oriented film, but it is not limited thereto.

Said (an)other film(s) in the multilayer film may be produced, for example, by laminating another film described above with an unoriented film made of resin composition (X4) and subsequently orientating the laminate or by bonding another film to a single-layer oriented film related to the fourth aspect that is formed in advance.

The film of the fourth aspect can be also prepared by producing a single-layer or multilayer film (unoriented film) having at least one layer made of resin composition (X4) containing (A4), (B4), and optionally hydrocarbon resin (C4) below, followed by orientating with the above orientation process:

10 to 97 wt % of isotactic polypropylene (A4);

3 to 90 wt % of propylene/ethylene/α-olefin copolymer (B4) that contains 40 to 85 mol % of propylene-derived structural units, 5 to 30 mol % of ethylene-derived structural units, and 5 to 30 mol % of $C_4$-$C_{20}$ α-olefin-derived structural units (a4), the melting point of (B4) being lower than 100° C. or not observed when measured with a differential scanning calorimeter, wherein the total of (A4) and (B4) is 100 wt %.

<Use>

The films of the fourth aspect are preferably used for, for example, heat-shrinkable package materials, heat-shrinkable labels, and the like.

5. Fifth Aspect

Hereinafter, the fifth aspect of the present invention is explained in detail.

<Isotactic Polypropylene (A5)>

Isotactic polypropylenes (A5) used in the fifth aspect include homopolypropylene and copolymers of propylene and at least one $C_2$-$C_{20}$ α-olefin except propylene. Specific examples of the $C_2$-$C_{20}$ α-olefins except propylene include the same as those for isotactic polypropylene (A1) used in the first aspect. Also, the preferable range is the same.

These α-olefins may form a random or block copolymer with propylene.

The structural units derived from these α-olefins may be contained in an amount of 35 mol % or less and preferably 30 mol % or less of the whole structural units composing isotactic polypropylene (A5).

The melting point of isotactic polypropylene (A5) measured with a differential scanning calorimeter (DSC) is 120° C. or higher, preferably 120 to 170° C., and more preferably 130 to 160° C.

There may be used, if necessary, a plurality of isotactic polypropylenes (A5) together, for example, two or more components different in melting point or rigidity.

Isotactic polypropylene (A5) preferably has the same properties as isotactic polypropylene (A1) used in the first aspect concerning isotactic pentad fraction (mmmm) and melt flow rate (MFR).

Such isotactic polypropylene (A5) can be produced similarly to isotactic polypropylene (A1) used in the first aspect.

<Propylene-Based Polymer (B5)>

Propylene-based polymers (B5) used in the fifth aspect include homopolypropylene and copolymers of propylene and at least one $C_2$-$C_{20}$ α-olefin except propylene. Specific examples of the $C_2$-$C_{20}$ α-olefins except propylene include the same as those for isotactic polypropylene (A5). Also, the preferable range is the same.

These α-olefins may form a random or block copolymer with propylene.

In propylene polymer (B5), the content of propylene-derived structural units is generally 40 to 100 mol %, preferably 40 to 99 mol %, more preferably 40 to 92 mol %, and still more preferably 50 to 90 mol %; and the content of structural units derived from the $C_2$-$C_{20}$ α-olefin (except propylene), which is used as a co-monomer, is generally 0 to 60 mol %, preferably 1 to 60 mol %, more preferably 8 to 60 mol %, and still more preferably 10 to 50 mol %, wherein the total of propylene units and $C_2$-$C_{20}$ α-olefin units is 100 mol %.

Propylene-based polymer (B5) generally has a melt flow rate (MFR) of 0.1 to 50 g/10 min as measured at 230° C. under a load of 2.16 kg in accordance with ASTM D1238.

The melting point of propylene polymer (B5) measured with a differential scanning calorimeter (DSC) is lower than 120° C. or not observed, and preferably not higher than 100° C. or not observed. Here, "melting point is not observed" means that any melting endothermic peak of crystal having a melting endothermic entalpy of crystal of 1 J/g or more is not observed in the temperature range of −150 to 200° C. The measurement conditions are as described in Examples of the fifth aspect.

The intrinsic viscosity [η] of propylene-based polymer (B5) is generally 0.01 to 10 dl/g, and preferably 0.05 to 10 dl/g, as measured in decalin at 135° C.

The method for producing propylene-based polymer (B5) is not particularly limited. It can be produced by polymerizing propylene or copolymerizing propylene and another α-olefin in the presence of a publicly known catalyst that can stereospecifically yield isotactic or syndiotactic polyolefin, for example, a catalyst containing a solid titanium component and an organometallic compound as major components, or a metallocene catalyst containing a metallocene compound as one of the catalyst components. Propylene-based polymer (B5) may be produced by polymerizing propylene or copolymerizing propylene and another α-olefin using a publicly known catalyst capable of providing an atactic polyolefin. It is preferred to copolymerize propylene and the $C_2$-$C_{20}$ α-olefin (except propylene) in the presence of the metallocene catalyst, as described below.

As propylene/α-olefin random copolymer (B5) characterized as above, propylene/ethylene/$C_4$-$C_{20}$ α-olefin random copolymer (B5-1) below is suitably used.

Propylene/ethylene/$C_4$-$C_{20}$ α-olefin random copolymer (B5-1) is described in detail below.

In propylene/ethylene/α-olefin random copolymer (B5-1), the content of propylene-derived structural units is 55 to 85 mol %, preferably 61 to 82 mol %, and more preferably 66 to 75 mol %; the content of ethylene-derived structural units is 5 to 15 mol %, preferably 8 to 14 mol %, and more preferably 10 to 14 mol %; and the content of $C_4$-$C_{20}$ α-olefin-derived structural units (a5) is 0 to 30 mol %, preferably 10 to 25 mol %, and more preferably 15 to 20 mol %, wherein the total of propylene-derived structural units, ethylene-derived structural units, and $C_4$-$C_{20}$ α-olefin-derived structural units is 100 mol %.

Propylene/ethylene/α-olefin random copolymer (B5-1) containing propylene units, ethylene units, and optionally $C_4$-$C_{20}$ α-olefin units in the above ratio has excellent compatibility with isotactic polypropylene (A5) and provides propylene-based polymer composition (X5) likely to be excellent in transparency, mechanical strength (strength at break), flexibility, heat resistance, scratch resistance, and compression set resistance.

For example, use of propylene/ethylene/α-olefin random copolymer (B5-1) provides propylene-based polymer composition (X5) with a greatly improved elongation when the yield stress is attained in tensile test (YS) (elongation at yield). As a result, the sheet related to the fifth aspect exhibits greatly improved folding properties including the whitening resistance on folding and wrinkle resistance.

Further, propylene/ethylene/α-olefin random copolymer (B5-1) provides propylene-based polymer composition (X5) with excellent compression set resistance, reducing the permanent deformation caused by folding or compression of the sheet related to the fifth aspect.

Propylene/ethylene/α-olefin random copolymer (B5-1) preferably has the same properties as propylene/ethylene/α-olefin copolymer (B1) of the first aspect concerning intrinsic viscosity [η], stress at 100% elongation (M100), crystallinity, and glass transition temperature Tg. The effects of these properties are also the same.

When propylene/ethylene/α-olefin random copolymer (B5-1) exhibits a melting point (Tm in ° C.) in the endothermic curve obtained with a differential scanning calorimeter (DSC), the melting endothermic entalpy ΔH is generally 30 J/g or less, and the $C_3$ content (mol %) and ΔH (J/g) also satisfy the same relation as that for propylene/ethylene/α-olefin copolymer (B1) used in the first aspect.

In propylene/ethylene/α-olefin random copolymer (B5-1), the desired molecular weight distribution (Mw/Mn, relative to polystyrene standards, Mw: weight-average molecular weight, Mn: number-average molecular weight) is generally 1.5 to 4.0, preferably 1.5 to 3.0, and more preferably 1.5 to 2.5 as measured by gel permeation chromatography (GPC).

In the fifth aspect, the triad tacticity (mm-fraction) determined by $^{13}$C-NMR is generally 85% to 97.5%, preferably 87% to 97%, and more preferably 90% to 97%. With the copolymer having the above range of mm-fraction, excellent permanent compression set particularly at high temperature and mechanical strength are attained, which is desirable for the fifth aspect. The mm-fraction can be determined by the method described in WO 04/087775 pamphlet from Page 21 line 7 to Page 26 line 6.

Propylene/ethylene/α-olefin random copolymer (B5-1) may be produced with a metallocene catalyst used for producing isotactic polypropylene (A5) in a similar manner or with another metallocene catalysts, although the method is not limited thereto.

<Soft Polymer (C5)>

Soft polymer (C5) optionally used in the fifth aspect is different from propylene-based polymer (B5) and at least one soft polymer having a Shore A hardness of 95 or less and/or a Shore D hardness of 60 or less. Here, Shore A hardness is determined in accordance with JIS K6301, and Shore D hardness is determined in accordance with ASTM D-2240.

Soft polymer (C5) is preferably a copolymer in which the content of ethylene-derived structural units is more than 60 mol %, preferably 61 mol % or more, and more preferably 61 to 99 mol % of the whole structural units.

Specific examples of soft polymer (C5) include styrene-based elastomer, ethylene/α-olefin random copolymer, ethylene/vinyl acetate copolymer, ethylene/acrylic acid copolymer, ethylene/methyl methacrylate copolymer, and others. Styrene-based elastomer (C5-1) and ethylene/α-olefin copolymer (C5-2) below are preferably employed.

Specific examples of styrene-based elastomer (C5-1) include the same elastomers as styrene-based elastomer (C3-1) used in the third aspect, and publicly known such elastomers may be used without limitation. Styrene-based elastomer (C5-1) may be used alone or in combination of two or more.

Publicly known paraffin oils with properties as mentioned in the third aspect can be incorporated into styrene-based elastomer (C5-1). Blending such paraffin oil largely improves the flexibility of the resulting molded articles. The amount of paraffin oil blended is preferably 10 to 150 parts by weight relative to 100 parts by weight of styrene-based elastomer (C5-1).

Ethylene/α-olefin random copolymer (C5-2) refers to a copolymer of ethylene and a $C_3$-$C_{20}$ α-olefin, preferably a $C_3$-$C_{10}$ α-olefin. Preferably it has the same properties as ethylene/α-olefin random copolymer (C3-2) used in the third aspect concerning density, MFR, and crystallinity.

Specific examples of the $C_3$-$C_{20}$ α-olefins used as the co-monomer include co-monomers like those for ethylene/α-olefin random copolymer (C3-2), and the preferred range is also the same. These co-monomers may be used alone or in combination of two or more.

The α-olefin content of copolymer (C5-2) is, for example, generally 3 mol % or more and less than 40 mol %, preferably 3 to 39 mol %, more preferably 5 to 30 mol %, and still more preferably 5 to 25 mol %.

If necessary, there may be used a small amount of (an) other co-monomer (s), for example, a diene such as 1,6-hexadiene and 1,8-octadiene, a cycloolefin such as cyclopentene, or the like.

The molecular structure of copolymer (C5-2) may be linear or branched with long or short side-chains. Furthermore, a plurality of different ethylene/α-olefin random copolymers may be used as a mixture.

The methods for producing such ethylene/α-olefin random copolymer (C5-2) are not particularly limited to, but include methods similar to those for producing ethylene/α-olefin random copolymer used in the third aspect. In particular, the copolymer produced using a metallocene catalyst has a molecular weight distribution (Mw/Mn) of generally 3 or less, and is suitably used in the fifth aspect.

<Propylene-Based Resin Composition (X5)>

Propylene-based resin composition (X5) related to the fifth aspect comprises isotactic polypropylene (A5) and propylene-based polymer (B5).

Propylene-based resin composition (X5) may further contain soft polymer (C5) and also may contain, as necessary, inorganic filler, additives, or others below.

In propylene-based polymer composition (X5), isotactic polypropylene (A5) is used in a ratio of 10 to 99 parts by weight, preferably 15 to 98 parts by weight, and more preferably 60 to 95 parts by weight, in 100 parts by weight of the total of (A5) and (B5). This range is preferred because such composition has good moldability and provides sheets with excellent heat resistance.

In propylene-based polymer composition (X5), propylene-based polymer (B5) is used in a ratio of 1 to 90 parts by weight, preferably 2 to 85 parts by weight, and more preferably 5 to 40 parts by weight, in 100 parts by weight of the total of (A5) and (B5). Blending in this range is preferred, because flexibility, mechanical strength, scratch resistance, transparency, and heat resistance are improved and excellent whitening resistance on folding and wrinkle resistance can be attained.

It is desirable that propylene-based resin composition (X5) contain soft polymer (C5), which is optionally used, in an amount of generally 1 to 80 parts by weight and preferably 5 to 70 parts by weight relative to 100 parts by weight of the total of (A5) and (B5). The composition containing such amount of soft polymer (C5) can provide molded articles with excellent flexibility, surface hardness, and impact resistance, and in particular, excellent low-temperature impact strength.

Propylene-based resin composition (X5) may further contain, as necessary, other resins, other rubbers, inorganic filler, additives, and others as long as the objectives of the fifth aspect are not impaired.

The inorganic fillers used in the fifth aspect include, for example, talc, clay, calcium carbonate, mica, silicates, carbonates, and glass fibers. Among these, talc and calcium carbonate are preferable, and talc is particularly preferable. It is desirable that talc has an average particle diameter of 1 to 5 μm and preferably 1 to 3 μm. The inorganic fillers may be used alone or in combination of two or more.

Propylene-based polymer composition (X5) may further contain additives such as weathering stabilizers, heat stabilizers, antistatic agents, anti-slip agents, anti-blocking agents, anti-fogging agents, lubricants, pigments, dyes, plasticizers, anti-aging agents, hydrochloric acid absorbers, antioxidants, and nucleating agents, as long as the objectives of the fifth aspect are not impaired.

The amount of other resins, other rubbers, inorganic filler, additives, and others described above is not particularly limited as long as the objects of the first aspect are not impaired. In an embodiment, the total of isotactic polypropylene (A5), propylene-based polymer (B5), and, if any, soft polymer (C5) is 60 wt % or more and preferably 80 wt % to 100 wt % of the whole composition, and the remainder is accounted for by the above described other resins, other rubbers, inorganic filler, additives, and others.

Propylene-based polymer composition (X5) can be produced using individual components in the above ranges of content by various publicly known methods, for example, multi-step polymerization; a method of mixing the components with a Henschel mixer, a V-blender, a ribbon blender, a tumbler blender, or the like; and a method of mixing the components followed by melt-kneading with a single-screw or twin-screw extruder, a kneader, a Banbury mixer, or the like and subsequent granulation or pulverization.

Propylene-based polymer composition (X5) may also be obtained by adding a small amount of isotactic polypropylene (A5) to propylene-based polymer (B5) to prepare pellets in advance, followed by further adding isotactic polypropylene (A5) to the pellets. In this case, other resins, other rubbers, inorganic filler, additives, and others as well as soft polymer (C5) may be added on the pelletization or may be added when isotactic polypropylene (A5) is further added after the pelletization.

When propylene-based polymer composition (X5) does not contain the above styrene-based elastomer, but contains a softener, the amount of softener to be added is not particularly limited, but in one preferred embodiment, it is 15 parts by weight or less and preferably 10 parts by weight relative to 100 parts by weight of the total of isotactic polypropylene (A5), propylene-based polymer (B5), and if any, soft polymer (C5). An embodiment containing no softener is also preferred.

<Polyolefin Decorative Sheet>

The polyolefin decorative sheet of the fifth aspect is used in publicly known decorative boards wherein said sheet is laminated on the surface of adherants such as plywood, steel plate, aluminum plate, particle board, MDF (medium-density fiberboard), inorganic board (gypsum board, etc.), concrete wall, plastic board, foam, and heat insulator, with an adhesive or otherwise. The propylen decorative sheets of the fifth aspect also include building material-protective sheets, for example, a sheet used as a surface layer of floors, walls, ceilings, and other parts. Both decorative and protective sheets are used to produce picture or print designs and to protect surfaces.

A typical example of the polyolefin decorative sheet related to the fifth aspect is, for example, a propylen decorative sheet having at least one component layer made of propylene-based polymer composition (X5) as shown in FIG. 5-1. The decorative sheet may contain two or more layers made of propylene-based polymer composition (X5). In this case, these two or more layers may be composed of the same components or different components from each other.

The polyolefin decorative sheet of the fifth aspect may contain, besides the layer(s) made of propylene-based polymer composition (X5), publicly known component layers of decorative sheets, such as a print or picture layer displaying designs, a surface-coating layer, a luster-adjusting layer, a shielding layer (which prevents the substrate surface from being seen through the foreground layer and may also serves as a base material), and an adhesive layer bonding these layers together.

The configurations of the decorative sheet related to the fifth aspect is not particularly limited, but include such configurations as described in the first aspect.

Namely, the configurations of the decorative sheet related to the fifth aspect are not particularly limited, but include, for example, an embodiment wherein the decorative sheet contains a layer [a] made of propylene-based polymer composition (X5), at least one layer [b] selected from print layer, picture layer, and shielding layer, and if necessary at least one layer [c] selected from surface-coating layer and luster-adjusting layer.

In another embodiment, the decorative sheet contains a shielding layer [d], a layer [a] made of propylene-based polymer composition (X5), at least one layer [b] selected from print layer and picture layer, and if necessary at least one layer [c] selected from surface-coating layer and luster-adjusting layer.

Since the layer made of propylene-based polymer composition (X5) is excellent in strength at break, scratch resistance, abrasion resistance, whitening resistance on folding, wrinkle resistance, heat resistance, and transparency, it is suitably used as a protective layer for a print or picture layer (that is, the layer made of propylene-based polymer composition (X5) is used as a surface layer protecting a print or picture layer, and onto the layer of the polymer composition there may be applied publicly known treatment such as providing a surface-coating layer or a luster-adjusting layer as long as the objectives of the fifth aspect are not impaired). The polyolefin decorative sheets with such configuration are particularly preferable.

The layer made of propylene-based polymer composition (X5) is also suitably used as one layer in combination with a layer made of another component because of its excellent flexibility and water resistance. In this case, the layer made of propylene-based polymer composition (X5) can be bonded without a publicly known adhesive or an adhesive having the same effect with the publicly known adhesive. Specifically, sufficient bonding strength can be attained by publicly known hot-melt bondings such as heat lamination, extrusion lamination, sandwich lamination, and co-extrusion.

Figure 2B:
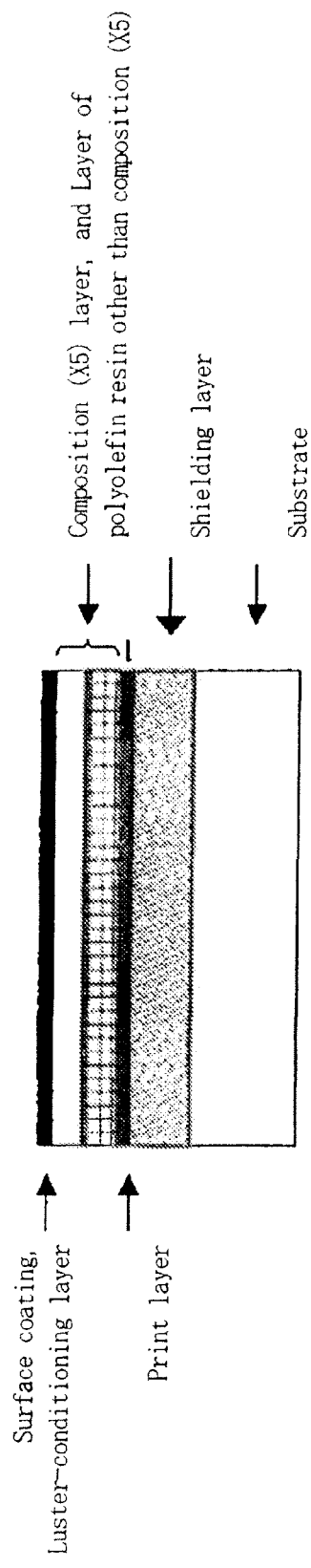
FIG. 2B shows an example of a decorative board using the polyolefin decorative sheet of the fifth aspect, in which the decorative board has a laminate composed of a layer made of propylene-based polymer composition (X5) and a layer made of a polyolefin-based resin composition other than propylene-based polymer composition (X5).

Therefore, as shown in FIG. 5-2, the layer made of propylene-based polymer composition (X5) can be suitably used for a polyolefin decorative sheet in combination with layers made of a polyolefin resin composition other than propylene-based resin composition (X5), that is, polyolefin resin composition out of the scope of propylene-based resin composition (X5) (including publicly known adhesive polyolefin resin layers). Namely, the polyolefin decorative sheet of the fifth aspect preferably contains at least one additional component layer made of a polyolefin resin composition other than propylene-based polymer composition (X5).

The polyolefin decorative sheet of the fifth aspect is excellent in wrinkle resistance on folding. In particular, when the layer made of propylene-based polymer composition (X5) is laminated with the layer made of a polyolefin resin composition other than propylene-based polymer composition (X5), the wrinkle resistance is excellent.

The polyolefin decorative sheet is suitably used, even though the sheet has been formed by laminating, without any adhesive, the back surface of the layer made of propylene-based polymer composition (X5) and the layer made of a polyolefin resin composition other than propylene-based polymer composition (X5). Here, "lamination without any adhesive" means direct lamination by hot-melt bonding.

As the polyolefin resin composition other than propylene-based polymer composition (X5), any composition other than propylene-based polymer composition (X5), that is, polyolefin resin composition out of the scope of propylene-based polymer composition (X5) may be used without particular limitation. Specifically, the polyolefin resin compositions include polyethylene, polypropylene, poly-α-olefin, ethylene/α-olefin copolymer, ethylene/polar vinyl monomer copolymer, and resin compositions containing two or more of these.

The above polyolefin resin composition may further contain additives such as inorganic filler, weathering stabilizers, heat stabilizers, antistatic agents, anti-slip agents, anti-blocking agents, anti-fogging agents, lubricants, pigments, dyes, plasticizers, anti-aging agents, hydrochloric acid absorbers, antioxidants, and nucleating agents, as long as the objectives of the fifth aspect are not impaired.

The thickness of the layer made of propylene-based polymer composition (X5) is, although not particularly limited to, generally 5 to 2000 μm.

To the polyolefin decorative sheet of the fifth aspect, there may be applied publicly known processing such as embossing, engraining, and wiping.

For producing the polyolefin decorative sheet of the fifth aspect, any publicly known method may be employed without particular limitation.

The applications of the polyolefin decorative sheet are, although not particularly limited to, preferably the same as those of the first aspect.

Namely, the applications of the polyolefin decorative sheet are not particularly limited, and the sheet is preferably used for home electric appliances and furniture such as TV cabinets, stereo-speaker boxes, video cabinets, various storage furniture, and unified furniture; housing members such as doors, door frames, window sashes, crowns, plinth, and opening frames; furniture members such as doors of kitchen or storage furniture; building materials such as flooring material, ceiling material, and wall paper; automobile interior materials; stationery; office goods; and others.

6. Sixth Aspect

Hereinafter, the sixth aspect of the present invention is explained in detail.

<Propylene-Based Polymer (A6)>

Propylene-based polymers (A6) used in the sixth aspect include homopolypropylene and copolymers of propylene and at least one $C_2$-$C_{20}$ α-olefin except propylene. The $C_2$-$C_{20}$ α-olefins except propylene include α-olefins like those for isotactic polypropylene (A1)) used in the first aspect. Also, the preferable range is the same.

These α-olefins may form a random or block copolymer with propylene.

The structural units derived from these α-olefins may be contained in an amount of 35 mol % or less and preferably 30 mol % or less of the whole units composing propylene-based polymer (A6).

The melt flow rate (MFR) of propylene-based polymer (A6) is generally 0.01 to 1000 g/10 min, preferably 0.05 to 100 g/10 min, and more preferably 0.1 to 50 g/10 min as measured at 230° C. under a load of 2.16 kg in accordance with ASTM D1238.

The melting point of propylene-based polymer (A6) measured with a differential scanning calorimeter (DSC) is generally 120° C. or higher, preferably 120 to 170° C., and more preferably 125 to 165° C.

Propylene-based polymer (A6) may be either isotactic or syndiotactic, but preferably isotactic considering heat resistance and others.

There may be used, if necessary, two or more kinds of propylene-based polymers (A6) together, for example, two or more components different in melting point or rigidity.

For attaining the desired properties, there may be used, as propylene-based polymer (A6), one or more polymers selected from homopolypropylene with excellent heat resistance (publicly known, generally containing 3 mol % or less of comonomer except propylene), block polypropylene with excellent balance of heat resistance and impact resistance (publicly known, generally containing from 3 to 30 wt % of n-decane-soluble rubber components), and random polypropylene with excellent balance of flexibility and transparency (publicly known, generally having a melting peak of 120° C. or higher and preferably 125° C. to 150° C. as measured with a differential scanning calorimeter (DSC)).

Such propylene-based polymer (A6) can be produced by methods like those for producing isotactic polypropylene (A1) used in the first aspect.

<Propylene-Based Polymer (B6)>

Propylene-based polymers (B6) used in the six embodiment include homopolypropylene and copolymers of propylene and at least one $C_2$-$C_{20}$ α-olefin except propylene. The $C_2$-$C_{20}$ α-olefins except propylene include α-olefins like those used for propylene-based polymer (A6). Also, the preferable range is the same.

These α-olefins may form a random or block copolymer with propylene.

In propylene-based polymer (B6), the content of propylene-derived structural units is generally 40 to 100 mol %, preferably 40 to 99 mol %, more preferably 40 to 92 mol %, and still more preferably 50 to 90 mol %; and the content of structural units derived from a $C_2$-$C_{20}$ α-olefin (except propylene) used as a co-monomer is generally 0 to 60 mol %, preferably 1 to 60 mol %, more preferably 8 to 60 mol %, and still more preferably 10 to 50 mol %, wherein the total of propylene units and $C_2$-$C_{20}$ α-olefin units is 100 mol %.

Propylene-based polymer (B6) generally has a melt flow rate (MFR, measured at 230° C. under a load of 2.16 kg in accordance with ASTM D1238) of 0.1 to 50 (g/10 min).

The melting point of propylene-based polymer (B6) is lower than 120° C. or not observed, and preferably 100° C. or lower or not observed, as measured with a differential scanning calorimeter (DSC). Here, "melting point is not observed" means that any melting endothermic peak of crystal having a melting endothermic entalpy of crystal of 1 J/g or more is not observed in the temperature range of −150 to 200° C. The measurement conditions are as described in Examples of the sixth aspect.

In propylene-based polymer (B6), the intrinsic viscosity [η] measured in decalin at 135° C. is generally 0.01 to 10 dl/g and preferably 0.05 to 10 dl/g.

Propylene-based polymer (B6) preferably has the same triad tacticity (mm-fraction) as that of propylene/ethylene/α-olefin copolymer (B1) of the first aspect, whereby the same effect can be obtained.

Namely, the triad tacticity (mm-fraction) of propylene-based polymer (B6) determined by $^{13}$C-NMR is preferably 85% or more, more preferably 85% to 97.5%, still more preferably 87% to 97%, and particularly preferably 90% to 97%. With the above range of triad tacticity (mm-fraction), the balance of flexibility and mechanical strength is particularly excellent, which is desirable for the sixth aspect. The mm-fraction can be determined by the method described in WO 04/087775 pamphlet from Page 21 line 7 to Page 26 line 6.

The methods for producing propylene-based polymer (B6), although not particularly limited to, include a method similar to that for producing propylene-based polymer (B5) used in the fifth aspect.

Specific examples of propylene/α-olefin random copolymer (B6) with the above properties include propylene/$C_4$-$C_{20}$ α-olefin random copolymer (B6-1) and propylene/ethylene/$C_4$-$C_{20}$ α-olefin random copolymer (B6-2).

When the propylene-based resin composition contains propylene/$C_4$-$C_{20}$ α-olefin random copolymer (136-1), which is compatible with crystalline polypropylene components, the composition has more excellent mechanical strength, elongation at break, scratch resistance, and whitening resistance.

Propylene/ethylene/$C_4$-$C_{20}$ α-olefin random copolymer (B6-2) is also compatible with crystalline polypropylene components, as propylene/$C_4$-$C_{20}$ α-olefin random copolymer (B6-1), so that the propylene-based resin composition containing propylene/ethylene/$C_4$-$C_{20}$ α-olefin random copolymer (B6-2) has more excellent flexibility, scratch resistance, and whitening resistance.

Details are explained below on propylene/$C_4$-$C_{20}$ α-olefin random copolymer (B6-1) and propylene/ethylene/$C_4$-$C_{20}$ α-olefin random copolymer (B6-2) suitably used in the sixth aspect.

[Propylene/$C_4$-$C_{20}$ α-Olefin Random Copolymer (B6-1)]

Propylene/$C_4$-$C_{20}$ α-olefin random copolymer (B6-1) preferably used in the sixth aspect has properties (a) and (b) below:

(a) the molecular weight distribution (Mw/Mn) measured by gel permeation chromatography (GPC) is 1 to 3; and (b) the melting point Tm (° C.) and the comonomer content M (mol %) determined by $^{13}$C-NMR spectrum satisfy the relation, $$146\exp(-0.022M) \geq Tm \geq 125\exp(-0.032M),$$

wherein Tm is lower than 120° C., preferably lower than 100° C.

The melting point Tm of propylene/$C_4$-$C_{20}$ α-olefin random copolymer (B6-1) is measured with a DSC as follows: a sample put in an aluminum pan is heated to 200° C. at 100° C./min, kept at 200° C. for 5 min, cooled to −150° C. at 10° C./min, and heated to 200° C. at 10° C./min, wherein the temperature when an endothermic peak is observed in the second heating step is counted as the melting point Tm. The melting point Tm is generally lower than 120° C., preferably lower than 100° C., more preferably 40 to 95° C., still more preferably 50 to 90° C. With the above range of melting point Tm, the composition provides molded articles with excellent balance between flexibility and mechanical strength in particular. Furthermore, because of reduced surface stickiness, the molded articles of the composition related to the sixth aspect have an advantage of good processability.

Desirably, propylene/$C_4$-$C_{20}$ α-olefin random copolymer (B6-1) further satisfies that, (c) the crystallinity measured by X-ray diffractometry is preferably 40% or less, and more preferably 35% or less.

In propylene/$C_4$-$C_{20}$ α-olefin random copolymer (B6-1), the content of $C_4$-$C_{20}$ α-olefin-derived structural units is preferably 5 to 50 mol %, and more preferably 10 to 35 mol %. Particularly, 1-butene is preferably used as the $C_4$-$C_{20}$ α-olefin.

Such propylene-based polymer (B6-1) is produced by methods similar to those for producing soft propylene/α-olefin random copolymer (B3) used in the third aspect. For example, the method described in WO 04/087775 pamphlet may be employed.

[Propylene/Ethylene/$C_4$-$C_{20}$ α-Olefin Random Copolymer (B6-2)]

Propylene/ethylene/$C_4$-$C_{20}$ α-olefin random copolymer (B6-2) preferably used in the sixth aspect has properties (m) and (n) below:

(m) the molecular weight distribution (Mw/Mn) measured by gel permeation chromatography (GPC) is 1 to 3; and (n) the content of propylene-derived structural units is 40 to 85 mol %, the content of ethylene-derived structural units is 5 to 30 mol %, and the content of $C_4$-$C_{20}$ α-olefin-derived structural units is 0.5 to 30 mol %, wherein the total of propylene-derived structural units, ethylene-derived structural units, and $C_4$-$C_{20}$ α-olefin-derived structural units is 100 mol %; and the total of ethylene-derived structural units and $C_4$-$C_{20}$ α-olefin-derived structural units preferably is 60 to 15 mol %.

It is preferred that propylene/ethylene/$C_4$-$C_{20}$ α-olefin random copolymer (B6-2) further satisfies at least one or more, more preferably both, of properties (o) and (p) below:

(o) the Shore hardness A is 30 to 80, and preferably 35 to 60; and (p) the crystallinity measured with X-ray diffractometry is 20% or less, and preferably 10% or less.

The melting point, Tm, of propylene/ethylene/$C_4$-$C_{20}$ α-olefin random copolymer (B6-2) is preferably not higher than 50° C. or not observed, and more preferably not observed, when measured with a DSC. The melting point can be measured by the same way as the case of copolymer (B6-1) described above.

For the contents of propylene and other co-monomer components, more specifically, the content of propylene-derived structural units is preferably 60 to 82 mol % and more preferably 61 to 75 mol %, the content of ethylene-derived structural units is preferably 8 to 15 mol % and more preferably 10 to 14 mol %, and the content of $C_4$-$C_{20}$ α-olefin-derived structural units is preferably 10 to 25 mol % and more preferably 15 to 25 mol %. Particularly, 1-butene is preferably used as the $C_4$-$C_{20}$ α-olefin.

Such propylene/ethylene/α-olefin random copolymer (B6-2) can be produced by methods similar to those for producing soft propylene/α-olefin random copolymer (B3) used in the third aspect, for example, by the method described in WO 04/087775 pamphlet.

When propylene/ethylene/$C_4$-$C_{20}$ α-olefin random copolymer (B6-2) is used in the sixth aspect, molded articles obtained have more improved flexibility and excellent low-temperature embrittlement property. For example, when the molded article is an electrical wire, it has an advantage that its electrical wire cover is resistant to cracking at low temperature.

<Elastomer (C6)>

Elastomer (C6) used in the sixth aspect is one or more elastomer selected from ethylene-based elastomer (C6-1) containing 61 mol % or more of ethylene-derived structural units in the whole structural units, and styrene-based elastomer (C6-2) containing 5 to 70 wt % of styrene-derived structural units in the whole structural units.

Elastomer (C6) is not particularly limited as long as its Shore A hardness is in the range of 30 to 90. The elastomers include, for example, styrene/butadiene rubber and its hydrogenated derivative, ethylene/α-olefin random copolymer, ethylene/vinyl acetate copolymer, ethylene/acrylic acid copolymer, ethylene/methyl methacrylate copolymer, and others.

As ethylene-based elastomer (C6-1), ethylene/α-olefin random copolymer (C6-1-1) is preferably used. Ethylene/α-olefin random copolymer (C6-1-1) refers to a copolymer of ethylene and a $C_3$-$C_{20}$ α-olefin, preferably a $C_3$-$C_{10}$ α-olefin, and preferably has the same properties as ethylene/α-olefin random copolymer (C3-2) used in the third aspect concerning density, MFR, and crystallinity.

Specific examples of the $C_3$-$C_{20}$ α-olefins used as a co-monomer include co-monomers like those for ethylene/α-olefin random copolymer (C3-2) used in the third aspect. The preferable range is also the same. These may be used alone or in combination of two or more.

The α-olefin content in copolymer (C6-1-1) is, for example, generally 3 to 39 mol %, preferably 5 to 30 mol %, and more preferably 5 to 25 mol %.

There may be contained, if necessary, a small amount of structural units derived from another co-monomer, for example, a diene such as 1,6-hexadiene and 1,8-octadiene, a cycloolefin such as cyclopentene, or others.

The molecular structure of copolymer (C6-1-1) may be linear or branched with long or short side-chains.

A plurality of different ethylene/α-olefin random copolymers (C6-1-1) may be used as a mixture.

The methods for producing such ethylene/α-olefin random copolymer (C6-1-1) is not particularly limited to, but include the same methods as those for producing ethylene/α-olefin random copolymer (C3-2) used in the third aspect. In particular, the copolymer produced with a metallocene catalyst has a molecular weight distribution of generally 3 or less, and is preferably used in the sixth aspect.

Specific examples of styrene-based elastomer (C6-2) include the same elastomers as styrene-based elastomer (C3-1) used in the third aspect, and publicly known elastomers may be used without limitation. Styrene-based elastomer (C6-2) may be used alone or in combination of two or more.

In the sixth aspect, ethylene elastomer (C6-1) and styrene-based elastomer (C6-2) may be used together.

<Inorganic Filler (D6)>

As inorganic filler (D6) used in the sixth aspect, there may be used various substances, for example, metal compounds, inorganic compounds such as glass, ceramics, talc, and mica, or others. Among them, metal hydroxides, metal carbonates (carbonated compounds), and metal oxides are preferably used. Inorganic filler (D6) may be used alone or in combination of two or more.

The average particle diameter of inorganic filler (D6) is generally 0.1 to 20 μm, and preferably 0.5 to 15 μm, which is determined with the laser method.

Inorganic filler (D6) may be surface-treated with a fatty acid such as stearic acid and oleic acid, an organosilane, or others. In the inorganic filler, fine particles with the above average particle diameter may be agglomerated.

<Oil (E6)>

Oils (E6) used in the sixth aspect include various oils such as paraffin oil, naphthene oil, aromatic oil, and silicone oil. Among them, paraffin oil and naphthene oil are preferably used.

Oil (E6), although not particularly limited, preferably has a kinematic viscosity at 40° C. of generally 20 to 800 cSt (centiStrokes), and preferably 40 to 600 cSt. For oil (E6), it is desirable that the pour point is generally 0 to −40° C., and preferably 1 to −30° C., while the flash point (COC test) is generally 200 to 400° C., and preferably 250 to 350° C. When oil (E6) is blended, the propylene-based resin composition of the sixth aspect is particularly excellent in low-temperature properties such as cold embrittlement resistance and scratch resistance.

The naphthene process oil suitably used for the sixth aspect is a petroleum-derived softener containing 30 to 45 wt % of naphthene hydrocarbons, which is blended in rubber processing for the purpose of softening, dispersing blended components, lubrication, improving low-temperature properties, or others. When such process oil is blended, the resin composition has further improved pour point on molding, and in molded articles thereof, the flexibility and low-temperature properties are further improved and the surface stickiness caused by bleeding is suppressed. In the sixth aspect, a naphthene process oil having an aromatic hydrocarbon content of 10 wt % or less is preferably used. When the composition contains such naphthene oil, the surface bleeding is suppressed in molded articles, although the reason is unclear.

<Graft-Modified Polymer (E6)>

The starting polymers for graft-modified polymer (E6) include, for example, polymers of one or more α-olefin, styrene-based block copolymers, and others. In particular, ethylene-based polymers, propylene-based polymers, and styrene-based block copolymers are preferable. The above α-olefins include, for example, $C_2$-$C_{20}$ α-olefins.

The ethylene-based polymer is preferably polyethylene or an ethylene/α-olefin copolymer. Among ethylene/α-olefin copolymers described above, ethylene/$C_3$-$C_{10}$ α-olefins copolymers are preferable. The $C_3$-$C_{10}$ α-olefins include, specifically, propylene, 1-butene., 1-pentene, 1-hexene, 3-methyl-1-butene, 3-methyl-1-pentene, 3-ethyl-1-pentene, 4-methyl-1-pentene, 4-methyl-1-hexene, 4,4-dimethyl-1-pentene, 4-ethyl-1-hexene, 1-octene, 3-ethyl-1-hexene, 1-octene, 1-decene, and others. These may be used alone or in combination of two or more. Above all, at least one selected from propylene, 1-butene, 1-hexene, and 1-octene is desirably used.

For the content of each structural units in the ethylene-based copolymer, it is desirable that the content of ethylene-derived structural units is 75 to 95 mol %, and the content of structural units derived from at least one compound selected from $C_3$-$C_{10}$ α-olefins is 5 to 20 mol %.

The ethylene/α-olefin copolymer preferably satisfies:

(i) the density is 0.855 to 0.910 g/cm$^3$, and preferably 0.857 to 0.890 g/cm$^3$;

(ii) the melt flow rate (MFR, at 190° C. under a load of 2.16 kg) is in the range of 0.1 to 100 g/10 min, and preferably 0.1 to 20 g/10 min;

(iii) the index of molecular weight distribution (Mw/Mn) determined by GPC is 1.5 to 3.5, preferably 1.5 to 3.0, and more preferably 1.8 to 2.5; and (iv) the B-value determined from $^{13}$C-NMR spectrum using the following equation is 0.9 to 1.5, and preferably 1.0 to 1.2.

$$B\text{-value}=[POE]/(2\cdot[PE][PO])$$

(In the formula, [PE] denotes the mole fraction of ethylene-derived structural units in the copolymer; [PO] denotes the mole fraction of α-olefin-derived structural units in the copolymer; and [POE] is the ratio of the number of ethylene-α-olefin dyads to the total number of dyads in the copolymer.)

Besides the above, it is desirable that the ethylene/α-olefin copolymer has the same properties as those of the ethylene/α-olefin copolymer used for component (A6). For this copolymer, the co-monomer species, density, and molecular weight may be identical to or different from those for component (A6).

The graft-modified polymer used in the sixth aspect can be obtained by, for example, graft-modification of a poly-α-olefin, a styrene-based block copolymer, or the like with a polar group-containing vinyl compound. The vinyl compounds include vinyl compounds having an oxygen-containing group such as acid, acid anhydride, ester, alcohol, epoxy, and ether, vinyl compounds having a nitrogen-containing group such as isocyanate and amide, and vinyl compounds having a silicon-containing group such as vinylsilane.

Among them, the vinyl compound having an oxygen-containing group is preferable. Specifically, unsaturated epoxy monomers, unsaturated carboxylic acids, and their derivatives are preferable.

The unsaturated epoxy monomers include unsaturated glycidyl ethers, and unsaturated glycidyl esters (for example, glycidyl methacrylate).

The unsaturated carboxylic acids include acrylic acid, maleic acid, fumaric acid, tetrahydrophthalic acid, itaconic acid, citraconic acid, crotonic acid, isocrotonic acid, and Nadic Acid™, (endo-cis-bicyclo[2.2.1]hept-5-ene-2,3-dicarboxylic acid).

The unsaturated carboxylic acid derivatives include acid halide, amide, imide, anhydride, and ester of the unsaturated carboxylic acids. Specifically, they include maleyl chloride, maleimide, maleic anhydride, citraconic anhydride, monomethyl maleate, dimethyl maleate, glycidyl maleate, and others.

The unsaturated dicarboxylic acids and their anhydrides are more preferable among them, particularly maleic acid, Nadic Acid™, and their anhydrides are preferably used.

Such unsaturated carboxylic acid or its derivative may bond to any carbon atom in the unmodified ethylene-based copolymer without particular limitation on the position to be grafted.

Graft-modified polymer (F6) described above is prepared by various known methods, for example, by the followings:

(1) To the unmodified polymer melted with an extruder or the like, the unsaturated carboxylic acid or the like is added to be graft-copolymerized; or (2) To a solution prepared by dissolving the unmodified polymer in a solvent, the unsaturated carboxylic acid or the like is added to be graft-copolymerized.

In either method, it is preferred that the reaction is conducted in the presence of a radical initiator for efficient graft-copolymerization of the above grafting monomer such as unsaturated carboxylic acids.

The radical initiators used herein include, for example, organic peroxides, azo compounds, and others.

The organic peroxides include benzoyl peroxide, dichlorobenzoyl peroxide, dicumyl peroxide, and others.

The azo compounds include azobisisobutyronitrile, dimethyl azoisobutyrate, and others.

Specifically, the radical initiators suitably used are dialkyl peroxides such as dicumyl peroxide, di-tert-butyl peroxide, 2,5-dimethyl-2,5-di(tert-butylperoxy)-3-hexyne, 2,5-dimethyl-2,5-di(tert-butylperoxy)hexane, and 1,4-bis(tert-butylperoxyisopropyl)benzene.

The amount of radical initiator to be used is generally 0.001 to 1 part by weight, preferably 0.003 to 0.5 parts by weight, and more preferably 0.05 to 0.3 parts by weight, relative to 100 parts by weight of the unmodified polymer.

In the graft-polymerization with or without the above radical initiator, the reaction temperature is generally 60 to 350° C., and preferably 150 to 300° C.

In graft-modified polymer (F6) thus obtained, the ratio of polar group-containing vinyl compound grafted is generally 0.01 to 10 wt %, and preferably 0.05 to 5 wt %, wherein the weight of graft-modified polymer is 100 wt %. In the sixth aspect, use of graft-modified polymer (F6) particularly enhances interactions of the inorganic filler with the propylene-based polymer, propylene/α-olefin random copolymer, and elastomer; therefore, the composition provides molded articles with excellent balance of tensile strength and scratch resistance.

<Propylene-Based Resin Composition (X6) and Molded Article>

Propylene-based resin composition (X6) of the sixth aspect of the present invention contains 0 to 80 wt % of propylene-based polymer (A6), 5 to 85 wt % of propylene-based polymer (B6), 0 to 40 wt % of elastomer (C6), and 15 to 80 wt % of inorganic filler (D6), wherein the total of components (A6), (B6), (C6), and (D6) is 100 wt %.

When propylene/$C_4$-$C_{20}$ α-olefin random copolymer (B6-1) is used as propylene-based polymer (B6), it is desirable that propylene-based resin composition (X6) contains propylene-based polymer (A6) in an amount of 0 to 80 wt %, preferably 0 to 70 wt %, more preferably 0 to 60 wt %, still more preferably 0 to 50 wt %, and particularly preferably 10 to 40 wt %; propylene/$C_4$-$C_{20}$ α-olefin random copolymer (B6-1) in an amount of 5 to 85 wt %, preferably 10 to 80 wt %, more preferably 10 to 70 wt %, still more preferably 15 to 60 wt %, and particularly preferably 25 to 55 wt %; elastomer (C6) in an amount of 0 to 40 wt. %, preferably 0 to 30 wt %, more preferably 0 to 25 wt %, still more preferably 5 to 20 wt %, and particularly preferably 5 to 15 wt %; and inorganic filler (D6) in an amount of 15 to 80 wt %, preferably 20 to 70 wt %, more preferably 30 to 70 wt %, still more preferably 30 to 60 wt %, and particularly preferably 35 to 60 wt %, wherein the total of components (A6), (B6), (C6), and (D6) is 100 wt %.

When propylene/ethylene/$C_4$-$C_{20}$ α-olefin random copolymer (B6-2) is used as propylene-based polymer (B6), it is desirable that propylene-based resin composition (X6) contains propylene-based polymer (A6) in an amount of 0 to 80 wt %, preferably 0 to 70 wt %, more preferably 0 to 60 wt %, still more preferably 0 to 50 wt %, and particularly preferably 10 to 40 wt %; propylene/1-butene random copolymer as (B6-2) in an amount of 5 to 85 wt %, preferably 10 to 80 wt %, more preferably 10 to 70 wt %, still more preferably 15 to 50 wt %, and particularly preferably 20 to 50 wt %; elastomer (C6) in an amount of 0 to 40 wt %, preferably 0 to 30 wt %, more preferably 0 to 25 wt %, still more preferably 5 to 20 wt %, and particularly preferably 5 to 15 wt %; and inorganic filler (D6) in an amount of 15 to 80 wt %, preferably 20 to 70 wt %, more preferably 30 to 70 wt %, still more preferably 30 to 60 wt %, and particularly preferably 35 to 60 wt %, wherein the total of components (A6), (B6), (C6), and (D6) is 100 wt %.

The amount of oil (E6) used in the sixth aspect is 0.1 to 20 parts by weight, preferably 0.1 to 10 parts by weight, and more preferably 0.1 to 8 parts by weight relative to 100 parts by weight to the total of components (A6), (B6), (C6), and (D6). When the composition contains oil (E6) in the above range, the effect of improving low-temperature properties is remarkable while the oil is seldom bled in surfaces of molded articles; hence such composition is preferred.

When both graft-modified polymer (F6) and propylene/$C_4$-$C_{20}$ α-olefin random copolymer (B6-1) are used, it is desirable that propylene-based resin composition (X6) contains propylene-based polymer (A6) in an amount of 0 to 80 wt %, preferably 0 to 70 wt %, more preferably 0 to 60 wt %, still more preferably 0 to 50 wt %, and particularly preferably 10 to 40 wt %; propylene/$C_4$-$C_{20}$ α-olefin random copolymer (B6-1) in an amount of 5 to 85 wt %, preferably 5 to 80 wt %, more preferably 5 to 65 wt %, still more preferably 5 to 55 wt %, and particularly preferably 5 to 45 wt %; elastomer (C6) in an amount of 0 to 40 wt %, preferably 0 to 30 wt %, more preferably 0 to 25 wt %, still more preferably 0 to 20 wt %, and particularly preferably 0 to 15 wt %; and inorganic filler (D6) in an amount of 15 to 80 wt %, preferably 20 to 70 wt %, more preferably 30 to 70 wt %, still more preferably 30 to 60 wt %, and particularly preferably 35 to 60 wt %, wherein the total of components (A6), (B6), (C6), and (D6) is 100 wt %. In this case, graft-modified polymer (F6) is added in an amount of 0.1 to 10 parts by weight, preferably 0.1 to 8 parts by weight, relative to 100 parts by weight of the total of components (A6), (B6), (C6), and (D6). When the composition contains graft-modified polymer (F6) in the above range, the effect of improving scratch resistance is remarkable and the composition has excellent flowability; hence such composition is preferred.

When graft-modified polymer (F6) is used and propylene/ethylene/$C_4$-$C_{20}$ α-olefin random copolymer (B6-2) is used as propylene/α-olefin random copolymer (B6), it is desirable that propylene-based resin composition (X6) contains propylene-based polymer (A6) in an amount of 0 to 80 wt %, preferably 0 to 70 wt %, more preferably 0 to 60 wt %, still more preferably 0 to 50 wt %, and particularly preferably 10 to 40 wt %; propylene/ethylene/$C_4$-$C_{20}$ α-olefin random copolymer (B6-2) in an amount of 5 to 85 wt %, preferably 5 to 80 wt %, more preferably 5 to 65 wt %, still more preferably 5 to 50 wt %, and particularly preferably 5 to 40 wt %; elastomer (C6) in an amount of 0 to 40 wt %, preferably 0 to 30 wt %, more preferably 0 to 25 wt %, still more preferably 0 to 20 wt %, and particularly preferably 0 to 15 wt %; and inorganic filler (D6) in an amount of 15 to 80 wt %, preferably 20 to 70 wt %, more preferably 30 to 70 wt %, still more preferably 30 to 60 wt %, and particularly preferably 35 to 60 wt %, wherein the total of components (A6), (B6), (C6), and (D6) is 100 wt %. In this case, the graft-modified polymer (F6) is blended in an amount of generally 0.1 to 30 parts by weight, preferably 0.1 to 10 parts by weight, and more preferably 0.1 to 8 parts, by weight relative to 100 parts by weight of the total of components (A6), (B6), (C6), and (D6). When the composition contains graft-modified polymer (F6) in the above range, the effect of improving scratch resistance is remarkable and the composition has excellent flowability; therefore such composition is preferred.

As long as the objectives of the sixth aspect are not impaired, propylene-based resin composition (X6) may further contain other resins, other rubbers, additives such as antioxidants, heat stabilizers, weathering stabilizers, anti-slip agents, anti-blocking agents, nucleating agents, pigments, hydrochloric acid absorbers, and inhibitors against copper-induced damage. Such other resins, other rubbers, additives, and others described above may be added in any amount without particular limitation as long as the objectives of the sixth aspect are not impaired. In a preferred embodiment, for example, the total of (A6), (B6), (C6), and (D6) is 60 to 100 wt %, and preferably 80 to 100 wt % of the whole composition (X6), and the remainder is accounted for by the above described other resins, other rubbers, additives, oil (E6), graft-modified polymer (F6), and others.

<Method for Producing Propylene-Based Resin Composition (X6)>

Propylene-based resin composition (X6) of the sixth aspect can be produced by publicly known methods, for example, by melt-kneading of the above components.

When propylene-based resin composition (X6) contains graft-modified polymer (F6), propylene-based polymer (B6) and graft-modified polymer (F6) are melt-kneaded to produce propylene-based polymer composition (G6), which is subsequently melt-kneaded together with inorganic filler (D6), if necessary propylene-based polymer (A6), and if necessary one or more elastomers (C6) selected from ethylene-based elastomer (C6-1) and styrene-based elastomer (C6-2). This process is preferable because scratch resistance can be further improved while no other properties are impaired.

Here, part of (B6) or (F6) may be supplied independently of propylene-based polymer composition (G6) (melt-kneaded product), similar to component (A6) and others, without preliminarily melt-kneading. However, it is the most effective that whole (B6) and (F6) are preliminarily melt-kneaded to prepare propylene-based polymer composition (G6) (melt-kneaded product), and then the composition is supplied.

<Propylene-Based Polymer Composition (G'6)>

Propylene-based polymer composition (G'6) comprises propylene-based polymer (36) and graft-modified polymer (F6). The content of (B6) is 99 to 14 parts by weight and that of (F6) is 1 to 86 parts by weight, wherein the total of (B6) and (F6) is 100 parts by weight. Particularly preferably, the content of (B6) is 99 to 50 parts by weight and that of (F6) is 1 to 50 parts by weight. When propylene-based polymer composition (G'6) is used for producing propylene-based resin composition (X6), the ratio of (B6) to (F6) may be selected according to the ratio of (B6) to (F6) in said propylene-based resin composition (X6). Propylene-based polymer composition (G'6) can be produced, for example, by melt-kneading (B6) and (F6).

<Molded Article>

The molded article of the sixth aspect is made of propylene-based resin composition (X6) described above. Molded articles with various shapes are obtained from propylene-based resin composition (X6) using conventional publicly-known melt-molding methods. The melt-molding methods include, for example, extrusion molding, rotation molding, calendar molding, injection molding, compression molding, transfer molding, powder molding, blow molding, vacuum molding, and others. The molded article may be a composite with a molded article made of another material, for example, laminate.

The molded articles are suitably used, for example, as coatings for electrical wire bodies such as electrical wire insulators and wire sheaths. The coating layers, such as electrical wire insulators and wire sheaths, are formed around electrical wire bodies using conventional publicly-known methods, for example, extrusion molding.

The electrical wire of the sixth aspect has an insulator made of propylene-based resin composition (X6) and/or a sheath made of propylene-based resin composition (X6). The electrical wire is, in particular, preferably an electrical wire for automobiles (automobile electrical wire) and an electrical wire for apparatuses (insulated wires for electric apparatus).

Propylene-based resin composition (X6) is also suitably used for building materials and others.

7. Seventh Aspect

Hereinafter, the seventh aspect of the present invention is explained in detail. Foaming material (X7) related to the seventh aspect is characterized by containing propylene-based polymer (B7).

<Propylene-Based Polymer (A7)>

Propylene-based polymers (A7) optionally used in the seventh aspect include homopolypropylene and copolymers of propylene and at least one $C_2$-$C_{20}$ α-olefin except propylene. The $C_2$-$C_{20}$ α-olefins except propylene include α-olefins like those for isotactic polypropylene (A1) used in the first aspect. Also, the preferable range is the same.

These α-olefins may form a random or block copolymer with propylene.

Propylene-based polymer (A7) may contain structural units derived from these α-olefins in an amount of 35 mol % or less, and preferably 30 mol % or less. Here, the total of propylene-derived structural units and structural units derived from α-olefins except propylene is 100 mol %.

The desirable melt flow rate (MFR) of propylene-based polymer (A7) is 0.01 to 1,000 g/10 min, and preferably 0.05 to 100 g/10 min, as determined at 230° C. under a load of 2.16 kg in accordance with ASTM D1238.

The melting point of propylene-based polymer (A7) measured with a differential scanning calorimeter is 100° C. or higher, preferably 100 to 160° C., and more preferably 110 to 150° C.

Propylene-based polymer (A7) may be either isotactic or syndiotactic, but preferably isotactic, considering heat resistance and others.

There may be used, if necessary, two or more propylene-based polymers (A7) in combination, for example, two or more components different in melting point or rigidity.

To attain desired properties, there may be used, as propylene-based polymer (A7), one or more polymers selected from homopolypropylene with excellent heat resistance (publicly known, generally copolymerized with 3 mol % or less of comonomers except propylene), block polypropylene with excellent balance of heat resistance and flexibility (publicly known, generally containing 3 to 30 wt % of n-decane-soluble rubber components), and random polypropylene with excellent balance of flexibility and transparency (publicly known, generally having a melting peak of 100° C. or higher and preferably 110° C. to 150° C. as measured with a differential scanning calorimeter DSC).

Such propylene-based polymer (A7) can be produced by methods similar to those for producing isotactic polypropylene (A1) used in the first aspect.

Foaming material (X7) of the seventh aspect containing component (A7) attains excellent scratch resistance and permanent compression set, in particular.

<Propylene-Based Polymer (B7)>

Propylene-based polymers (B7) used in the seventh aspect include homopolypropylene and copolymers of propylene and at least one $C_2$-$C_{20}$ α-olefin except propylene. The $C_2$-$C_{20}$ α-olefins except propylene include the same α-olefins as those for propylene-based polymer (A7). Also, the preferable range is the same.

These α-olefins may form a random or block copolymer with propylene.

In propylene-based polymer (B7), the content of propylene-derived structural units is generally 40 to 100 mol %, preferably 40 to 99 mol %, more preferably 40 to 92 mol %, and still more preferably 50 to 90 mol %; and the content of structural units derived from the $C_2$-$C_{20}$ α-olefin (except propylene) used as a co-monomer is generally 0 to 60 mol %, preferably 1 to 60 mol %, more preferably 8 to 60 mol %, and still more preferably 10 to 50 mol %, wherein the total of propylene-units and $C_2$-$C_{20}$ α-olefin-units is 100 mol %).

The melting point of propylene-based polymer (B7) is lower than 120° C. or not observed, and preferably not higher than 100° C. or not observed, as measured with a differential scanning calorimeter (DSC). Here, "melting point is not observed" means that any melting endothermic peak of crystal with a melting endothermic entalpy of crystal of 1 J/g or more is not observed in the temperature range of −150 to 200° C. The measurement conditions are as described in Examples of the seventh aspect.

The intrinsic viscosity [η] of propylene-based polymer (B7) is generally 0.01 to 10 dl/g, and preferably 0.05 to 10 dl/g as measured in decalin at 135° C.

Propylene-based polymer (B7) preferably has the same triad tacticity (mm-fraction) as propylene/ethylene/α-olefin copolymer (B1) used in the first aspect, whereby the same effect is obtained.

Namely, the triad tacticity (mm-fraction) of propylene-based polymer (B7) determined by $^{13}$C-NMR is preferably 85% or more, more preferably 85% to 97.5%, still more preferably 87% to 97%, and particularly preferably 90% to 97%. Polymer (B7) with the above range of triad tacticity (mm-fraction) is preferred for the seventh aspect, because excellent balance of flexibility and mechanical strength is attained, in particular. The mm-fraction can be determined by the method described in WO 04/087775 from Page 21 line 7 to Page 26 line 6.

The methods for producing propylene-based polymer (B7) are not particularly limited to, but include methods similar to those for producing propylene-based polymer (B5) used in the fifth aspect.

It is desirable that propylene-based polymer (B7) has additionally independently the following properties.

The Shore A hardness of propylene-based polymer (B7) is preferably 30 to 80, and more preferably 35 to 70.

The stress at 100% elongation (M100) of propylene-based polymer (B7) is generally 4 MPa or less, preferably 3 MPa or less, and more preferably 2 MPa or less, as measured in accordance with JIS K6301 at a span distance of 30 mm and a tensile speed of 30 mm/min with a JIS #3 dumbbell at 23° C. With the above range of M100, propylene polymer (B7) provides excellent flexibility and rubber elasticity.

Propylene-based polymer (B7) preferably has the same properties as propylene/ethylene/α-olefin copolymer (B1) used in the first aspect concerning crystallinity, glass transition temperature Tg, and molecular weight distribution (Mw/Mn). These properties provide the same effects.

For example, the molecular weight distribution (Mw/Mn, relative to polystyrene standards, Mw: weight-average molecular weight, Mn: number-average molecular weight) of propylene-based polymer (B7) measured by GPC is preferably 4.0 or less, more preferably 3.0 or less, and still more preferably 2.5 or less.

When propylene-based polymer (B7) shows a melting point (Tm in ° C.) in the endothermic curve recorded with a differential scanning calorimeter (DSC), the melting endothermic entalpy, ΔH, is generally 30 J/g or less, and also satisfies the same relation between $C_3$ content (mol %) and melting endothermic entalpy ΔH (J/g) as that of propylene/ethylene/α-olefin copolymer (B1) used in the first aspect.

Preferred examples of propylene-based polymer (B7) include, specifically, propylene/ethylene/$C_4$-$C_{20}$ α-olefin copolymer (B7-1) below. Crosslinked foams obtained using propylene/ethylene/$C_4$-$C_{20}$ α-olefin copolymer (B7-1) are excellent in flexibility and properties of permanent compression set and mechanical strength.

In propylene/ethylene/$C_4$-$C_{20}$ α-olefin copolymer (B7-1), the content of propylene-derived structural units is 45 to 92 mol %, preferably 56 to 90 mol %, and more preferably 61 to 86 mol %; the content of ethylene-derived structural units is 5 to 25 mol %, preferably 5 to 14 mol %, and more preferably 8 to 14 mol %; and the content of $C_4$-$C_{20}$ α-olefin-derived structural units is 3 to 30 mol %, preferably 5 to 30 mol %, and more preferably 6 to 25 mol %, wherein the total of propylene-derived structural units, ethylene-derived structural units, and $C_4$-$C_{20}$ α-olefin-derived structural units is 100 mol %. As the $C_4$-$C_{20}$ α-olefin, 1-butene is particularly preferred.

When the composition contains propylene-based polymer (A7), propylene/ethylene/$C_4$-$C_{20}$ α-olefin copolymer (B7-1) containing propylene-derived structural units, ethylene-derived structural units, and $C_4$-$C_{20}$ α-olefin-derived structural units in the above contents has good compatibility with (A7), providing crosslinked foams excellent in permanent compression set and scratch resistance.

With the contents of structural units derived from propylene, ethylene, and $C_4$-$C_{20}$ α-olefins in the above preferred ranges, resultant forming materials can provide foams with more excellent balance of flexibility, permanent compression set, and scratch resistance. Further, incorporating component (B7) in foaming material (X7) imparts foams to low resilience.

<Ethylene/α-Olefin Copolymer (C7)>

Ethylene/α-olefin copolymer (C7) optionally used in the seventh aspect is a non-crystalline or low-crystalline random or block copolymer composed of ethylene and a $C_3$-$C_{20}$ α-olefin. Its density (evaluated in accordance with ASTM D1505) is generally 0.857 g/cm³ or more and 0.910 g/cm³ or less, preferably 0.860 to 0.905 g/cm³, and more preferably 0.880 to 0.905 g/cm³; and its melt flow rate (MFR measured in accordance with ASTM D1238 at 190° C. under a load of 2.16 kg) is generally 0.1 to 40 g/10 min, and preferably 0.5 to 20 g/10 min.

The $C_3$-$C_{20}$ α-olefins include, specifically, propylene, 1-butene, 1-pentene, 1-hexene, 1-heptene, 1-octene, 1-nonene, 1-decene, 1-undecene, 1-dodecene, 1-hexadecene, 1-octadecene, 1-nonadecene, 1-eicosene, 4-methyl-1-pentene, and others. Among them, preferred are $C_3$-$C_{10}$ α-olefins, and particularly preferred are propylene, 1-butene, 1-hexene, and 1-octene. These α-olefins may be used alone or in combination of two or more.

Desirably, ethylene/α-olefin copolymer (C7) contains 75 to 95 mol % of ethylene-derived structural units and 5 to 25 mol % of $C_3$-$C_{20}$ α-olefin-derived structural units, wherein the total of ethylene-units and α-olefin-units is 100 mol %.

Ethylene/α-olefin copolymer (C7) may further contain, besides these units, units derived from other polymerizable monomers, as long as the objectives of the seventh aspect are not impaired.

Ethylene/α-olefin copolymers (C7) include, specifically, ethylene/propylene copolymer, ethylene/1-butene copolymer, ethylene/propylene/1-butene copolymer, ethylene/propylene/ethylidenenorbornene copolymer, ethylene/1-hexene copolymer, and ethylene/1-octene copolymer. Among them, preferably used are ethylene/propylene copolymer, ethylene/1-butene copolymer, ethylene/1-hexene copolymer, ethylene/1-octene copolymer, and others. Ethylene/1-butene copolymer is particularly preferably used. These copolymers may be random or block copolymers, but random copolymers are preferable in particular.

The crystallinity of ethylene/α-olefin copolymer (C7) is generally 40% or less, and preferably 10 to 30% as measured by X-ray diffractometry.

In ethylene/α-olefin copolymer (C7), the desired molecular weight distribution (Mw/Mn) determined by gel permeation chromatography (GPC) is 1.5 to 3.0, and preferably 1.7 to 2.5. When ethylene/α-olefin copolymer (C7) with this range of molecular weight distribution (Mw/Mn) is used, foaming material (X7) obtained provides foams excellent in permanent compression set and filling property. Ethylene/α-olefin copolymer (C7) described above exhibits generally properties as elastomers.

With ethylene/α-olefin copolymer (C7), it is desirable that the ratio $MFR_{10}/MFR_2$, wherein $MFR_{10}$ and $MFR_2$ are melt flow rates under a load of 10 kg and a load of 2.16 kg, respectively, measured at 190° C. in accordance with ASTM D1238, satisfies following relations:

$MFR_{10}/MFR_2 \geq 6.0$, preferably $7 \leq MRT_{10}/MFR_2 \leq 15$, and at the same time, the molecular weight distribution (Mw/Mn) and $MRT_{10}/MFR_2$ satisfy the following relation:

$Mw/Mn+5.0<MFR_{10}/MFR_2$

These relations ensure availability of foaming material (X7) capable of preparing foams (uncrosslinked or crosslinked) that is foamed at high foaming ratio, i.e. having low specific gravity, highly elastic, and excellent in permanent compression set and filling property.

Desirably, in the $^{13}C$-NMR spectrum of ethylene/α-olefin copolymer (C7), the intensity ratio of Tαβ to Tαα (Tαβ/Tαα) is 0.5 or less, and preferably 0.4 or less.

Here, Tαα and Tαβ are the peak intensities of $CH_2$ in the structural units derived from an α-olefin having 3 or more carbon atoms, and these two kinds of $CH_2$ groups are different in the position relative to the tertiary carbon atom as shown below.

[formula 1]

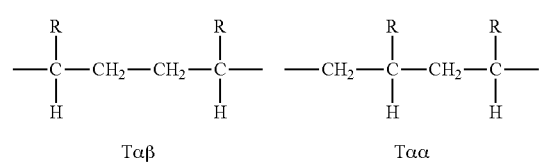

Tαβ/Tαα is determined as follows. For example, the $^{13}C$-NMR spectrum of ethylene/α-olefin copolymer (C7) is recorded on an NMR spectrometer (JEOL-GX270, manufactured by JEOL Ltd.) with a solution containing 5 wt % of the sample in hexachlorobutadiene/benzene-$d_6$ (2/1 by volume) mixed solvent, at 67.8 MHz at 25° C. using benzene-$d_6$ (128 ppm) as reference. The obtained $^{13}$C-NMR spectrum is analyzed in accordance with proposals by Lindeman & Adams (Analysis Chemistry 43, 1245 (1971)) and J. C. Randall (Reviews in Macromolecular Chemistry and Physics, C29, 201 (1989)) to obtain $T\alpha\beta/T\alpha\alpha$.

It is desirable that the B-value of ethylene/α-olefin copolymer (C7) is 0.9 to 1.5 and preferably 0.95 to 1.2, which is obtained from the $^{13}$C-NMR spectrum using equation (7-1) below:

$$B\text{-value}=[P_{OE}]/(2 \cdot [P_E][P_O]) \qquad (7\text{-}1),$$

(in the formula, $[P_E]$ is the mole fraction of ethylene-derived structural units in the copolymer; $[P_O]$ is the mole fraction of α-olefin-derived structural units in the copolymer; and $[P_{OE}]$ is the ratio of number of ethylene-α-olefin dyad to the total number of dyads in the copolymer).

This B-value is an index representing the distribution of ethylene units and the $C_3$-$C_{20}$ α-olefin units in the ethylene/α-olefin copolymer, and is obtained according to papers by J. C. Randall (Macromolecules, 15, 353 (1982)) and J. Ray et al. (Macromolecules, 10, 773 (1977)).

The B-value of ethylene/α-olefin copolymer (C7) is typically determined by acquiring the $^{13}$C-NMR spectrum of a sample solution, in which about 200 mg of the ethylene/α-olefin copolymer is homogeneously dissolved in 1 mL of hexachlorobutadiene, in a 10-mmΦ sample tube at measurement temperature of 120° C. with measurement frequency of 25.05 MHz, spectrum width of 1500 Hz, pulse repetition interval of 4.2 sec, and pulse width of 6 μsec.

A larger B-value means that each blocked chain of ethylene or α-olefin copolymer is shorter, that is, the distribution of ethylene and α-olefin is more uniform, or the composition distribution in copolymer rubber is narrower. As the B-value is more lowered from 1.0, the ethylene/α-olefin copolymer has a wider composition distribution and hence disadvantages such as difficulties in handling.

Ethylene/α-olefin copolymer (C7) can be produced by conventional methods using a vanadium catalyst, a titanium catalyst, or a metallocene catalyst. In particular, solution polymerization described in Japanese Patent Laid-Open Publication No. S62-121709 and others are preferable.

Ethylene/α-olefin copolymer (C7) is used, if any, in an amount of 1 to 1900 parts by weight, preferably 5 to 1000 parts by weight, and more preferably 5 to 500 parts by weight, relative to 100 parts by weight of the total of propylene-based polymer (B7) and propylene-based polymer (A7), which is optionally used. The composition containing such amount of component (C7) provides foams having low specific gravity and low permanent compression set in particular. This effect is particularly remarkable in use for crosslinked foams.

<Ethylene/Polar Monomer Copolymer (D7)>

As the polar monomer used for ethylene/polar monomer copolymer (D7) optionally used in the seventh aspect, there may be mentioned, unsaturated carboxylic acids, their salts, their esters, their amides, vinyl esters, carbon monoxide, and others. Specifically, the polar monomer may be one compound or two or more compounds selected from unsaturated carboxylic acids such as acrylic acid, methacrylic acid, fumaric acid, itaconic acid, monomethyl maleate, monoethyl maleate, maleic anhydride, and itanonic anhydride; salts of such unsaturated carboxylic acid with a mono-valent metal such as lithium, sodium, and potassium; salts of such unsaturated carboxylic acid with a poly-valent metal such as magnesium, calcium, and zinc; unsaturated carboxylic esters such as methyl acrylate, ethyl acrylate, isopropyl acrylate, isobutyl acrylate, n-butyl acrylate, isooctyl acrylate, methyl methacrylate, ethyl methacrylate, isobutyl methacrylate, and dimethyl maleate; vinyl esters such as vinyl acetate and vinyl propionate; carbon monoxide; sulfur dioxide; and others.

Ethylene/polar monomer copolymers (D7) include, more specifically, ethylene/unsaturated acid copolymers such as ethylene/acrylic acid copolymer and ethylene/methacrylic acid copolymer; ionomers wherein part or all of carboxyl protons in said ethylene/unsaturated carboxylic acid copolymer are replaced by the metals described above; ethylene/unsaturated carboxylate copolymers such as ethylene/methyl acrylate copolymer, ethylene/ethyl acrylate copolymer, ethylene/methyl methacrylate copolymer, ethylene/isobutyl acrylate copolymer, and ethylene/n-butyl acrylate copolymer; ethylene/unsaturated carboxylate/unsaturated carboxylic acid copolymers such as ethylene/isobutyl acrylate/methacrylic acid copolymer and ethylene/n-butyl acrylate/methacrylic acid copolymer; ionomers wherein part or all of carboxyl protons in said ethylene/unsaturated carboxylate/unsaturated carboxylic acid copolymer are replaced by the metals described above; ethylene/vinyl ester copolymers such as ethylene/vinyl acetate copolymer; and others.

In particular, (D7) of these, copolymers of ethylene and a polar monomer selected from unsaturated carboxylic acids, their salts, their esters, and vinyl acetate are preferable; ionomers derived from ethylene/(meth)acrylic acid copolymer, ionomers derived from ethylene/(meth)acrylic acid/(meth)acrylate copolymer, or ethylene/vinyl acetate copolymer are more preferable; and ethylene/vinyl acetate copolymers are still more preferable.

In ethylene/polar monomer copolymer (D7), the polar monomer content is 1 to 50 wt %, and preferably 5 to 45 wt %, although varied with the polar monomer. It is desirable that such ethylene/polar monomer copolymer (D7) has a melt flow rate (MFR) at 190° C. under a load of 2160 g of 0.05 to 500 g/10 min, and preferably 0.5 to 20 g/10 min, considering moldability, mechanical strength, and others.

The copolymers of ethylene with unsaturated carboxylic acids, unsaturated carboxylates, vinyl ester, or the like can be obtained by radical copolymerization at high temperature under high pressure. The copolymers of ethylene and metal salts of unsaturated carboxylic acids (ionomers) can be obtained by reacting the ethylene/unsaturated carboxylic acid copolymers with the corresponding metal compounds.

When ethylene/vinyl acetate copolymer is used as ethylene/polar monomer copolymer (D7), the vinyl acetate content is 10 to 30 wt %, preferably 15 to 30 wt %, and more preferably 15 to 25 wt % in the ethylene/vinyl acetate copolymer. The melt flow rate (MFR, measured in accordance with ASTM D1238, at 190° C. under a load of 2.16 kg) of ethylene/vinyl acetate copolymer (D7) is 0.1 to 50 g/10 min, preferably 0.5 to 20 g/10 min, and more preferably 0.5 to 5 g/10 min.

When ethylene/α-olefin copolymer (C7) is used, ethylene/polar monomer copolymer (D7) is used in an amount of 1 to 1900 parts by weight, preferably 5 to 1000 parts by weight, and more preferably 5 to 500 parts by weight, relative to 100 parts by weight of the total of propylene-based polymer (B7) and propylene-based polymer (A7) optionally used.

When ethylene/polar monomer copolymer (D7) is an ethylene/unsaturated carboxylic acid copolymer, blending of the copolymer in the above ratio provides elastomer compositions capable of forming crosslinked foams with excellent adhesion to other layers made of polyurethane, rubber, leather, or the like. In addition, when ethylene/polar monomer copolymer (D7) is blended in the above ratio, the resulting foam layer is excellent in adhesion to other layers made of polyurethane, rubber, leather, or the like, and suitable for lamination.

<Material for Foam (X7)>

Foaming material (X7) of the seventh aspect contains at least propylene-based polymer (B7) and may further contain propylene-based polymer (A7), if necessary. Foaming material (X7) is preferably a composition containing 30 to 100 parts by weight of propylene-based polymer (B7) and 0 to 70 parts by weight of propylene-based polymer (A7), the melting point of (A7) being 100° C. or higher as measured with a differential scanning calorimeter (here, the total of (A7) and (B7) is 100 parts by weight). More preferably, the foaming material contains 30 to 99 parts by weight of propylene-based polymer (B7) and 1 to 70 parts by weight of propylene-based polymer (A7); still more preferably, 50 to 95 parts by weight of propylene-based polymer (B7) and 5 to 50 parts by weight of propylene-based polymer (A7); and particularly preferably, 70 to 90 parts by weight of propylene-based polymer (B7) and 10 to 30 parts by weight of propylene based-polymer (A7).

Foaming material (X7) of the seventh aspect is preferably a composition containing 1 to 1900 parts by weight of ethylene/α-olefin copolymer (C7) and/or 1 to 1900 parts by weight of ethylene/polar monomer copolymer (D7) relative to 100 parts by weight of the total of propylene-based polymer (B7) and if any, propylene-based polymer (A7). Such compositions include, for example, (i) composition containing 1 to 1900 parts by weight of ethylene/α-olefin copolymer (C7) relative to 100 parts by weight of the total of propylene-based polymer (B7) and if any, propylene-based polymer (A7);

(ii) composition containing 1 to 1900 parts by weight of ethylene/polar monomer copolymer (D7) relative to 100 parts by weight of the total of propylene-based polymer (B7) and if any, propylene-based polymer (A7); and (iii) composition containing 1 to 1900 parts by weight of ethylene/α-olefin copolymer (C7) and 1 to 1900 parts by weight of ethylene/polar monomer copolymer (D7) relative to 100 parts by weight of the total of propylene-based polymer (B7) and if any, propylene-based polymer (A7).

More preferred embodiments include a composition containing 5 to 1000 parts by weight of ethylene/α-olefin copolymer (C7) among composition (i), a composition containing 5 to 1000 parts by weight of ethylene/α-olefin copolymer (C7) among composition (iii), a composition containing 5 to 1000 parts by weight of ethylene/α-olefin copolymer (C7) and 5 to 1000 parts by weight of ethylene/polar monomer copolymer (D7) among composition (iii), and others.

<Foaming Agent (E7)>

Foaming agents (E7) optionally used in the seventh aspect include chemical foaming agents, specifically, organic thermally decomposable foaming agents including azo compounds such as azodicarbonamide (ADCA), 1,1'-azobis(1-acetoxy-1-phenylethane), dimethyl 2,2'-azobisbutyrate, dimethyl 2,2'-azobisisobutyrate, 2,2'-azobis(2,4,4-trimethylpentane), 1,1'-azobis(cyclohexane-1-carbonitrile), and 2,2'-azobis[N-(2-carboxyethyl)-2-methylpropionamidine]; nitroso compounds such as N,N'-dinitrosopentamethylenetetramine (DPT); hydrazine derivatives such as 4,4'-oxybis (benzenesulfonylhydrazide) and diphenylsulfone-3,3'-disulfonylhydrazide; semicarbazides such as p-toluenesulfonylsemicarbazide; and trihydrazinotriazine, and also inorganic thermally decomposable foaming agents including hydrogencarbonates such as sodium hydrogencarbonate and ammonium hydrogencarbonate; carbonates such as sodium carbonate and ammonium carbonate; nitrites such as ammonium nitrite, and hydrogen compounds. Among these, azodicarbonamide (ADCA) and sodium hydrogencarbonate are particularly preferable.

As foaming agent (E7) in the seventh aspect, there may also be used physical foaming agents (foaming agents do not necessarily generate bubbles with chemical reaction), for example, organic physical forming agents including aliphatic hydrocarbons such as methanol, ethanol, propane, butane, pentane, and hexane; chlorohydrocarbons such as dichloroethane, dichloromethane, and carbon tetrachloride; and chlorofluorohydrocarbons such as CFCs, and also inorganic physical foaming agents including air, carbon dioxide, nitrogen, argon, and water. Among these, carbon dioxide, nitrogen, and argon are excellent, because they can dispense with vaporization process, are not expensive, and quite hardly cause environmental pollution or ignition.

Since the physical foaming agent generates no decomposition residue, mold staining can be prevented when the composition is crosslinked foamed. In addition, the physical foaming agent is not powdery and hence readily mixed in kneading. Further, with the physical foaming agent, resultant crosslinked foams will not generate offensive odors (for example, ammonia odor generated on decomposition of ADCA).

In the seventh aspect, the chemical foaming agent described above may be used together, as long as no adverse effect such as offensive odor or mold staining comes about.

For using a physical foaming agent in small scale production, the agent, such as carbon dioxide and nitrogen, stored in a cylinder may be supplied to an injection molding machine, an extrusion molding machine, or the like either through a pressure regulator or while being pressurized with a pump or the like.

In facilities for large-scale production of foamed articles, a tank for storing liquid carbon dioxide, liquid nitrogen, or the like is installed, the liquid is vaporized through a heat exchanger, and the gas is supplied to an injection molding machine, an extrusion molding machine, or the like through tubing and a pressure regulator.

In the case of a liquid physical foaming agent, the pressure of agent in storage is preferably 0.13 to 100 MPa. If the pressure is too low, the agent would sometimes fail to be supplied into an injection molding machine, an extrusion molding machine, or the like after reducing pressure. If the pressure is too high, the storage tank is required to have high pressure resistance, whereby the tank sometimes becomes large in size and complex in structure. The "pressure of agent in storage" defined here is the pressure at which the agent is supplied to the pressure regulator after vaporized.

When the chemical foaming agent is used as foaming agent (E7), the chemical foaming agent is used in a ratio of generally 1 to 40 parts by weight and preferably 2 to 20 parts by weight relative to 100 parts by weight of the total of propylene-based polymer (A7), propylene-based polymer (B7), ethylene/α-olefin copolymer (C7), and ethylene/polar monomer copolymer (D7). Note that, the components other than (B7) are optional, so that the amount of one or more of components (A7), (C7), and (D7) may be 0 parts by weight. The amount of chemical foaming agent is adjusted as appropriate according to a desired foaming ratio, because the volume of gas generated from the foaming agent varies with species and/or grade of the foaming agent to be used.

When the physical foaming agent is used as foaming agent (E7), the amount of physical foaming agent is adjusted as appropriate according to a desired foaming ratio.

In the seventh aspect, a foaming auxiliary may be optionally used together with foaming agent (E7). The foaming auxiliary has functions such as lowering the decomposition temperature of foaming agent (E7), promoting the decomposition, and homogenizing bubble generation. Such foaming auxiliaries include zinc oxide (ZnO), zinc stearate, organic acids such as salicylic acid, phthalic acid, stearic acid, and oxalic acid, urea or its derivatives, and others.

<Organic Peroxide (F7)>

Organic peroxides (F7) optionally used as the crosslinker in the seventh aspect include, specifically, dicumyl peroxide, di-t-butyl peroxide, 2,5-dimethyl-2,5-di-(t-butylperoxy)hexane, 2,5-dimethyl-2,5-(t-butylperoxy)-3-hexyne, 1,3-bis(t-butylperoxyisopropyl)benzene, 1,1-bis(t-butylperoxy)-3,3,5-trimethylcyclohexane, n-butyl 4,4-bis(t-butylperoxy)valerate, benzoyl peroxide, p-chlorobenzoyl peroxide, 2,4-dichlorobenzoyl peroxide, t-butylperoxy benzoate, t-butyl perbenzoate, t-butylperoxy isopropyl carbonate, diacetyl peroxide, lauloyl peroxide, t-butyl cumyl peroxide, and others.

The amount of organic peroxide (F7) used in the seventh aspect is generally 0.1 to 1.5 parts by weight, and preferably 0.2 to 1.0 part by weight, relative to 100 parts by weight of the total of propylene-based polymer (A7), propylene-based polymer (B7), ethylene/α-olefin copolymer (C7), and ethylene/polar monomer copolymer (D7). Note that, the components other than (B7) are optional, so that the amount of one or more of components (A7), (C7), and (D7) may be 0 parts by weight. Use of organic peroxide (F7) in the above ratio gives crosslinked foams having appropriate structure of crosslinking. When organic peroxide (F7) is used in the above ratio together with crosslinking auxiliary (G7), crosslinked foams obtained have more appropriate structure of crosslinking.

<Crosslinking Auxiliary (G7)>

Crosslinking auxiliaries (G7) optionally used in the seventh aspect include, specifically, auxiliaries for peroxycrosslinking such as sulfur, p-quinonedioxime, p,p'-dibenzoylquinonedioxime, N-methyl-N,4-dinitrosoaniline, nitrosobenzene, diphenylguanidine, and trimethylolpropane-N,N'-m-phenylene dimaleimide; divinylbenzene, triallyl cyanurate (TAC), and triallyl isocyanurate (TAIC). Crosslinking auxiliaries (G7) also include multifunctional methacrylate monomers such as ethylene glycol dimethacrylate, diethylene glycol dimethacrylate, polyethylene glycol dimethacrylate, trimethylolpropane trimethacrylate, and allyl methacrylate; multifunctional vinyl monomers such as vinyl butyrate and vinyl stearate; and others. Among them, triallyl cyanurate (TAC) and triallyl isocyanurate (TAIC) are preferred.

In the seventh aspect, the desirable weight ratio of organic peroxide (F7) to crosslinking auxiliary (G7) ((F7)/(G7)) is 1/30 to 20/1, and preferably 1/20 to 10/1.

<Preparation of Material for Foam (X7)>

Foaming material (X7) related to the seventh aspect of is an uncrosslinked and unfoamed material and may be in a molten state or solidified by cooling into pellets or sheets.

Pellets of foaming material (X7) described above are prepared, for example, as follows: at first, there are mixed required components selected from propylene-based polymer (B7), which is the copolymer of propylene and at least one $C_2$-$C_{20}$ α-olefin except propylene and whose melting point is lower than 100° C. or not observed with a differential scanning calorimeter, propylene-based polymer (A7) having the melting point of 100° C. or higher as measured with a differential scanning calorimeter, ethylene/α-olefin copolymer (C7), ethylene/polar monomer copolymer (D7), foaming agent (E7), organic peroxide (F7), and optionally crosslinking auxiliary (G7) and the foaming auxiliary, in the above ratios, with a Henschel mixer or the like; the resulting mixture is melted and plasticized with a kneader, such as Banbury mixer, roll, and extruder, at a temperature at which foaming agent (E7) and/or organic peroxide (F7) are not decomposed, so that the components are uniformly mixed and dispersed; and then, the mixture is processed with a pelletizer to obtain pellets.

Foaming material (X7) may optionally contain, besides the above components, various additives such as filler, heat stabilizers, weathering stabilizers, flame retardants, hydrochloric acid absorbers, and pigments as long as the objectives of the seventh aspect are not impaired.

The sheet (uncrosslinked and unfoamed foaming sheet) of foaming material (X7) is prepared, for example, by molding the pelletized composition prepared above using an extruder or a calendar molding machine. Alternative methods for preparing the sheet include a method of kneading components of the above composition with a Brabender mill or the like, followed by forming the kneaded material into a sheet with a calendar roll or a press molding machine; a method of kneading the components using an extruder, followed by molding of the kneaded material through a T-die or circular die into a sheet; and others.

<Foam>

The foam related to the seventh aspect is obtained by foaming or crosslinking foaming of foaming material (X7) described above, generally under conditions of 130 to 200° C., 30 to 300 kgf/cm$^2$, and 10 to 90 min. However, the forming or crosslink forming time may be adjusted out of the above range as appropriate, because it depends on the thickness of mold.

The foam or crosslinked foam of the seventh aspect may be a foam or crosslinked foam obtained by compression molding of a molded article, which has been foamed or crosslinked foamed under the above conditions, at 130 to 200° C., under 30 to 300 kgf/cm$^2$, for 5 to 60 min, at a compression ratio of 1.1 to 3, and preferably 1.3 to 2.

With the foam or crosslinked foam, the specific gravity (JIS K7222) is generally 0.6 or less, preferably 0.03 to 0.4, more preferably 0.03 to 0.25, and still more preferably 0.05 to 0.25; while the surface hardness (Asker C hardness) is generally 20 to 80, and preferably 30 to 65. The gel fraction of crosslinked foam is desirably 70% or more, and generally 70% to 95%.

The crosslinked foam of the seventh aspect with such properties has small permanent compression set, high tear strength, excellent vibration damping property, and excellent scratch resistance.

Here, the gel fraction (gel content, xylene-insoluble fraction) is measured as follows.

A weighed sample of crosslinked foam is cut finely into chips, the resulting chips are put in a sealed vessel with p-xylene, and p-xylene is refluxed under normal pressure for 3 hours. Specifically, 1.5 g of the sample is put in 100 cc of p-xylene at 140° C., which is refluxed for 3 hours. Then, insoluble part is collected with a 325-mesh screen.

After that, the resulting sample (insoluble part) is completely dried. The "corrected final weight (Y)" is calculated by subtracting the weight of xylene-insoluble part other than polymers (for example, filler, fillings, pigments, etc.) from the weight of dried residue.

On the other hand, the "corrected initial weight (X)" is calculated by subtracting the weight of xylene-soluble part other than polymers (for example, stabilizers, etc.) and the weight of xylene-insoluble part other than polymers (for example, filler, fillings, pigments, etc.) from the sample weight.

Now, the gel fraction (xylene-insoluble content) is determined by the following equation:

Gel fraction (wt %)=([corrected final weight (Y)]÷[corrected initial weight (X)])×100

<Preparation of Foam>

The foam (uncrosslinked or crosslinked foam) related to the seventh aspect is prepared, for example, by the following method.

The sheet of foaming material (X7) related to the seventh aspect can be obtained, for example, from a mixture described in the section of preparation of foaming material (X7), using a calendar molding machine, press molding machine, or T-die extruder. The sheet is required to be molded at a temperature below the decomposition temperatures of foaming agent (E7) and organic peroxide (F7). Specifically, the sheet is preferably molded under such conditions that the temperature of melted foaming material (X7) is 100 to 130° C.

The sheet formed from foaming material (X7) by the above method is cut to reduce its volume to 1.0 to 1.2 times of the volume of mold and the cut material is inserted into the mold kept at 130 to 200° C. A primary foam (uncrosslinked or crosslinked foam) is prepared under such conditions that the clamping pressure of mold is 30 to 300 kgf/cm$^2$ and the hold time is 10 to 90 min, although the hold time may be adjusted beyond the above range as appropriate, because it depends on the thickness of mold.

The mold for producing the above foam is not particularly limited on its shape, but a mold with a shape capable of forming sheets is generally used. This mold is required to have a totally closed structure to prevent leakage of the resin melt and gas generated by decomposition of the foaming agent. The mold frame preferably has tapered inside face for easy release of resins.

The primary foam obtained by the above method is compression-molded into a predetermined shape (prepare a secondary foam). The compression molding is conducted at a mold temperature of 130 to 200° C., under a clamping pressure of 30 to 300 kgf/cm$^2$, for a compressing time of 5 to 60 min, at a compression ratio of 1.1 to 3.0.

The method for obtain the crosslinked foam through crosslinking using ionizing irradiation is as follows. Firstly, the necessary components selected from propylene-based polymer (B7), which is the copolymer of propylene and at least one $C_2$-$C_{20}$ α-olefin except propylene and whose melting point is lower than 100° C. or not observed with a differential scanning calorimeter, propylene-based polymer (A7) having a melting point of 100° C. or higher as measured with a differential scanning calorimeter, ethylene/α-olefin copolymer (C7), and ethylene/polar monomer copolymer (D7) are melt-kneaded together with the organic thermally decomposable foaming agent as foaming agent (E7) and other additives at a temperature below the decomposition temperature of the organic thermally decomposable foaming agent; then the resulting mixture is molded, for example, in a sheet form to obtain a foaming sheet.

After the resulting sheet is exposed to ionizing radiation in a predetermined exposure dose for crosslinking, the crosslinked foaming sheet thus obtained is foamed by heating above the decomposition temperature of the organic thermally decomposable foaming agent, whereby a crosslinked foamed sheet is obtained.

The ionizing radiations include α-rays, β-rays, γ-rays, electron beam, neutron beam, and X-rays. Among these, γ-rays from cobalt-60 and electron beam are preferably used.

The product shapes of the foam include, for example, sheet, heavy board, net, and mold.

From the crosslinked foam (primary foam) thus obtained, a secondary crosslinked foam with the above properties can be prepared, in a similar manner to that in producing the above secondary foam.

<Laminate>

The laminate related to the seventh aspect of invention contains a layer of the above foam (uncross linked or crosslinked foam) and a layer made of at least one material selected from the group consisting of polyolefin, polyurethane, rubber, leather, and artificial leather.

The above polyolefin, polyurethane, rubber, leather, and artificial leather are not particularly limited; there may be used conventional publicly known polyolefin, polyurethane, rubber, leather, and artificial leather. The laminate is suitably used especially for footwear and footwear components.

<Footwear and Footwear Components>

The footwear and footwear components of the seventh aspect are composed of the above foam (uncrosslinked or crosslinked) or laminate. The footwear components include, for example, shoe soles, shoe mid soles, inner soles, soles, and sandals.

8. Eighth Aspect

Hereinafter, the eighth aspect of invention is explained in detail.

<Propylene-Based Polymer (A8)>

Propylene-based polymers (A8) used in the eighth aspect include homopolypropylene and copolymers of propylene and at least one $C_2$-$C_{20}$ α-olefin except propylene. The $C_2$-$C_{20}$ α-olefins except propylene include the same as those for isotactic polypropylene (A1) used in the first aspect. Also, the preferable range is the same.

These α-olefins may form a random or block copolymer with propylene.

The structural units derived from these α-olefins may be contained in a ratio of 35 mol % or less and preferably 30 mol % or less in propylene-based polymer (A8).

It is desirable that the melt flow rate (MFR) of propylene-based polymer (A8), as measured at 230° C. under a load of 2.16 kg in accordance with ASTM D1238, is 0.01 to 1000 g/10 min, and preferably 0.05 to 100 g/10 min.

The melting point of propylene-based polymer (A8) measured with a differential scanning calorimeter is 100° C. or higher, preferably 100 to 160° C., and more preferably 110 to 150° C.

Propylene-based polymer (A8) may be either isotactic or syndiotactic, but the isotactic structure is preferred considering heat resistance and others.

There may be used, if necessary, a plurality of propylene-based polymers (A8), for example, two or more components different in melting point or rigidity.

To obtain desired properties, there may be used, as propylene-based polymer (A8), one polymer or a combination of polymers selected from homopolypropylene excellent in heat resistance (publicly known, generally containing 3 mol % or less of copolymerized components except propylene), block polypropylene excellent in balance of heat resistance and flexibility (publicly known, generally containing 3 to 30 wt % of n-decane-soluble rubber components), and random polypropylene excellent in balance of flexibility and transparency (publicly known, generally having a melting peak of 100° C. or higher and preferably 110° C. to 150° C. as measured with a differential scanning calorimeter DSC).

Such propylene-based polymer (A8) can be produced in a similar manner to that for producing isotactic polypropylene (A1) used in the first aspect.

<Soft Propylene-Based Copolymer (B8)>

Soft propylene-based copolymer (B8) used in the eighth aspect is a copolymer of propylene and at least one $C_2$-$C_{20}$ α-olefin except propylene. Shore A hardness thereof is 30 to 80 and preferably 35 to 70, and melting point thereof is lower than 100° C. or not observed when measured with a differential scanning calorimeter (DSC). Here, "melting point is not observed" means that any melting endothermic peak of crystal having a melting endothermic enthalpy of crystal of 1 J/g or more is not observed in the temperature range of −150 to 200° C. The measurement conditions are as described in Examples.

In soft propylene-based copolymer (B8), the α-olefin used as a co-monomer is preferably ethylene and/or a $C_4$-$C_{20}$ α-olefin.

In soft propylene-based copolymer (B8), preferably, the content of propylene-derived units is 45 to 92 mol % and preferably 56 to 90 mol %, and the content of units derived from the α-olefin used as a co-monomer is 8 to 55 mol % and preferably 10 to 44 mol %.

It is desirable that the melt flow rate (MFR) of soft propylene-based copolymer (B8), as measured at 230° C. under a load of 2.16 kg in accordance with ASTM D1238, is 0.01 to 100 g/10 min and preferably 0.05 to 50 g/10 min.

The method for producing soft propylene-based copolymer (B8) is not particularly limited; it may be produced by polymerizing propylene or copolymerizing propylene and another α-olefin in the presence of a publicly known catalyst used for stereospecific olefin polymerization capable of yielding an isotactic or syndiotactic polymer, for example, a catalyst mainly composed of a solid titanium component and an organometallic compound, or a metallocene catalyst containing a metallocene compound as one of catalyst components. Preferably, as described later, the copolymer is produced by copolymerizing propylene, ethylene, and a $C_4$-$C_{20}$ α-olefin in the presence of the metallocene catalyst.

It is desirable that soft propylene-based polymer (B8) has additionally independently the following properties.

Soft propylene-based copolymer (B8) preferably has the same properties as propylene/ethylene/α-olefin copolymer (B1) used in the first aspect concerning triad tacticity (mm-fraction), stress at 100% elongation, crystallinity, glass transition temperature Tg, and molecular weight distribution (Mw/Mn). These properties provide the same effects.

For instance, the triad tacticity (mm-fraction) of soft propylene-based copolymer (B8) determined by $^{13}$C-NMR is preferably 85% or more, more preferably 85% to 97.5%, still more preferably 87% to 97%, and particularly preferably 90 to 97%. With the above range of triad tacticity (mm-fraction), the composition is excellent particularly in balance of flexibility and mechanical strength, which is preferable in the present invention. The mm-fraction can be determined by the method described in WO 2004/087775 pamphlet from Page 21 line 7 to Page 26 line 6.

The molecular weight distribution (Mw/Mn, relative to polystyrene standards, Mw: weight average molecular weight, Mn: number average molecular weight) of soft propylene-based copolymer (B8), as measured by GPC, is preferably 4.0 or less, more preferably 3.0 or less, and still more preferably 2.5 or less.

When soft propylene-based copolymer (B8) has a melting point (Tm in ° C.) in the endothermic curve recorded with a differential scanning calorimeter (DSC), its melting endothermic enthalpy, ΔH, is generally 30 J/g or less and the same relation is satisfied between $C_3$ content (mol %) and melting endothermic enthalpy ΔH (J/g) as that in propylene/ethylene/α-olefin copolymer (B1) used in the first aspect.

Preferred examples of soft propylene-based copolymer (B8) include, specifically, propylene/ethylene/α-olefin copolymer (B8-1) below. Propylene/ethylene/α-olefin copolymer (B8-1) imparts flexibility, heat resistance, mechanical strength, and transparency, and is suitably used.

In propylene/ethylene/α-olefin copolymer (B8-1), the content of propylene-derived structural units is 45 to 92 mol %, preferably 56 to 90 mol %, and more preferably 61 to 86 mol %; that of ethylene-derived structural units is 5 to 25 mol %, preferably 5 to 14 mol %, and more preferably 8 to 14 mol %; and that of $C_4$-$C_{20}$ α-olefin-derived structural units is 3 to 30 mol %, preferably 5 to 30 mol %, and more preferably 6 to 25 mol %. Of the α-olefins 1-butene is particularly preferable.

Propylene/ethylene/α-olefin copolymer (B8-1) containing propylene-derived structural units, ethylene-derived structural units, and $C_4$-$C_{20}$ α-olefin-derived structural units in the above ratios exhibits excellent compatibility with propylene-based polymer (A8), providing sufficient transparency, flexibility, heat resistance, and scratch resistance.

Further, with the above range of ratios of the structural units derived from propylene, ethylene, and a $C_4$ to $C_{20}$ α-olefin, materials with excellent balance of flexibility, heat resistance, and scratch resistance can be obtained.

<Coupling Agent (Y8)>

As coupling agent (Y8) used in the eighth aspect, there may be used, without particular limitation, any agent that can improve adhesion between the layer containing resin composition (X8) used in the eighth aspect and another layer containing a polar group-containing resin or an inorganic substance, such as metal, in an amount of 50 wt % or more. Suitably used are silane-, titanate-, and chromium-type coupling agents. In particular, the silane-type coupling agent (silane coupling agent) is preferably used.

As the silane coupling agent, publicly known silane coupling agents may be used without particular limitation. Specifically, there may be mentioned n-butyltrimethoxysilane, n-butyltriethoxysilane, n-hexyltrimethoxysilane, n-hexyltriethoxysilane, n-octyltrimethoxysilane, n-octyltriethoxysilane, n-octyltripropoxysilane, vinyltriethoxysilane, vinyltrimethoxysilane, vinyltris(β-methoxyethoxy)silane, γ-glycidoxypropyltrimethoxysilane, γ-aminopropyltriethoxysilane, and the like.

<Organic Peroxide (Z8)>

As organic peroxide (Z8) optionally used in the eighth aspect, there may be used, without particular limitation, publicly known organic peroxides. Specifically they include dilauroyl peroxide, 1,1,3,3-tetramethylbutylperoxy 2-ethylhexanoate, dibenzoyl peroxide, t-amylperoxy 2-ethylhexanoate, t-butylperoxy 2-ethylhexanoate, t-butylperoxy isobutyrate, t-butylperoxymaleic acid, 1,1-di(t-amylperoxy)-3,3,5-trimethylcyclohexane, 1,1-di(t-amylperoxy)cyclohexane, t-amylperoxy isononanoate, t-amylperoxy n-octate, 1,1-di(t-butylperoxy)-3,3,5-trimethylcyclohexane, 1,1-di(t-butylperoxy)cyclohexane, t-butylperoxy isopropyl carbonate, t-butylperoxy 2-ethylhexyl carbonate, 2,5-dimethyl-2,5-di(benzoylperoxy)hexane, t-amylperoxy benzoate, t-butylperoxy acetate, t-butylperoxy isononanoate, t-butylperoxy benzoate, 2,2-di(butylperoxy)butane, n-butyl 4,4-di(t-butylperoxy) butyrate, methyl ethyl ketone peroxide, ethyl 3,3-di(t-butylperoxy)butyrate, dicumyl peroxide, t-butyl cumyl peroxide, di-t-butyl peroxide, 1,1,3,3-tetramethylbutylhydroperoxide, acetylacetone peroxide, and others.

Further, the following auxiliaries may be used as necessary in the eighth aspect. Preferred examples of such auxiliary specifically include auxiliaries for peroxy-crosslinking such as sulfur, p-quinonedioxime, p,p'-dibenzoylquinonedioxime, N-methyl-N,4-dinitrosoaniline, nitrosobenzene, diphenylguanidine, and trimethylolpropane-N,N'-m-phenylene dimaleimide; divinylbenzene; triallyl cyanurate (TAC); triallyl isocyanurate (TAIC); and others. There may also be used multifunctional methacrylate monomers such as ethylene glycol dimethacrylate, diethylene glycol dimethacrylate, polyethylene glycol dimethacrylate, trimethylolpropane trimethacrylate, and allyl methacrylate; multifunctional vinyl monomers such as vinyl butyrate and vinyl stearate; and others. Among them, triallyl cyanurate (TAC) and triallyl isocyanurate (TAIC) are preferred.

In the eighth aspect, it is desirable to use the auxiliary in such an amount that the weight ratio of the auxiliary to the organic peroxide ((auxiliary)/(organic peroxide)) is 1/30 to 20/1, and preferably 1/20 to 10/1.

Resin composition (X8) may be crosslinked, but preferably it is non-crosslinked. Here, "Non-crosslinked" means that the content of components insoluble in boiled xylene is 0.1 wt % or less of the whole organic substances present in the composition. In practice, 1.5 g of the sample is dissolved in 100 cc of p-xylene (140° C.), and after the mixture is refluxed for 3 hr, insoluble components are recovered with a 325-mesh screen. From the weight of dried residue of the insoluble components, is subtracted the weight of xylene-insoluble components other than polymers (for example, filler, bulking agents, pigments, etc.) to obtain "corrected final weight (Y)."

On the other hand, from the weight of the sample, is subtracted the weight of xylene-insoluble components other than polymers (for example, filler, bulking agents, pigments, etc.) to obtain "corrected initial weight (X)."

Here, the content of components insoluble in boiled xylene is determined by the following equation:

Content of components insoluble in boiled xylene (wt %)=([corrected final weight (Y)]÷[corrected initial weight (X)])×100

<Resin Composition (X8)>

Resin composition (X8) used in the eighth aspect contains propylene-based polymer (A8), soft propylene-based copolymer (B8), and coupling agent (Y8). The content of (A8) is 0 to 90 wt % and preferably 10 to 70 wt %, and that of (B8) is 10 to 100 wt % and preferably 30 to 90 wt % (here, the total of (A8) and (B8) is 100 wt %). Desirably, the composition further contains coupling agent (Y8) in an amount of 0.1 to 10 parts by weight, and preferably 0.5 to 5 parts by weight, relative to 100 parts by weight of the composition consisting of (A8) and (B8) (the total amount of (A8) and (B8)), and also contains organic peroxide (Z8) in an amount of 0 to 5 parts by weight, and preferably 0 to 3 parts by weight, relative to 100 parts by weight of the composition consisting of (A8) and (B8) (the total amount of (A8) and (B8)). When composition (X8) contains organic peroxide (Z8), its amount is not less than 0.001 parts by weight and not more than 5 parts by weight, and more preferably not less than 0.01 parts by weight and not more than 3 parts by weight, relative to 100 parts by weight of the composition consisting of (A8) and (B8) (the total amount of (A8) and (B8)).

In the eighth aspect, adhesion can be attained even without organic peroxide (Z8), but adhesion would be enhanced in some cases if the organic peroxide is used in the above range according to applications. If the amount of organic peroxide (Z8) is over the above range, the molecular weight of the resin components including propylene-based polymer (A8) and soft propylene-based copolymer (B8) decreases in some cases.

Resin composition (X8) is characterized in that specific soft propylene-based copolymer (B8) with the above properties is used as a component. Use of soft propylene-based copolymer (B8) improves the composition in balance of flexibility, heat resistance, and transparency, and also provides high adhesion and high peeling strength to other materials in a wider temperature range.

Resin composition (X8) may contain, as necessary, other resins, other rubbers, additives such as antioxidants, heat stabilizers, weathering stabilizers, slipping agents, anti-blocking agents, nucleating agents, pigments, and hydrochloric acid absorbers, inorganic filler, and others as long as the performances of the composition are not impaired.

After individual components and if necessary various additives are blended, for example, with a mixer such as Henschel mixer, Banbury mixer, and tumbler mixer, the blend may be molded, with a single-screw or twin-screw extruder, into pellets, which are then supplied to a publicly known molding machine. Alternatively, the blend prepared as above may be supplied to a publicly known molding machine such as sheet molding machine and injection molding machine.

The heat resistance (TMA) of resin composition (X8) is 100° C. or higher, and preferably 110 to 130° C. The tensile strength at break of resin composition (X8) is 8 to 25 MPa, and preferably 10 MPa to 25 MPa, and its modulus in tension is 5 to 50 MPa, and preferably 10 to 35 MPa.

It is desirable that resin composition (X8) has, additionally and independently, the following properties. Resin composition (X8) may have each of the properties independently, but would be more preferable with these properties at the same time.

(i) In the dynamic viscoelastic measurement at torsion mode (10 rad/s), the loss tangent (tan δ) peak appears in the range of −25° C. to 25° C., and the loss tangent is 0.5 or more;
(ii) the ratio of storage modulus G' (20° C.) to G'(100° C.) (G'(20° C.)/G'(100° C.)) determined based on the above dynamic viscoelastic measurement is 5 or less; and
(iii) the residual strain is 20% or less when a specimen is elongated by 100% at a tensile speed of 30 mm/min with a chuck-to-chuck distance of 30 mm, kept for 10 min, and freed from the load, and the strain is measured after 10 min.

In a desirable embodiment in terms of (i), the loss tangent, tan δ, is 0.5 or more, preferably 0.5 to 2.5, and more preferably 0.6 to 2 in −25° C. to 25° C. When tan δ is 0.5 or less, the flexibility may be insufficient, or even through flexibility is attained, scratch resistance tends to be poor.

In a desirable embodiment in terms of (ii), the ratio of storage modulus G' (20° C.) to G' (100° C.) (G' (20° C.)/G' (100° C.)) is 5 or less, preferably 4 or less, and more preferably 3.5 or less. When G' (20° C.)/G' (100° C.) exceeds 5, the surface may suffer from stickiness or the like, possibly resulting in poor handleability or inadequate heat resistance.

In a desirable embodiment in terms of (iii), the residual strain is 20% or less, preferably 18% or less, and more preferably 16% or less, when a dumbbell specimen of 1 mm thick, 50 mm long, and 5 mm wide is elongated by 100% at a tensile speed of 30 mm/min with a chuck-to-chuck distance of 30 mm, kept for 10 min, and freed from the load, and the strain is measured after 10 min. If the residual strain exceeds 20%, rubber elasticity is likely to decrease, possibly making it difficult to use in such applications where stretching property and resilience are required.

It is desirable that a molded article made of resin composition (X8) has an internal haze of 250 or less, and preferably 20% or less as measured at a thickness of 1 mm.

It is also desirable that a molded article made of resin composition (X8) has a Young's modulus in tension (YM) of 100 MPa or less, and preferably 80 MPa or less as measured in accordance with JIS K 6301.

The melt flow rate (measured in accordance with ASTM D1238, at 230° C. under a load of 2.16 kg) of resin composition (X8) is generally 0.0001 to 1000 g/10 min, preferably 0.0001 to 900 g/10 min, and more preferably 0.0001 to 800 g/10 min. The intrinsic viscosity [η] of resin composition (X8) measured at 135° C. in decahydronaphthalene is generally 0.01 to 10 dl/g, preferably 0.05 to 10 dl/g, and more preferably 0.1 to 10 dl/g.

It is preferred that in the endothermic curve for resin composition (X8) obtained with a differential scanning calorimeter (DSC), the temperature at maximum endothermic peak, which corresponds to the melting point (Tm, ° C.), is observed at 100° C. or higher, and the melting endothermic entalpy corresponding to the peak is preferably in the range of 5 to 40 J/g, and more preferably 5 to 35 J/g.

The temperature at maximum endothermic peak (melting point) of resin composition (X8) is 130° C. or higher, preferably 140° C. or higher, and more preferably 160° C. or higher.

The melt tension (MT) of resin composition (X8) is generally 0.5 to 10 g, and preferably 1 to 10 g. With this range of MT, the composition is readily molded into film, sheet, tube, and the like. Here, the melt tension (MT) is determined with a melt tension tester (available from Toyo Seiki Seisaku-sho, Ltd.) as the tension applied on a filament when the composition is extruded into a strand at a rate of 15 mm/min at 200° C. and the strand is drawn at a constant speed (10 m/min).

<Laminate>

A laminate usable in various applications can be obtained by laminating a layer [a] containing resin composition (X8) and another layer [b] containing a certain material (base material).

There is no particular limitation on the method for producing the laminate. For instance, the laminate is obtained by a method in which resin composition (X8) is molded with the above conventional molding machine such as sheet molding machine and injection molding machine and the resultant molding is heat-bonded with a base material with a heat roller or by vacuum molding. Alternatively, the laminate may be produced by melt-extruding resin composition (X8) on a base material. As long as the effects of the eighth aspect are not impaired, an adhesive layer may be provided between the molded article made of resin composition (X8) and the base material layer, but in the eighth aspect, sufficient adhesion strength can be obtained without the adhesive layer. When no adhesive layer is provided, the laminate of the eighth aspect is excellent in flexibility, rubber elasticity, and transparency, and the production process is simplified.

As the base material for the laminate of the eighth aspect, a polar material is used. Specifically, there may be mentioned metal (aluminum, copper, stainless steel, iron, and other known metallic base materials), inorganic compounds (glass and other known inorganic base materials), polar plastics (AS (acrylonitrile/styrene) resin, ABS (acrylonitrile/butadiene/styrene) resin, polyvinyl chloride resin, fluororesin, polyester resin such as polyethylene terephthalate and polyethylene naphthalate, phenol resin, polyacrylic resin, polyamide resin including various kinds of nylons, polyimide resin, polyamide-imide resin, polyurethane resin, polycarbonate resin, and other known polar plastics), and others.

The laminate of the eighth aspect is used for automobile materials, electrical/electronics materials, construction materials (including wall covering and window materials), convenience goods (including stationery), materials for transportation, civil engineering, and building, and food packaging.

9. Ninth Aspect

Hereinafter, the ninth aspect of the present invention is explained in detail.

<Propylene-Based Polymer (A9)>

Propylene-based polymer (A9) used in the ninth aspect is the same as propylene-based copolymer (A8) used in the eighth aspect.

Propylene-based polymers (A9) used in the ninth aspect include homopolypropylene and copolymers of propylene and at least one $C_2$-$C_{20}$ α-olefin except propylene. The $C_2$-$C_{20}$ α-olefins except propylene include ethylene, 1-butene, 1-pentene, 1-hexene, 4-methyl-1-pentene, 1-octene, 1-decene, 1-dodecene, 1-tetradecene, 1-hexadecene, 1-octadecene, 1-eicosene, and others. Ethylene or a $C_4$-$C_{10}$ α-olefin is preferable.

These α-olefins may form a random or block copolymer with propylene.

The structural units derived from these α-olefins may be contained in an amount of 35 mol % or less and preferably 30 mol % or less in the polypropylene.

It is desirable that the melt flow rate (MFR) of propylene-based polymer (A9), as measured at 230° C. under a load of 2.16 kg in accordance with ASTM D1238, is 0.01 to 10000 g/10 min, and preferably 0.05 to 100 g/10 min.

The melting point of propylene-based polymer (A9) measured with a differential scanning calorimeter is 100° C. or higher, preferably 100 to 160° C., and more preferably 110 to 150° C.

Propylene-based polymer (A9) may be either isotactic or syndiotactic, but the isotactic one is preferred considering heat resistance and others.

There may be used, if necessary, a plurality of propylene-based polymers (A9), for example, two or more components different in melting point or rigidity.

To obtain desired properties, there may be used, as propylene-based polymer (A9), one polymer or a combination of polymers selected from homopolypropylene excellent in heat resistance (known homopolypropylene, generally containing 3 mol % or less of copolymerized components except propylene), block polypropylene excellent in balance of heat resistance and flexibility (known block polypropylene, generally containing 3 to 30 wt % of n-decane-soluble rubber components), and random polypropylene excellent in balance of flexibility and transparency (known random polypropylene, generally having a melting peak of 100° C. or higher and preferably 110° C. to 150° C. as measured with a differential scanning calorimeter DSC).

Such propylene-based polymer (A9) can be produced, for example, like isotactic polypropylene (A1) used in the first aspect, by polymerizing propylene or copolymerizing propylene and the α-olefin with Ziegler catalyst that is composed of a solid catalyst component containing magnesium, titanium, halogen, and an electron donor as essential components, an organoaluminum compound, and an electron donor, or a metallocene catalyst containing a metallocene compound as one component of the catalyst.

<Soft Propylene-Based Copolymer (B9)>

Soft propylene-based copolymer (B9) used in the ninth aspect is a copolymer of propylene and at least one $C_2$-$C_{20}$ α-olefin except propylene, and its Shore A hardness is 30 to 80, and preferably 35 to 70, and its melting point is lower than 100° C. or not observed when measured with a differential scanning calorimeter DSC. Here, "melting point is not observed" means that any melting endothermic peak of crystal having a melting endothermic enthalpy of crystal not less than 1 J/g is not observed in the temperature range of −150 to 200° C. The measurement conditions are as described in Examples of the ninth aspect.

In soft propylene-based copolymer (B9), the α-olefin used as the co-monomer is preferably ethylene and/or a $C_4$-$C_{20}$ α-olefin.

In soft propylene-based copolymer (B9), the content of propylene-derived structural units is 45 to 92 mol % and preferably 56 to 90 mol %, and the content of structural units derived from the α-olefin used as the co-monomer is 8 to 55 mol %, and preferably 10 to 44 mol %.

It is desirable that the melt flow rate (MFR) of propylene polymer (B9), as measured at 230° C. under a load of 2.16 kg in accordance with ASTM D1238, is 0.01 to 100 g/10 min, and preferably 0.05 to 50 g/10 min.

There is no particular limitation on the method for producing soft propylene-based copolymer (B9). There may be mentioned methods similar to those for producing soft propylene-based polymer (B8) used in the eighth aspect.

Namely, soft propylene copolymer (B9) can be produced by polymerizing propylene or copolymerizing propylene and the α-olefin in the presence of a publicly known catalyst used for stereospecific olefin polymerization that can yield an isotactic or syndiotactic polymer, for example, a catalyst mainly composed of a solid titanium component and an organometallic compound, or a metallocene catalyst containing a metallocene compound as one of catalyst components. Preferably, as described later, the copolymer is produced by copolymerizing propylene, ethylene, and a $C_4$-$C_{20}$ α-olefin in the presence of the metallocene catalyst.

It is preferred that soft propylene-based copolymer (B9) have additionally independently the following properties.

Soft propylene-based copolymer (B9) preferably has the same properties as propylene/ethylene/α-olefin copolymer (B1) used in the first aspect concerning triad tacticity (mm-fraction), stress at 100% elongation, crystallinity, glass transition temperature Tg, and molecular weight distribution (Mw/Mn). These properties provide the same effects.

For instance, the triad tacticity (mm-fraction) of soft propylene-based copolymer (B9) determined by $^{13}$C-NMR is preferably 85% or more, more preferably 85 to 97.5%, still more preferably 87% to 97%, and particularly preferably 90% to 97%. With the above range of triad tacticity (mm-fraction), in particular, excellent balance of flexibility and mechanical strength is attained, which is desirable for the present invention. The mm-fraction can be determined by the method described in WO 2004/087775 from Page 21 line 7 to Page 26 line 6.

The stress at 100% elongation (M100) of soft propylene-based copolymer (B9) is generally 4 MPa or less, preferably 3 MPa or less, and more preferably 2 MPa or less, as measured in accordance with JIS K6301 at a span of 30 mm and a tensile speed of 30 mm/min at 23° C. with a JIS #3 dumbbell. With the above range of M100, soft propylene-based polymer (B9) provides excellent flexibility, transparency, and rubber elasticity.

The crystallinity of soft propylene-based copolymer (B9) is generally 20% or less, and preferably 0 to 15% as measured by X-ray diffractometry. It is also desirable that the soft propylene-based copolymer in the present invention has a single glass transition temperature and that the glass transition temperature Tg is generally −10° C. or lower, and preferably −15° C. or lower as measured with a differential scanning calorimeter (DSC). With the above range of glass transition temperature Tg, soft propylene-based copolymer (B9) provides excellent cold temperature resistance and low-temperature properties.

The molecular weight distribution (Mw/Mn, relative to polystyrene standards, Mw: weight-average molecular weight, Mn: number-average molecular weight) of soft propylene-based copolymer (B9) is preferably 4.0 or less, more preferably 3.0 or less, and still more preferably 2.5 or less as measured by GPC.

When soft propylene copolymer (B9) shows a melting point (Tm in ° C.) in the endothermic curve obtained with a differential scanning calorimeter (DSC), the melting endothermic entalpy ΔH is 30 J/g or less and the following relation is satisfied between $C_3$ content (mol %) and melting endothermic entalpy AB (J/g):

$$\Delta H < 345 \, \text{Ln}(C_3 \text{ content in mol \%}) - 1492,$$

wherein, 76<$C_3$ content (mol %)<90.

Preferred specific examples of soft propylene-based copolymer (B9) include propylene/ethylene/α-olefin copolymer (B9-1) below. When propylene/ethylene/α-olefin copolymer (B9-1) is used, there is provided a solar cell-sealing sheet with excellent flexibility, heat resistance, mechanical strength, solar cell-sealing performance, and transparency. Here, "solar cell-sealing performance" means the ability of reducing the incidence of cracking of solar cell elements, due to the excellent flexibility, on embedding the elements.

In propylene/ethylene/α-olefin copolymer (B9-1), the content of propylene-derived structural units is 45 to 92 mol %, preferably 56 to 90 mol %, and more preferably 61 to 86 mol %; the content of ethylene-derived structural units is 5 to 25 mol %, preferably 5 to 14 mol %, and more preferably 8 to 14 mol %; and the content of $C_4$-$C_{20}$ α-olefin-derived structural units is 3 to 30 mol %, preferably 5 to 30 mol %, and more preferably 6 to 25 mol %. 1-Butene is particularly preferred as the α-olefin.

Propylene/ethylene/α-olefin copolymer (B9-1) containing propylene-derived structural units, ethylene-derived structural units, and $C_4$-$C_{20}$ α-olefin-derived structural units in the above ratio has good compatibility with propylene-based polymer (A9), providing a solar cell-sealing sheet with adequate transparency, flexibility, heat resistance, and scratch resistance.

<Thermoplastic Resin Composition Used for Solar Cell-Sealing Sheet, and Solar Cell-Sealing Sheet>

The solar cell-sealing sheet of the ninth aspect is a solar cell-sealing sheet (also called "sheet-shaped sealing material for solar cells") formed from thermoplastic resin composition (X9) containing (A9) and (B9) below in amounts described below:

propylene-based polymer (A9) in an amount of 0 to 70 parts by weight, and preferably 10 to 50 parts by weight; and soft propylene-based copolymer (B9) in an amount of 30 to 100 parts by weight, and preferably 50 to 90 parts by weight, wherein the total of (A9) and (B9) is 100 parts by weight.

As described above, with the preferred ranges of (A9) and (B9), composition (X9) is nicely molded into sheets and resultant solar cell-sealing sheets are excellent in heat resistance, transparency, and flexibility, which is suitable for the ninth aspect.

In the solar cell-sealing sheet of the ninth aspect, there may be used coupling agent (Y9) to promote adhesion of (A9) and (B9) to glass, plastics, or the like. There is no particular limitation on coupling agent (Y9) as long as it can improve adhesion between the layer containing resin composition (X9) and another layer containing 50 wt % or more of polar group-containing resin or inorganic substance such as metal. Suitably used coupling agents are of silane-type, titanate-type, or chromium-type. In particular, a silane-type coupling agent (silane coupling agent) is preferably used.

As the above silane coupling agent, publicly known agents may be used without particular limitation. Specifically they include vinyltriethoxysilane, vinyltrimethoxysilane, vinyltris (β-methoxyethoxysilane), γ-glycidoxypropyltrimethoxysilane, γ-aminopropyltriethoxysilane, and the like.

It is desirable that the silane coupling agent is contained in an amount of 0.1 to 5 parts by weight, and preferably 0.1 to 3 parts by weight, relative to 100 parts by weight of thermoplastic resin composition (X9) (the total amount of (A9) and (B9)).

The above coupling agent may be grafted to thermoplastic resin composition (X9) using organic peroxide (Z9). In this case, it is desirable that the silane coupling agent is present in an amount from 0.1 parts to 5 parts by weight relative to 100 parts by weight of thermoplastic resin composition (X9) (the total amount of (A9) and (B9)). Thermoplastic resin composition (X9) silane-grafted also provides the same or more adhesion to glass and plastics as compared with a blend containing the silane coupling agent. The amount of organic peroxide (Z9), if used, is preferably 0.001 to 5 parts by weight, and more preferably 0.01 to 3 parts by weight, relative to 100 parts by weight of thermoplastic resin composition (X9) (the total amount of (A9) and (B9)).

As organic peroxide (Z9), there may be used publicly known organic peroxides, including those which is the same as organic peroxide (Z8) used in the eighth aspect, without particular limitation.

Specifically, organic peroxides (Z9) include dilauroyl peroxide, 1,1,3,3-tetramethylbutylperoxy 2-ethylhexanoate, dibenzoyl peroxide, t-amylperoxy 2-ethylhexanoate, t-butylperoxy 2-ethylhexanoate, t-butylperoxy isobutyrate, t-butylperoxymaleic acid, 1,1-di(t-amylperoxy)-3,3,5-trimethylcyclohexane, 1,1-di(t-amylperoxy)cyclohexane, t-amylperoxy isononanoate, t-amylperoxy n-octoate, 1,1-di(t-butylperoxy)-3,3,5-trimethylcyclohexane, 1,1-di(t-butylperoxy)cyclohexane, t-butylperoxy isopropyl carbonate, t-butylperoxy 2-ethylhexyl carbonate, 2,5-dimethyl-2,5-di(benzoylperoxy)hexane, t-amylperoxy benzoate, t-butylperoxy acetate, t-butylperoxy isononanoate, t-butylperoxy benzoate, 2,2-di(butylperoxy)butane, n-butyl 4,4-di(t-butylperoxy)butyrate, methyl ethyl ketone peroxide, ethyl 3,3-di(t-butylperoxy)butyrate, dicumyl peroxide, t-butyl cumyl peroxide, di-t-butyl peroxide, 1,1,3,3-tetramethylbutylhydroperoxide, acetylacetone peroxide, and the like.

In the ninth aspect, the following auxiliary may be further used as necessary. As such auxiliary, preferably used are the same auxiliaries as those used in the eighth aspect.

Specifically, preferred auxiliaries include auxiliaries for peroxy-crosslinking such as sulfur, p-quinonedioxime, p,p'-dibenzoylquinonedioxime, N-methyl-N,4-dinitrosoaniline, nitrosobenzene, diphenylguanidine, and trimethylolpropane-N,N'-m-phenylene dimaleimide; divinylbenzene; triallyl cyanurate (TAC); and triallyl isocyanurate (TAIC). As the auxiliary, there may be also used multifunctional methacrylate monomers such as ethylene glycol dimethacrylate, diethylene glycol dimethacrylate, polyethylene glycol dimethacrylate, trimethylolpropane trimethacrylate, and allyl methacrylate; multifunctional vinyl monomers such as vinyl butyrate and vinyl stearate; and others. Among them, triallyl cyanurate (TAC) and triallyl isocyanurate (TAIC) are preferred.

In the ninth aspect, the desirable weight ratio of the auxiliary to the organic peroxide ((auxiliary)/(organic peroxide)) is 1/30 to 20/1, and preferably 1/20 to 10/1.

Thermoplastic resin composition (X9) used in the ninth aspect may be crosslinked, but preferably it is non-crosslinked. Here, "non-crosslinked" means that the content of component insoluble in boiled xylene is 0.1 wt % or less in the whole organic substances present in the composition.

Specifically, the content of component insoluble in boiled xylene is determined in a similar manner to that described in the eighth aspect.

Namely, in practice, 1.5 g of the sample is dissolved in 100 cc of p-xylene (140° C.), which is then refluxed for 3 hr, and insoluble components are recovered with a 325-mesh screen. From the weight of dried residue of the insoluble component, is subtracted the weight of the xylene-insoluble components other than polymer components (for example, filler, bulking agents, pigments, etc.) to obtain "corrected final weight (Y)."

On the other hand, from the weight of the sample, is subtracted the weight of the xylene-insoluble components other than polymer components (for example, filler, bulking agents, pigments, etc.) to obtain "corrected initial weight (X)."

Here, the content of component insoluble in boiled xylene is determined by the following equation:

Content of component insoluble in boiled xylene (wt %)=([corrected final weight $(Y)$]÷[corrected initial weight $(X)$])×100.

The solar cell-sealing sheet of the ninth aspect also contains various other additives, which include, for example, ultraviolet absorbers and light stabilizers for preventing degradation caused by ultraviolet rays in the sun light, antioxidants, and others.

As the ultraviolet absorbers, there are used specifically benzophenones such as 2-hydroxy-4-methoxybenzophenone, 2,2-dihydroxy-4-methoxybenzophenone, 2-hydroxy-4-methoxy-4-carboxybenzophenone, and 2-hydroxy-4-(n-octyloxy)benzophenone; benzotriazoles such as 2-(2-hydroxy-3,5-di-t-butylphenyl)benzotriazole and 2-(2-hydroxy-5-methylphenyl)benzotriazole; and salicylate esters such as phenyl salicylate and p-octylphenyl salicylate.

As the light stabilizers, hindered amines are used.

As the antioxidants, hindered phenols and phosphites are used.

The sheet of the ninth aspect is obtained from a sheet made of thermoplastic resin composition (X9) having a thickness of 0.1 to 3 mm. If the thickness is below this range, glass or solar cells may be damaged in the lamination step. If the thickness is over this range, the light transmittance lowers, whereby the photovoltaic power generation possibly lowers.

The methods for molding the solar cell-sealing sheet relating to the ninth aspect, although not particularly limited to, include publicly known extrusion molding (cast molding, extrusion sheet molding, inflation molding, injection molding, etc.), compression molding, calendar molding, and others. The sheet may be embossed. Surface embossing is preferred since mutual blocking of sheets is suppressed and the embossed surface serves as a cushion for glass and solar cells to prevent damage on lamination.

For resin composition (X9) forming the solar cell-sealing sheet, the internal haze is preferably 1.0% to 10%, and more preferably 1.5% to 7% when molded into a 1-mm thick press-molded sheet.

The internal haze of the solar cell-sealing sheet of the ninth aspect is 1.0% to 10%, and preferably 1.5% to 7%. Note that, in this case, the internal haze is measured with the solar cell-sealing sheet irrespective of its thickness.

The light transmittance (Trans) of resin composition (X9) is 88% or more, and preferably 90% or more when molded into a 1-mm thick press-molded sheet.

The light transmittance of the solar cell-sealing sheet of the ninth aspect is 88% or more, and preferably 90% or more. Note that, in this case, the light transmission is measured with the solar cell-sealing sheet irrespective of its thickness.

The heat resistance (TMA) of resin composition (X9) is preferably 80° C. or higher, and more preferably 90 to 130° C. when molded into a 2-mm thick press-molded sheet.

The tensile strength at break of resin composition (X9) is preferably 8 to 25 MPa, and more preferably 10 to 25 MPa, and modulus in tension thereof is preferably 5 to 50 MPa, more preferably 10 to 35 MPa, and still more preferably 10 to 30 MPa.

It is desirable that the solar cell-sealing sheet of the ninth aspect or resin composition (X9) forming the solar cell-sealing sheet has additionally independently the following properties. The following properties each may be satisfied independently, but in more preferable embodiments, these are satisfied at the same time.

(i) In the dynamic viscoelastic measurement at torsion mode (10 rad/s), the loss tangent (tan δ) peak appears in the range of −25° C. to 25° C., and the loss tangent is 0.5 or more;
(ii) the ratio of storage modulus G(20° C.) to G'(100° C.) (G'(20° C.)/G'(100° C.)) determined based on the above dynamic viscoelastic measurement is 5 or less; and
(iii) the residual strain is 20% or less when a specimen is elongated by 100% at a tensile speed of 30 mm/min with a chuck-to-chuck distance of 30 mm, kept for 10 min, and freed from the load, and the strain is measured after 10 min.

In a desirable embodiment in terms of (i), the loss tangent, tan δ, is 0.5 or more, preferably 0.5 to 2.5, and more preferably 0.6 to 2 in −25° C. to 25° C. When tan δ is 0.5 or less, the flexibility may be insufficient, or even through flexibility is attained, scratch resistance tends to be poor.

In a desirable embodiment in terms of (ii), the ratio of storage modulus G'(20° C.) to G'(100° C.) (G'(20° C.)/G'(100° C.)) is 5 or less, preferably 4 or less, and more preferably 3.5 or less. When G'(20° C.)/G'(100° C.) exceeds 5, the surface may suffer from stickiness or the like, possibly resulting in poor handleability or inadequate heat resistance.

In a desirable embodiment in terms of (iii), the residual strain is 20% or less, preferably 18% or less, and more preferably 16% or less, when a dumbbell specimen of 1 mm thick, 50 mm long, and 5 mm wide is elongated by 100% at a tensile speed of 30 mm/min with a chuck-to-chuck distance of 30 mm, kept for 10 min, and freed from the load, and the strain is measured after 10 min. If the residual strain exceeds 20%, rubber elasticity is likely to decrease, and moldability tends to be poor.

It is desirable that resin composition (X9) has the same properties as resin composition (X8) used in the eighth aspect concerning melt flow rate, intrinsic viscosity [η], melting point (Tm, ° C.) and melting endothermic entalpy.

Namely, the melt flow rate (measured in accordance with ASTM D1238 at 230° C. under a load of 2.16 kg) of resin composition (X9) is generally 0.0001 to 1000 g/10 min, preferably 0.0001 to 900 g/10 min, and more preferably 0.0001 to 800 g/10 min, and its intrinsic viscosity [η] measured in decahydronaphthalene at 135° C. is generally 0.01 to 10 dl/g, preferably 0.05 to 10 dl/g, and more preferably 0.1 to 10 dl/g.

Preferably, in the endothermic curve of resin composition (X9) obtained with a differential scanning calorimeter (DSC), the temperature at maximum endothermic peak, which corresponds to the melting point (Tm, ° C.), is observed at 100° C. or higher and the melting endothermic entalpy corresponding to the peak is in the range of 5 to 40 J/g, and more preferably 5 to 35 J/g.

The temperature at maximum endothermic peak (melting point) of resin composition (X9) is 100° C. or higher, preferably 110° C. or higher, and more preferably 120° C. or higher.

The melt tension (MT) of resin composition (X9) is generally 0.5 to 10 g, and preferably 1 to 10 g. With this range of MT, the solar cell-sealing sheet can be molded excellently. Here, the melt tension (MT) is determined with a melt tension tester (available from Toyo Seiki Seisaku-sho, Ltd.) as the tension applied on a filament when the composition is extruded into a strand at a rate of 15 mm/min at 200° C. and the strand is draw at a constant speed (10 m/min).

Thermoplastic resin composition (X9) may contain other resins, other rubbers, and inorganic filler, as long as the objectives of the ninth aspect are not impaired.

The solar cell-sealing sheet of the ninth aspect can be used in a solar cell in which said sheet is laminated on the one side and/or both sides of a solar cell element, and if necessary, a surface-protective layer is further laminated on the outer face of the solar cell-sealing sheet(s). FIG. 9-1 shows one embodiment in which the solar cell-sealing sheet is applied.

The methods for producing solar cells are not particularly limited but include, for instance, a method in which a surface-protective layer, a solar cell element, and the solar cell-sealing sheet of the ninth aspect are successively laminated, and they are hot-press laminated by vacuum suction or the like.

For the surface protective layer, publicly known materials may be used without particular limitation as long as the layer can protect the solar cell and solar cell-sealing sheet layer without impairing the objectives of the solar cell. Specific examples of material used for the surface protective layer include glass, polyethylene resin, polypropylene resin, polycycloolefin resin, AS (acrylonitrile/styrene) resin, ABS (acrylonitrile/butadiene/styrene) resin, polyvinyl chloride resin, fluororesin, polyester resin such as polyethylene terephthalate and polyethylene naphthalate, phenol resin, polyacrylic resin, polyamide resin including various nylons, polyimide resin, polyamide-imide resin, polyurethane resin, cellulose resin, silicone resin, polycarbonate resin, and the like. A plurality of these resins may be used. There may also be preferably used an inorganic/organic composite film in which an inorganic oxide or the like is deposited on such resin for improving performances as gas and/or moisture barrier.

Between the surface protective layer and the layer of solar cell-sealing sheet of the ninth aspect or between a plurality of surface protective layers, a layer of publicly known adhesive or adhesive resin may be interposed to enhance the adhesion. According to the mode of using the solar cell, one side of the surface protective layer may have light-shielding and/or light-reflecting nature.

Applications of the ninth aspect include a solar cell module fabricated by using the solar cell-sealing sheet of the ninth aspect and an electric power generator having said solar cell module. As the configurations of the solar cell module and electric power generator, there may be mentioned the configurations in which the solar cell-sealing sheet of the ninth aspect is used instead of the solar cell-sealing sheet of the tenth aspect in the configurations of the solar cell module and electric power generator of the tenth aspect described later. As components other than the solar cell-sealing sheet used for the solar cell module, for example, a front protective sheet for solar cell modules, a back protective sheet for solar cell modules, a solar cell element, there may be used the same components as those in the tenth aspect described later.

10. Tenth Aspect

Hereinafter, the tenth aspect of the present invention is explained in detail.

The tenth aspect of invention provides to an electrical/electronic element-sealing sheet having layer (I-10) made of an ethylene-based copolymer, in which the Shore A hardness is 50 to 90 and ethylene content is 60 to 95 mol %, and layer (II-10) made of thermoplastic resin composition (X10). The composition contains 0 to 90 parts by weight of propylene-based polymer (A10) whose melting point is 100° C. or higher as measured with a differential scanning calorimeter, and 10 to 100 parts by weight of propylene-based copolymer (B10) that is a copolymer of propylene and at least one olefin selected from ethylene and $C_4$-$C_{20}$ α-olefins, in which the Shore A hardness is 30 to 80 and the melting point is lower than 100° C. or not observed when measured with a differential scanning calorimeter (wherein, the total of (A10) and (B10) is 100 parts by weight).

The tenth aspect of invention is explained in detail below.
<Layer (I-10) Made of Ethylene-Based Copolymer>
[Ethylene-Based Copolymer]

The ethylene-based copolymer used for layer (I-10) of the tenth aspect is obtained by copolymerizing ethylene and at least one monomer except ethylene, has a Shore A hardness of 50 to 90, and contains 60 to 95 mol % of ethylene-derived structural units.

With the above range of Shore A hardness, cracking of solar cells in sealing can be suppressed, which is preferred. The Shore A hardness is preferably 55 to 88, and more preferably 60 to 85. Shore A hardness can be measured in accordance with JIS K6301.

The above range of ethylene content is preferred, since such copolymer can readily attain the Shore A hardness in the above range. The ethylene content is preferably 65 to 92 mol %, and more preferably 70 to 90 mol %. The ethylene content is determined by quantifying the ratio of individual monomer units based on $^{13}$C-NMR spectrum.

In the ethylene-based copolymer used for layer (I-10), any monomers except ethylene may be used without particular limitation as long as the copolymer satisfy the above conditions on the hardness and ethylene content. Therefore, various monomers copolymerizable with ethylene may be used as appropriate, but it is desirable to use at least one monomer selected from vinyl acetate, acrylic esters, methacrylic esters, propylene, 1-butene, 1-hexene, 4-methyl-1-pentene, and 1-octene. These monomers may be used alone or in combination of two or more. There is no particular limitation on the combination when two or more monomers are used.

Among these, vinyl acetate, propylene, and/or 1-butene are preferably used as a co-monomer because the resulting ethylene-based copolymer has excellent transparency, flexibility, and others. Consequently, the ethylene-based copolymer is particularly preferably ethylene/vinyl acetate copolymer, ethylene/propylene copolymer, or ethylene/butene copolymer.

[Ethylene/Vinyl Acetate Copolymer]

In ethylene/vinyl acetate copolymer (EVA) preferably used in the tenth aspect, it is desired that the content of vinyl acetate (VA)-derived structural units is 5 to 40 wt %, and preferably 10 to 35 wt %. With this range of VA content, the resulting resin has excellent balance of weather resistance, flexibility, transparency, mechanical properties, and film-forming performance.

The melt flow rate (MFR2.16) (measured in accordance with ASTM D1238 at 190° C. under a load of 2.16 kg) of ethylene/vinyl acetate copolymer is desirably 0.1 to 50 g/10 min, and preferably 1 to 30 g/10 min.

In layer (I-10), there may be used one ethylene/vinyl acetate copolymer, or two or more ethylene/vinyl acetate copolymers different in molecular weight, or the like.

[Ethylene/Propylene Copolymer or Ethylene/Butene Copolymer]

The ethylene/propylene copolymer or ethylene/butene copolymer preferably used in the tenth aspect is a copolymer of ethylene with propylene and/or butene, and generally a non-crystalline or low-crystalline random copolymer.

This ethylene/propylene copolymer or ethylene/butene copolymer desirably has a melt flow rate (MFR2.16) (measured in accordance with ASTM D1238, at 190° C. under a load of 2.16 kg) of 0.1 g/10 min to 50 g/10 min, preferably 1 g/10 min to 30 g/10 min, and more preferably 5 g/10 min to 25 g/10 min. With this range of melt flow rate, the copolymer provides electrical/electronics element-sealing sheets excellent in flexibility with high productivity.

The density of such ethylene/propylene copolymer or ethylene/butene copolymer (measured in accordance with ASTM D1505) is generally 855 to 905 kg/m$^3$, preferably 857 to 895 kg/m$^3$, and more preferably 858 to 890 kg/m$^3$. This range of density nearly corresponds to the above ethylene content at which preferable properties are attained.

For this ethylene/propylene copolymer or ethylene/butene copolymer, the ratio of melt flow rate measured at 190° C. under a load of 10 kg (MFR10) (measured in accordance with ASTM D1238) to MFR2.16 (MFR10/MFR2.16) is preferably 5 to 12.

Desirably, the molecular weight distribution (Mw/Mn) of ethylene/propylene copolymer or ethylene/butene copolymer is 1.5 to 3.0, and preferably 1.8 to 2.5 as measured by gel permeation chromatography (GPC). With the above range of molecular weight distribution (Mw/Mn), the copolymer provides sheets with reduced stickiness after molded.

The crystallinity of such ethylene/propylene copolymer or ethylene/butene copolymer is generally 40% or less, and preferably 10% to 30% as measured by X-ray diffractometry.

The ethylene/propylene copolymer or ethylene/butene copolymer as described above can be produced by conventional methods in which a titanium catalyst, a vanadium catalyst, or a metallocene catalyst (for example, metallocene catalyst described in WO 97/10295) is used.

Silane Coupling Agent (Y10)

In a desirable embodiment of the tenth aspect, layer (I-10) further contains 0.1 to 5 parts by weight of silane coupling agent (Y10), 0 to 5 parts by weight of organic peroxide (Z10), and 0 to 5 parts by weight of a weathering stabilizer relative to 100 parts by weight of the ethylene-based copolymer.

The main objective of blending coupling agent (Y10) is generally to enhance adhesion to glass, plastics, and others.

As coupling agent (Y10), there may be used, without particular limitations, any coupling agent that can enhance adhesion of layer (I-10) to another layer made of glass, polyester resin, or the like. Preferably used are silane-type coupling agents, titanate-type coupling agents, or chromium-type coupling agents. Particularly, silane-type coupling agents (silane coupling agent) are preferably used. Conventional silane coupling agents may be used without particular limitation, specifically including the same silane coupling agents as those used in the ninth aspect.

The amount of the silane coupling agent to be added is typically 0.1 to 5 parts by weight, and preferably 0.1 to 3 parts by weight relative to 100 parts by weight of the ethylene-based copolymer. Adding the coupling agent in the above ratio is preferred since it provides sufficiently improved adhesion without adverse influence on the transparency and flexibility of the resultant film.

[Radical Initiator]

For the coupling agents, including silane coupling agents as representatives, the improving effects on adhesion to glass is enhanced when the agent is grafted to the ethylene-based copolymer using a radical initiator. As the radical initiator preferably used in the tenth aspect, there may be used, without particular limitation, any radical initiators that can graft the ethylene-based copolymer with the coupling agent. Above all, organic peroxide (Z10) is particularly preferred as the radical initiator.

The amount of organic peroxide (Z10) added herein is preferably 0 to 5 parts by weight relative to 100 parts by weight of the ethylene-based copolymer. The content of organic peroxide (Z10), if any, is preferably 0.001 to 5 parts by weight and more preferably 0.01 to 3 parts by weight relative to 100 parts by weight of the ethylene-based copolymer.

As organic peroxide (Z10), publicly known organic peroxides may be used without particular limitation, but preferred specific examples include peroxides like organic peroxide (Z8) used in the eighth aspect.

[Weathering Stabilizer]

Layer (I-10) may further contain various weathering stabilizers. Preferred amount of the weathering stabilizer present in layer (I-10) is 0 to 5 parts by weight relative to 100 parts by weight of the ethylene-based copolymer. For example, the content of weathering stabilizer, if any, is preferably 0.01 to 5 parts by weight relative to 100 parts by weight of the ethylene-based copolymer. Adding the weathering stabilizer in the above ratio assures sufficient improving effects on weathering stability and suppresses deterioration in the transparency and adhesion to glass of layer (I-10).

As the weathering stabilizer, there may be used one or more compounds selected from ultraviolet absorbers, light stabilizers, antioxidants, and the like.

As the ultraviolet absorber, light stabilizer, and antioxidant, specifically, there may be mentioned those used in the ninth aspect.

[Other Components]

Layer (I-10) may optionally contain various components besides the above components, as long as the objectives of the tenth aspect are not impaired. For instance, it may contain as appropriate, polyolefins other than the above ethylene-based copolymer, resins and/or rubbers other than polyolefins, and one or more additives selected from plasticizers, filler, pigments, dyes, antistatic agents, antibacterial agents, fungicides, flame retardants, dispersants, and others.

[Composition and Formation Method of Layer (I-10)]

The thickness of layer (I-10) is generally 10 μm to 1000 μm and preferably 20 μm to 600 μm. With this range of thickness, the layer has sufficient adhesion strength to glass and also assures sufficient light transmittance that contributes generation of high photovoltaic power.

As the method for forming layer (I-10), there may be employed, although not limited to, conventional extrusion molding (cast molding, extrusion sheet molding, inflation molding, injection molding, etc.), compression molding, calendar molding, and the like. In the tenth aspect, preferred is a method in which layer (I-10) and layer (II-10) made of thermoplastic resin composition (X10) described later are co-extruded with a publicly known melt-extrusion machine such as cast molding machine, extrusion sheet molding machine, inflation molding machine, and injection molding machine, to obtain a laminate; or a method in which thermoplastic resin composition (X10) is molded into layer (II-10), on which layer (I-10) is applied as melt or hot-laminated to obtain a laminate.

For the desirable composition forming layer (I-10), the internal haze is 0.1% to 15%, and preferably 0.1% to 10% as measured with a 0.5-mm thick specimen.

<Layer (II-10) Made of Thermoplastic Resin Composition (X10)>

[Thermoplastic Resin Composition (X10)]

Layer (II-10) used in the tenth aspect is made of thermoplastic resin composition (X10) containing propylene-based polymer (A10) and propylene-based copolymer (B10) described in detail below, in the following ratio.

Namely, thermoplastic resin composition (X10) is composed of propylene-based polymer (A10) in an amount of 0 to 90 parts by weight, preferably 0 to 70 parts by weight, and more preferably 10 to 50 parts by weight, and propylene-based copolymer (B10) in an amount of 10 to 100 parts by weight, preferably 30 to 100 parts by weight, and more preferably 50 to 90 parts by weight. Here, the total of (A10) and (B10) is 100 parts by weight. Thermoplastic resin composition (X10) used for layer (II-10) may contain components other than (A10) and (B10), for example, resins other than (A10) and (B10), rubber, inorganic filler, and others as long as the objectives of the tenth aspect of the invention are not impaired.

With the above range of ratio of (A10) and (B10), the composition is excellently molded into sheets and also provide solar cell-sealing sheets excellent in heat resistance, transparency, flexibility, and the like.

With thermoplastic resin composition (X10), desirably, the permanent compression set measured at 23° C. is 5% to 35% and the permanent compression set measured at 70° C. is 50% to 70%. With the above ranges of permanent compression sets, the resultant sheet is freed from deformation over a wider temperature range from normal temperature to high temperature, whereby preventing decrease in power generation efficiency of solar cells. In particular, falling the permanent compression set measured at 70° C. within the above range is especially important in order to suppress sheet deformation due to long-term loading such as gravitational load of glass itself in solar cells.

The permanent compression set measured at 23° C. is more preferably 5% to 30%, and still more preferably 5% to 25%. The permanent compression set measured at 70° C. is more preferably 50% to 68%, and still more preferably 50% to 66%. The permanent compression set can be measured as follows in accordance with JIS K6301.

That is, six 2-mm thick press-molded sheets are stacked and compressed by 25%; the stack is kept under this load at a specified temperature (23° C. or 70° C.) for 24 hr; then the compression is released and the thickness of the stack is measured. From the results of the above measurement, the residual strain (permanent compression set) after 24-hr loading is calculated from the following equation.

$$\text{Residual strain (\%)} = 100 \times (\text{"thickness before test"} - \text{"thickness after test"}) / (\text{"thickness before test"} - \text{"thickness during compressed"})$$

The Shore A hardness of thermoplastic resin composition (X10) is generally 55 to 92, and preferably 60 to 80. Within this range of Shore A hardness, cracking of solar cells is prevented when the solar cells are sealed, also the solar cells can attain flexibility, which protects the solar cells against deformation and impact shock.

[Propylene-Based Polymer (A10)]

Propylene-based polymers (A10) used in the tenth aspect include homopolypropylene and copolymers of propylene and at least one $C_2$-$C_{20}$ α-olefin except propylene. The $C_2$-$C_{20}$ α-olefins except propylene include the same α-olefins as those for isotactic polypropylene (A1) used in the first aspect. Also, the preferable range is the same.

These α-olefins may form a random or block copolymer with propylene.

The structural units derived from these α-olefins may be contained in an amount of 35 mol or less, and preferably 30 mol % or less in the polypropylene.

Desirably, the melt flow rate (MFR) of propylene-based polymer (A10) measured at 230° C. under a load of 2.16 kg in accordance with ASTM D1238 is 0.01 to 1000 g/10 min and preferably 0.05 to 100 g/10 min.

The melting point of propylene-based polymer (A10) measured with a differential scanning calorimeter (DSC) is 100° C. or higher, preferably 100 to 160° C., and more preferably 110 to 150° C.

Propylene-based polymer (A10) may be either isotactic or syndiotactic, but the isotactic structure is preferred considering heat resistance and others.

There may be used, if necessary, a plurality kinds of propylene-based polymers (A10), for example, two or more components different in melting point or rigidity.

To obtain desired properties, there may be used, as propylene-based polymer (A10), one or more polymers selected from homopolypropylene excellent in heat resistance (publicly known, generally having 3 mol % or less of copolymerized components except propylene), block polypropylene excellent in balance of heat resistance and flexibility (publicly known, generally having 3 to 30 wt % of n-decane-soluble rubber components), and random polypropylene excellent in balance of flexibility and transparency (publicly known, generally having a melting peak of 100° C. or higher and preferably 110° C. to 150° C. as measured with a differential scanning calorimeter (DSC)).

Such propylene-based polymer (A10) can be produced by a similar method to that for producing isotactic polypropylene (A1) used in the first aspect.

[Propylene-Based Copolymer (B10)]

Propylene-based copolymer (B10) used in the tenth aspect is a copolymer of propylene and at least one olefin selected from the group consisting of ethylene and $C_4$-$C_{20}$ α-olefins. The Shore A hardness of this copolymer is 30 to 80, preferably 35 to 70, and its melting point is lower than 100° C. or not observed as measured with a differential scanning calorimeter (DSC). Here, "melting point is not observed" means that any melting endothermic peak of crystal having a melting endothermic enthalpy of crystal of 1 J/g or more is not observed in the temperature range of −150 to 200° C. The measurement conditions are as described in Examples of the tenth aspect.

In propylene-based copolymer (B10), the α-olefin used as a co-monomer is preferably ethylene and/or a $C_4$ to $C_{20}$ α-olefin.

In propylene-based copolymer (B10), preferably, the content of propylene-derived units is 45 to 92 mol % and preferably 56 to 90 mol %, whereas the content of units derived from the α-olefin used as a co-monomer is 8 to 55 mol % and preferably 10 to 44 mol %.

It is desirable that the melt flow rate (MFR) of propylene-based copolymer (B10), as measured at 230° C. under a load of 2.16 kg in accordance with ASTM D1238, is 0.01 to 100 g/10 min and preferably 0.05 to 50 g/10 min.

The methods for producing propylene copolymer (B10), although not limited to, but include a method like that for producing soft propylene-based copolymer (B8) used in the eighth aspect.

It is desirable that propylene-based copolymer (B10) has additionally independently the following properties.

Propylene-based copolymer (B10) preferably has the same properties as propylene/ethylene/α-olefin copolymer (B1) used in the first aspect concerning triad tacticity (mm-fraction), stress at 100% elongation, crystallinity, glass transition temperature Tg, and molecular weight distribution (Mw/Mn). These properties provide the same effects.

For instance, the triad tacticity (mm-fraction) of propylene-based copolymer (B10) determined by $^{13}$C-NMR is preferably 85% or more, more preferably 85% to 97.5%, still more preferably 87% to 97%, and particularly preferably 90% to 97%. With the above range of triad tacticity (mm-fraction), particularly excellent balance of flexibility and mechanical strength is attained. This is suitable for the tenth aspect. The mm-fraction can be estimated by the method described in WO 2004/087775 from Page 21 line 7 to Page 26 line 6.

For propylene-based copolymer (B10), for instance, the molecular weight distribution (Mw/Mn, relative to polystyrene standards, Mw: weight-average molecular weight, Mn: number-average molecular weight) measured by GPC is preferably 4.0 or less, more preferably 3.0 or less, and still more preferably 2.5 or less.

When propylene copolymer (B10) has a melting point (Tm in ° C.) in the endothermic curve obtained with a differential scanning calorimeter (DSC), the melting endothermic entalpy ΔH is generally 30 J/g or less, and the same relation holds between $C_3$ content (mol %) and melting endothermic entalpy ΔH (J/g) as that of propylene/ethylene/α-olefin copolymer (B1) used in the first aspect.

Preferred specific examples of propylene-based copolymer (B10) include propylene/ethylene/α-olefin copolymer (B10-1) below. Use of propylene/ethylene/α-olefin copolymer (B10-1) enables to form electrical/electronic element-sealing sheets excellent in flexibility, heat resistance, mechanical strength, element-sealing performance, and transparency. Here, "element-sealing performance" means the ability of reducing the incidence of cracking of elements owing to excellent flexibility when the electrical/electronic elements are embedded.

In propylene/ethylene/α-olefin copolymer (B10-1), the content of propylene-derived structural units is 45 to 92 mol %, preferably 56 to 90 mol %, and more preferably 61 to 86 mol %; the content of ethylene-derived structural units is 5 to 25 mole, preferably 5 to 14 mol %, and more preferably 8 to 14 mol %; and the content of $C_4$-$C_{20}$ α-olefin-derived structural units is 3 to 30 mol %, preferably 5 to 30 mol %, and more preferably 6 to 25 mol %. The α-olefin is particularly preferably 1-butene.

Propylene/ethylene/α-olefin copolymer (B10-1) containing propylene-derived structural units, ethylene-derived structural units, and $C_4$-$C_{20}$ α-olefin-derived structural units in the above ratio exhibits excellent compatibility with propylene-based polymer (A10) and provides solar cell-sealing sheets with sufficient transparency, flexibility, heat resistance, and scratch resistance.

[Other Components]

Layer (II-10) used in the tenth aspect may optionally contain components other than thermoplastic resin composition (X10), as long as the objectives of the tenth aspect are not impaired.

For instance, the layer may contain, as appropriate, various additives that may be added to layer (I-10) (coupling agents including silane coupling agents, organic peroxides, and/or weathering stabilizers), polyolefins other than the above ethylene-based copolymer, resins and/or rubbers other than polyolefins, and one or more additives selected from plasticizers, filler, pigments, dyes, antistatic agents, antibacterial agents, fungicides, flame retardants, dispersants, and others.

[Composition and Molding Method of Layer (II-10)]

The thickness of layer (II-10) is generally 0.1 mm to 5 mm, and preferably 0.1 to 1 mm. With this range of thickness, the layer can prevent damage on glass and solar cells in lamination process and also assures sufficient light transmittance, which contributes to generation of high photovoltaic power.

The methods for forming layer (II-10), although not limited to, include conventional extrusion molding (cast molding, extrusion sheet molding, inflation molding, injection molding, etc.), compression molding, calendar molding, and the like. The above sheet may be embossed. Embossing is preferred since embossed surfaces suppresses mutual blocking of the sheets and functions as cushion for preventing damage on glass and solar cells.

It is desirable that the internal haze of composition for forming layer (II-10) is 0.1% to 15%, and preferably 0.1% to 10% as measured with a 0.5-mm thick specimen.

<Electrical/Electronic Element-Sealing Sheet>

The electrical/electronic element-sealing sheets of the tenth aspect include any electrical/electronic element-sealing sheet (also called "sheet-shaped sealing material for electrical/electronic elements") having at least one layer (I-10) made of the above ethylene-based copolymer and at least one layer (II-10) made of thermoplastic resin composition (X10).

Therefore, the number of layer (I-10) may be one, or two or more. One layer is preferable from the viewpoint of lowering the cost through simplification of sheet configuration, and utilizing light effectively through minimizing the reflection at interface between layers when used for sealing an element using light.

The number of layer (II-10) may be one, or two or more. One layer is also preferable from the same viewpoints as in the case of layer (I-10).

The methods for laminating layer (I-10) and layer (II-10) are not limited to, but include preferably a method in which layer (I-10) and layer (II-10) are co-excluded with a conventional melt-extruding machine such as cast molding machine, extrusion sheet molding machine, inflation molding machine, and injection molding machine to prepare a laminate; or a method in which thermoplastic resin composition (X10) is molded to form layer (II-10), on which layer (I-10) is applied in melt or hot-laminated to obtain a laminate.

The electrical/electronic element-sealing sheet of the tenth aspect may contain a layer other than layer (I-10) and layer (II-10) (also called "additional layer" in the present specification), or may be composed of only layer (I-10) and layer (II-10) without such additional layers.

As classification according to objectives, other layers that may be provided here include a hard coat layer for protecting the front and back surfaces, an adhesive layer, a reflection preventive layer, a gas barrier layer, an anti-fouling layer, and others. As classification according to material, other layers include a layer made of ultraviolet-curable resin, a layer made of thermoplastic resin, a layer made of polyolefin resin, a layer made of carboxylic acid-modified polyolefin resin, a layer made of fluororesin, and others.

There is no particular limitation on the positional relationship among layer (I-10), layer (II-10), and another layer. An appropriate layer constitution is selected in accordance with the objectives of the invention. Namely, another layer may be placed between layer (I-10) and layer (II-10), placed in the outermost layer of the electrical/electronic element-sealing sheet, or placed in another position.

The number of other layers is not particularly limited, namely, the sheet may contain any number or none of other layers.

From the viewpoint of lowering the cost through simplification of the constitution, and utilizing light effectively through minimizing the reflection at interfaces between layers when used for sealing an element using light, it is particularly preferred to provide only layer (I-10) and layer (II-10), each one layer, directly bonded together without other layer.

The electrical/electronic element-sealing sheet related to the tenth aspect is produced by laminating a plurality of layers. The method for lamination is not particularly limited.

The laminate can be produced, for example, dry lamination using an appropriate adhesive, for example, a maleic anhydride-modified polyolefin resin ("Admer"™, (available from Mitsui Chemicals, Inc.), "Modic"™, (available from Mitsubishi Chemical Corp.), etc.), a low- (or non-)crystalline soft polymer such as unsaturated polyolefin, an acrylic adhesive such as ethylene/acrylate/maleic anhydride ternary copolymer (for example, "Bondine"™, (available from Sumika CDF Chemical Co., Ltd.)), ethylene/vinyl acetate copolymer, or an adhesive resin composition containing these adhesives; or by heat lamination. An adhesive having heat resistance of about 120° C. to 150° C. is preferably used, and a polyester or polyurethane adhesive is suitable. To improve the adhesion of both layers, for example, these layers may be treated with a silane coupling agent or titanium coupling agent, or may be exposed to corona, plasma, and others.

For the electrical/electronic element-sealing sheet of the tenth aspect, the internal haze is preferably 0.1% to 15%, and more preferably 0.1% to 10%. Note that, in this case, the internal haze is measured with the sealing sheet irrespective of its thickness.

The light transmittance is preferably 86% or more, and more preferably 88% or more. The sheet having the above light transmittance less lowers the power generation efficiency, and is suitably used for the tenth aspect.

[Solar Cell-Sealing Sheet]

The electrical/electronic element-sealing sheet of the tenth aspect is excellent in heat resistance, transparency, and flexibility, so that the sheet is suitable for use as a sealing sheet for electrical/electronic elements using intense light illumination, in particular, a sealing sheet for solar cells (a solar cell-sealing sheet or a sheet-shaped sealing material for solar cells). In using as a solar cell-sealing sheet, the above electrical/electronic element-sealing sheet may be used as it is or may be used after processing such as addition of another layer.

[Solar Cell Module]

A solar cell module generally has a structure in which a solar cell element made of polycrystalline silicon or the like is sandwiched between solar cell-sealing sheets to form a laminate and both front and back surfaces of the laminate are further covered with protective sheets. Namely, a typical structure of solar cell module is represented as solar cell module-protecting sheet (front protective sheet)/solar cell-sealing sheet/solar cell element/solar cell-sealing sheet/solar cell module-protecting sheet (back protective sheet). However, the solar cell module, which is one of preferred embodiments of the tenth aspect, is not limited to the above structure but may have any convenient layer other than the above as long as the objectives of the tenth aspect are not impaired. Specifically, the module may have, typically, although not limited to, an adhesive layer, an impact-absorbing layer, a coating layer, an reflection preventive layer, a back re-reflection layer, a light diffusive layer, and the like. These layers may be formed in any position suitable for objectives and characteristics thereof without particular limitation.

[Front Protective Sheet for Solar Cell Module]

Although there is no particular limitation on the front protective sheet for solar cell modules, but it is preferably possesses weather resistance, water repellency, anti-fouling property, mechanical strength, and other performances for assuring long-term reliability of solar cell modules exposed to outdoor environment, because the sheet is positioned in the outmost layer of the solar cell module. In addition, the sheet preferably has high transparency and low optical loss in order to utilize sun light efficiently.

The materials for the front protective sheet for solar cell modules include a resin film made of polyester resin, fluororesin, acrylic resin, or the like and a glass plate.

Polyester resin, particularly polyethylene terephthalate resin is suitably used for the resin film since it has superiority in transparency, mechanical strength, cost, and others.

Fluororesins with excellent weather resistance are also suitably used. Specifically, there may be mentioned, tetrafluoroethylene/ethylene copolymer (ETFE), polyvinyl fluoride resin (PVF), polyvinylidene fluoride resin (PVDF), poly(tetrafluoro)ethylene resin (TFE), tetrafluoroethylene/hexafluoropropylene copolymer (FEP), and poly(trifluorochloro) ethylene resin (CTFE). In weather resistance, polyvinylidene fluoride resin is superior whereas tetrafluoroethylene/ethylene copolymer is excellent in both weather resistance and mechanical strength. It is desirable to treat the film surface treated with corona or plasma to improve adhesion to the above sealing resin. An oriented film may also be used for improving mechanical strength.

When the glass plate is used as the front protective sheet for solar cell modules, the total light transmittance of glass plate is preferably 80% or more, and more preferably 90% or more in the wavelength of 350 to 1400 nm. As the above glass plate, a white glass plate with low absorption in the infra red region is usually used, but even a blue glass plate has a minor effect on output characteristics of solar cell modules if its thickness is 3 mm or less. There is available reinforced glass, which is heat-treated for enhancing the mechanical strength of the glass plate, but a float glass without heat treatment may be also used. The light receiving face of the glass plate may have reflection preventive coating to suppress reflection.

As described above, the polyester resin and the glass have excellent properties as the front protective sheet, but they are known to be relatively difficult to be bonded. Layer (I-10) in the solar cell-sealing sheet related to the tenth aspect is made of a specific polyethylene copolymer with excellent adhesion and preferably contains a silane coupling agent, so that layer (I-10) has excellent adhesion to the polyester resin and the glass. Therefore, in the solar cell module of the tenth aspect, it is desirable to bond the solar cell-sealing sheet to the front protective sheet through layer (I-10).

[Back Protective Sheet for Solar Cell Modules]

There is no particular limitation on the back protective sheet for solar cell modules, but the sheet is required to have similar properties including weather resistance and mechanical strength to those of the front protective sheet, since the sheet is positioned in the outmost layer of the solar cell module. Accordingly, the back protective sheet for solar cell modules may be made of a similar material to that of the front protective sheet. Namely, the polyester resin and the glass are preferably used.

Layer (I-10) of the solar cell-sealing sheet related to the tenth aspect is made of the specific polyethylene copolymer with excellent adhesion and preferably contains the silane coupling agent, so that layer (I-10) has excellent adhesion to the polyester resin and the glass. Therefore, in the solar cell module of the tenth aspect, it is desirable to bond the solar cell-sealing sheet to the back protective sheet through layer (I-10).

The back protective sheet is not essentially required to transmit sun light, so that the transparency, which is required for the front protective sheet, is not always requested. Therefore, a reinforcing plate may be attached to the sheet in order to increase the mechanical strength of the solar cell module or to prevent distortion and strain caused by temperature change. For instance, a steel plate, a plastic board, and an FRP (glass-reinforced plastic) board are preferably used.

[Solar Cell Element]

As the solar cell element of the tenth aspect of the present invention, any element that can generate electricity based on the photovoltaic effect of semiconductors, for instance, solar cells of silicon (single crystal, polycrystalline, and non-crystalline (amorphous) silicon), solar cells of compound semiconductor (Group III/V, Group II/VI, etc.), wet solar cells, organic semiconductor solar cells, and others. Among these, polycrystalline silicon solar cells are preferable in terms of cost performance and others.

Both silicon and compound semiconductors are known to exhibit excellent properties as solar cell elements, but they are also known to be liable to damage by external stress, impact, or the like. Layer (II-10) in the solar cell-sealing sheet of the tenth aspect is made of specific thermoplastic resin composition (X10) with excellent flexibility, so that layer (II-10) absorbs the stress and impact loaded on the solar cell elements and effectively prevents damage on the solar cell elements. Therefore, in the above solar cell module, it is desirable to bond the solar cell-sealing sheet of the tenth aspect to the solar cell element through layer (1'-10).

Since layer (II-10) is made of thermoplastic resin composition (X10), the solar cell element can be relatively easily removed from the solar cell module even after the module is once fabricated. Such excellent recyclability is also preferable.

[Electric Power Generator]

The solar cell module, which is a preferred embodiment of the tenth aspect, is excellent in productivity, power generation efficiency, service life, and others. Therefore, an electric power generator using the solar cell module is also excellent in cost performance, power generation efficiency, service life, and others, and practically valuable.

The above electric power generator is suitable for long-term uses, regardless indoor or outdoor, including uses as a power unit on the roofs of houses, a portable power source for camping and other outdoor applications, an auxiliary power unit for car batteries, and others.

EXAMPLES

Hereinafter, the present invention will be explained in detail with reference to Examples, but the present invention is not limited to these examples.

<First Aspect of Invention>

The followings are explanation on (i) preparation method and properties of starting materials, (ii) preparation of specimens, and (iii) test methods used for evaluation in Examples and Comparative Examples.

(i) Preparation Method and Properties of Starting Materials (a) Synthesis of Propylene/Ethylene/Butene Random Copolymer (PEER)

In a 2000-mL polymerization reactor fully purged with nitrogen, 833 mL of dry hexane, 100 g of 1-butene, and 1.0 mmol of triisobutylaluminum were charged at normal temperature, the temperature in the reactor is elevated to 40° C., and propylene was supplied so that the pressure in the reactor increased to 0.76 MPa, and then ethylene was supplied to adjust the pressure at 0.8 MPa. To the reactor was added a toluene solution in which 0.001 mmol of dimethylmethylene (3-tert-butyl-5-methylcyclopentadienyl)fluorenylzirconium dichloride and 0.3 mmol (relative to aluminum) of methylaluminoxane (available from Tosoh Finechem Corporation) had been contacted, and the polymerization was conducted for 20 min while the inside temperature was kept at 40° C. and the inside pressure was kept at 0.8 MPa by supplying ethylene. Then, 20 mL of methanol was added to terminate polymerization. After the pressure was released, the polymer was precipitated from the polymerization solution in 2 L of methanol and dried at 130° C. under vacuum for 12 hr to yield 36.4 g of PEBR. For this polymer, intrinsic viscosity [η] was 1.81 dl/g, glass transition temperature Tg was −29° C., ethylene content was 17 mol %, butene content was 7 mol %, molecular weight distribution (Mw/Mn) was 2.1, and mm-fraction was 90%. No distinctive melting peak was observed (ΔH was less than 0.5 J/g) with a DSC. The basic properties of the present PEBR are shown in Table 1-1.

(b) Properties of Other Starting Materials

Table 1-1 shows the basic properties of other starting materials used for the present evaluation, which are homopolypropylene (hPP), random polypropylene (rPP), ethylene/butene random copolymer (EBR), styrene/ethylene butene/styrene copolymer (SEBS), and low-density polyethylene (LDPE). In the present evaluation, as a softener was used a paraffin oil, "PW-90" available from Idemitsu Kosan Co., Ltd. (kinematic viscosity at 40° C.: 95.5 cst).

3. MFR

MFR at 230° C. under a load of 2.16 kg was measured in accordance with ASTM D1238.

4. Co-Monomer (C2, C3, and C4) Contents

The contents were determined by $^{13}$C-NMR spectrum.

5. Molecular Weight Distribution (Mw/Mn)

The Mw/Mn was measured by GPC (gel permeation chromatography) using o-dichlorobenzene as a solvent at 140° C.

(ii) Preparation Methods of Specimens

Starting materials were kneaded in the ratios described in Table 1-2 with a Labo plast-mill (available from Toyo Seiki Seisaku-sho, Ltd.) and molded into a 2-mm thick sheet with a press molding machine (heating: 190° C. for 7 min, cooling: 15° C. for 4 min, cooling speed: about −40° C./min).

(iii) Evaluation Items for Properties

1. Permanent Compression Set

Six 2-mm thick press-molded sheets were stacked, compressed by 250, kept under load for 24 hr at 23° C., 50° C., or 70° C., and the residual strain (given by the following equation) was examined.

Residual strain=100×"strain after test" ("thickness before test"−"thickness after test")/"strain" ("thickness before test"−"thickness on compression")

2. Mechanical Properties

In accordance with JIS K7113-2, yield stress (YS), tensile strength at break (TS), elongation at break (chuck-to-chuck distance, EL), and Young's modulus (YM) were measured using a 2-mm thick press-molded sheet.

3. Hardness

In accordance with ASTM D2240, using two 2-mm thick press-molded sheets stacked, Shore-A hardness was evaluated.

TABLE 1-1

| Properties of Starting Materials | | | | | | |
|---|---|---|---|---|---|---|
| | | hPP | rPP | LDPE | PEBR | EBR-1 | SEBS |
| Melting point | ° C. | 163 | 140 | 110 | not observed | not observed | Tuftec H1221 |
| MFR(230° C.) | g/10 min | 7 | 7 | 6.5 | 8.5 | 2.6 | |
| Density | kg/m³ | | | 920 | | 861 | |
| C2(ethylene) content | mol % | | 2.2 | 99< | 17 | 81 | |
| C3(propylene) content | mol % | 99< | 96.3 | | 76 | | |
| C4(butene) content | mol % | | 1.5 | | 7 | 19 | |

* SEBS: "Tuftec H1221"(TM) available from Asahi Kasei Chemicals Corp.

For both hPP and rPP in the table, the isotactic pentad fraction (mmmm-fraction) was 0.95 or more.

1. Melting Point and Glass Transition Temperature

In exothermic/endothermic curve measured with a DSC, the temperature at which the maximum melting peak appeared in heating was counted as Tm, and the secondary transition point observed in the endothermic curve between −100° C. and 0° C. was counted as Tg. A sample loaded on an aluminum pan was heated to 200° C. at 100° C./min, kept at 200° C. for 5 min, cooled to −150° C. at 10° C./min, and heated at 10° C./min during which the exothermic/endothermic curve was recorded.

2. Density

A strand that had been used for MFR measurement at 190° C. under a load of 2.16 kg was kept at 120° C. for 1 hr, gradually cooled to room temperature over 1 hr, and used for density measurement with a density gradient column.

4. Oil-Acceptance

After a molded specimen was kept in an oven at 70° C. for 14 days, oil-bleeding in the surface was evaluated by visual observation.

Examples 1-1 to 1-8, Comparative Examples 1-1 to 1-5, and Reference Example 1-1

For sheet specimens with the composition described in Tables 1-2 and 1-3, the mechanical properties, hardness, and permanent compression set characteristics are shown in Tables 1-2 and 1-3. The results of oil acceptance evaluation are shown in Table 1-4.

TABLE 1-2

| | | Examples | | | | | | | |
|---|---|---|---|---|---|---|---|---|---|
| | | Example 1-1 | Example 1-2 | Example 1-3 | Example 1-4 | Example 1-5 | Example 1-6 | Example 1-7 | Example 1-8 |
| (A1) hPP (pbw) | | 20 | 40 | 40 | | | 40 | | |
| (A1) rPP (pbw) | | | | | 50 | 50 | | 50 | 50 |
| (B1) PEBR (pbw) | | 70 | 50 | 50 | 25 | 25 | 40 | 25 | 25 |
| (C1) SEBS (pbw) | | 10 | 10 | 10 | 25 | 25 | 10 | 15 | 15 |
| (D1) EBR (pbw) | | | | | | | 10 | 10 | 10 |
| (E1) PW-90 (pbw) | | | | 20 | | 10 | | | 10 |
| YS | MPa | none | 7.7 | none | none | none | none | none | none |
| TS | MPa | 15< | 21 | 16 | 22< | 17< | 18 | 17< | 12< |
| EL | % | 800< | 580 | 520 | 800< | 800< | 460 | 800< | 800< |
| YM | MPa | 23 | 118 | 75 | 74 | 45 | 123 | 80 | 50 |
| Shore A | | 80 | 95 | 92 | 88 | 83 | 97 | 92 | 86 |
| CS | 23° C. | 31 | 40 | 37 | 34 | 35 | 31 | 33 | 36 |
| | 50° C. | 56 | 55 | 57 | 54 | 56 | 57 | 55 | 58 |
| | 70° C. | 65 | 60 | 65 | 69 | 71 | 70 | 71 | 67 |

Note:
pbw = parts by weight

TABLE 1-3

| | | Comparative Examples and Reference Example | | | | | |
|---|---|---|---|---|---|---|---|
| | | Comparative Example 1-1 | Comparative Example 1-2 | Comparative Example 1-3 | Comparative Example 1-4 | Comparative Example 1-5 | Reference Example 1-1 |
| (A1) hPP (pbw) | | 20 | 40 | 40 | 40 | | 40 |
| LDPE (pbw) | | | | | | 40 | |
| (B1) PEBR (pbw) | | | | | | | 60 |
| (C1) SEBS (pbw) | | | | 60 | 60 | | |
| (D1) EBR (pbw) | | 80 | 60 | | | 60 | |
| (E1) PW-90 (pbw) | | | | 20 | 40 | | 20 |
| YS | MPa | none | none | none | none | none | none |
| TS | MPa | 2.2 | 6.6 | 21 | 11 | 13 | 17 |
| EL | % | 480 | 70 | 440 | 340 | 790 | 550 |
| YM | MPa | 10 | 182 | 129 | 91 | 39 | 77 |
| Shore A | | 66 | 90 | 93 | 88 | 85 | 92 |
| CS | 23° C. | 36 | 34 | 23 | 27 | 26 | 36 |
| | 50° C. | 99 | 93 | 62 | 63 | 61 | 52 |
| | 70° C. | 100 | 95 | 88 | 91 | 77 | 62 |

Note:
pbw = parts by weight

TABLE 1-4

Oil-acceptance
(Examples, Comparative Examples, and Reference example)

| | Example 1-3 | Comparative Example 1-3 | Reference Example 1-1 |
|---|---|---|---|
| (A1) hPP | 40 | 40 | 40 |
| (B1) PEBR | 50 | | 60 |
| (C1) SEBS | 10 | 60 | |
| (E1) PW-90 | 20 | 20 | 20 |
| CS 70° C. | 65 | 88 | 62 |
| Oil-acceptance | Excellent | Excellent | Poor |

Excellent: no oil-bleeding, Poor: oil-bleeding observed

<Second Aspect of Invention>
(i) The properties of starting materials used in the present Examples and Comparative Examples are described below.
(1) Propylene/α-Olefin Random Copolymer (PBR)
  Propylene/1-butene copolymer (Butene content=27 mol %, Tm=73° C., MFR(230° C.)=7 g/10 min, Mw/Mn=2.1) was used. The mm-Fraction was 91%. The copolymer was produced with a metallocene catalyst described in WO 2004/087775.
(2) Styrene-Based Elastomer (SEES)
  SEBS "Tuftec H1062"™ available from Asahi Kasei Chemicals Corp. was used.
(3) Isotactic Polypropylene (rPP)
  Propylene/ethylene/1-butene random copolymer (Tm=140° C., MFR(230° C.)=7 g/10 min, mmmm-Fraction=0.96, Mw/Mn=4.8) was used.
(4) Ethylene/α-Olefin Copolymer (EBR)
  Ethylene/1-butene copolymer (density=870 kg/m$^3$, Tm=53° C., MFR(230° C.)=7 g/10 min, Mw/Mn=2.1) was used.
(5) Softener (Oil)
  Paraffin oil "PW-90"™ available from Idemitsu Kosan Co., Ltd. (Kinematic viscosity at 40° C.: 95.5 cSt) was used.
The above properties were measured by the following methods.
(1) Melting Point
  In an exothermic/endothermic curve measured with a DSC, the temperature at which the maximum melting peak appeared in heating was counted as Tm. Here, the sample loaded on an aluminum pan was heated to 200° C. at 100° C./min, kept at 200° C. for 5 min, cooled to −150° C. at 10° C./min, and heated at 10° C./min during which the exothermic/endothermic curve was recorded.
(2) Co-Monomer (C2, C3, and C4) Contents
  The contents were determined by $^{13}$C-NMR spectrum.
(3) MFR
  MFR at 230° C. under a load of 2.16 kg was measured in accordance with ASTM D1238.
(4) Molecular Weight Distribution (Mw/Mn)
  The Mw/Mn was measured by GPC (gel permeation chromatography) using o-dichlorobenzene as a solvent at 140° C.
(5) Density
  The density was measured in accordance with ASTM D1505.
(ii-1) Preparation of Samples
  Starting materials were kneaded in the ratio described in Tables 2-1 and 2-2 with a Labo plast-mill (available from Toyo Seiki Seisaku-sho, Ltd.) and molded into a 2-mm thick sheet with a press molding machine (heating: 190° C. for 7 min, cooling: 15° C. for 4 min, cooling speed: about −40° C./min).
(iii-1) Evaluation Methods and Items
(1) Flexibility (YM)
  Young's modulus (YM) was measured with a 2-mm thick press-molded sheet in accordance with JIS K7113-2.
(2) Abrasion Resistance (ΔGloss)
  Each sample was abraded using a "Gakushin" abrasion testing machine available from Toyo Seiki Seisaku-sho Ltd. equipped with a 45R SUS-made abrasion indenter weighing 470 g whose tip was covered with cotton cloth No. 10, under conditions of 23° C., the number of reciprocations of 100 times, a reciprocation speed of 33 times/min, and a stroke of 100 mm. The gloss retention percentage with abrasion, ΔGloss, was calculated as follows.

Gloss retention percentage=Gloss after abrasion/Gloss before abrasion×100.

The larger ΔGloss is, the better the abrasion resistance is.
(3) Whitening Resistance
  A specimen was folded by 180° to form a symmetric shape. After a cylindrical weight with 5 cm of radius and 10 kg of weight was loaded on the folded specimen for 1 hr, the whitening level was evaluated by visual observation.
Excellent: no whitening, Do: slight whitening, Poor: marked whitening.
(4) Low-Temperature Kneadability
  With a Labo plast-mill, a composition was kneaded (40 rpm, 5 min) at 150 to 160° C. and the kneadability was evaluated.
Excellent: kneadable, Poor: not kneadable (Non-melted part is present), NE: not evaluated.

Examples 2-1 to 2-5

Using samples prepared in (ii-1) at the blending proportions described in Table 2-1, items (1) to (3) above were evaluated. The results are also shown in Table 2-1.

Comparative Examples 2-1 and 2-2

Using samples prepared in (ii-1) at the blending proportions described in Table 2-2, items (1) to (3) above were evaluated. The results are also shown in Table 2-2. Item (4) was evaluated for only Example 2-4 and Comparative Example 2-1.

TABLE 2-1

|  |  | Example 2-1 | Example 2-2 | Example 2-3 | Example 2-4 | Example 2-5 |
|---|---|---|---|---|---|---|
| (B2) PBR (pbw) |  | 70 | 50 | 50 | 50 | 70 |
| (C2) SEBS (pbw) |  | 30 | 30 | 20 | 30 | 30 |
| (A2) rPP (pbw) |  |  | 20 | 20 |  |  |
| (D2) EBR (pbw) |  |  |  | 10 | 20 |  |
| (E2) Oil (pbw) |  |  |  |  |  | 30 |
| YM | MPa | 160 | 250 | 265 | 105 | 85 |
| ΔGloss | % | 65 | 83 | 76 | 52 | 54 |
| Whitening resistance |  | Excellent | Excellent | Excellent | " | Excellent |
| Low-temperature kneadability |  | NE | NE | NE | Excellent | NE |

Note:
pbw = parts by weight

TABLE 2-2

|  |  | Comparative Example 2-1 | Comparative Example 2-2 |
|---|---|---|---|
| (A2) rPP (pbw) |  | 50 | 40 |
| (D2) EBR (pbw) |  | 50 | 60 |
| YM | MPa | 180 | 110 |
| ΔGloss | % | 35 | 20 |
| Whitening resistance |  | Poor | Poor |
| Low temperature kneadability |  | Poor | NE |

Note:
pbw = parts by weight

The above evaluation shows that the molded articles formed from thermoplastic resin composition (X2) related to the second aspect of invention are superior to those made of conventional compositions composed of polypropylene and ethylene/α-olefin copolymer in balance of flexibility and scratch and whitening resistances. In addition, thermoplastic resin composition (X2) is kneadable at low temperature, so that thermoplastic resin composition (X2) can be processed under wider molding conditions including dynamic crosslinking.

(ii-2) Preparation of Samples

The starting materials described in Table 2-3 were kneaded with a 40-mmΦ extruder to make pellets, which were melt-processed with an injection molding machine under the following conditions to prepare samples.

Preset temperatures: H3/H2/H1/NH=180/200/210/210° C.
Mold temperature: 40° C.
Injection pressure: 1000/800 kgf/cm² (square plate), 400/280 kgf/cm² (specimen)
Mold cycle: primary/secondary/cooling=10/10/30 sec weight at room temperature for 1 week. Stickiness experienced when the plates were separated from each other was evaluated.

Excellent: no stickiness, Do: slight stickiness, Poor: marked stickiness

Example 2-6, Comparative Examples 2-3 to 2-5, and Reference Examples 2-1 and 2-2

Using samples prepared in (ii-2), items (1) to (5) above were evaluated. The results are shown in Table 2-3.

TABLE 2-3

|  |  | Example 2-6 | Comparative Example 2-3 | Reference example 2-1 | Comparative Example 2-4 | Comparative Example 2-5 | Reference example 2-2 |
|---|---|---|---|---|---|---|---|
| (B2) PBR (pbw) |  | 7.5 |  | 15 |  |  | 7.5 |
| (C2) SEBS (pbw) |  | 7.5 |  |  | 15 |  |  |
| (A2) rPP (pbw) |  | 85 | 100 | 85 | 85 | 85 | 85 |
| (D2) EBR (pbw) |  |  |  |  |  | 15 | 7.5 |
| Tensile strength at break | MPa | 38 | 41 | 40 | 37 | 32 | 36 |
| Elongation at break | % | 540 | 500 | 570 | 520 | 420 | 490 |
| Modulus in tension | MPa | 730 | 950 | 790 | 660 | 680 | 740 |
| Total haze | % | 62 | 72 | 64 | 63 | 78 | 74 |
| Impact resistance (0° C.) | J/m | 170 | 20 | 35 | 360 | 210 | 85 |
| Surface stickiness |  | Excellent | Excellent | Excellent | Poor | " | Excellent |
| Hue | L | 29.0 | 28.5 | 28.0 | 29.0 | 31.0 | 29.0 |
| After ball drop | L | 29.5 | 30.0 | 29.5 | 30.5 | 35.0 | 32.0 |
| ΔL |  | 0.5 | 1.5 | 0.5 | 1.5 | 4.0 | 3.0 |

Note:
pbw = parts by weight (iii-2) Evaluation Methods and Items (1) Tensile Strength at Break, Elongation at Break, and Modulus in Tension (Young's Modulus)

The tensile strength at break, elongation at break, and modulus in tension were measured in accordance with ASTM D638 using ASTM-IV injection-molded specimens at 23° C. and a tensile speed of 50 mm/min.

(2) Total Haze

The total haze was measured with an injection-molded square plate, 110×110×3 (thickness) mm in size.

(3) Falling Ball Whitening Test

A steel ball weighing 287 g was dropped from a height of 80 cm on an injection-molded square plate (110×110×3 (thickness) mm) held on a cylindrical jig with an inside diameter of 55 mm. The change in hue L (L-value in specular component excluded method) was evaluated in whitened part where the steel ball was directly hit. The smaller ΔL is, the more excellent whitening resistance is.

$\Delta L = L$ (after test)$-L$ (before test)

(4) Impact Resistance

Izod impact strength was measured in accordance with ASTM D785.

Measurement temperature: 0° C., Specimen size: 12.7 (width)×64 (length)×3.2 (thickness) mm (5) Anti-Blocking Property Two injection-molded square plates were stacked and fixed together with a tape, and the stack was loaded with 5 kg of As clearly seen in Table 2-3, the composition related to the second aspect of invention (Example 2-6) is particularly excellent in balance of tensile elasticity, transparency, impact resistance, and whitening resistance.

<Third Aspect of Invention>

(1) Measurement of Intensity of Magnetization in Decay Process Due to Transverse Relaxation Up to 1000 μs in Pulse NMR Solid-Echo Experiment Observed for $^1H$ The starting materials used in the present examples are as follows:

(A3-1) Isotactic Polypropylene (rPP)

Propylene/ethylene/1-butene random copolymer (Mw/Mn=4.8, MFR(230° C.)=7 g/10 min, Tm=140° C., mm-Fraction=97%, Content of n-decane-insoluble components=98 wt %, Tm of n-decane-insoluble components=140° C., Propylene content in n-decane-insoluble components=98 mol %, Intrinsic viscosity [η] of n-decane-insoluble components=1.9 dl/g) was used.

(B3) Propylene/Ethylene/1-Butene Copolymer (PEBR)

Ethylene content=14.0 mol %, 1-Butene content=19 mol %, MFR=7 g/10 min, Intrinsic viscosity [a]=2.0 dl/g, Melting point=not observed (ΔH: less than 0.5 J/g), Molecular weight distribution (Mw/Mn)=2.0, Shore A hardness=45, mm-Fraction=92% (PEBR was prepared by the method described in WO 2004/87775.)

Specifically, PEBR was prepared as follows. In a 2000-mL polymerization reactor fully purged with nitrogen, 917 mL of dry hexane, 85 g of 1-butene, and 1.0 mmol of triisobutylaluminum were charged at normal temperature, the inside temperature of the reactor was elevated to 65° C., propylene was introduced so that the inside pressure of the reactor increased to 0.77 MPa, and then ethylene was supplied so as to adjust the inside pressure to 0.78 MPa. Into the reactor was added a toluene solution in which 0.002 mmol of dimethylmethylene(3-tert-butyl-5-methylcyclopentadienyl)fluorenylzirconium dichloride and 0.6 mmol (relative to aluminum) of methylaluminoxane (available from Tosoh Finechem Corp.) had been contacted, and polymerization was conducted for 20 min while the inside temperature was kept at 65° C. and the inside pressure was kept at 0.78 MPa by adding ethylene. The polymerization was terminated by adding 20 mL of methanol, the pressure was released, and the polymer was precipitated from the polymerization solution in 2 L of methanol and dried at 130° C. under vacuum for 12 hr to yield 60.4 g of the desired copolymer.

(b3-1) Soft Propylene-Based Copolymer (PER)

"VISTAMAXX VM1100"™ available from Exxon Mobil Corp. (Tm=159° C., Ethylene content=20 mol %, mm-Fraction=93%, Shore A hardness=66) was used.

(b3-2) Non-Crystalline PP

There was used a composition (Shore A hardness of the composition=61) obtained by melt-kneading 85 wt % of non-crystalline propylene/1-butene copolymer (Melting point=not observed, 1-Butene content=3 mol %, mm-Fraction=11%, MFR=3 g/10 min) and 15 wt % of isotactic homopolypropylene (Tm=160° C.).

(C3) Styrene/Ethylene Butylene/Styrene Copolymer (SEBS)

"Tuftec H1062"™ available from Asahi Kasei Chemicals Corp. (Tm=not observed, Shore A hardness=67) was used.

(D3) Ethylene/1-Butene Copolymer (EBR)

Density=870 kg/m$^3$, Melting point=53° C., MFR (230° C.)=7.2 g/10 min, Mw/Mn=2.1, Shore A hardness=71

The properties of the above starting materials were measured by the following methods:

(1) Melting Point (Tm)

In an exothermic/endothermic curve measured with a DSC, the temperature at which the maximum melting peak appeared in heating was regarded as Tm. Here, the sample loaded on an aluminum pan was heated to 200° C. at 100° C./min, kept at 200° C. for 5 min, cooled to −150° C. at 20° C./min, and heated at 20° C./min during which the exothermic/endothermic curve was recorded.

(2) Co-Monomer (C2, C3, and C4) Contents and mm-Fraction

The contents and mm-fraction were determined by $^{13}$C-NMR spectrum.

(3) MFR

MFR at 230° C. under a load of 2.16 kg was measured in accordance with ASTM D1238.

(4) Molecular Weight Distribution (Mw/Mn)

The Mw/Mn was measured by GPC (gel permeation chromatography) using o-dichlorobenzene as a solvent at 140° C.

(5) Shore A Hardness

The Shore A hardness was measured in accordance with JIS K6301.

(6) Density

The density was measured in accordance with ASTM D1505.

(7) Content of N-Decane-Insoluble Components n-Decane extraction test was conducted by the method described in the present specification, and the content of n-decane-insoluble components was obtained from the following equation:

Content of n-decane insoluble components (wt %)=100−content of n-decane-soluble components (wt %).

Example 3-1

A polymer composition containing 80 wt % of rPP (A3-1) and 20 wt % of PEBR (B3) was obtained by kneading with a Labo plast-mill available from Toyo Seiki Seisaku-sho, Ltd. at 190° C. for 5 min (40 rpm, charged starting materials occupied 75% of mill volume). Namely, the polymer composition contained 78.4 wt % of n-decane-insoluble propylene-based polymer (A3) and 20 wt % of PEBR (B3); in other words, (A3) was 79.7 wt %, and (B3) was 20.3 wt % relative to 100 wt % of the total of (A3) and (B3); hence $f_B$ was 0.203.

Figure 3:
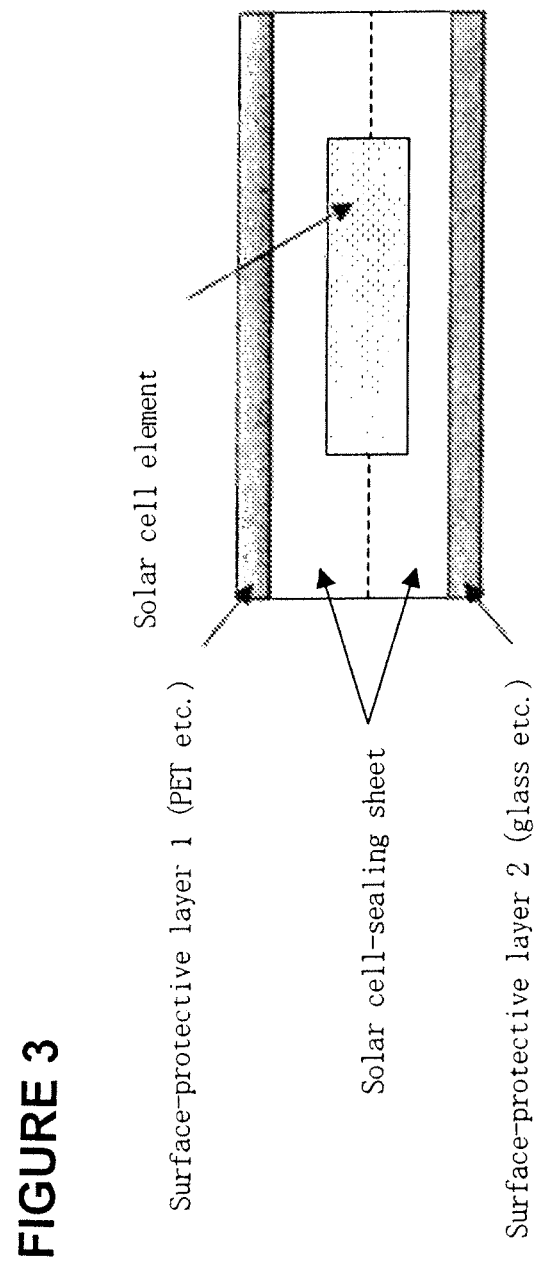
FIG. 3 shows an exemplary embodiment in which a solar cell-sealing sheet is applied.

The composition thus obtained was molded into a 2-mm thick sheet with a press molding machine (heating: 190° C. for 17 min, cooling: 15° C. for 4 min, cooling speed: about −40° C./min). A sample was cut out of this sheet and used for the pulse NMR measurement (solid-echo experiment observed for $^1$H at 100° C.) by the method described in the present specification. FIG. 3-1 shows the intensity of magnetization in decay process M(t) (corresponding to M(t)) in transverse relaxation process up to 1000 μs.

FIG. 3-1 also shows the calculated intensity of magnetization in decay process, M(t)$_{CAL1}$, which was calculated from intensities of magnetizations in decay processes of rPP(A3-1) alone and PEBR(B3) alone, using equation 3-1-2 in the present specification, considering that the content of n-decane-insoluble components in rPP(A3-1) was 98 wt % and $f_B$ was 0.203. The differences, M(t)$_{CAL}$−M(t)$_C$, at observation time, t, of 500 and 1000 μs (ΔM(500) and ΔM(1000), respectively) are shown in Table 3-1. (In Example 3-2 and Comparative Examples 3-1 to 3-3 below, the results were analyzed similarly to above.)

Example 3-2

Intensity of magnetization in decay process M(t)$_{C2}$ was measured by the same method as that in Example 3-1 except that 50 wt % of rPP (A3-1) and 50 wt % of PEBR (B3) were used (namely, n-decane-insoluble propylene-based polymer (A3) was 49 wt % and PEBR (B3) was 50 wt %; based on 100 wt % of the total of (A3) and (B3), (A3) was 49.5 wt %, (B3) was 50.5 wt %, and hence $f_B$ was 0.505). The results are shown in FIG. 3-2. FIG. 3-2 also shows the calculated intensity of magnetization in decay process M(t)$_{CAL2}$ obtained from the intensities of magnetizations in decay processes measured for rPP (A3-1) alone and PEBR (B3) alone using equation 3-1-2 in the present specification, considering that the content of n-decane-insoluble components in rPP (A3-1) was 98 wt % and $f_B$ was 0.505.

Comparative Example 3-1

Intensity of magnetization in decay process M(t)$_{C3}$ was measured by the same method as that in Example 3-1 except that 50 wt % of rPP (A3-1) and 50 wt % of PER (b3-1) were used. The results are shown in FIG. 3-3. FIG. 3-3 also shows the calculated intensity of magnetization in decay process M(t)$_{CAL3}$ obtained from the intensities of magnetizations in decay processes measured for rPP (A3-1) alone and PER (b3-1) alone using equation 3-1-2 in the present specification, considering that the content of n-decane-insoluble components in rPP (A3-1) was 98 wt % and $f_B$ was 0.505.

Comparative Example 3-2

Figure 4:
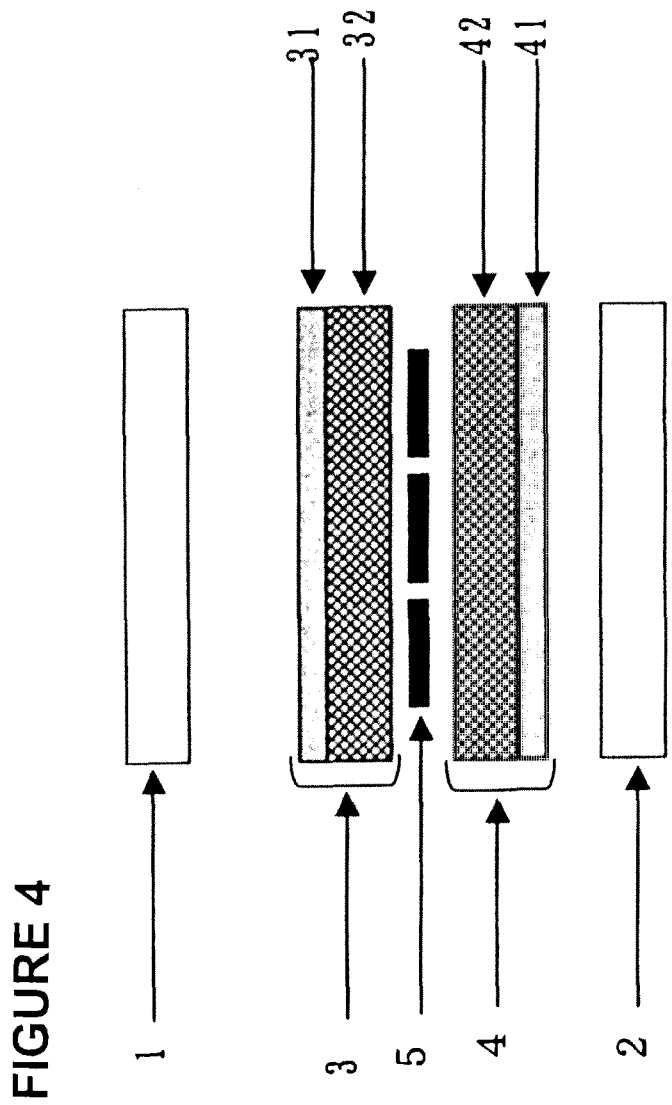
FIG. 4 is a cross-sectional view illustrating schematically the solar cell module structure of an preferred embodiment related to the tenth aspect; the solar cell module is sealed between 32 and 42, that is, between layers (II-10).

Intensity of magnetization in decay process M(t)$_{C5}$ was measured by the same method as that in Example 3-1 except that 50 wt % of rPP (A3-1) and 50 wt % of SEBS (C3) were used. The results are shown in FIG. 3-4. FIG. 3-4 also shows the calculated intensity of magnetization in decay process M(t)$_{CAL5}$ obtained from the intensities of magnetizations in decay processes measured for rPP (A3-1) alone and SEBS (C3) alone using equation 3-1-2 in the present specification, considering that the content of n-decane-insoluble components in rPP (A3-1) was 98 wt % and $f_B$ was 0.505.

Comparative Example 3-3

Intensity of magnetization in decay process $M(t)_{C6}$ was measured by the same method as that in Example 3-1 except that 50 wt % of rPP (A3-1) and 50 wt % of EBR (D3) were used. The results are shown in FIG. 3-5. FIG. 3-5 also shows the calculated intensity of magnetization in decay process $M(t)_{CAL6}$ obtained from the intensities of magnetizations in decay processes measured for rPP (A3-1) alone and EBR (D3) alone using equation 3-1-2 in the present specification, considering that the content of n-decane-insoluble components in rPP (A3-1) was 98 wt % and $f_B$ was 0.505.

TABLE 3-1

|  | Example 3-1 | Example 3-2 | Comparative Example 3-1 | Comparative Example 3-2 | Comparative Example 3-3 |
|---|---|---|---|---|---|
| ΔM (500) | 0.05 | 0.06 | 0.01 | 0.00 | 0.00 |
| ΔM (1000) | 0.10 | 0.09 | 0.00 | 0.00 | 0.00 |

The compositions using PBER (B3) related to the third aspect of the present invention satisfy equation 3-1 in the entire range of observation time t from 500 to 1000 μs.

(2) Evaluations for Mechanical Properties, Scratch Resistance, and Transparency

Examples 3-11 and 3-12, and Comparative Examples 3-11 to 3-16

Each of rPP (A3-1) alone, which served as a reference, and the polymer compositions with the component ratios described in Table 3-2 was melt-kneaded and press-molded into a 2-mm thick sheet. With this sample, the mechanical properties, scratch resistance, transparency, and thermal whitening resistance were evaluated.

Evaluation Methods:
(i) Mechanical Properties
   Yield stress (YS), elongation at yield [EL(YS)], tensile strength at break (TS), elongation at break [EL(TS)], and Young's modulus (YM) were measured with a 2-mm thick press-molded sheet in accordance with JIS K7113-2.
(ii) Scratch Resistance (Gloss Retention Percentage)
   Each sample was abraded using a "Gakushin" abrasion testing machine available from Toyo Seiki Seisaku-sho Ltd. equipped with a 45R SUS-made abrasion indenter weighing 470 g whose tip was covered with cotton cloth No. 10, under conditions of 23° C., the number of reciprocations of 100 times, a reciprocation speed of 33 times/min, and a stroke of 100 mm. The gloss retention percentage with abrasion was calculated as follows:

Gloss retention percentage=Gloss after abrasion/Gloss before abrasion×100.

(iii) Transparency (Internal Haze)
   Measurement was performed with a digital haze/tubidimeter "NDH-20D" available from Nippon Denshoku Kogyo Co., Ltd. for a 2-mm thick press-molded sheet immersed in cyclohexanol. Internal haze was calculated from the following equation:

Internal haze (%)=100×(Diffuse transmission)/(Total transmission).

(iv) Whitening Resistance (Thermal Whitening Resistance)
   After each press-molded sheet was heated in a hot-air drier at 120° C. for 3 min and at 160° C. for 3 min, whitening resistance was evaluated by visual observation.
   A: no whitening, B: slight whitening, C: marked whitening.

TABLE 3-2

|  |  | rPP (A3) alone | Example 3-11 | Example 3-12 | Comparative Example 3-11 | Comparative Example 3-12 |
|---|---|---|---|---|---|---|
| Elastomers |  |  | PBER(B3) | | PER(b3-1) | |
| *1 |  | 0.0 | 0.2 | 0.5 | 0.2 | 0.5 |
| Yield stress YS | MPa | 27.0 | 18.7 | 8.5 | 18.0 | 10.5 |
| Elongation at yield point EL(YS) | % | 7.2 | 11.0 | 20.5 | 8.8 | 11.0 |
| Tensile strength at break TS | MPa | 34.0 | 29.5 | 25.0 | 24.0 | 24.9 |
| Elongation at break EL(TS) | % | 450 | 530 | 590 | 460 | 550 |
| Young's modulus (YM) | MPa |  | 610 | 150 | 680 | 290 |
| Scratch resistance (Gloss retention) | % | 97 | 96 | 82 | 78 | 33 |
| Transparency | % | 81 | 75 | 49 | 86 | 91 |
| Whitening resistance (Thermal whitening resistance) |  | B | A | A | C | C |

|  |  | Comparative Example 3-13 | Comparative Example 3-14 | Comparative Example 3-15 | Comparative Example 3-16 |
|---|---|---|---|---|---|
| Elastomers |  | Non-crystalline PP(b3-2) | | SEBS(C3) | EBR(D3) |
| *1 |  | 0.2 | 0.5 | 0.2 | 0.2 |
| Yield stress YS | MPa | 16.2 | 10.4 | 18.2 | 18.2 |
| Elongation at yield point EL(YS) | % | 11.5 | 17.4 | 7.5 | 8.0 |
| Tensile strength at break TS | MPa | 21.8 | 17.5 | 29.0 | 21.8 |
| Elongation at break EL(TS) | % | 440 | 520 | 720 | 440 |
| Young's modulus (YM) | MPa | 540 | 210 | 770 | 720 |
| Scratch resistance (Gloss retention) | % | 93 | 88 | 80 | 62 |
| Transparency | % | 73 | 45 | 82 | 89 |
| Whitening resistance (Thermal whitening resistance) |  | C | C | C | C |

*1: Fraction of elastomer (B3), (b3-1), (b3-2), (C3), or (D3) blended

The propylene-based polymer compositions using PEBR (B3) related to the third aspect of invention, which satisfy formulae 3-2 and 3-3 in the present specification, are superior to other soft polypropylene materials (b3-1) and (b3-2) and conventional elastomers (C3) and (D3) in flexibility, transparency, mechanical properties, scratch resistance, and whitening resistance (thermal whitening resistance).

(3) Molded Sheets and Wrap Films (3-1) Evaluation of Whitening Resistance for Molded Sheets Examples 3-21 to 3-26 and Comparative Examples 3-21 to 3-30

Each of PEBR (B3), PER (b3-1), non-crystalline PP (b3-2), SEBS (C3), EBR (D3), rPP (A3-1), and isotactic block polypropylene (bPP) (A3-2) below was molded into a 500-μm thick sheet, with which whitening resistance was evaluated (Tables 3-3-1, 3-3-2).

(A3-2) Isotactic Block Polypropylene (bPP)

Tm=158° C., MFR(230° C.)=1.3 g/10 min, mm-Fraction=97%, Content of n-decane-insoluble components=89 wt %, Tm of n-decane-insoluble components=158° C., Intrinsic viscosity [η] of n-decane-insoluble components=2.3 dl/g Sheet Molding Method:

The starting materials with composition ratios described in Tables 3-3-1 and 3-3-2 were melt-kneaded with a 60-mmΦ extrusion sheet molding machine into a 500-μm thick sheet.

Evaluation Method for Whitening Resistance:

A dumbbell for tensile test in accordance with JIS K6301-2 was obtained from the resulting sheet. The change in hue (L-value) was evaluated when the dumbbell was stretched by 5 mm or 10 mm.

$\Delta L = L\text{-value (after stretch)} - L\text{-value (before stretch)}$

TABLE 3-3-1

| | | Example 3-21 | Example 3-22 | Example 3-23 | Comparative Example 3-21 |
|---|---|---|---|---|---|
| Propylene-based polymer | rPP(A3-1) | 90 | 90 | 90 | 100 |
| Soft propylene/α-olefin random copolymer | PEBR(B3) | 10 | 5 | 5 | |
| | PER(b3-1) | | | | |
| | Non-crystalline PP(b3-2) | | | | |
| Soft polymer | SEBS(C3) | | 5 | | |
| | EBR(D3) | | | 5 | |
| L(before stretch) | | 26.5 | 26.9 | 27.6 | 26.5 |
| ΔL(5 mm) | | 0.7 | 1.9 | 1.6 | 6.7 |
| ΔL(10 mm) | | 19.5 | 27.5 | 22.4 | 49.4 |

| | | Comparative Example 3-22 | Comparative Example 3-23 | Comparative Example 3-24 | Comparative Example 3-25 |
|---|---|---|---|---|---|
| Propylene-based polymer | rPP(A3-1) | 90 | 90 | 90 | 90 |
| Soft propylene/α-olefin random copolymer | PEBR(B3) | | | | |
| | PER(b3-1) | 10 | | | |
| | Non-crystalline PP(b3-2) | | 10 | | |
| Soft polymer | SEBS(C3) | | | 10 | |
| | EBR(D3) | | | | 10 |
| L(before stretch) | | 27.3 | 26.8 | 27.1 | 29.8 |
| ΔL(5 mm) | | 3.8 | 0.7 | 1.1 | 4.2 |
| ΔL(10 mm) | | 37.9 | 24.8 | 33.1 | 40.6 |

Note:
Amount of each component blended is given in parts by weight

TABLE 3-3-2

| | | Example 3-24 | Example 3-25 | Example 3-26 | Comparative Example 3-26 |
|---|---|---|---|---|---|
| Propylene-based polymer | bPP(A3-2) | 90 | 90 | 90 | 100 |
| Soft propylene/α-olefin random copolymer | PEBR(B3) | 10 | 5 | 5 | |
| | PER(b3-1) | | | | |
| | Non-crystalline PP(b3-2) | | | | |
| Soft polymer | SEBS(C3) | | 5 | | |
| | EBR(D3) | | | 5 | |
| L(before stretch) | | 34.6 | 34.7 | 34.6 | 36.3 |
| ΔL(5 mm) | | 0.9 | 2.0 | 1.5 | 28.7 |
| ΔL(10 mm) | | 14.2 | 23.6 | 21.5 | 50.2 |

| | | Comparative Example 3-27 | Comparative Example 3-28 | Comparative Example 3-29 | Comparative Example 3-30 |
|---|---|---|---|---|---|
| Propylene-based polymer | rPP(A3-2) | 90 | 90 | 90 | 90 |
| Soft propylene/α-olefin random copolymer | PEBR(B3) | | | | |
| | PER(b3-1) | 10 | | | |
| | Non-crystalline PP(b3-2) | | 10 | | |

TABLE 3-3-2-continued

| Soft polymer | SEBS(C3) | | | 10 | |
|---|---|---|---|---|---|
| | EBR(D3) | | | | 10 |
| L(before stretch) | | 35.4 | 35.2 | 35.2 | 35.9 |
| ΔL(5 mm) | | 10.3 | 2.4 | 17.2 | 19.4 |
| ΔL(10 mm) | | 34.2 | 27.7 | 36.6 | 38.7 |

Note:
Amount of each component blended is given in parts by weight

The molded articles obtained from the propylene-based polymer compositions using PEBR (B3) related to the third aspect of invention are excellent in whitening resistance.

<3-2> Evaluations for Cap Liner and Wrap Film Performance

Examples 3-31 and 3-32 and Comparative Examples 3-31 to 3-38

Cap liner performances were compared among PEBR (B3), PER (b3-1), non-crystalline PP (b3-2), SEBS (C3), EBR (D3), and rPP (A3-1) (Table 3-4-1). Wrap film performances were also evaluated with films formed from these materials (Table 3-4-2). In Tables 3-4-1 and 3-4-2, the unit for each component is parts by weight.

Evaluation Method for Cap Liner Performances:

Starting materials with the component ratios shown in Table 3-4-1 were kneaded by the same method as that in Example 3-1 to form pellets, which were molded into 0.3-mm or 2-mm thick sheets with a press molding machine (heating: 190° C. for 7 min, cooling: 15° C. for 4 min, cooling speed: about −40° C./min).

Stretching Property Evaluation:

A film strip was cut out of the 0.3-mm thick sheet. This film was stretched by 150% (45 mm (chuck-to-chuck distance after stretching)/30 mm (chuck-to-chuck distance before stretching)×100) at a tensile speed of 20 mm/min with a tensile tester. Then the tensile stress was released, and the residual strain was measured when the tensile stress became zero. Residual strain=(100×(chuck-to-chuck distance at zero stress)/30)−100

Compression Property Evaluation:

In accordance with JIS K-6301, six 2-mm thick pressed sheets were stacked and compressed by 25% and kept at predetermined temperatures (23° C. and 70° C.) for 24 hr, and after the load was released, the thickness of the stack was measured. From the results, deformation after 24-hr compression (permanent compression set) was calculated using the following equation:

Permanent compression set=100×(thickness before test−thickness after test)/(thickness before test−thickness on compression).

Evaluation Method for Wrap Film Performances:

With a three-kind three-layer cast molding machine, was prepared a multi-layer film composed of a 20-μm thick film made of the composition in Table 3-4-2 as an inner layer and a 5-μm thick layer made of LLDPE (density=915 kg/m$^3$, MFR (230° C.)=7.2 g/10 min) on each of both the faces of the film.

The resulting film was stretched by 150% in a similar manner to the residual strain evaluation, the whitening status of the film was evaluated by visual observation.

Excellent: no whitening, Do: slight whitening, Poor: marked whitening

From the above 150%-stretched (1.5-times stretched) film, a dumbbell in accordance with JIS K6781 was obtained and subjected to tensile test at a tensile speed of 200 m/min to evaluate the presence or absence of yield point.

TABLE 3-4-1

| | | Example 3-31 | Comparative Example 3-31 | Comparative Example 3-32 | Comparative Example 3-33 | Comparative Example 3-34 |
|---|---|---|---|---|---|---|
| Propylene-based polymer | rPP(A3) | 20 | 20 | 20 | 20 | 20 |
| Soft propylene/α-olefin random copolymer | PEBR(B3) | 80 | | | | |
| | PER(b3-1) | | 80 | | | |
| | Non-crystalline PP(b3-2) | | | 80 | | |
| Soft polymer | SEBS(C3) | | | | 80 | |
| | EBR(D3) | | | | | 80 |
| Residual strain | % | 22 | 22 | 37 | 20 | 26 |
| Permanent compression set (23° C.) | % | 21 | 23 | 75 | 18 | 33 |
| Permanent compression set (70° C.) | % | 63 | 94 | 86 | 98 | 99 |

TABLE 3-4-2

| | | Example 3-32 | Comparative Example 3-35 | Comparative Example 3-36 | Comparative Example 3-37 | Comparative Example 3-38 |
|---|---|---|---|---|---|---|
| Propylene-based polymer | rPP(A3) | 50 | 50 | 50 | 50 | 50 |

TABLE 3-4-2-continued

|  |  | Example 3-32 | Comparative Example 3-35 | Comparative Example 3-36 | Comparative Example 3-37 | Comparative Example 3-38 |
|---|---|---|---|---|---|---|
| Soft propylene/α-olefin random copolymer | PEBR(B3) | 50 |  |  |  |  |
|  | PER(b3-1) |  | 50 |  |  |  |
|  | Non-crystalline PP(b3-2) |  |  | 50 |  |  |
| Soft polymer | SEBS(C3) |  |  |  | 50 |  |
|  | EBR(D3) |  |  |  |  | 50 |
| Wrap film whitening resistance |  | Excellent | " | Excellent | " | Poor |
| Yield point status |  | absent | absent | absent | absent | absent |

The film made of the propylene-based polymer composition using PEBR (B3) of the third aspect of invention exhibits excellent stretching property and whitening resistance.

<Fourth Aspect of Invention>

[Starting Materials]

(a) Isotactic Polypropylene (iPP)
Ethylene content=4.2 mol %, MFR=2.7 g/10 min, Melting point=135° C., mmmm-Fraction=0.96

(b) Propylene/Ethylene/1-Butene Random Copolymer (PEBR)
Ethylene content=14.0 mol %, 1-Butene content=20 mol %, MFR=8.5 g/10 min, Melting point=not observed (ΔH: less than 0.5 J/g), Molecular weight distribution (Mw/Mn)=2.0, mm-Fraction=92%
(PEBR was prepared by the method described in WO 2004/87775.)

Specifically, PEER was prepared as follows. Namely, in a 2000-mL polymerization reactor fully purged with nitrogen, 917 mL of dry hexane, 90 g of 1-butene, and 1.0 mmol of triisobutylaluminum were charged at normal temperature, the inside temperature of the reactor was elevated to 65° C., and propylene was introduced so that the inside pressure of reactor increased to 0.77 MPa, and then ethylene was supplied so as to adjust the pressure to 0.79 MPa. To this reactor was added a toluene solution in which 0.002 mmol of dimethylmethylene(3-tert-butyl-5-methylcyclopentadienyl)fluorenylzirconium dichloride and 0.6 mmol (relative to aluminum) of methylaluminoxane (available from Tosoh Finechem Corp.) had been contacted, and the polymerization was conducted for 20 min while the inside temperature was kept at 65° C. and ethylene was supplied to keep the inside pressure at 0.79 MPa. The polymerization was terminated by adding 20 mL of methanol, the pressure was released, and the polymer was precipitated from the polymerization solution in 2 L of methanol and dried at 130° C. under vacuum for 12 hr to yield 60.4 g of the desired polymer.

(c) Petroleum Resin (P-125, Available from Arakawa Chemical Industries, Ltd.)
Mn=820, Softening point measured with the ring-and-ball method=125° C.

(d) Propylene/1-Butene Copolymer (PBR)
1-Butene content=27 mol %, MFR=7.1 g/10 min, Melting point=73° C., Molecular weight distribution (Mw/Mn)=2.1

(e) Ethylene/1-Butene Copolymer (EBR)
Density=870 kg/m³, Melting point=53° C., MFR(230° C.)=7.0 g/10 min, Mw/Mn=2.1

The properties of the above materials were measured by the following methods:

(1) Co-Monomer (Ethylene and 1-Butene) Contents
the contents were determined by $^{13}C$-NMR spectrum analysis.

(2) MFR
MFR at 230° C. under a load of 2.16 kg was measured in accordance with ASTM D1238.

(3) Melting Point
In exothermic/endothermic curve measured with a DSC, the temperature at the maximum melting peak in heating was counted as Tm. A sample loaded on an aluminum pan was heated to 200° C. at 100° C./min, kept at 200° C. for 5 min, cooled to −150° C. at 10° C./min, and heated at 10° C./min during which the exothermic/endothermic curve was recorded.

(4) Molecular Weight Distribution (Mw/Mn)
The Mw/Mn was measured by GPC (gel permeation chromatography) using o-dichlorobenzene as a solvent at 140° C.

(5) Density
The density was measured by the method in accordance with ASTM D1505.

(6) Mn of Hydrocarbon Resins
The Mn was measured by GPC (gel permeation chromatography).

(7) Softening Point of Hydrocarbon Resins
The softening point was measured by the ring-and-ball method in accordance with ASTM D36.

Examples 4-1 to 4-3, Reference Example 4-1, and Comparative Example 4-2

Preparation of Oriented Film:

Each starting material shown in Table 4-1 was kneaded with a 40-mmΦ extruder and the resulting pellets were extruded at 230° C., with a cast film molding machine, into a 250-μm thick single-layer film. In Table 4-1, the unit for each component is parts by weight.

A 9-cm square sheet was cut out of the above film and drawn by 5 times (in molding direction of cast film, i.e., MD direction) and 1 time (in TD direction) with a benchtop biaxial film stretching machine.

Draw temperature was 80° C., pre-heating time was 90 sec, and draw speed was 10 m/min. The film was air-cooled immediately after drawn.

TABLE 4-1

|  | Example 4-1 | Example 4-2 | Example 4-3 | Reference Example 4-1 | Comparative Example 4-2 |
|---|---|---|---|---|---|
| iPP | 80 | 80 | 80 | 80 | 80 |
| PEBR | 20 | 20 | 15 |  |  |
| PBR |  |  |  | 20 |  |
| EBR |  |  | 5 |  | 20 |
| P-125 |  | 15 | 15 |  | 15 |

The resulting films were evaluated on the following properties.

1. Heat Shrink Ratio

A specimen of 10 mm×100 mm (in draw direction) was cut out of the oriented film and immersed in hot water at 80° C. or 90° C. for 10 sec. Heat shrink ratio was obtained from the dimensional changes of the film before and after the immersion, using equation (1).

[Mathematical 1]

$$100\times\{(\text{dimension in draw direction before test})-(\text{dimension in draw direction after test})\}/(\text{dimension in draw direction after test}) \quad (1)$$

2. Transparency

Internal haze (%) was measured with a digital haze/tubidimeter "NDH-20D" available from Nippon Denshoku Kogyo Co., Ltd.

3. Film Impact (F.I.)

The film impact was measured for a film sized 100 mm×100 mm at −10° C. using a film impact tester with a 0.5-inchΦ spherical impact head, available from Toyo Seiki Seisaku-sho Ltd.

4. Film Strength

Tensile strength at break (TS) was measured in the tensile test in accordance with JIS K6781 (tensile direction was the same as the draw direction of the film, and the tensile speed was 200 mm/min).

The contents and mmmm-fraction were determined by $^{13}$C-NMR spectrum analysis.

(4) mm-Fraction

The mm-fraction was measured by the method described in WO 2004/87775.

(5) Molecular Weight Distribution (Mw/Mn)

The Mw/Mn was measured by GPC (gel permeation chromatography) using o-dichlorobenzene as a solvent at 140° C.

(6) Density

The density was measured in accordance with ASTM D1505.

(7) Shore A Hardness

The Shore A hardness was measured in accordance with JIS K6301 under the following conditions.

A 2-mm thick sheet was prepared with a press molding machine. The scale was read immediately after the pointer of a Type-A hardness tester touched the sheet.

(ii) Properties of Each Component (A5-1) Isotactic Polypropylene-1 (rPP)

PP ter-polymer (propylene/ethylene/1-butene random copolymer) (Tm=140° C., MFR(230° C.)=7 g/10 min., mmmm-Fraction=96%, Mw/Mn=4.8) was used.

(A5-2) Isotactic Block Polypropylene-2 (bPP)

Propylene/ethylene block copolymer (Tm=158° C., MFR (230° C.)=1.39/10 min, mmmm-Fraction=96%, Rubber content (n-decane-extractable fraction)=11 wt %, Ethylene content=10 mol %) was used.

TABLE 4-2

Characteristics of oriented film

| | | Example 4-1 | Example 4-2 | Example 4-3 | Reference Example 4-1 | Comparative Example 4-2 |
|---|---|---|---|---|---|---|
| Shrink ratio (90° C.) | % | 19 | 25 | 25 | 16 | 18 |
| Shrink ratio (80° C.) | % | 13 | 14 | 13 | 10 | 13 |
| Internal haze | % | 1.8 | 2.5 | 2.4 | 1.7 | 5.5 |
| F.I. | kJ/m | 12.5 | 9.5 | 12.0 | 4.5 | 13.0 |
| TS | MPa | 90 | 84 | 80 | 94 | 78 |

The above results clearly indicate that the films of the fourth aspect of invention have high heat shrink ratio, and also excellent transparency and film impact resistance.

<Fifth Aspect of Invention>

The test methods for evaluation in Examples and Comparative Examples are described below.

(i) Methods for Measuring Properties of Each Component (1) Melting Point (Tm), Crystallization Temperature (Tc), and Glass Transition Temperature (Tg)

In exothermic/endothermic curve measured with a DSC, the temperature at the maximum exothermic peak on cooling was counted as Tc, the temperature at the maximum melting peak on heating was counted as Tm, and the secondary transition point observed in the endothermic curve between −100° C. and 0° C. was counted as Tg.

In the above measurement, a sample loaded on an aluminum pan was heated to 200° C. at 100° C./min, kept at 200° C. for 5 min, cooled to −150° C. at 20° C./min, and heated at 20° C./min during which the exothermic/endothermic curve was recorded.

(2) Melt Flow Rate (MFR)

MFR at 230° C. under a load of 2.16 kg was measured in accordance with ASTM D1238.

(3) Co-Monomer (Ethylene, Propylene, and 1-Butene) Contents and mmmm-Fraction (Stereoregularity, Pentad Isotacticity)

(B5-1) Propylene/Ethylene/1-Butene Copolymer (PEBR)

Propylene/ethylene/1-butene copolymer (Ethylene content=14.0 mol %, 1-Butene content=19 mol %, MFR(230° C.)=7 g/10 min, Tm=not observed (ΔH: less than 0.5 J/g), Mw/Mn=2.0, Shore A hardness=45, mm-Fraction=92%) was used.

Specifically, PEER was prepared as follows. Namely, in a 2000-mL polymerization reactor fully purged with nitrogen, 917 mL of dry hexane, 85 g of 1-butene, and 1.0 mmol of triisobutylaluminum were charged at normal temperature, the inside temperature of reactor was elevated to 65° C., and propylene was introduced so that the inside pressure of reactor increased to 0.77 MPa, and then ethylene was supplied so as to adjust the pressure to 0.78 MPa. To this reactor was added a toluene solution in which 0.002 mmol of dimethylmethylene(3-tert-butyl-5-methylcyclopentadienyl)fluorenylzirconium dichloride and 0.6 mmol (relative to aluminum) of methylaluminoxane (available from Tosoh Finechem Corp.) had been contacted, and the polymerization was conducted for 20 min while the inside temperature was kept at 65° C. and ethylene was supplied to keep the inside pressure at 0.78 MPa. The polymerization was terminated by adding 20 mL of methanol, the pressure was released, and the polymer was precipitated from the polymerization solution in 2 L of methanol and dried at 130° C. under vacuum for 12 hr to yield 60.4 g of PEBR.

(B5-2) Non-Crystalline PP

There was used a composition (Shore A hardness of the composition=61) obtained by melt-kneading 85 wt % of non-crystalline propylene/1-butene copolymer (Melting point=not observed, 1-Butene content=3 mol %, mm-Fraction=11%, MFR=3 g/10 min) and 15 wt % of isotactic homopolypropylene (Melting point=160° C.)

(C5) Soft Polymer

Ethylene/1-butene copolymer (EBR) (Density=870 kg/m$^3$, Tm=53° C., MFR(230° C.)=7.2 g/10 min, Mw/Mn=2.1, Shore A hardness=71) was used.

(iii) Evaluation Items for Examples 5-1 to 5-4 and Comparative Examples 5-1 and 5-2

(1) Transparency

The diffuse transmission and total transmission were measured with a digital haze/tubidimeter "NDH-2000" available from Nippon Denshoku Kogyo Co., Ltd. for each sheet in cyclohexanol to obtain internal haze using the following equation:

Internal haze=100×(Diffuse transmission)/(Total transmission).

(2) Scratch Resistance

Each sample was abraded using a "Gakushin" abrasion testing machine available from Toyo Seiki Seisaku-sho Ltd. equipped with a 45R SUS-made abrasion indenter weighing 470 g whose tip was covered with a cotton cloth No. 10, under conditions of 23° C., the number of reciprocations of 100 times, a reciprocation speed of 33 times/min, and a stroke of 100 mm. The gloss retention percentage with abrasion, ΔGloss, was calculated as follows. The larger ΔGloss is, the better the abrasion resistance is.

Gloss retention percentage=100×Gloss after abrasion/Gloss before abrasion (3) Heat Resistance The heat resistance was evaluated as Vicat softening temperature (JIS K7206). Each resin composition with the component ratio described in Table 5-1 was re-molded into a 2-mm thick press-molded sheet (hot-pressed at 190° C., cooled at about −40° C./min with a chiller), which was used in the test.

(4) Mechanical Properties

In accordance with JIS K6301, yield stress (YS), elongation at yield (EL at YS), tensile strength at break (TS), elongation at break (EL), and Young's modulus (YM) were measured for JIS #3 dumbbell with a span distance of 30 mm at a tensile speed of 30 mm/min at 23° C.

(5) Permanent Compression Set (CS at 23° C. and 70° C.)

In accordance with JIS K6301, six 2-mm thick press-molded sheets were stacked and compressed by 25% and the permanent compression set after 24-hr compression at 23° C. or 70° C. was evaluated using the following equation. The smaller the value is, the more excellent the compression set resistance is.

Permanent compression set=100×"strain after test" (thickness before test−thickness after test)/ "strain" (thickness before test−thickness on compression)

Example 5-1

The starting materials with the component ratio described in Table 5-1 was melt-kneaded with a 40-mmΦ single-screw extruder into pellets, which were molded into a 2-mm thick sheet with a press molding machine (heating: 90° C. for 7 min, cooling: 15° C. for 4 min, cooling speed: about −40° C./min). Items (1) to (5) above were evaluated for the resultant sheet. The results are shown in Table 5-1.

Examples 5-2 to 5-4 and Comparative Examples 5-1 and 5-2

Evaluation was made similarly to Example 5-1, except that each starting material with the component ratio described in Table 5-1 was used instead of the composition in Example 5-1.

TABLE 5-1

| | | Example 5-1 | Example 5-2 | Example 5-3 | Example 5-4 | Comparative Example 5-1 | Comparative Example 5-2 |
|---|---|---|---|---|---|---|---|
| A5-1 rPP | pbw | 80 | 40 | 80 | 40 | 80 | 40 |
| B5-1 PEBR | pbw | 20 | 60 | | | | |
| B5-2 non-crystalline PP | pbw | | | 20 | 60 | | |
| C5 EBR | pbw | | | | | 20 | 60 |
| Transparency | % | 75 | 50 | 73 | 48 | 91 | 93 |
| Scratch resistance | % | 90 | 77 | 93 | 85 | 62 | 7 |
| Heat resistance | ° C. | 115 | 73 | 110 | 55 | 112 | 42 |
| YS | MPa | 19 | 9 | 16 | None | 19 | 8 |
| EL at YS | % | 11 | 20 | 11 | None | 7 | 9 |
| TS | MPa | 30 | 25 | 22 | 11 | 19 | 12 |
| EL | % | 530 | 590 | 480 | 560 | 370 | 150 |
| YM | MPa | 620 | 150 | 580 | 120 | 770 | 100 |
| CS(23° C.) | % | 54 | 43 | 55 | 56 | 58 | 55 |
| CS(70° C.) | % | 77 | 66 | 80 | 77 | 90 | 100 |

Note:
pbw = parts by weight (iv) Evaluation Items for Examples 5-11 and 5-12, and Comparative Examples 5-21 and 5-22

(6) Mechanical Properties

Using specimens in accordance with ASTM 4, yield stress (YS), elongation at yield (EL at YS), tensile strength at break (TS), elongation at break (EL), and Young's modulus (YM) were determined at a tensile speed of 50 mm/min (tensile direction=MD (mol %) direction).

(7) Whitening Resistance on Drawing

Dumbbells for tensile test in accordance with JIS K6301-2 were obtained from the sheets prepared. Each dumbbell was drawn by 5 mm or 10 mm, and the change in hue (L-value in specular excluded method) was evaluated using the following equation. The smaller ΔL is, the more excellent whitening resistance on drawing is.

ΔL=L-value (after drawn)−L-value (before drawn)

(8) Whitening Resistance on Folding

Each sheet prepared was folded at about 90° to evaluate the occurrence of whitening.

Excellent: no whitening (whitening disappears when unfolded)

Poor: whitening (whitening remains even after unfolded)

(9) Wrinkle Resistance

Each sheet prepared was heat-sealed at 190° C. under 0.2 MPa for 3 sec onto a substrate, which was a 200-μm thick polyethylene sheet (LLDPE, density=900 kg/m$^3$), to obtain a specimen, which was folded at 90° to evaluate the appearance.

Excellent: no creases develop after folded,

Poor: creases (including sheet peeling off) develop.

Example 5-11

The starting materials with the component ratio described in Table 5-2 were molded into a 500-μm thick sheet at 230° C. with a sheet-molding machine. Items (6) to (9) above were evaluated for this sheet. The results are shown in Table 5-2.

Example 5-12, Comparative Examples 5-21 and 5-22

Evaluation was made similarly to Example 5-11 except that each starting material with the component ratio described in Table 5-2 was used instead of the composition in Example 5-11.

(B6-2) Propylene/Ethylene/1-Butene Copolymer (PEBR)

Propylene/ethylene/1-butene random copolymer (MFR=8.5 g/10 min, Tm=not observed (ΔH: less than 0.5 J/g), Ethylene content=14 mol %, 1-Butene content=20 mol %, Mw/Mn=2.0, Shore A hardness=38, crystallinity (by WAXD)=5% or less, mm-Fraction=92%, prepared by the method described in WO 2004/87775) was used. Specifically, PEBR was prepared as follows. In a 2000-mL polymerization reactor fully purged with nitrogen, 917 mL of dry hexane, 90 g of 1-butene, and 1.0 mmol of triisobutylaluminum were charged at normal temperature, the inside temperature of the reactor was elevated to 65° C., propylene was introduced so that the inside pressure of the reactor was increased to 0.77 MPa, and then the inside pressure was regulated at 0.79 MPa with ethylene. Into the reactor was added a toluene solution in which 0.002 mmol of dimethylmethylene(3-tert-butyl-5-methylcyclopentadienyl)fluorenylzirconium dichloride and 0.6 mmol (relative to aluminum) of methylaluminoxane (available from Tosoh Finechem Corp.) had been contacted, and polymerization was conducted for 20 min while the inside temperature was kept at 65° C. and the inside pressure was kept at 0.79 MPa by adding ethylene. The polymerization was terminated by adding 20 mL of methanol, the pressure was released, and the polymer was precipitated from the polymerization solution in 2 L of methanol and dried at 130° C. under vacuum for 12 hr to yield 60.4 g of the desired polymer.

TABLE 5-2

|  |  | Example 5-11 | Example 5-12 | Comparative Example 5-21 | Comparative Example 5-22 |
| --- | --- | --- | --- | --- | --- |
| A5-2 bPP | pbw | 90 | 90 | 100 | 90 |
| B5-1 PEBR | pbw | 10 |  |  |  |
| B5-2 non-crystalline PP | pbw |  | 10 |  |  |
| C5 EBR | pbw |  |  |  | 10 |
| YS | MPa | 23 | 22 | 26 | 23 |
| EL at YS | % | 10 | 10 | 7 | 8 |
| TS | MPa | 38 | 36 | 40 | 39 |
| EL | % | 620 | 640 | 610 | 640 |
| YM | MPa | 1010 | 980 | 1300 | 1060 |
| Whitening resistance on drawing | ΔL(5 mm) | 1 | 2 | 28 | 3 |
|  | ΔL(10 mm) | 16 | 19 | 50 | 34 |
| Whitening resistance on folding | Occurrence of Whitening | Excellent | Excellent | Poor | Poor |
| Wrinkle resistance | Appearance evaluation | Excellent | Excellent | Poor | Excellent |

Note:
pbw = parts by weight

<Sixth Aspect of Invention>
(i) Components (A6) to (F6)
(A6) Propylene-Based Polymer
(A6-1) Isotactic Random Polypropylene (rPP)

Propylene/ethylene/1-butene random copolymer (Tm=140° C., MFR(230° C.)=7 g/10 min, mmmm-Fraction=0.96, Mw/Mn=4.8) was used.

(A6-2) Isotactic Block Polypropylene (bPP)

Propylene/ethylene block copolymer (Tm=160° C., MFR (230° C.)=23 g/10 min, Ethylene content=9 wt %, n-Decane-soluble content=12%) was used.

(B6) Propylene-Based Polymer
(B6-1) Propylene/1-Butene Copolymer (PBR)

Propylene/1-butene copolymer (MFR=7 g/10 min, Tm=75° C., 1-Butene content=26 mol %, Mw/Mn=2.1, crystallinity (by WAXD)=28%, mm-Fraction=90%) was used. (PBR was prepared by the method described in WO 2004/87775.)

(C6) Elastomer
(C6-1) Styrene-Based Elastomer (SEBS)

SEBS "G1650" (product name) available from Kraton Polymers LLC was used.

(C6-2) Ethylene/1-Butene Copolymer (EBR)

Ethylene/1-butene copolymer (Density=870 kg/m$^3$, Tm=53° C., MFR(230° C.)=7 g/10 min, Mw/Mn=2.1) was used.

(D6) Inorganic Filler

Magnesium hydroxide (Mg(OH)$_2$, "KISUMA 5P" (product name) available from Kyowa Chemical Industry Co., Ltd.) was used.

(E6) Oil

Paraffin oil ("PW-90" (product name) available from Idemitsu Kosan Co., Ltd., Kinematic viscosity at 40° C.=90 cSt) was used.

(F6) Graft-Modified Polymer

Maleic anhydride-grafted ethylene/1-butene copolymer (F6-2) was prepared using ethylene/1-butene copolymer (F6-1) below.

TABLE 6-1

| Properties of ethylene/1-butene copolymer (F6-1) | (F6-1) |
|---|---|
| Density (kg/m$^3$) | 885 |
| MFR(g/10 min) (190° C., under a load of 2.16 kg) | 0.5 |
| Mw/Mn | 2.1 |
| B-value | 1.05 |

Ten kilograms of ethylene/1-butene copolymer (F6-1) produced using a metallocene catalyst, whose properties are shown in Table 6-1, and a solution containing 50 g of maleic anhydride and 3 g of di-tert-butyl peroxide in 50 g of acetone were blended in a Henschel mixer.

The resulting blend was supplied to the hopper of a single-screw extruder (40-mmΦ, L/D=26) and extruded at a resin temperature of 260° C. at an extrusion speed of 6 kg/hr into a strand, which was water-cooled and pelletized to obtain maleic anhydride-grafted ethylene/1-butene copolymer (F6-2).

After unreacted maleic anhydride was extracted with acetone from the resulting maleic anhydride-grafted ethylene/1-butene copolymer (F6-2), the amount of maleic anhydride grafted in this copolymer was measured to be 0.43 wt %.
(G6) Propylene-Based Polymer Composition (Corresponding to Propylene-Based Polymer Composition (G'6))

Propylene/1-butene copolymer (PBR) (B6-1) as propylene-based polymer (B6) and maleic anhydride-grafted ethylene/1-butene copolymer (F6-2) above were kneaded in the ratio in Table 6-2 at 190° C. with a Labo plast-mill available from Toyo Seiki Seisaku-sho, Ltd. to prepare composition (G6).

TABLE 6-2

| (B6-1) PBR | (F6-1) Maleic anhydride-grafted ethylene/1-butene copolymer |
|---|---|
| 16 (wt %) | 5 (wt %) |

(ii) Methods for Measuring Properties for Each Component

The properties of each component were measured as follows.
(1) Co-Monomer (Ethylene and 1-Butene) Content and mmmm-Fraction (Stereoregularity, Pentad Isotacticity)

The content and mmmm-fraction were determined by $^{13}$C-NMR spectrum analysis.
(2) Melt Flow Rate (MFR)

In exothermic/endothermic curve measured with a DSC, the peak top temperature of melting peak with ΔH of 1 J/g or higher observed on heating was counted as Tm.

A sample loaded on an aluminum pan was heated to 200° C. at 100° C./min, kept at 200° C. for 5 min, cooled to −150° C. at 10° C./min, and heated to 200° C. at 10° C./min during which the exothermic/endothermic curve was recorded.
(4) Molecular Weight Distribution (Mw/Mn)

The Mw/Mn was measured by GPC (gel permeation chromatography) using o-dichlorobenzene as a solvent at 140° C.

(5) Density

The density was measured by the method in accordance with ASTM D 1505.
(6) Crystallinity The crystallinity was estimated from a wide-angle X-ray diffraction profile recorded with an X-ray diffractometer "RINT2500" available from Rigaku Corp., using CuKα X-ray source.
(7) Shore A Hardness The Shore A hardness was measured in accordance with JIS K6301 under the following conditions.

A sheet was prepared with a press molding machine. The scale was read immediately after the pointer of a Type-A hardness tester touched the sheet.
(iii) Evaluation Items for Examples 6-1 and 6-2, Comparative Examples 6-1 and 6-2, and Reference Examples 6-1 and 6-2
(1) Tensile Strength at Break (TS), Elongation at Break (EL), and Flexibility (YM)

In accordance with JIS K7113-2, tensile strength at break (TS), elongation at break (EL), and Young's modulus (YM) were measured for a 2 mm-thick press-molded sheet.
(2) Scratch Resistance (Gloss Retention Percentage)

Each specimen was abraded using a "Gakushin" abrasion testing machine available from Toyo Seiki Seisaku-sho Ltd. equipped with a 45R SUS-made abrasion indenter weighing 470 g whose tip was covered with cotton cloth No. 10, under conditions of 23° C., the number of reciprocations of 100 times, a reciprocation speed of 33 times/min, and a stroke of 100 mm. The gloss retention percentage with abrasion, ΔGloss, was calculated as follows. The larger Gloss is, the better the abrasion resistance is.

Gloss retention percentage=100×Gloss after abrasion/ Gloss before abrasion

Example 6-1

The starting materials with the component ratio in Table 6-3 were kneaded with a Labo plast-mill (available from Toyo Seiki Seisaku-sho, Ltd.) and molded into a 2-mm thick sheet with a press molding machine (heating: 190° C. for 7 min, cooling: 15° C. for 4 min, cooling speed: about −40° C./min). Items (1) and (2) above were evaluated with this sheet. The results are shown in Table 6-3.

Example 6-2, Comparative Examples 6-1 and 6-2, and Reference Examples 6-1 and 6-2

Evaluation was made similarly to Example 6-1 except that the starting materials with the component ratio in Table 6-3 were used instead of the composition in Example 6-1.

Note that the composition used in Reference Example 6-1 has the same resin component as that in Example 6-1, and contains no Mg(OH)$_2$, and that the composition used in Reference Example 6-2 has the same resin component as that in Comparative Example 6-1, and contains no Mg(OH)$_2$.

TABLE 6-3

Examples 6-1 and 6-2, Comparative Examples 6-1 and 6-2, and Reference Examples 6-1 and 6-2

|  |  | Reference Example 6-1 | Example 6-1 | Example 6-2 | Reference Example 6-2 | Comparative Example 6-1 | Comparative Example 6-2 |
|---|---|---|---|---|---|---|---|
| (A6-1) rPP | wt % | 20 | 14 | 6 |  |  |  |
| (B6-2) PEBR | wt % | 80 | 56 | 24 |  |  |  |
| (C6-2) EBR | wt % |  |  |  | 100 | 70 | 30 |
| (D6) Mg(OH)$_2$ | wt % |  | 30 | 70 |  | 30 | 70 |
| Mg(OH)$_2$ blended | wt % | 0 | 30 | 70 | 0 | 30 | 70 |
| TS | MPa | 12 | 7.5 | 4.5 | 11 | 5.2 | 3.8 |
| EL | % | 800< | 800< | 560 | 800< | 800< | 20 |
| YM | MPa | 16< | 18 | 91 | 13 | 24 | 169 |
| Gloss retention percentage | % | 90 | 65 | 46 | 10 | 15 | 25 |

For compositions containing inorganic filler (magnesium hydroxide), the propylene-based resin compositions of the present invention are superior to the ethylene-based resin compositions used in Comparative Examples in tensile strength at break, elongation at break, and scratch resistance. In addition, the propylene-based resin compositions have excellent balance of mechanical strength and flexibility, as shown by less increase in Young's modulus.

(iv) Evaluation Items for Examples 6-3 to 6-5 and Comparative Example 6-3

(3) Tensile Strength at Break (TS) and Elongation at Break (EL)

The tensile strength at break and elongation at break were evaluated with a 2-mm thick press-molded sheet in accordance with JIS K-6301-3.

(4) Scratch Resistance (Taber Abrasion)

With a Taber type abrasion tester in accordance with JIS K7204, the abrasion weight loss (mg) was obtained from the weight change of each specimen before and after the abrasion test using a truck wheel (CS-17) under the conditions of rotation speed of 60 rpm, 1000 test cycles, and load of 1000 g.

(5) Low-Temperature Brittleness Temperature (Btp)

The low-temperature brittleness temperature was measured in accordance with ASTM D746.

(6) D Hardness (HD-D)

The D hardness was measured in accordance with ASTM D 2240.

Example 6-3

The starting materials with the ratio in Table 6-4 were kneaded with a Labo plast-mill (available from Toyo Seiki Seisaku-sho, Ltd.) and molded into a 2-mm thick sheet with a press molding machine (heating: 190° C. for 7 min, cooling: 15° C. for 4 min, cooling speed: about −40° C./min). Items (3) to (6) above were evaluated with this sheet. The results are shown in Table 6-4.

Examples 6-4 and 6-5 and Comparative Example 6-3

Evaluation was made similarly to Example 6-3 except that the starting materials were changed as described in Table 6-4.

TABLE 6-4

Examples 6-3 to 6-5 and Comparative Example 6-3

|  |  | Example 6-3 | Example 6-4 | Example 6-5 | Comparative Example 6-3 |
|---|---|---|---|---|---|
| (A6-1) rPP | wt % |  |  | 4 |  |
| (A6-2) bPP | wt % | 30 | 30 | 30 | 30 |
| (B6-1) PBR | wt % | 20 | 15 |  |  |
| (B6-2) PEBR | wt % |  |  | 16 |  |
| (C6-1) SEBS | wt % |  | 5 |  |  |
| (C6-2) EBR | wt % |  |  |  | 20 |
| (D6) Mg(OH)$_2$ | wt % | 50 | 50 | 50 | 50 |
| TS | MPa | 19 | 14 | 12 | 12 |
| EL | % | 310 | 210 | 210 | 50 |
| Abrasion weight loss | mg | 118 | 119 | 99 | 127 |
| Low-temperature brittleness | ° C. | 2 | −3 | −8 | −10 |
| D hardness |  | 61 | 60 | 51 | 57 |

The propylene-based resin compositions of the sixth aspect of invention are superior to the conventional compositions used in the comparative Examples containing polypropylene (bPP) and elastomer particularly in elongation at break (EL) and scratch resistance (abrasion weight loss). In particular, as shown in Example 6-5, it is confirmed that use of propylene/ethylene/1-butene copolymer (PEBR) (B6-2) improves flexibility and also provides better low-temperature brittleness property.

Example 6-6

Evaluation was made similarly to Example 6-3 except that the starting materials were changed to those described in Table 6-5.

TABLE 6-5

Example 6-6

|  |  | Example 6-6 |
|---|---|---|
| (A6-2) bPP | wt % | 30 |
| (B6-1) PBR | wt % | 20 |
| (D6) Mg(OH)$_2$ | wt % | 50 |
| (E6) Oil | parts by weight *1 | 5 |
| TS | MPa | 17 |
| EL | % | 360 |
| Abrasion weight loss | mg | 82 |
| Low-temperature brittleness | ° C. | −27 |

TABLE 6-5-continued

Example 6-6

| | Example 6-6 |
|---|---|
| D hardness | 57 |
| Feeling by hands | No stickiness |

*1 Amount relative to 100 parts by weight of the total of components (A6-2), (B6-1), and (D6).

As shown in Example 6-6, it is confirmed that additional use of oil provides the propylene-based resin composition of the sixth aspect of invention with particularly excellent low-temperature brittleness property and scratch resistance.

Example 6-7

Evaluation was made similarly to Example 6-3 except that the starting materials were changed to those described in Table 6-6.

TABLE 6-6

Example 6-7

| | | Example 6-7 |
|---|---|---|
| (A6-2) bPP | wt % | 32 |
| (B6-1) PBR | wt % | 16 |
| (D6) Mg(OH)$_2$ | wt % | 52 |
| (F6-2) graft-modified polymer | parts by weight *1 | 5 |
| TS | MPa | 19 |
| EL | % | 280 |
| Abrasion weight loss | mg | 90 |
| D hardness | | 58 |
| Feeling by hands | | No stickiness |

*1 Amount relative to 100 parts by weight of the total of components (A6-2), (B6-1), and (D6)

As shown in Example 6-7, it is confirmed that additional use of graft-modified polymer provides the propylene-based resin composition of the present invention with particularly excellent scratch resistance.

Example 6-8

Evaluation was made similarly to Example 6-3 except that the starting materials were changed to those described in Table 6-7.

TABLE 6-7

Example 6-8

| | | Example 6-8 |
|---|---|---|
| (A6-2) bPP | parts by weight | 32 |
| (D6) Mg(OH)$_2$ | parts by weight | 52 |
| (G6) Polymer blend: (B6-1)PBR/(F6-2)graft-modified polymer = 16/5 (weight ratio) | parts by weight | 21 |
| TS | MPa | 20 |
| EL | % | 300 |
| Abrasion weight loss | mg | 81 |
| D hardness | | 58 |
| Feeling by hands | | No stickiness |

As shown in Example 6-8, it is confirmed that the propylene-based resin composition of the sixth aspect of invention exhibits more excellent scratch resistance when produced using the melt-kneaded blend (propylene-based polymer composition).

<Seventh Aspect of Invention>

(i) Properties of propylene-based polymer (A7), propylene-based polymer (B7), ethylene/α-olefin copolymer (C7), and ethylene/polar monomer copolymer (D7) used in Examples and Comparative Examples were measured as follows.

(1) Density

The density was measured in accordance with ASTM D1505 at 23° C.

(2) MFR

The MFR was measured in accordance with ASTM D1238 at predetermined temperatures. MFR(230° C.) represents the value at 230° C. under a load of 2.16 kg. MFR$_2$ represents the value at 190° C. under a load of 2.16 kg. MFR$_{10}$ represents the value at 190° C. under a load of 10 kg.

(3) B-value, Tαβ Tαα intensity ratio

The B-value and Tαβ were determined by $^{13}$C-NMR.

(4) Molecular weight distribution (Mw/Mn)

The Mw/Mn was determined by gel permeation chromatography using o-dichlorobenzene as a solvent at 140° C.

(5) Ethylene content and Propylene Content

The ethylene content and propylene content were determined by $^{13}$C-NMR.

(6) Melting Point

The melting point was determined with a differential scanning calorimeter (DSC). In exothermic/endothermic curve measured with a DSC, the temperature at the maximum melting peak on heating was counted as Tm. A sample loaded on an aluminum pan was heated to 200° C. at 100° C./min, kept at 200° C. for 5 min, cooled to −150° C. at 10° C./min, and heated at 10° C./min during which the exothermic/endothermic curve was recorded.

(ii) The properties of components (A7), (B7), (C7), and (D7) used in the present invention are described below.

(1) Propylene Polymer (B7-1): Propylene/Ethylene/1-Butene Random Copolymer (PSBR)

Ethylene content=14.0 mol %, 1-Butene content=20 mol o, MFR (230° C.)=8.5 g/10 min, Melting point=not observed (ΔH: less than 0.5 J/g), Molecular weight distribution (Mw/Mn)=2.0, mm-Fraction=92%

The propylene/ethylene/1-butene copolymer used for the present invention was prepared, for example, by the method in accordance with Examples 1e to 5e of WO 2004/87775. Specifically, the copolymer was prepared as follows. Namely, in a 2000-mL polymerization reactor fully purged with nitrogen, 917 mL of dry hexane, 90 g of 1-butene, and 1.0 mmol of triisobutylaluminum were charged at normal temperature, the inside temperature of the reactor was elevated to 65° C., and propylene was introduced so that the inside pressure of the reactor increased to 0.77 MPa, and then ethylene was supplied to adjust the inside pressure to 0.79 MPa. To this reactor was added a toluene solution in which 0.002 mmol of dimethylmethylene(3-tert-butyl-5-methylcyclopentadienyl) fluorenylzirconium dichloride and 0.6 mmol (relative to aluminum) of methylaluminoxane (available from Tosoh Finechem Corp.) had been contacted, and the polymerization was performed for 20 min while the inside temperature was kept at 65° C. and the inside pressure was kept at 0.79 MPa by supplying ethylene. The polymerization was terminated by adding 20 mL of methanol, the pressure was released, and the polymer was precipitated from the polymerization solution in 2 L of methanol and dried at 130° C. under vacuum for 12 hr to yield 60.4 g of the desired copolymer.

Propylene-Based Polymer (B7-2): Propylene/1-Butene Copolymer (PBR)

1-Butene content=4 mol %, MFR(230° C.)=3.0 g/10 min, Melting point=not observed, Molecular weight distribution (Mw/Mn)=2.0, Shore A hardness=61, mm-Fraction=15%

(2) Propylene-Based Polymer (A7): Isotactic Polypropylene (iPP)

Ethylene content=2.0 mol %, 1-Butene content=1.5 mol %, MFR(230° C.)=7 g/10 min, Melting point=140° C.

(3) Ethylene/α-Olefin Copolymer (C7): Ethylene/1-Butene Copolymer (EBR)

The copolymer was synthesized as shown in Production Example 1 below.

Production Example 7-1

[Preparation of Catalyst Solution]

In 5 mL of toluene was dissolved 18.4 mg of triphenylcarbenium (tetrakispentafluorophenyl)borate to prepare a 0.004-M toluene solution. In 5 mL of toluene was dissolved 1.8 mg of [dimethyl(t-butylamido)(tetramethyl-$\eta^5$-cyclopentadienyl)silane]titanium dichloride to prepare a 0.001-M toluene solution. Prior to starting polymerization, 0.38 mL of the toluene solution of triphenylcarbenium (tetrakispentafluorophenyl)borate and 0.38 mL of the toluene solution of [dimethyl(t-butylamido)(tetramethyl-$\eta^5$-cyclopentadienyl)silane]titanium dichloride were mixed with 4.24 mL of toluene to prepare 5 mL of a toluene solution so that, in the polymerization solution, the concentration of triphenylcarbenium (tetrakispentafluorophenyl) borate became 0.002 mM (relative to boron) and that of [dimethyl(t-butylamido)(tetramethyl-$\eta^5$-cyclopentadienyl)silane]titanium dichloride became 0.0005 mM (relative to titan).

[Preparation of Ethylene/1-Butene Copolymer (C7)]

In a 1.5-L SUS autoclave with stirring propellers fully purged with nitrogen, 750 mL of heptane was charged at 23° C. Into the autoclave, 10 g of 1-butene and 120 mL of hydrogen were charged with ice-cooling while the stirring propellers rotated. The autoclave was heated to 100° C., and ethylene was introduced so that the total pressure became 0.6 MPa. When the inside pressure of the autoclave reached 0.6 MPa, 1.0 mL of 1.0-mM/mL hexane solution of triisobutylaluminum (TIBA) was injected with positive pressure of nitrogen, and then 5 mL of the catalyst solution prepared above was injected into the autoclave with positive pressure of nitrogen to start polymerization. The polymerization was performed for 5 min while the temperature inside the autoclave was regulated at 100° C. and the inside pressure was kept at 0.6 MPa by directly supplying ethylene. At 5 min after start of polymerization, 5 mL of methanol was pumped into the autoclave to terminate polymerization, the autoclave was released to atmospheric pressure, and 3 L of methanol was added to the reaction solution. The resulting polymer containing solvent was dried at 130° C. for 13 hr under 600 Torr to obtain 10 g of ethylene/1-butene copolymer (C7). The properties of ethylene/1-butene copolymer (C7) obtained are shown in Table 7-1.

TABLE 7-1

| Properties of polymer | Production Example 7-1 Ethylene/1-butene copolymer (C7) |
| --- | --- |
| Density (kg/m$^3$) | 885 |
| Melt flow rate (MFR$_2$) | 1.2 |
| Mw/Mn | 2.1 |
| MFR$_{10}$/MFR$_2$ | 10.0 |
| B-value | 1.0 |
| Tαβ/Tαα | 0.3 |

(4) Ethylene/Polar Monomer Copolymer (D7): Ethylene/Vinyl Acetate Copolymer (EVA)

"EV460"™, (available from DU PONT-MITSUI POLYCHEMICALS Co., Ltd.),
Vinyl acetate content=19 wt %
Density (ASTM D1505, 23° C.)=0.94 g/cm$^3$
Melt flow rate (MFR$_2$(190° C.))(ASTM D1238, 2.16-kg load, 190° C.)=2.5 g/10 min (iii) Properties of crosslinked foams were evaluated as follows.

(1) Specific Gravity

The specific gravity was measured in accordance with JIS K7222.

(2) Permanent Compression Set

The permanent compression set test was performed in accordance with JIS K6301 at 50° C. for 6 hr with 50%-compression to determine permanent compression set (CS).

(3) Tear Strength

Tear strength test was performed in accordance with BS 5131-2.6 at a tensile speed of 10 mm/min to obtain tear strength.

(4) Asker C Hardness

The Asker C hardness was measured in accordance with "Spring-type hardness test, Type-C test method" described in Appendix 2 of JIS K7312-1996.

(5) Impact Resilience

A steel ball of 15 g was fallen from a height of 50 cm (L$_0$) and the height rebound (L) was measured at 23° C. and 40° C. to obtain impact resilience using equation, impact resilience (%)=L/L$_0$×100

(6) Abrasion Resistance

Akron abrasion test was conducted in accordance with JIS K6246 under a load of 6 lbs at an angle of 15° with a total rotation number of 3000 at a rotation speed of 35 rpm, and the weight change of specimen was measured to abrasion resistance.

(7) Adhesion Strength of Laminate (7-1) Treatment for Secondary Crosslinked Foam At first, surfaces of a secondary crosslinked foam were water-washed using a surfactant and dried at room temperature for 1 hr. This secondary crosslinked foam was immersed in methylcyclohexane for 3 min and then dried in an oven at 60° C. for 3 min.

An ultraviolet-curable primer ("GE258H1"™ available from Great Eastern Resins Industrial Co., Ltd.) was thinly applied with a brush on the foam, and dried in an oven at 60° C. for 3 min. The foam was irradiated with ultraviolet light on an irradiation system (EPSH-600-3S UV irradiation system, available from GS Corp.) with three 80-W/cm high-pressure mercury lamps installed perpendicular to the traveling direction, while traveled in a plane 15 cm beneath the light source at a conveyer speed of 10 m/min.

After that, an auxiliary primer ("GE6001L"™ available from Great Eastern Resins Industrial Co., Ltd., mixed with 5 wt % of curing agent "GE366S") was thinly applied using a brush and dried in an oven at 60° C. for 3 min.

Then, an adhesive ("98H"™ available from Great Eastern Resins Industrial Co., Ltd., mixed with 4 wt % of curing agent "GE348") was thinly applied with a brush and dried in an oven at 60° C. for 5 min.

Finally, the above adhesive-coated secondary crosslinked foam was laminated with a synthetic leather sheet of polyurethane (PU) treated as described below and they were press-bonded under 20 kg/cm$^2$ for 10 sec.

(7-2) Treatment for PU Synthetic Leather Sheet

Surface of a PU synthetic leather sheet was washed with methyl ethyl ketone and dried at room temperature for 1 hr. On the surface, an auxiliary primer ("GE6001L"™ available from Great Eastern Resins Industrial Co., Ltd., mixed with 5 wt % of curing agent "GE366S") was thinly applied with a brush and dried in an oven of 60° C. for 3 min. Then, an adhesive ("98H"™ available from Great Eastern Resins Industrial Co., Ltd., mixed with 4 wt % of curing agent "GE348") was thinly applied with a brush and dried in an oven of 60° C. for 5 min.

(7-3) Peeling Test

The adhesion strength of the above press-bonded laminate was evaluated at 24 hr after preparation as follows.

Namely, the laminate was cut into 1-cm wide specimens. At one end of each specimen, the two layers were separated and pulled at a tensile speed of 200 mm/min in directions making an angle of 180° to measure the peeling strength. The peeling test was conducted for five specimens, and the average value is shown as adhesion strength in Table 7-2. The peeling status of specimen was observed by eyes.

Example 7-1

A mixture containing 80 parts by weight of propylene/ethylene/1-butene copolymer (B7-1), 20 parts by weight of isotactic polypropylene (A7), and 100 parts by weight of ethylene/1-butene copolymer (C7) relative to 100 parts by weight of the total of (B7-1)+(A7); further, relative to 100 parts by weight of the total of (B7-1), (A7), and (C7), 3.0 parts by weight of zinc oxide, 0.7 parts by weight of dicumyl peroxide (DCP), 0.2 parts by weight of triallyl isocyanurate (TAIC) ("M-60" (product name, containing 60% TAIC), available from Nippon Kasei Chemical Co., Ltd.) (0.12 parts by weight relative to TAIC), 0.4 parts by weight of 1,2-polybutadiene, and 3.5 parts by weight of azodicarbonamide was kneaded with a kneader at a preset temperature of 100° C. for 10 min. The mixture was further kneaded with rolls at a roll surface temperature of 100° C. for 10 min and molded into a sheet.

The resulting sheet was placed in a press mold and pressed and heated under 150 kg/cm² at 155° C. for 30 min to obtain a primary crosslinked foam. The press mold sized 15 mm thick, 150 mm long, and 200 mm.

This primary crosslinked foam was compression-molded under 150 kg/cm² at 155° C. for 10 min to obtain a secondary crosslinked foam, which sized 15 mm thick, 160 mm long, and 250 mm wide.

For this secondary crosslinked foam, evaluation was performed by the above methods on specific gravity, permanent compression set, tear strength, Asker C hardness, impact resilience, and abrasion resistance. Further, the adhesion strength of a laminate composed of the foam and a synthetic leather sheet of polyurethane (PU) was measured by the above method, and the peeling status was observed by eyes. The results are shown in Table 7-2.

Example 7-2

A secondary crosslinked foam was prepared and properties thereof were evaluated similarly to Example 7-1, except that the amount of ethylene/1-butene copolymer (C7) was changed from 100 parts by weight to 200 parts by weight and that the mixture used here contained, relative to 100 parts by weight of the total of (B7-1), (A7), and (C7), 3.0 parts by weight of zinc oxide, 0.7 parts by weight of dicumyl peroxide (DCP), 0.2 parts by weight of triallyl isocyanurate (TAIC) ("M-60" (product name, containing 60% TAIC), available from Nippon Kasei Chemical Co., Ltd.) (0.12 parts by weight relative to TAIC), 0.4 parts by weight of 1,2-polybutadiene, and 3.7 parts by weight of azodicarbonamide. The results are shown in Table 7-2.

Example 7-3

A secondary cross linked foam was prepared and properties thereof were evaluated similarly to Example 7-1, except that 100 parts by weight of ethylene/1-butene copolymer (C7) was changed to 100 parts by weight of ethylene/1-butene copolymer (C7) and 100 parts by weight of ethylene/vinyl acetate copolymer (D7), and that the mixture used herein contained, relative to 100 parts by weight of the total of (A7-1), (B7), (C7), and (D7), 3.0 parts by weight of zinc oxide, 0.7 parts by weight of dicumyl peroxide (DCP), 0.2 parts by weight of triallyl isocyanurate (TAIC) ("M-60" (product name, containing 60% TAIC), available from Nippon Kasei Chemical Co., Ltd.) (0.12 parts by weight relative to TAIC), 0.4 parts by weight of 1,2-polybutadiene, and 3.7 parts by weight of azodicarbonamide. The results are shown in Table 7-2.

Example 7-4

A secondary cross linked foam was prepared and properties thereof were evaluated similarly to Example 7-1, except that ethylene/1-butene copolymer (B7-1) in Example 1 was replaced by propylene/1-butene copolymer (B7-2), and that the mixture used herein contained, relative to 100 parts by weight of the total of (B7-2), (A7), and (C7), 3.0 parts by weight of zinc oxide, 0.7 parts by weight of dicumyl peroxide (DCP), 0.2 parts by weight of triallyl isocyanurate (TAIC) ("M-60" (product name, containing 60% TAIC), available from Nippon Kasei Chemical Co., Ltd.) (0.12 parts by weight relative to TAIC), 0.4 parts by weight of 1,2-polybutadiene, and 3.7 parts by weight of azodicarbonamide. The results are shown in Table 7-2.

Comparative Example 7-1

A secondary cross linked foam was prepared and properties thereof were evaluated similarly to Example 7-1, except that the amount of propylene/ethylene/1-butene copolymer (B7-1) was changed from 80 parts by weight to 0 parts by weight and the amount of isotactic polypropylene (A7) was changed from 20 parts by weight to 0 parts by weight, and that the mixture used herein contained, relative to 100 parts by weight of ethylene/1-butene copolymer (C7), 3.0 parts by weight of zinc oxide, 0.7 parts by weight of dicumyl peroxide (DCP), 0.2 parts by weight of triallyl isocyanurate (TAIC) ("M-60" (product name, containing 60% TAIC), available from Nippon Kasei Chemical Co., Ltd.) (0.12 parts by weight relative to TAIC), 0.4 parts by weight of 1,2-polybutadiene, and 4.0 parts by weight of azodicarbonamide. The results are shown in Table 7-2.

Comparative Example 7-2

A secondary crosslinked foam was prepared and properties thereof were evaluated similarly to Comparative Example 7-1, except that 100 parts by weight of ethylene/1-butene copolymer (C7) was changed to 100 parts by weight of ethylene/vinyl acetate copolymer (D7). The results are shown in Table 7-2.

TABLE 7-2

|  |  | Example 7-1 | Example 7-2 | Example 7-3 | Example 7-4 | Comparative Example 7-1 | Comparative Example 7-2 |
|---|---|---|---|---|---|---|---|
| PEBR | B7-1 | 80 | 80 | 80 |  |  |  |
| PBR | B7-2 |  |  |  | 80 |  |  |
| iPP | A7 | 20 | 20 | 20 | 20 |  |  |
| EBR | C7 | 100 | 200 | 100 | 100 | 100 |  |
| EVA | D7 |  |  | 100 |  |  | 100 |
| Additive (phr) (Amount relative to 100 parts by weight of the total of B7-1, B7-2, A7, C7, and D7 above) | | | | | | | |
| ZnO |  |  |  |  | 3.0 |  |  |
| St/A |  |  |  |  | 1.0 |  |  |
| TiO2 |  |  |  |  | 3.0 |  |  |
| DCP |  |  |  |  | 0.70 |  |  |
| TAIC M60 |  |  |  |  | 0.20 |  |  |
| 1,2-polybutadiene |  |  |  |  | 0.40 |  |  |
| ADCA (AC#3) |  | 3.5 | 3.7 | 3.7 | 3.7 | 4.0 | 4.0 |
| Properties of crosslinked foams | | | | | | | |
| Hardness |  | 44 | 45 | 49 | 43 | 46 | 52 |
| Specific gravity |  | 0.17 | 0.15 | 0.14 | 0.18 | 0.15 | 0.15 |
| Permanent compression set | % | 49 | 54 | 56 | 61 | 57 | 66 |
| Tear strength | N/cm | 85 | 87 | 80 | 71 | 86 | 60 |
| Impact resilience | % | 38 | 49 | 46 | 49 | 65 | 50 |
| Abrasion resistance (weight loss) | g | 0.075 | 0.081 | 0.088 | 0.078 | 0.092 | 0.178 |
| Adhesion strength | N/cm | 2.8 | 2.7 | 2.6 | 2.5 | 2.5 | 1.9 |
| Gel fraction | % | 79 | 81 | 83 | 81 | 86 | 84 |
| Peeling status |  | Partly peeled (*) | Partly peeled (*) | Partly peeled (*) | Partly peeled (*) | Partly peeled (*) | Partly peeled (*) |

(*) The laminate was separated at the interface between the foam layer and the PU synthetic leather sheet.

<Eighth Aspect of Invention>
[Starting Materials]
(A8) Isotactic Polypropylene (rPP):
Propylene/ethylene/1-butene random copolymer (Tm=140° C., MFR(230° C.)=7 g/10 min, mmmm-Fraction=0.96, Mw/Mn=4.8) was used.
(B8) Propylene/Ethylene/1-Butene Copolymer (PEBR)
Ethylene content=14.0 mol %, 1-Butene content=20 mol %, MFR=8.5 g/10 min, Melting point=not observed (ΔH: less than 0.5 J/g), Molecular weight distribution (Mw/Mn)=2.0, Shore A hardness=38, mm-Fraction=92%
(PEBR was prepared by the method described in WO 2004/87775.) Specifically, PEBR was prepared as follows. In a 2000-mL polymerization reactor fully purged with nitrogen, 917 mL of dry hexane, 90 g of 1-butene, and 1.0 mmol of triisobutylaluminum were charged at normal temperature, the temperature in the reactor was elevated to 65° C., propylene was introduced so that the pressure in the reactor was increased to 0.77 MPa, and then ethylene was supplied so as to the pressure became 0.79 MPa. Into the reactor was added a toluene solution in which 0.002 mmol of dimethylmethylene(3-tert-butyl-5-methylcyclopentadienyl)fluorenylzirconium dichloride and 0.6 mmol (relative to aluminum) of methylaluminoxane (available from Tosoh Finechem Corp.) had been contacted, and polymerization was conducted for 20 min while the inside temperature was kept at 65° C. and the inside pressure was kept at 0.79 MPa by adding ethylene. The polymerization was terminated by adding 20 mL of methanol, the pressure was released, and the polymer was precipitated from the polymerization solution in 2 L of methanol and dried at 130° C. under vacuum for 12 hr to yield 60.4 g of PEBR.
(Y8) Silane Coupling Agent (VTMOS)
Vinyltrimethoxysilane, available from Dow Corning Toray Co., Ltd.
(D8) Ethylene/1-Butene Copolymer (EBR)
Density=870 kg/m³, Melting point=53° C., MFR(230° C.)=7.0 g/10 min, Mw/Mn=2.1

The properties of the above materials were measured by the following methods.
(1) Co-Monomer (Ethylene and 1-Butene) Contents, and mmmm-Fraction (Stereoregularity: Pentad Isotacticity)
The contents and mmmm-fraction were determined by $^{13}$C-NMR spectrum analysis.
(2) MFR
MFR at 230° C. under a load of 2.16 kg was measured in accordance with ASTM D1238.
(3) Melting Point
In exothermic/endothermic curve measured with a DSC, the temperature at which the maximum melting peak appeared on heating was counted as Tm. A sample loaded on an aluminum pan was heated to 200° C. at 100° C./min, kept at 200° C. for 5 min, cooled to −150° C. at 10° C./min, and heated at 10° C./min during which the exothermic/endothermic curve was recorded.
(4) Molecular Weight Distribution (Mw/Mn)
The Mw/Mn was measured by GPC (gel permeation chromatography) using o-dichlorobenzene as a solvent at 140° C.
(5) Density
The density was measured by the method described in ASTM D1505.
[Evaluation Items]
Tensile Strength at Break (TS) and Flexibility:
In accordance with JIS K7113-2, tensile strength at break (TS) and Young's modulus (YM) were measured for a 2-mm thick press-molded sheet.
Transparency (Haze) (Internal Haze)
Measurement was performed with a digital haze/tubidimeter of "NDH-2000" available from Nippon Denshoku Kogyo Co., Ltd. using a 1.0-mm thick press-molded sheet in cyclohexanol to calculate haze from the following equation:

Haze (%)=100×(Diffuse transmission)/(Total transmission).

Heat Resistance (TMA)

In accordance with JIS K7196, a TMA curve was measured for a 2-mm thick sheet using a 1.8-mmΦ flat-ended needle under a load of 2 kgf/cm² at a heating speed of 5° C./min. The temperature (° C.) at which the needle penetrated into the specimen was determined.

Adhesion Strength to Glass and PET

A 0.6-mm thick sheet was hot-press bonded (200° C., 5 min) to a glass plate (4 mm thick) and a PET film ("Lumirror"™ available from Toray Industries, Inc., 100 µm thick), respectively. The peeling strength of the laminate was evaluated at −10° C. and then at room temperature.

Excellent: Firmly bonded, not easy to peel
Do: Bonded, but peelable
Poor: Not bonded Shore A Hardness The Shore A hardness was measured in accordance with JIS K6301. (Measurement conditions) A sheet was prepared with a press molding machine. The scale was read immediately after the pointer of a Type-A hardness tester touched the sheet.

Example 8-1

A mixture of 20 parts by weight of isotactic polypropylene (A8) (rPP), 80 parts by weight of propylene/ethylene/1-butene copolymer (B8) (PEBR), and 1.5 parts by weight of silane coupling agent (Y8) was kneaded with a Labo plast mill at 190° C. for 5 min. The resulting resin composition was molded, using a press molding machine, into a 0.6-mm or 2-mm thick sheet, which was used to evaluate the above items.

Comparative Example 8-1

Relative to 100 parts by weight of isotactic polypropylene (A8) (rPP), 1.5 parts by weight of silane coupling agent (Y8) was blended. The resultant resin composition was evaluated by methods similar to those in Example 8-1.

Comparative Example 8-2

Relative to 100 parts by weight of ethylene/1-butene copolymer (D8) (EBR), 1.5 parts by weight of silane coupling agent (Y8) was blended. The resulting resin composition was evaluated by methods similar to those in Example 8-1.

TABLE 8-1

|  | Example 8-1 | Comparative Example 8-1 | Comparative Example 8-2 |
|---|---|---|---|
| (A8) iPP | 20 | 100 |  |
| (B8) PEBR | 80 |  |  |
| (D8) EBR |  |  | 100 |
| (Y8) VTMOS | 1.5 | 1.5 | 1.5 |
| Tensile strength at break (MPa) | 14.5 | 35.5 | 9.5 |
| Modulus in tension (MPa) | 14 | 1020 | 18 |
| Internal haze (%) | 4.2 | 8.3 | 4.7 |
| TMA (° C.) | 117.2 | 139.5 | 78.5 |
| Peeling strength (to glass, −10° C.) | Excellent | Poor | Excellent |
| Peeling strength (to glass, 23° C.) | Excellent | Excellent | Excellent |
| Peeling strength (to PET, −10° C.) | Excellent | " | Excellent |
| Peeling strength (to PET, 23° C.) | Excellent | Excellent | Excellent |

<Ninth Aspect of Invention>
[Evaluation Items]
Haze (Internal Haze)

Measurement was performed with a digital haze/tubidimeter "NDH-2000" available from Nippon Denshoku Kogyo Co., Ltd. for a 1.0-mm thick press-molded sheet in cyclohexanol to calculate haze using the following equation:

Haze (%)=100×(Diffuse transmission)/(Total transmission).

Light Transmittance (Trans)

The light transmittance was measured for a 1.0-mm thick sheet. Trans is calculated using the following equation:

Trans (%)=100×(total transmitted light intensity)/(incident light intensity).

Heat Resistance (TMA)

In accordance with JIS K7196, a TMA curve was measured for a 2-mm thick sheet using a 1.8-mmΦ flat-ended needle under a load of 2 kgf/cm² at a heating speed of 5° C./min. The temperature (° C.) at which the needle penetrated into the sheet was determined.

Mechanical Properties (Tensile Strength at Break and Modulus in Tension)

Tensile strength at break (TS) and Young's modulus (YM) were measured in accordance with JIS K7113-2 for a 2-mm thick press-molded sheet.

Adhesion Strength to Glass

A 0.6-mm thick sheet was hot-press bonded to a glass plate with a press molding machine (150° C., 10 min, 0.2 MPa). The adhesion strength of this laminate was measured with a tensile tester (peeling speed: 300 mm/min, peeling width (sample width): 1.5 cm, T-peel test method).

Shore A Hardness

The Shore A hardness was measured in accordance with JIS K6301. (Measurement conditions) A sheet was prepared with a press molding machine. The scale was read immediately after the pointer of a Type-A hardness tester touched the sheet.

[Starting Materials Used for the Ninth Aspect]
(A9) Isotactic Polypropylene (iPP)

Ethylene content=3.0 mol %, 1-Butene content=1.0 mol %, MFR(230° C.)=7 g/10 min, Melting point=140° C.

(B9) Propylene/Ethylene/1-Butene Copolymer (PEBR)

Ethylene content=14.0 mol %, 1-Butene content=20 mol %, MFR(230° C.)=8.5 g/10 min, Melting point=not observed (ΔH: less than 0.5 J/g), Molecular weight distribution (Mw/Mn)=2.0, Shore A hardness=37, mm-Fraction=92%

The propylene/ethylene/1-butene copolymer used in the present invention can be prepared, for example, by a method similar to Examples 1e to 5e of WO 2004/87775.

In Examples here, specifically, the copolymer was produced in accordance with the method used for producing propylene/butene/ethylene copolymer (B8) in Examples of the eighth aspect.

(C9) Ethylene/Vinyl Acetate Copolymer (EVA)

Density=950 kg/m³, Vinyl acetate content=28 wt %, MFR (190° C.)=15 g/10 min, Melting point=71° C.

(D9) Ethylene/1-Butene Copolymer (EBR)

Density=870 kg/m³, Melting point=53° C., MFR (230° C.)=7.0 g/10 min, Mw/Mn=2.1

(Y9) Silane Coupling Agent (VTMOS)

Vinyltrimethoxysilane, available from Dow Corning Toray Co, Ltd.

(Z9) Organic Peroxide (PH25B)

Dialkyl peroxide ("PERHEXA 25B"™, available from NOF Corp.)

(Z9-2) Auxiliary (TAIC)

Triallyl isocyanurate (TAIC) ("M-60" (product name), TAIC content=60%, available from Nippon Kasei Chemical Co., Ltd.), 0.2 parts by weight (0.12 parts by weight relative to TAIC)

[Measurement Methods for Properties of the Above Starting Materials]

(1) Co-Monomer (Ethylene and 1-Butene) Contents

The contents were determined by $^{13}$C-NMR spectrum analysis.

(2) MFR

MFR at 190° C. or 230° C. under a load of 2.16 kg was measured in accordance with ASTM D1238.

(3) Melting Point

In exothermic/endothermic curve measured with a DSC, the temperature at which the maximum melting peak appeared on heating was counted as Tm. A sample loaded on an aluminum pan was heated to 200° C. at 100° C./min, kept at 200° C. for 5 min, cooled to −150° C. at 10° C./min, and heated at 10° C./min during which the exothermic/endothermic curve was recorded.

(4) Molecular Weight Distribution (Mw/Mn)

The Mw/Mn was measured by GPC (gel permeation chromatography) using o-dichlorobenzene as a solvent at 140° C.

(5) Density

The density was measured by the method in accordance with ASTM D1505.

Example 9-1

The starting materials shown in Table 9-1 were melt-kneaded with a single-screw extruder (extrusion temperature: 220° C.). The resultant melt-kneaded material was molded into a sheet (0.6 mm, 1 mm, or 2 mm thick) with a press molding machine (heating temperature: 190° C., heating time: 5 min, cooling speed: −40° C./min). The above properties were evaluated for this sheet, which was a solar cell-sealing sheet. The results are shown in Table 9-1.

Example 9-2

A specimen of solar cell-sealing sheet was prepared from the starting materials (containing PH25B) shown in Table 9-1 by a similar method to that in Example 9-1. The above properties were evaluated for this specimen. The results are shown in Table 9-1.

Example 9-3

A specimen of solar cell-sealing sheet was prepared from the starting materials (containing PH25B and TAIC) shown in Table 9-1 by a similar method to that in Example 9-1. The above properties were evaluated for this specimen. The results are shown in Table 9-1.

Comparative Example 9-1

A specimen of solar cell-sealing sheet was prepared and above properties thereof were evaluated with the starting materials shown in Table 9-1 by a similar method to that in Example 9-1. The results are shown in Table 9-1.

Comparative Example 9-2

A specimen of solar cell-sealing sheet was prepared and above properties thereof were evaluated with the starting materials shown in Table 9-1 by a similar method to that in Example 9-1. The results are shown in Table 9-1.

TABLE 9-1

| | Examples and Comparative Examples | | | | |
|---|---|---|---|---|---|
| | Example 9-1 | Example 9-2 | Example 9-3 | Comparative Example 9-1 | Comparative Example 9-2 |
| (A9) iPP (pbw) | 20 | 20 | 20 | | |
| (B9) PEBR (pbw) | 80 | 80 | 80 | | |
| (C9) EVA (pbw) | | | | 100 | |
| (D9) EBR (pbw) | | | | | 100 |
| (Y9) VTMOS (pbw) | 2 | 2 | 2 | 2 | 2 |
| (Z9) PH25B (pbw) | | 0.09 | 0.09 | | |
| (Z9-2) TAIC (pbw) | | | 0.2 | | |
| Crosslinking | None | None | None | None | None |
| Boiled hexane-insoluble content (wt %) | 0 | 0 | 0 | 0 | 0 |
| Haze (%) | 3.5 | 3.7 | 3.3 | 3.2 | 4.2 |
| Trans (%) | 91 | 90 | 92 | 91 | 90 |
| TMA (° C.) | 117 | 113 | 115 | 77 | 80 |
| Tensile strength at break (MPa) | 14 | 7 | 9 | 10 | 9 |
| Modulus in tension (MPa) | 14 | 13 | 16 | 20 | 18 |
| Adhesion strength to glass (N/cm) | 6 | 12 | 19 | 20 | 20 |

Note
pbw: parts by weight

<Tenth Aspect of Invention>

[Measurement Methods]

In Examples and Comparative Examples below, the properties of electrical/electronic element-sealing sheets were evaluated by the following measurement methods.

Flexibility

In accordance with JIS K6301, Shore A hardness was measured. A 2-mm thick press-molded sheet was prepared from each composition by heating at 190° C. and then cooling at 40° C./min and used for measurement. In Examples, the composition forming layer (II-10) in the sheet was used, while in Comparative Examples, the composition forming the single-layer sheet was used.

Transparency (Internal Haze):

Diffuse transmission and total transmission were measured with a digital haze/tubidimeter "NDH-2000" available from Nippon Denshoku Kogyo Co., Ltd. for each sheet in cyclohexanol. Internal haze was calculated using the following equation:

Internal haze (%)=100×(Diffuse transmission)/(Total transmission).

Transparency (Light Transmittance)

Each composition was hot-pressed into a sheet (160° C., 2 atm, 10 min) while the sheet was protected with PET ("Lumirror"™, available from Toray Industries) to prevent surface roughness, which might affect the evaluation. After the sheet was air-cooled, the PET film was removed to obtain a specimen (0.4 mm thick). With this specimen, transmittance was measured with a digital haze/tubidimeter "NDH-2000" available from Nippon Denshoku Kogyo Co., Ltd. Transmittance is represented by the following equation:

Transmittance (%)=100×(total transmitted light intensity)/(incident light intensity).

Heat Resistance (TMA)

In Examples, layer (II-10) in the sheet was used, while in Comparative Examples the single-layer sheet was used. A TMA curve was measured in accordance with JIS K7196 using a 1.8-mmΦ flat-ended needle under a load of 2 kgf/cm$^2$ at a heating speed of 5° C./min. The temperature (° C.) at which the needle penetrated into the layer or sheet was determined.

Adhesion Strength to Glass and Appearance:

Layer (I-10) in the sheet in Examples, or the single-layer sheet in Comparative Examples, was hot-press bonded to a 4-mm thick glass plate under two different conditions (condition 1: 150° C., 2 atm, 10 min; condition 2: 160° C., 2 atm, 10 min). Peeling strength at room temperature of the laminate was evaluated as follows.

A: Firmly bonded, not easy to peel
B: Bonded, but peelable
C: Not bonded

Permanent Compression Set:

In accordance with JIS K6301, six 2-mm thick press-molded sheets were stacked and compressed by 25%, and the stack was kept under this load at a predetermined temperature (23° C. or 70° C.) for 24 hr, and then the stack was freed from the load and its thickness was measured. From the results of measurement, the residual strain (permanent compression set) was calculated using the following equation:

Residual strain (%)=100×("thickness before test"–"thickness after test")/("thickness before test"–"thickness on compression").

[Starting Materials]

The species and properties of resins used to prepare specimens in Examples and Comparative Examples are as follows.

(A10) Isotactic Polypropylene (rPP)

Propylene/ethylene/1-butene copolymer (Melting point (Tm)=140° C., Melt flow rate (MFR) (230° C.)=7 g/10 min, Isotactic pentad fraction (mmmm-fraction)=0.96, Molecular weight distribution (Mw/Mn)=4.8, Ethylene content=2.0 mol %, 1-Butene content=1.5 mol %) was used.

(B10) Propylene/Ethylene/1-Butene Copolymer (PEBR)

Propylene/ethylene/1-butene copolymer prepared in a similar method to that described in Examples of WO 2004/87775 was used (Ethylene content=14.0 mol %, 1-Butene content=20 mol %, Melt flow rate (MFR) (230° C.)=8.5 g/10 min, Melting point (Tm)=not observed (ΔH: less than 0.5 J/g), mm-Fraction=92%, Molecular weight distribution (Mw/Mn)=2.0, Shore A hardness=38).

Specifically, PEBR was prepared as follows. In a 2000-mL polymerization reactor fully purged with nitrogen, 917 mL of dry hexane, 90 g of 1-butene, and 1.0 mmol of triisobutylaluminum were charged at normal temperature, the temperature in the reactor was elevated to 65° C., propylene was introduced so that the pressure of the reaction system was increased to 0.77 MPa, and then the pressure was regulated at 0.79 MPa with ethylene. Into this reactor was added a toluene solution in which 0.002 mmol of dimethylmethylene (3-tert-butyl-5-methylcyclopentadienyl)fluorenylzirconium dichloride and 0.6 mmol (in terms of aluminum) of methylaluminoxane (available from Tosoh Finechem Corp.) had been contacted, and polymerization was conducted for 20 min while the inside temperature was kept at 65° C. and the inside pressure was kept at 0.79 MPa by adding ethylene. The polymerization was terminated by adding 20 mL of methanol, the pressure was released, and the polymer was precipitated from the polymerization solution in 2 L of methanol and dried at 130° C. under vacuum for 12 hr to yield 60.4 g of PEER.

(C10) Ethylene/Vinyl Acetate Copolymer (EVA)

Ethylene/vinyl acetate copolymer (Ethylene content=89 mol % (determined by FT-IR), Shore A hardness=79, Melt flow rate (MFR) (190° C.)=15 g/10 min) was used.

(D10) Ethylene/1-Butene Copolymer (EBR)

Ethylene/1-butene random copolymer (Melt flow rate (MFR) (190° C.)=15 g/10 min, Density=870 kg/m$^3$, Ethylene content=85 mol %, Shore A hardness=72) was used.

(E10) Ethylene/methacrylic Acid Copolymer (E(M)AA)

Ethylene/methacrylic acid copolymer (Methacrylic acid content=12 wt % (determined by FT-IR), Melt flow rate (MFR) (190° C.)=14 g/10 min) was used.

(Y10) Silane Coupling Agent

3-Methacryloxypropyltrimethoxysilane available from Dow Corning Toray Co., Ltd. was used.

(Z10) Peroxide

DCP (dicumyl peroxide) available from ARKEMA YOSHITOMI, LTD. was used.

Measurement Methods for Properties of the Above Source Materials (1) Co-Monomer (Ethylene and 1-Butene) Contents The contents were determined by $^{13}$C-NMR spectrum analysis.

(2) MFR

The MFR was measured in accordance with ASTM D1238 at 190° C. or 230° C. under a load of 2.16 kg.

(3) Melting Point

In exothermic/endothermic curve measured with a DSC, the temperature at which the maximum melting peak appeared on heating was counted as Tm. A sample loaded on an aluminum pan was heated to 200° C. at 100° C./min, kept at 200° C. for 5 min, cooled to −150° C. at 0° C./min, and heated at 10° C./min during which the exothermic/endothermic curve was recorded.

(4) Molecular Weight Distribution (Mw/Mn)

The Mw/Mn was measured by GPC (gel permeation chromatography) using o-dichlorobenzene as a solvent at 140° C.

(5) Density

The density was measured by the method in accordance with ASTM D1505.

(6) Shore A Hardness

The Shore A hardness was measured in accordance with JIS K6301 under the following conditions. (Measurement conditions) A sheet was prepared with a press molding machine. The scale was read immediately after the pointer of a Type-A hardness tester touch the sheet.

Example 10-11

Layer (II-10) (thickness: 300 μm, extrusion temperature: 190° C.) was prepared from a thermoplastic composition (permanent compression set at 23° C.: 20%, permanent compression set at 70° C.: 61%) containing 20 parts by weight of isotactic polypropylene (A10) (rPP) and 80 parts by weight of propylene/ethylene/1-butene copolymer (B10) (PEBR). Layer (I-10) (thickness: 100 µm, extrusion temperature: 120° C.) was prepared from 100 parts by weight of ethylene/vinyl acetate copolymer (C10) (EVA), 1.5 parts by weight of silane coupling agent (Y10), and 1.0 part by weight of peroxide (Z10). Thus a multilayer sheet (electrical/electronic element-sealing sheet) composed of these layers was obtained.

For the resulting sheet, the above measurements were performed. The results are shown in Table 10-1.

TABLE 10-1

|  |  | Example 10-1 | Example 10-2 | Comparative Example 10-1 | Comparative Example 10-2 | Reference Example 10-3 |
|---|---|---|---|---|---|---|
| Shore A |  | 74 | 74 | 76 | ≥95 | 74 |
| Internal haze | % | 1.2 | 1.6 | 0.9 | 1.6 | 2.4 |
| Light transmittance | % | 94 | 93 | 94 | 90 | 94 |
| TMA | °C. | 118 | 119 | 60> | 88 | 118 |
| Adhesion to glass | Condition 1 | A | A | A | A | C |
|  | Condition 2 | A | A | A | A | B |

Example 10-2

Layer (II-10) (thickness: 300 µm, extrusion temperature: 190° C.) was prepared from a thermoplastic composition (permanent compression set at 23° C.: 20%, permanent compression set at 70° C.: 61%) containing 20 parts by weight of isotactic polypropylene (A10) (rPP) and 80 parts by weight of propylene/ethylene/1-butene copolymer (B10) (PEBR). Layer (I-10) (thickness: 100 µm, extrusion temperature: 130° C.) was prepared from 100 parts by weight of ethylene/1-butene copolymer (D10) (EBR), 1.5 parts by weight of silane coupling agent (Y10), and 1.0 part by weight of peroxide (Z10). Thus, a multilayer sheet (electrical/electronic element-sealing sheet) composed of these layers was obtained.

For the resulting sheet, the above measurements were performed. The results are shown in Table 10-1.

Comparative Example 10-1

A single-layer sheet (thickness: 400 µm, extrusion temperature: 130° C.) was obtained from 100 parts by weight of ethylene/vinyl acetate copolymer (C10) (EVA).

For the resulting sheet, the above measurements were performed. The results are shown in Table 10-1.

Comparative Example 10-2

A single-layer sheet (thickness: 400 µm, extrusion temperature: 130° C.) was obtained from 100 parts by weight of ethylene/methacrylic acid copolymer (E10)(E(M)AA).

For the resulting sheet, the above measurements were performed. The results are shown in Table 10-1.

Reference Example 10-3

A single-layer sheet (thickness: 400 µm, extrusion temperature: 190° C., permanent compression set at 23° C.: 24%, permanent compression set at 70° C.: 66%) was obtained from 20 parts by weight of isotactic polypropylene (A10) (rPP) and 80 parts by weight of propylene/ethylene/1-butene copolymer (B10) (PEBR) (100 parts by weight in total), 1.5 parts by weight of silane coupling agent (Y10), and 0.03 parts by weight of peroxide (Z10).

For the resulting sheet, the above measurements were performed. The results are shown in Table 10-1.

INDUSTRIAL APPLICABILITY

The thermoplastic resin composition of the present invention is excellent in rubber elasticity, that is, permanent compression set as well as mechanical properties. In particular, the composition exhibits small temperature dependence in permanent compression set, keeping rubber elasticity even at high temperature, so that the composition is suitably used for automobile interior and exterior components, construction and building components, home electric appliance components, cap liners, gaskets, convenience goods (grips), and others.

The thermoplastic resin composition of the present invention and crosslinked product thereof have flexibility well-balanced with scratch resistance and whitening resistance and are kneadable at low temperature. So that, these are suitably used for automobile interior and exterior components, construction and building components, home electric appliance components, cap liners, gaskets, convenience goods (grips), and others.

The propylene-based polymer composition of the present invention is excellent in whitening resistance, impact resistance, scratch resistance, flexibility, transparency, mechanical strength, and stretching property. Molded articles made of the polymer composition are widely used in industrial applications as blow-molded articles, injection-molded articles, extrusion-molded articles (films and sheets), inflation-molded articles, tubes, and others.

The film of the present invention has a high heat-shrink ratio and also is excellent in flexibility, transparency, impact resistance, and stretching property, so that the film is suitably used as heat-shrinkable films and others. The thermoplastic resin composition of the present invention is suitably used to produce films having a high heat-shrink ratio and excellent flexibility, transparency, impact resistance, and stretching property.

The polyolefin decorative sheet of the present invention is excellent in flexibility, scratch resistance, abrasion resistance, mechanical strength (tensile strength at break), heat resistance, whitening resistance on stretching, whitening resistance on folding, wrinkle resistance, water resistance, and compression set resistance. Therefore, the film is not particularly limited on its applications, and suitably used for home electric appliances and furniture such as TV cabinets, stereo-speaker boxes, video cabinets, and various storage furniture and unified furniture; housing members such as doors, door frames, window sashes, crown, plinth, and opening frames; furniture members such as doors of kitchen and storage furniture; construction and building material such as floor material, ceiling material, and wall paper; automobile interior material; home electric appliances; stationery; office goods; and others.

The propylene-based resin composition of the present invention contains inorganic filler at a high content, and is excellent in, as well as flexibility, mechanical strength, elongation at break, and scratch resistance. In addition, the propylene-based resin composition of the present invention can be widely used for fire-retardant molded articles including electrical wires and construction and building materials because of high content of inorganic filler.

The foaming material (X7) of the present invention provides foams having low specific gravity and permanent compression set (CS) as well as excellent tearing strength, low resilience, and good scratch resistance. Such foams can be used for footwear and footwear components. The footwear components include, for example, shoe soles, shoe mid soles, inner soles, soles, and sandals.

The resin composition of the present invention exhibits good heat-bondability to inorganic materials, such as metals and glass, and other plastics, and also high peeling strength in a wide range of temperature. In addition, the resin composition of the present invention is excellent in flexibility, heat resistance, transparency, and mechanical strength, and hence suitably used as a raw material for various applications.

The solar cell-sealing sheet of the present invention exhibits excellent heat resistance even though not crosslinked. The solar cell-sealing sheet of the present invention can eliminate the crosslinking step from solar cell production processes, and also facilitate recycle of solar cells.

The invention claimed is:

1. A thermoplastic resin composition (X1) comprising (A1), (B1), (C1), and optionally (D1) below:

1 to 90 wt % of an isotactic polypropylene (A1);

9 to 98 wt % of a propylene/ethylene/α-olefin copolymer (B1) containing 45 to 89 mol % of propylene-derived structural units, 10 to 25 mol % of ethylene-derived structural units, and 1 to 30 mol % of $C_4$-$C_{20}$ α-olefin-derived structural units (a1);

1 to 80 wt % of a styrene-based elastomer (C1); and 0 to 70 wt % of an ethylene/α-olefin copolymer (D1) whose density is in the range of 0.850 to 0.910 $g/cm^3$, wherein, the total of (A1), (B1), (C1), and (D1) is 100 wt %, and a melting point of propylene/ethylene/α-olefin copolymer (B1) is not observed when measured with a differential scanning calorimeter (DSC).

2. The thermoplastic resin composition (X1) according to claim 1 further comprising 1 to 400 parts by weight of a softener (E1) relative to 100 parts by weight of the total of (A1), (B1), (C1), and (D1).

3. A molded article at least part of which is made of the thermoplastic resin composition (X1) according to claim 1.

4. The molded article according to claim 3 wherein said molded article is a film or a sheet.

5. The molded article according to claim 3 wherein said molded article is a monofilament, a fiber, or a nonwoven fabric.

6. An automobile interior or exterior component at least part of which is made of the thermoplastic resin composition (X1) according to claim 1.

7. A home electric appliance component at least part of which is made of the thermoplastic resin composition (X1) according to claim 1.

8. A construction or building component at least part of which is made of the thermoplastic resin composition (X1) according to claim 1.

9. A packaging sheet or a cap liner at least part of which is made of the thermoplastic resin composition (X1) according to claim 1.

10. A cap comprising the cap liner according to claim 9.

11. A packaging container comprising the cap according to claim 10.

12. A gasket at least part of which is made of the thermoplastic resin composition (X1) according to claim 1.

13. A daily-use product at least part of which is made of the thermoplastic resin composition (X1) according to claim 1.

14. A decorative sheet at least part of which is made of the thermoplastic resin composition (X1) according to claim 1.

* * * * *